US008400828B2

(12) United States Patent
Torii et al.

(10) Patent No.: US 8,400,828 B2
(45) Date of Patent: Mar. 19, 2013

(54) NONVOLATILE SEMICONDUCTOR MEMORY DEVICE

(75) Inventors: Satoshi Torii, Kawasaki (JP); Kazuhiro Mizutani, Kawasaki (JP); Toshio Nomura, Kawasaki (JP); Masayoshi Asano, Kawasaki (JP); Ikuto Fukuoka, Kawasaki (JP); Hiroshi Mawatari, Kawasaki (JP); Motoi Takahashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/435,901

(22) Filed: Mar. 30, 2012

(65) Prior Publication Data

US 2012/0195121 A1 Aug. 2, 2012

Related U.S. Application Data

(60) Division of application No. 13/188,869, filed on Jul. 22, 2011, which is a division of application No. 12/411,938, filed on Mar. 26, 2009, now Pat. No. 8,014,198, which is a continuation of application No. PCT/JP2006/319591, filed on Sep. 29, 2006, and a continuation of application No. PCT/JP2007/068849, filed on Sep. 27, 2007.

(51) Int. Cl.
*G11C 16/04* (2006.01)

(52) U.S. Cl. .................................. 365/185.05; 257/314

(58) Field of Classification Search ........................ None
See application file for complete search history.

(56) References Cited

U.S. PATENT DOCUMENTS 5,592,415 A 1/1997 Kato et al.
6,169,307 B1 1/2001 Takahashi et al.
6,639,843 B2 10/2003 Miyauchi
6,788,577 B2 9/2004 Mihara
6,788,579 B2 9/2004 Gregori et al.
6,940,762 B2 9/2005 Umezawa
6,958,940 B2 10/2005 Takase et al.
7,057,230 B2 6/2006 Tanaka et al.
2001/0048612 A1* 12/2001 Yi et al. .................. 365/185.17
2001/0050862 A1 12/2001 Nakamura
2002/0130314 A1 9/2002 Yim et al.
2002/0191444 A1 12/2002 Gregori et al.
2003/0058712 A1 3/2003 Yamamoto et al.
2004/0252558 A1 12/2004 Umezawa
2005/0083744 A1 4/2005 Arai et al.
2005/0248992 A1 11/2005 Hwang et al.
2008/0080247 A1 4/2008 Chang

FOREIGN PATENT DOCUMENTS

JP 5-167044 A 7/1993
JP 6-77437 A 3/1994
JP 11-177068 A 7/1999

(Continued)

OTHER PUBLICATIONS

U.S. Office Action dated May 17, 2012, issued in corresponding U.S. Appl. No. 13/188,869.

(Continued)

*Primary Examiner* — Hoai V Ho
*Assistant Examiner* — James G Norman
(74) *Attorney, Agent, or Firm* — Westerman, Hattori, Daniels & Adrian, LLP

(57) ABSTRACT

A nonvolatile semiconductor memory device including a memory cell array of memory cells arranged in a matrix, each of which includes a selecting transistor and a memory cell transistor; a column decoder controlling the potential of bit lines; a voltage application circuit controlling the potential of the first word lines; a first row decoder controlling the potential of the second word lines; and a second row decoder controlling the potential of the source line. The column decoder is formed of a circuit whose withstand voltage is lower than the voltage application circuit and the second row decoder.

3 Claims, 70 Drawing Sheets

FOREIGN PATENT DOCUMENTS

| | | | |
|---|---|---|---|
| JP | 11-260073 | A | 9/1999 |
| JP | 2000-40808 | A | 2/2000 |
| JP | 2002-319293 | A | 10/2002 |
| JP | 2002-324860 | A | 11/2002 |
| JP | 2003-100092 | A | 4/2003 |
| JP | 2005-116970 | A | 4/2005 |
| JP | 2005-122772 | A | 5/2005 |
| TW | 525170 | B | 3/2003 |
| TW | 594724 | B | 6/2004 |
| WO | 2003-012878 | A1 | 2/2003 |
| WO | 2006-085373 | A1 | 8/2006 |

OTHER PUBLICATIONS

International Search Report of PCT/JP2007/068849, date of mailing Jan. 8, 2008.

International Search Report of PCT/JP2006/319598, mailing date Nov. 14, 2006.

Taiwanese Office Action dated Oct. 22, 2008, issued in corresponding Taiwanese Patent Application No. 095137267.

Taiwanese Office Action dated Oct. 22, 2008, issued in corresponding Taiwanese Patent Application No. 095137268.

* cited by examiner

FIG. 6

| | BIT LINE | SOURCE LINE | FIRST WORD LINE | SECOND WORD LINE | WELL |
|---|---|---|---|---|---|
| READ | Vcc (0V) | 0V (0V) | CONSTANTLY Vcc | Vcc (0V) | 0V |
| WRITE | 0V (F) | 5V (0V or F) | 9V (0V or F) | Vcc (F) | 0V |
| ERASE | FLOATING | FLOATING | −9V | FLOATING | +9V |

FIG. 24

| | BIT LINE | SOURCE LINE | FIRST WORD LINE | SECOND WORD LINE | WELL |
|---|---|---|---|---|---|
| READ | Vcc (0V) | 0V (0V) | CONSTANTLY Vcc | Vcc (0V) | 0V |
| WRITE | 0V (Vcc) | 5V (0V or F) | 9V (0V or F) | Vcc (0V) | 0V |
| ERASE | FLOATING | FLOATING | −9V | FLOATING | +9V |

FIG. 27

| | BIT LINE | SOURCE LINE | FIRST WORD LINE | SECOND WORD LINE | WELL |
|---|---|---|---|---|---|
| READ | Vcc (0V) | 0V (0V) | CONSTANTLY Vcc | Vcc (0V) | 0V |
| WRITE | 0V (Vcc) | 5V (0V or F) | 9V (0V or F) | Vcc' (0V) | 0V |
| ERASE | FLOATING | FLOATING | −9V | FLOATING | +9V |

FIG. 28

| | BIT LINE | SOURCE LINE | FIRST WORD LINE | SECOND WORD LINE | WELL |
|---|---|---|---|---|---|
| READ | Vcc (0V) | 0V (0V) | Vcc (Vcc) | Vcc (0V) | 0V |
| WRITE | 0V (Vcc) | 5V (0V or F) | V step (0V or F) | Vcc (0V) | 0V |
| ERASE | FLOATING | FLOATING | −9V | FLOATING | +9V |

FIG. 32

| | BIT LINE | SOURCE LINE | FIRST WORD LINE | SECOND WORD LINE | FIRST CONTROL LINE | SECOND CONTROL LINE | WELL |
|---|---|---|---|---|---|---|---|
| READ | Vcc (0V) | 0V (0V) | Vcc (Vcc) | Vcc (0V) | 5V | 5V | 0V |
| WRITE | 0V (Vcc) | 5V (0V or F) | 9V (0V or F) | Vcc (0V) | 5V | 5V | 0V |
| ERASE | FLOATING | FLOATING | −9V | FLOATING | 0V | 0V | +9V |

FIG. 34

| | BIT LINE | SOURCE LINE | FIRST WORD LINE | SECOND WORD LINE | FIRST CONTROL LINE | SECOND CONTROL LINE | WELL |
|---|---|---|---|---|---|---|---|
| READ | Vcc (0V) | 0V (0V) | Vcc (Vcc) | Vcc (0V) | 5V | 5V | 0V |
| WRITE | 0V (F) | 5V (0V or F) | 9V (0V or F) | 4V (0V) | 5V | 0V | 0V |
| ERASE | FLOATING | FLOATING | −9V | FLOATING | 0V | 0V | +9V |

FIG. 36

| | BIT LINE | SOURCE LINE | FIRST WORD LINE | SECOND WORD LINE | FIRST CONTROL LINE | SECOND CONTROL LINE | THIRD CONTROL LINE | WELL |
|---|---|---|---|---|---|---|---|---|
| READ | Vcc (0V) | 0V (0V) | Vcc (Vcc) | Vcc (0V) | 5V | 5V | 0V | 0V |
| WRITE | 0V (F) | 5V (0V or F) | 9V (0V or F) | 5V (0V) | 5V | 0V | 6V | 0V |
| ERASE | FLOATING | FLOATING | −9V | FLOATING | 0V | 0V | 0V | +9V |

FIG. 38

| | BIT LINE | SOURCE LINE | FIRST WORD LINE | SECOND WORD LINE | FIRST CONTROL LINE | SECOND CONTROL LINE | THIRD CONTROL LINE | WELL |
|---|---|---|---|---|---|---|---|---|
| READ | Vcc (0V) | 0V (0V) | Vcc (Vcc) | Vcc (0V) | 5V | 5V | 0V | 0V |
| WRITE | 0V (F) | 5V (0V or F) | 9V (0V) | 9V (0V) | 5V | 0V | 10V | 0V |
| ERASE | FLOATING | FLOATING | −9V | FLOATING | 0V | 0V | 0V | +9V |

FIG. 40

| | BIT LINE | SOURCE LINE | FIRST WORD LINE | SECOND WORD LINE | FIRST CONTROL LINE | SECOND CONTROL LINE | THIRD CONTROL LINE | WELL |
|---|---|---|---|---|---|---|---|---|
| READ | Vcc (0V) | 0V (0V) | Vr (Vcc) | Vcc (0V) | 5V | 5V | 0V | 0V |
| WRITE | 0V (F) | 5V (0V or F) | 9V (0V or F) | 9V (0V or F) | 5V | 0V | 10V | 0V |
| ERASE | FLOATING | FLOATING | −9V | FLOATING | 0V | 0V | 0V | +9V |

FIG. 44

| | BIT LINE | SOURCE LINE | FIRST WORD LINE | SECOND WORD LINE | WELL |
|---|---|---|---|---|---|
| READ | Vcc (0V) | 0V (0V) | CONSTANTLY Vcc | Vcc (0V) | 0V |
| WRITE | 0V (Vcc) | 5.5V (0V) | V step (0V) | Vcc (0V) | 0V |
| ERASE | 0V | 5V | −5V | 0V | 0V |

FIG. 66

| | BIT LINE | SOURCE LINE | FIRST WORD LINE | SECOND WORD LINE | WELL |
|---|---|---|---|---|---|
| READ | Vcc (0V) | 0V (0V) | CONSTANTLY Vcc | Vcc (0V) | 0V |
| WRITE | 0V (Vcc) | 5.5V (0V) | V step (0V) | Vcc (0V) | 0V |
| ERASE | 0V | 5V | −5V | 0V | 0V |

FIG. 68

| | BIT LINE | SOURCE LINE | FIRST WORD LINE | SECOND WORD LINE | WELL |
|---|---|---|---|---|---|
| READ | Vcc (0V) | 0V (0V) | CONSTANTLY Vcc | Vcc (0V) | 0V |
| WRITE | 0V (Vcc) | 5.5V (0V) | V step (0V) | Vcc (0V) | 0V |
| ERASE | 0V | 5V | −5V | 0V | 0V |

FIG. 69

| | BIT LINE | SOURCE LINE | FIRST WORD LINE | SECOND WORD LINE | WELL |
|---|---|---|---|---|---|
| READ | Vcc (0V) | 0V (0V) | CONSTANTLY Vr | Vcc (0V) | 0V |
| WRITE | 0V (Vcc) | 5.5V (0V) | V step (0V) | Vcc (0V) | 0V |
| ERASE | 0V | 5V | −5V | 0V | 0V |

NONVOLATILE SEMICONDUCTOR MEMORY DEVICE

CROSS-REFERENCE TO RELATED APPLICATIONS

This application is a Divisional of application Ser. No. 13/188,869, filed Jul. 22, 2011, which is a Divisional application Ser. No. 12/411,938 filed Mar. 26, 2009, now U.S. Pat. No. 8,014,198, which is a Continuation of International Application No. PCT/JP2006/319591, with an international filing date of Sep. 29, 2006, designating the United States of America, and International Application No. PCT/JP2007/068849, with an international filing date of Sep. 27, 2007, designating the United States of America, the entire contents of both of which are incorporated herein by reference.

FIELD

The embodiments discussed herein are related to a nonvolatile semiconductor memory device.

BACKGROUND

Recently, nonvolatile semiconductor memory devices comprising memory cells each including a selecting transistor and a memory cell transistor are proposed.

In such nonvolatile semiconductor memory devices, bit lines and word lines and source lines, etc. are suitably selected by a column decoder and a row decoder to thereby select memory cells, and make read, write, erase, etc. of information for the selected memory cells.

SUMMARY

According to aspects of the embodiment, a nonvolatile semiconductor memory device including: a memory cell array of a plurality of memory cells arranged in a matrix, which each include a selecting transistor, and a memory cell transistor connected to the selecting transistor; a plurality of bit lines each commonly connecting the drains of a plurality of the selecting transistors present in one and the same column; a plurality of the first word lines each commonly connecting the gate electrodes of a plurality of the memory cell transistors present in one and the same row; a plurality of the second word lines each commonly connecting the select gates of a plurality of the selecting transistors present in one and the same row; a plurality of source lines each commonly connecting the sources of a plurality of the memory cell transistors present in one and the same row; a column decoder connected to the plural bit lines and controlling the potential of the plural bit lines; a voltage application circuit connected to the plural first word lines and controlling the potential of the plural first word lines; a first row decoder connected to the plural second word lines and controlling the potential of the plural second word lines; and a second row decoder connected to the plural source lines and controlling the potential of the plural source lines, the column decoder being formed of a circuit whose withstand voltage is lower than the voltage application circuit and the second row decoder, and the first row decoder being formed of a circuit whose withstand voltage is lower than the voltage application circuit and the second row decoder.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 6 is a view illustrating the reading method, the writing method and the erasing method of the nonvolatile semiconductor memory device according to the first embodiment;

FIG. 24 is a view illustrating the reading method, the writing method and the erasing method of the nonvolatile semiconductor memory device according to the second embodiment;

FIG. 27 is a view illustrating the reading method, the writing method and the erasing method of the nonvolatile semiconductor memory device according to the third embodiment;

FIG. 28 is a view illustrating the reading method, the writing method and the erasing method of the nonvolatile semiconductor memory device according to a fourth embodiment;

FIG. 32 is a view illustrating the reading method, the writing method and the erasing method of the nonvolatile semiconductor memory device according to the fifth embodiment;

FIG. 34 is a view illustrating the reading method, the writing method and the erasing method of the nonvolatile semiconductor memory device according to the sixth embodiment;

FIG. 36 is a view illustrating the reading method, the writing method and the erasing method of the nonvolatile semiconductor memory device according to the seventh embodiment;

FIG. 38 is a view illustrating the reading method, the writing method and the erasing method of the nonvolatile semiconductor memory device according to the eighth embodiment;

FIG. 40 is a view illustrating the reading method, the writing method and the erasing method of the nonvolatile semiconductor memory device according to the ninth embodiment;

FIG. 44 is a view illustrating the reading method, the writing method and the erasing method of the nonvolatile semiconductor memory device according to the tenth embodiment;

FIGS. 52A and 52B are sectional views (Part 4) of the nonvolatile semiconductor memory device according to the tenth embodiment in the steps of the method for manufacturing the nonvolatile semiconductor memory device, which illustrates the method;

FIG. 66 is a view illustrating the reading method, the writing method and the erasing method of the nonvolatile semiconductor memory device according to the eleventh embodiment;

FIG. 68 is a view illustrating the reading method, the writing method and the erasing method of the nonvolatile semiconductor memory device according to the twelfth embodiment;

FIG. 69 is a view illustrating the reading method, the writing method and the erasing method of the nonvolatile semiconductor memory device according to a thirteenth embodiment;

DESCRIPTION OF EMBODIMENTS

In the proposed nonvolatile semiconductor memory devices, both the column decoder and the row decoder use high withstand voltage circuits (high voltage circuits). The high withstand voltage circuits comprise high withstand voltage transistors having the gate insulation film formed thick, which makes it difficult to read information written in the memory cells at high speed.

Preferred embodiments of the present invention will be explained with reference to accompanying drawings.

[a] First Embodiment

The nonvolatile semiconductor memory device according to a first embodiment, a reading method, a writing method and an erasing method of the nonvolatile semiconductor memory device, and a method for manufacturing the nonvolatile semiconductor memory device will be explained with reference to FIGS. 1 to 22.

(Nonvolatile Semiconductor Memory Device)

Figure 1:
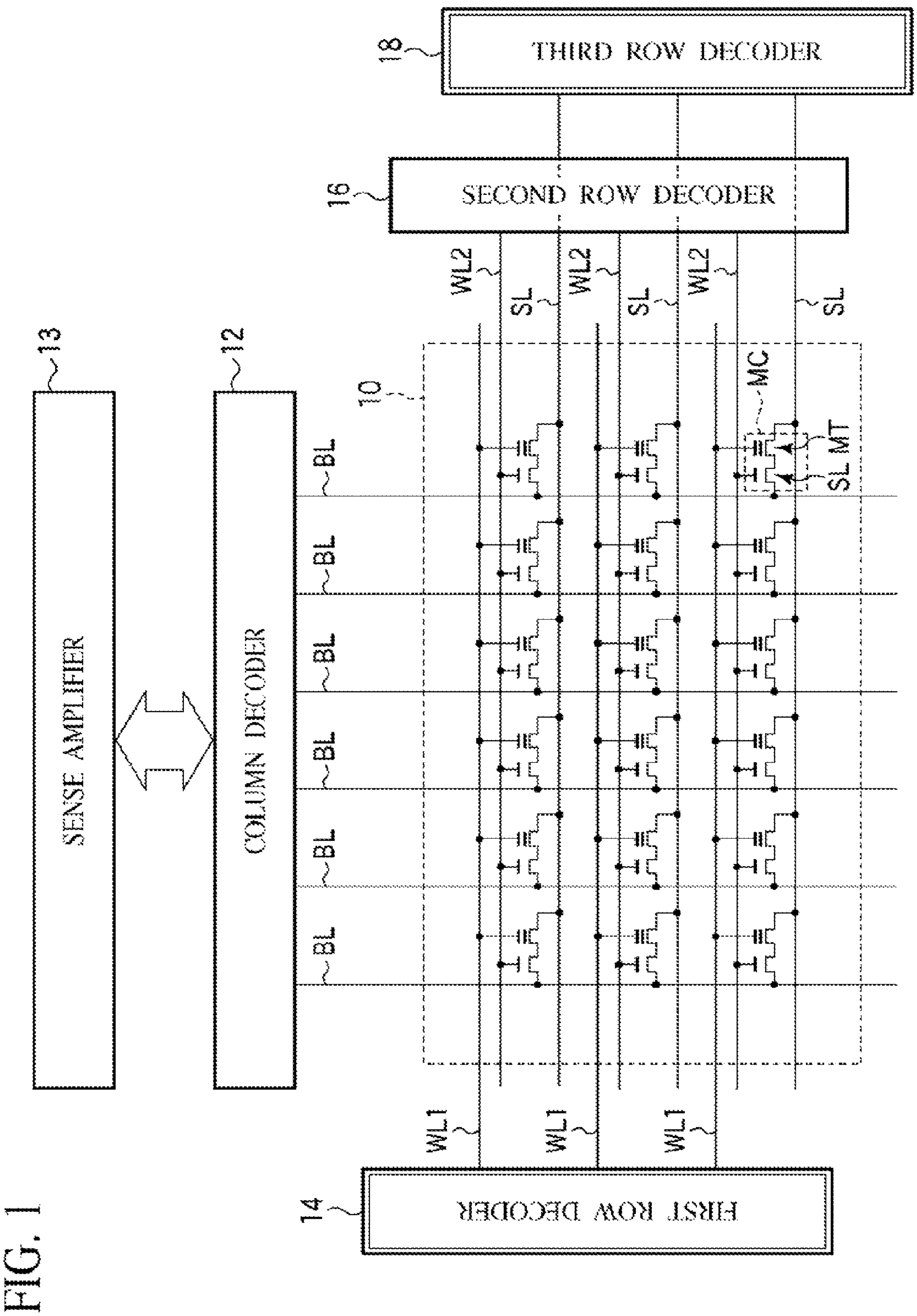
FIG. 1 is a circuit diagram of a nonvolatile semiconductor memory device according to a first embodiment.

First, the nonvolatile semiconductor memory device according to the present embodiment will be explained with reference to FIGS. 1 to 6. FIG. 1 is a circuit diagram of the nonvolatile semiconductor memory device according to the present embodiment.

As illustrated in FIG. 1, the nonvolatile semiconductor memory device according to the present embodiment comprises memory cells MC each including a selecting transistor ST and a memory cell transistor MT connected to the selecting transistor ST. The selecting transistor ST has the source connected to the drain of the memory cell transistor MT. More specifically, the source of the selecting transistor ST and the drain of the memory cell transistor MT are integrally formed of one impurity diffused layer.

A plurality of the memory cells MC are laid out in a matrix. The plural memory cells MC laid out in a matrix form a memory cell array 10.

The drains of a plurality of the selecting transistors ST present in one and the same column are commonly connected by a bit line BL.

The control gates of a plurality of the memory cell transistors MT present in one and the same row are commonly connected by the first word line WL1.

The select gates of a plurality of the selecting transistors ST present in one and the same row are commonly connected by the second word line WL2.

The sources of a plurality of the memory cell transistors MT present in one and the same row are commonly connected by a source line SL.

A plurality of bit lines BL commonly connecting the drains of the selecting transistors ST are connected to a column decoder 12. The column decoder 12 is for controlling the potential of plural bit lines BL commonly connecting the drains of the selecting transistors ST. The column decoder 12 is connected to a sense amplifier 13 for detecting current flowing in the bit lines BL. The column decoder 12 is formed of a low voltage circuit, which is operative at relatively low voltage. The low voltage circuit is a circuit whose withstand voltage is relatively low but is operative at high speed. The gate insulation film (not illustrated) of the transistors of the low voltage circuit is formed relatively thin. Accordingly, the transistors of the low voltage circuit used in the column decoder 12 can operate at relatively high speed. The column decoder 12 is formed of the low voltage circuit in the present embodiment because it is not necessary to apply high voltage to the drains of the selecting transistors ST but the selecting transistors ST is operated at high speed when information written in the memory cell transistors MT is read. In the present embodiment, the column decoder 12 is formed of the low voltage circuit, whereby the selecting transistors ST can be operated at relatively high speed, which resultantly allows the nonvolatile semiconductor memory device to operate at high read speed.

A plurality of the first word lines WL1 commonly connecting the control gates of the memory cell transistors MT are connected to the first row decoder (voltage application circuit) 14. The first row decoder 14 is for controlling the potential of the respective plural first word lines WL1 commonly connecting the control gates of the memory cell transistors MT. The first row decoder 14 is formed of a high voltage circuit (high withstand voltage circuit). The high voltage circuit is a circuit whose operation speed is relatively low and whose withstand voltage is relatively high. The gate insulation film (not illustrated) of the transistors (not illustrated) of the high voltage circuit is formed relatively thick so as to ensure sufficient withstand voltage. Accordingly, the operation speed of the transistors of the high voltage circuit is lower in comparison with the operation speed of the transistors of the low voltage circuit. The first row decoder 14 is formed of the high voltage circuit in the present embodiment because high voltages is applied to the first word lines WL1 when information is written into the memory cell transistors MT or information written in the memory cell transistors MT is erased. As will be described later, when information written in the memory cell transistors MT is read, a power supply voltage $V_{CC}$ is constantly applied to the first word lines WL1. Accordingly, even with the relatively low operation speed of the high voltage circuit used in the first row decoder 14, there is no special problem.

A plurality of second word lines WL2 commonly connecting the select gates of the selecting transistors ST are connected to the second row decoder 16. The second row decoder 16 is for controlling the potential of the plural second word lines WL2 commonly connecting the select gates of the selecting transistors ST. The second row decoder 16 is formed of a low voltage circuit (low withstand voltage circuit). The second row decoder 16 is formed of a low voltage circuit in the present embodiment because it is not necessary to apply high voltage to the select gates of the selecting transistors ST, but it is preferably to operate the selecting transistors ST at high speed. In the present embodiment, because of the second row decoder 16 comprising a low voltage circuit, the selecting transistors ST can operate at relatively high speed, which resultantly permits the nonvolatile semiconductor memory device to have high read speed.

A plurality of source lines SL commonly connecting the memory cell transistors MT are connected to the third row decoder 18. The third row decoder 18 is for controlling the potential of the plural source lines SL commonly connecting the sources of the memory cell transistors MT. The third row decoder 18 is formed of a high voltage circuit (high withstand voltage circuit). The third row decoder 18 is formed of a high voltage circuit in the present embodiment because high voltage is applied to the source lines SL when information is written into the memory cell transistors MT. As will be described later, when information written in the memory cell transistors MT is read, the source lines SL are constantly grounded. Accordingly, the operation speed of the third row decoder 18 whose operation speed is relatively low makes no special problem.

Figure 2:
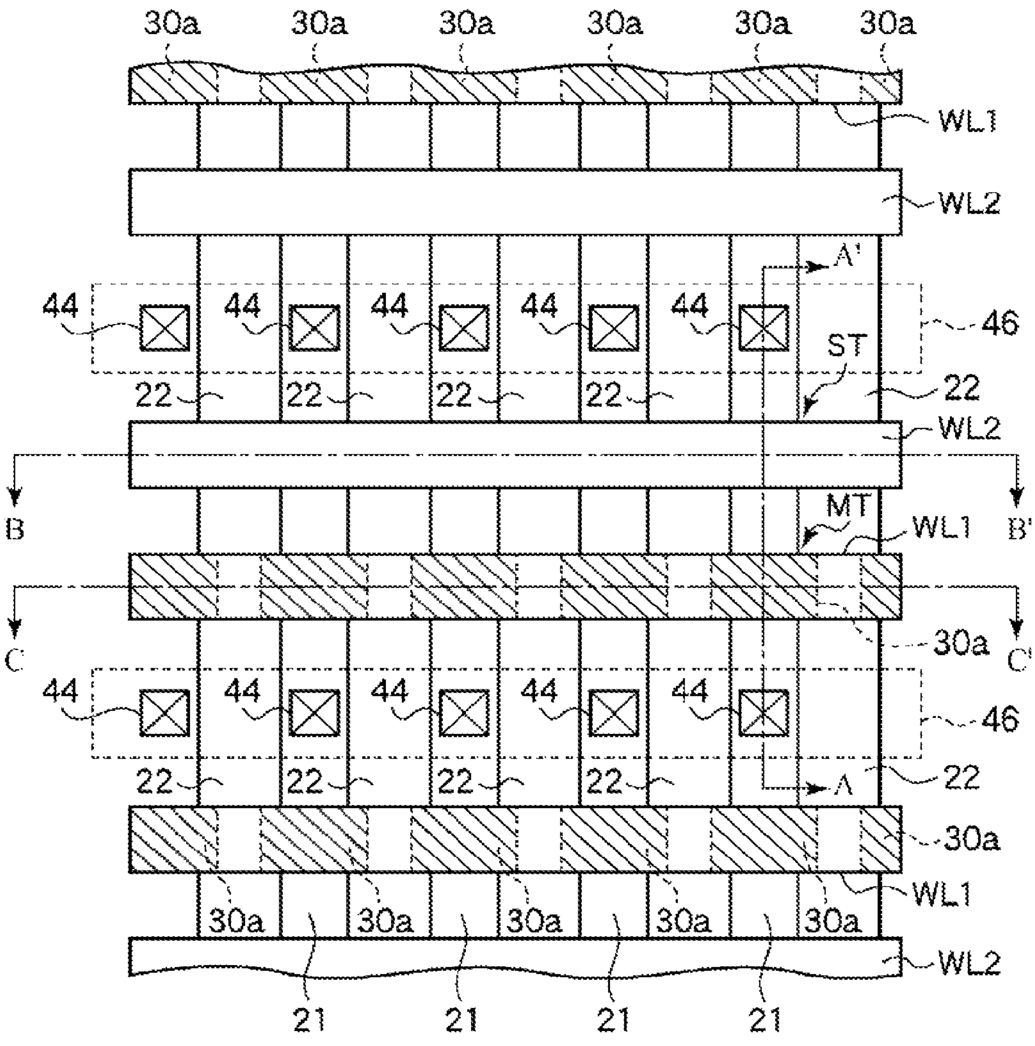
FIG. 2 is a plan view of the memory cell array of the nonvolatile semiconductor memory device according to the first embodiment.
Figure 3:
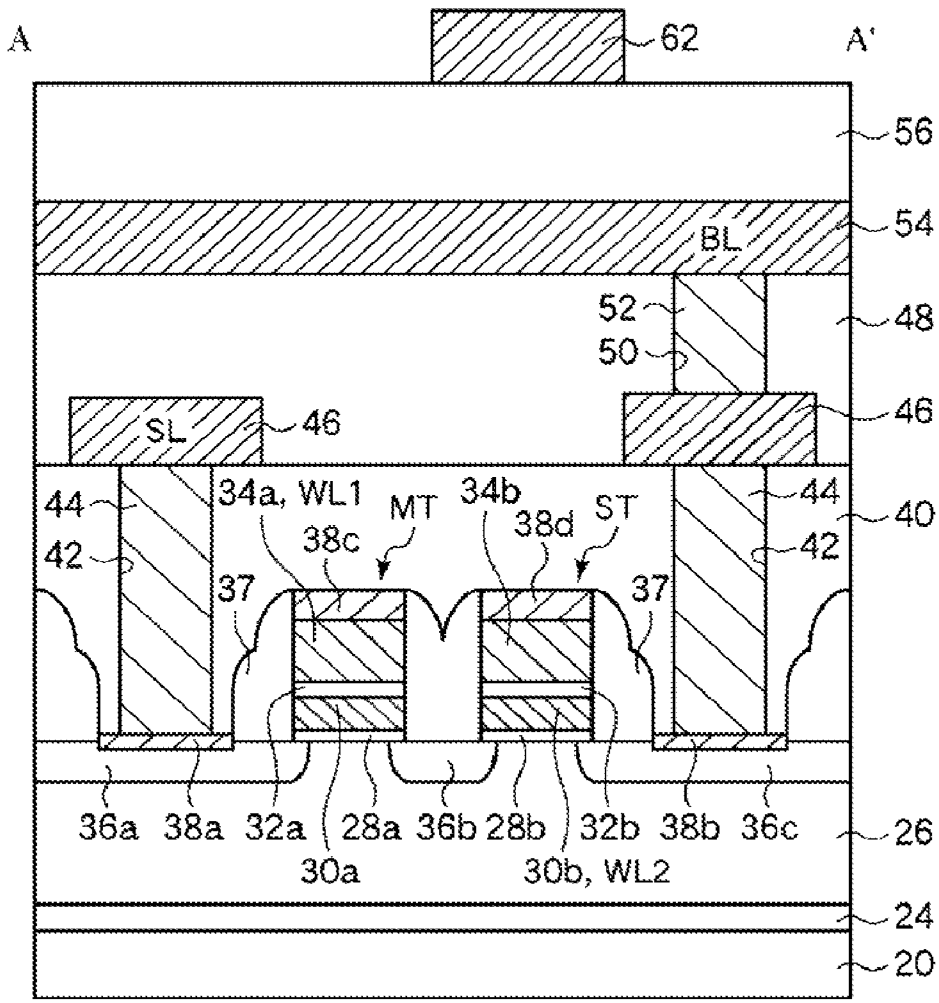
FIG. 3 is the sectional view along the A-A' line in FIG. 2.
Figure 4:
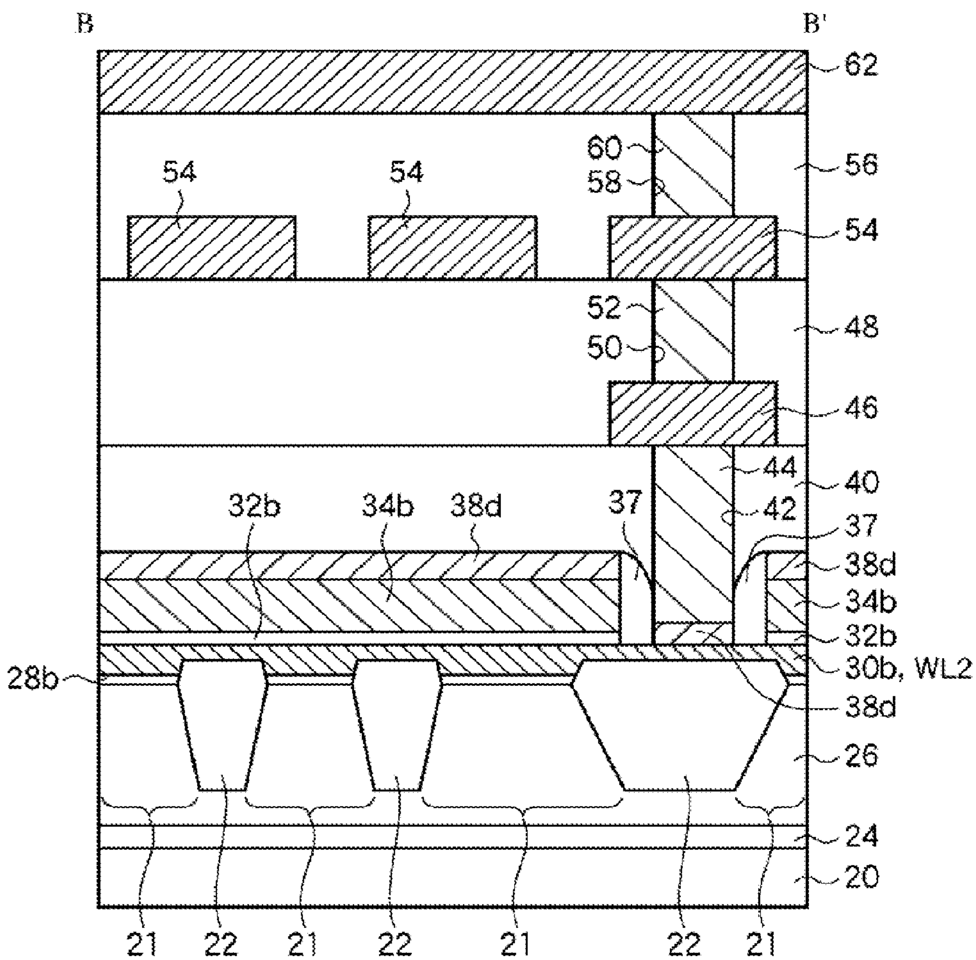
FIG. 4 is the sectional view along the B-B' line in FIG. 2.
Figure 5:
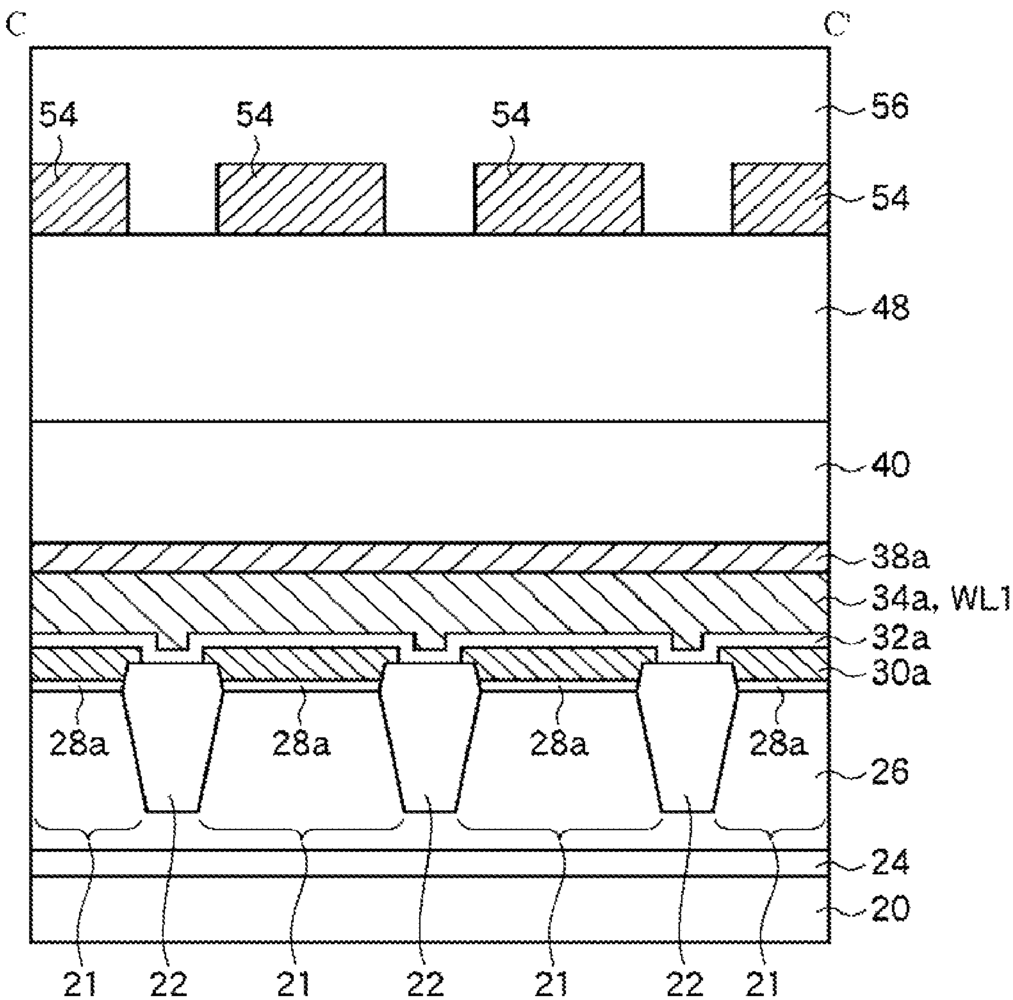
FIG. 5 is the sectional view along the C-C' line in FIG. 2.
Figure 7A:
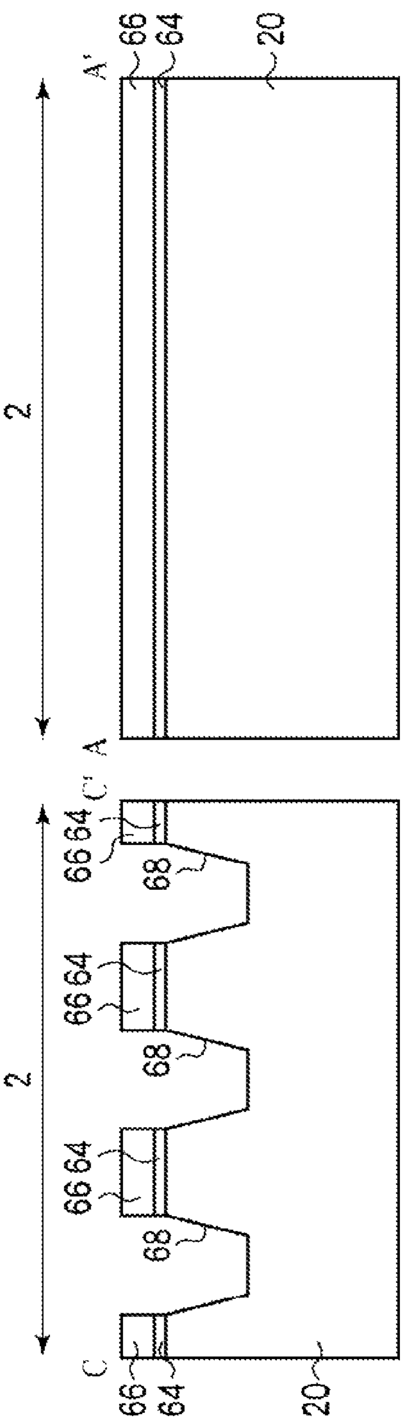
FIGS. 7A and 7B are sectional views (Part 1) of the nonvolatile semiconductor memory device according to the first embodiment in the steps of the method for manufacturing the nonvolatile semiconductor memory device, which illustrate the method.
Figure 7B:
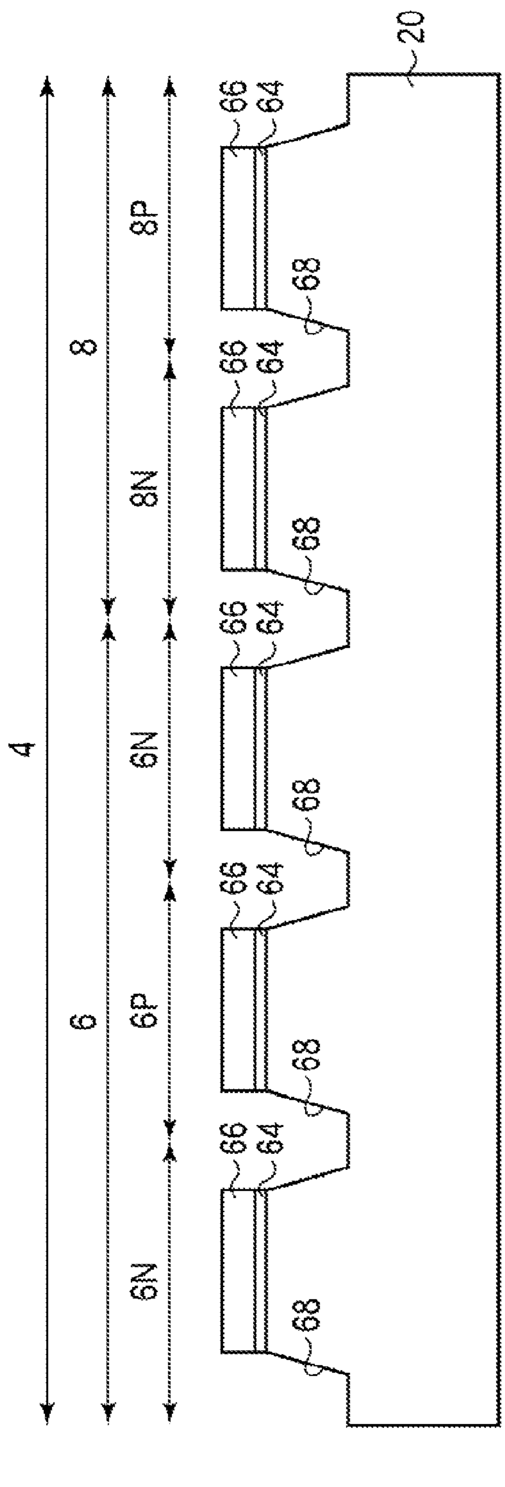

Then, the structure of the nonvolatile semiconductor memory device according to the present embodiment will be explained with reference to FIGS. 2 to 5. FIG. 2 is a plan view of the memory cell array of the nonvolatile semiconductor memory device according to the present embodiment. FIG. 3 is the sectional view along the A-A' line in FIG. 2. FIG. 4 is the sectional view along the B-B' line in FIG. 2. FIG. 5 is the sectional view along the C-C' line in FIG. 2.

In a semiconductor substrate 20, device isolation regions 22 for defining device regions 21 are formed. The semiconductor substrate 20 is, e.g., a P-type silicon substrate. The device regions 22 are formed by, e.g., STI (Shallow Trench Isolation).

In the semiconductor substrate 20 with the device isolation regions 22 formed in, an N-type buried diffused layer 24 is formed. The upper part of the N-type buried diffused layer 24 is a P-type well 26.

On the semiconductor substrate 20, floating gates 30*a* are formed with a tunnel insulation film 28*a* formed therebetween. The floating gates 30*a* in the respective device regions 21 are electrically isolated from each other.

On the floating gates 30*a*, control gates 34*a* are formed via an insulation film 32*a* formed therebetween. The control gates 34*a* of the memory cell transistors MT present in one and the same row are commonly connected. In other words, on the floating gates 30, the first word lines WL1 commonly connecting the control gates 34*a* are formed with the insulation film 32*a* formed therebetween.

On the semiconductor substrate 20, the select gates 30*b* of the selecting transistors ST are formed in parallel with the floating gates 30*a*. The select gates 30*b* of the selecting transistors ST present in one and the same row are commonly connected. In other words, on the semiconductor substrate 20, the second word lines WL2 commonly connecting the select gates 30*b* are formed with the gate insulation film 28*b* formed therebetween. The film thickness of the gate insulation film 28*b* of the selecting transistors ST is the same as the film thickness of the tunnel insulation film 28*a* of the memory cell transistors MT.

On the select gates 30*b*, a polycrystalline silicon layer 34*b* is formed with an insulation film 32*b* formed therebetween.

In the semiconductor substrate 20 on both sides of each floating gate 30*a* and in the semiconductor substrate 20 on both sides of each select gate 30*b*, an N-type impurity diffused layers 36*a*, 36*b*, 36*c* are formed.

The impurity diffused layer 36*b* forming the drain of the memory cell transistor MT, and the impurity diffused layer 36*b* forming the source of the selecting transistor ST are formed of one and the same impurity diffused layer 36*b*.

On the side wall of the layer structure of the floating gate 30*a* and the control gate 34*a*, a sidewall insulation film 37 is formed.

The sidewall insulation film 37 is formed also on the side wall of the layer structure of the select gate 30*b* and the polycrystalline silicon layer 34*b*.

On the source region 36*a* of the memory cell transistor MT, on the drain region of the selecting transistor ST, in the upper part of the control gate 34*a* and in the upper part of the polycrystalline silicon layer 34*b*, silicide layers 38*a*-38*d* of, e.g., cobalt silicide are respectively formed. The silicide layer 38a on the source electrode 36a functions as the source electrode. The silicide layer 38c on the drain electrode 36c functions as the drain electrode.

Thus, the memory cell transistors MT each comprising the floating gate 30a, the control gate 34a and the source/drain diffused layers 36a, 36b are formed.

The selecting transistors ST each comprising the select gate 30b and the source/drain diffused layers 36b, 36c are formed. The selecting transistors ST are NMOS transistors. In the present embodiments, NMOS transistors whose operation speed is higher than PMOS transistors are used as the selecting transistors ST, which can contribute to the operation speed increase.

On the semiconductor substrate 20 with the memory cell transistors MT and the selecting transistors ST formed on, an inter-layer insulation film 40 of a silicon nitride film (not illustrated) and a silicon oxide film (not illustrated) is formed.

In the inter-layer insulation film 40, contact holes 42 are formed respectively down to each source electrode 38a and the drain electrode 38b.

In the contact holes 42, conductor plugs 44 of, e.g., tungsten are buried.

On the inter-layer insulation film 40 with the conductor plugs 44 buried in, an interconnections (the first metal interconnection layers) 46 are formed.

On the inter-layer insulation film 40 with the interconnections 46 formed on, an inter-layer insulation film 48 is formed.

In the inter-layer insulation film 48, a contact hole 50 is formed down to the interconnection 46.

In the contact hole 50, a conductor plug 52 of, e.g., tungsten is buried.

On the inter-layer insulation film 48 with the conductor plug 52 buried in, interconnections (the second metal interconnection layers) 54 are formed.

On the inter-layer insulation film 48 with the interconnections 54 formed on, an inter-layer insulation film 56 is formed.

In the inter-layer insulation film 56, a contact hole 58 is formed down to the interconnection 54.

In the contact hole 58, a conductor plug 60 of, e.g., tungsten is buried.

On the inter-layer insulation film 56 with the conductor plug 60 buried in, an interconnection (the third metal interconnection layer) 62 is formed.

Thus, the memory cell array 10 (see FIG. 1) of the nonvolatile semiconductor memory device according to the present embodiment is constituted.

The explanation has been made here by means of the example as illustrated FIG. 1 that the memory cell transistors MT of each row are connected to the source line SL associated with said each row, but as will be detailed later with reference to FIG. 65, as in the nonvolatile semiconductor memory device according to an eleventh embodiment, the sources of the memory cell transistors MT present in rows adjacent to each other may be connected by a common source line SL. The plan view of FIG. 2 corresponds to the example that the sources of the memory cells MT present in rows adjacent to each other are connected by a common source line SL. The sources of the memory cell transistors MT present in rows adjacent to each other are connected by a common source line SL, whereby the area of the memory cell array region 2 can be small, and the nonvolatile semiconductor memory device can be downsized. The number of the source lines SL to be controlled by the third row decoder 18 can be made smaller, whereby the third row decoder 18 can be simplified.

(Operations of Nonvolatile Semiconductor Memory Device)

Next, the operation methods of the nonvolatile semiconductor memory device according to the present embodiment will be explained with reference to FIG. 6. FIG. 6 is a view illustrating the reading method, the writing method and the erasing method of the nonvolatile semiconductor memory device according to the present embodiment. In FIG. 6, the voltages in the parentheses are the potentials of the non-selected lines. In FIG. 6, F indicates floating.

(Reading Method)

First, the reading method of the nonvolatile semiconductor memory device according to the present embodiment will be explained with reference to FIG. 6.

When information written the memory cell transistors MT is read, the potentials of the respective parts are set as follows. That is, the bit line BL connected to a memory cell MC to be selected is $V_{CC}$. The potential of the bit lines other than the selected bit line is 0 V. The potential of all the source lines is 0 V. The potential of the first word lines WL1 is constantly $V_{CC}$ on standby for read. The potential of the second word line WL2 connected to the memory cell MC to be selected is $V_{CC}$. The potential of the second word lines WL2 other than the selected second word line WL2 is 0 V. The potential of all the wells 26 is 0 V. In the present embodiment, the potential of the source lines SL is set at 0 V on standby for read, and the potential of the first word lines WL1 is constantly set at $V_{CC}$ on standby for read, which allows information written in the memory cell transistors MT to be read by controlling only the potentials of the bit lines BL and the potential of the second word lines WL2. In the present embodiment, the column decoder 12 for controlling the potential of the bit lines BL is formed of a low voltage circuit as described above, whereby the bit lines BL are controlled at high speed. The second row decoder 16 for controlling the potential of the second word lines WL2 is formed of a low voltage circuit as described above, whereby the second word lines WL2 can be controlled at high speed. Thus, according to the present embodiment, information written in the memory cell transistors MT can be read at high speed.

When information is written into the memory cell transistor MT, i.e., the information in the memory cell transistor MT is "0", charges are stored in the floating gate 30a of the memory cell transistor MT. In this case, no current flows between the source diffused layer 36a of the memory cell transistor MT and the drain diffused layer 36c of the selecting transistor ST, and no current flows in one selected bit line BL. In this case, the information in the memory cell transistor MT is judged "0".

On the other hand, when information written in the memory cell transistor MT has been erased, i.e., the information in the memory cells MT is "1", no charges are stored in the floating gate 30a of the memory cell transistor MT. In this case, current flows between the source diffused layer 36a of the memory cell transistor MT and the drain diffused layer 36c of the selecting transistor ST, and current flows in one selected bit line BL. The current flowing in one selected bit line BL is detected by the sense amplifier 13. In this case, the information in the memory cell transistor MT is judged "1".

(Writing Method)

Then, the writing method of the nonvolatile semiconductor memory device according to the present embodiment will be explained with reference to FIG. 6.

When information is written into the memory cell transistor MT, the potentials of the respective parts are set as follows. That is, the potential of the bit line BL connected to a memory cell MC to be selected is 0 V. The potential of the bit lines BL other than the selected bit line BL is floating. The potential of the source line SL connected to the memory cell MC to be selected is set at, e.g., 5 V (the second potential). The potential of the source lines SL other than the selected source line SL is 0 V or floating. The potential of the first word line WL1 connected to the memory cell MC to be selected is, e.g., 9 V (the third potential). On the other hand, the potential of the first word lines WL1 other than the selected first word line WL1 is 0 V or floating. The potential of the second word line WL2 connected to the memory cell MC to be selected is $V_{CC}$ (the first potential). On the other hand, the potential of the second word lines WL2 other than the selected second word line WL2 is floating. The potential of all the wells is 0 V.

When the potentials of the respective parts are set as described above, electron flow between the source diffused layer 36*a* of the memory cell transistor MT and the drain diffused layer 36*c* of the selecting transistor ST, and the electrons are injected into the floating gate 30*a* of the memory cell transistor MT. Thus, charges are stored in the floating gate 30*a* of the memory cell transistor MT, and information is written into the memory cell transistor MT.

(Erasing Method)

Next, the erasing method of the nonvolatile semiconductor memory device according to the present embodiment will be explained with reference to FIG. 6.

When information written in the memory cell array 10 is erased, the potentials of the respective parts are set as follows. That is, the potential of the bit lines BL is floating. The potential of all the source lines SL is floating. The potential of all the first word lines WL1 is, e.g., −9 V. The potential of all the second word lines WL2 is floating. The potential of all the wells 26 is, e.g., +9 V.

When the potentials of the respective parts are set as described above, the charge is drawn out of the floating gate 30*a* of the memory cell transistor MT. Thus, no charge is stored in the floating gate 30*a* of the memory cell transistor MT, and the information in the memory cell transistor MT is erased.

As described above, according to the present embodiment, the column decoder 12 for controlling the potential of the bit lines BL commonly connecting the drain diffused layers 36*c* of the selecting transistors ST is formed of a low voltage circuit, which is operative at high speed, the second row decoder for controlling the potential of the second word lines WL2 commonly connecting the select gate 30*b* of the selecting transistor ST is formed of a low voltage circuit, which is operative at high speed, and the potentials of only the bit lines BL and the second word lines WL2 are controlled, whereby information written the memory cell transistors MT can be read. According to the present embodiment, the nonvolatile semiconductor memory device can read information written in the memory cell transistors MT at high speed.

In the present embodiment, the selecting transistors ST is formed of NMOS transistors, and can contribute more to increasing the operation speed than the selecting transistors being formed of PMOS transistors.

(Method for Manufacturing Nonvolatile Semiconductor Memory Device)

Then, the method for manufacturing the nonvolatile semiconductor memory device according to the present embodiment will be explained with reference to FIGS. 7A to 22. FIGS. 7A to 22 are sectional views of the nonvolatile semiconductor memory device according to the present embodiment in the steps of the method for manufacturing the nonvolatile semiconductor memory device, which illustrate the method. FIG. 7A, FIG. 8A, FIG. 9A, FIG. 10A, FIG. 11A, FIG. 12A, FIG. 13A, FIG. 14A, FIG. 15A, FIG. 16A, FIG. 17, FIG. 19 and FIG. 21 illustrate the memory cell array region (core region) 2. The views of FIG. 7A, FIG. 8A, FIG. 9A, FIG. 10A, FIG. 11A, FIG. 12A, FIG. 13A, FIG. 14A, FIG. 15A, FIG. 16A, FIG. 17, FIG. 19 and FIG. 21 on the left sides correspond to the C-C' section in FIG. 2. The views of FIG. 7A, FIG. 8A, FIG. 9A, FIG. 10A, FIG. 11A, FIG. 12A, FIG. 13A, FIG. 14A, FIG. 15A, FIG. 16A, FIG. 17, FIG. 19 and FIG. 21 on the right sides correspond to the A-A' section in FIG. 2. FIG. 7B, FIG. 8B, FIG. 9B, FIG. 10B, FIG. 11B, FIG. 12B, FIG. 13B, FIG. 14B, FIG. 15B, FIG. 16B, FIG. 18, FIG. 20 and FIG. 22 illustrate the peripheral circuit region 4. The views of FIG. 7B, FIG. 8B, FIG. 9B, FIG. 10B, FIG. 11B, FIG. 12B, FIG. 13B, FIG. 14B, FIG. 15B, FIG. 16B, FIG. 18, FIG. 20 and FIG. 22 on the left sides illustrate the region 6 where high withstand voltage transistors are to be formed. The left side views of the region 6 where the high withstand voltage transistors are to be formed illustrate the region 6N where the high withstand voltage N-channel transistors are to be formed. The right side views of the region 6N where the high withstand voltage N-channel transistors are to be formed illustrate the region 6P where the high withstand voltage P-channel transistor is to be formed. The right side of the region 6P where the high withstand voltage P-channel transistors are to be formed illustrate the region 6N where the high withstand voltage N-channel transistor is to be formed. The views of FIG. 7B, FIG. 8B, FIG. 9B, FIG. 10B, FIG. 11B, FIG. 12B, FIG. 13B, FIG. 14B, FIG. 15B, FIG. 16B, FIG. 18, FIG. 20 and FIG. 22 on the right sides illustrate the region 8 where low voltage transistors are to be formed. The left side views of the region 8 where the low voltage transistors are to be formed illustrate the region 8N where the low voltage N-channel transistor is to be formed, and the right side views of the regions 8 where the low voltage transistors are to be formed illustrate the region 8P where the low voltage P-channel transistor is to be formed.

First, a semiconductor substrate 20 is prepared. The semiconductor substrate 20 is, e.g., a P-type silicon substrate.

Next, on the entire surface, a 15 nm-thickness thermal oxide film 64 is formed by, e.g., thermal oxidation.

Next, on the entire surface, a 150 nm-thickness silicon nitride film 66 is formed by, e.g., CVD (Chemical Vapor Deposition).

Next, on the entire surface, a photoresist film (not illustrated) is formed by, e.g., spin coating.

Next, by photolithography, openings (not illustrated) are formed in the photoresist film. These openings are for patterning the silicon nitride film 66.

Next, with the photoresist film as the mask, the silicon nitride film 66 is patterned. Thus, a hard mask 66 of silicon nitride film is formed.

Next, with the hard mask 66 as the mask, the semiconductor substrate 20 is etched by dry etching. Thus, trenches 68 are formed in the semiconductor substrate 20 (see FIGS. 7A and 7B). The depth of the trenches 68 formed in the semiconductor substrate 20 is, e.g., 400 nm from the surface of the semiconductor substrate 20.

Next, the exposed parts of the semiconductor substrate 20 are oxidized by thermal oxidation. Thus, a silicon oxide film (not illustrated) is formed on the exposed parts of the semiconductor substrate 20.

Figure 8A:
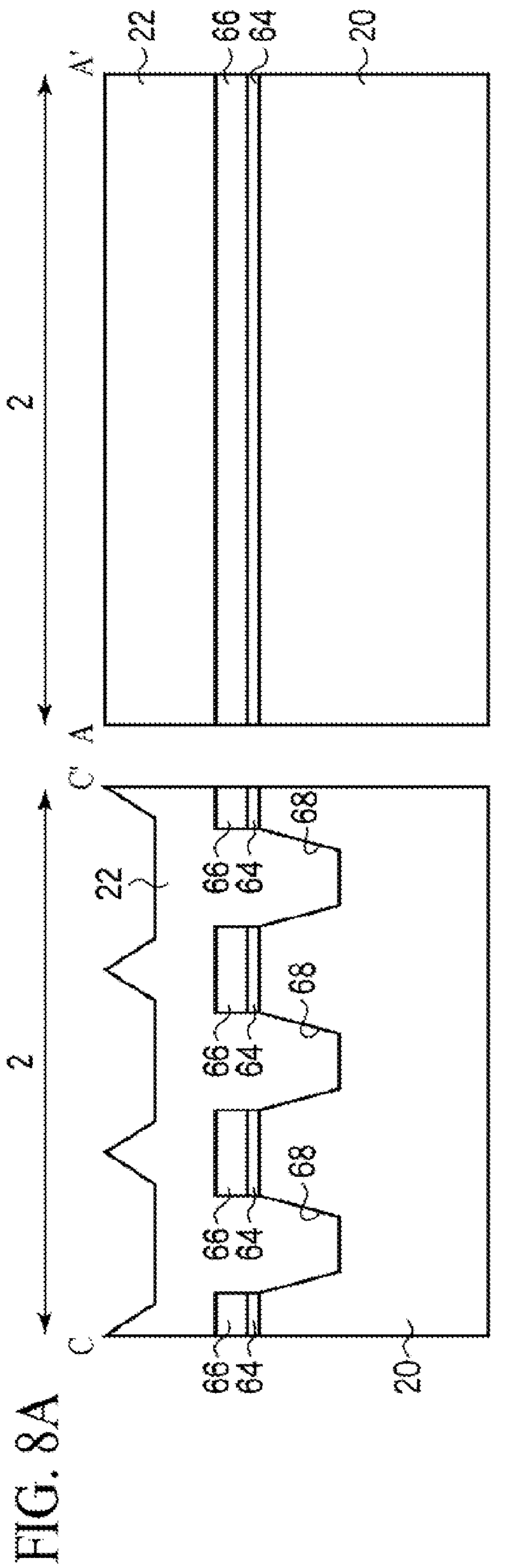
FIGS. 8A and 8B are sectional views (Part 2) of the nonvolatile semiconductor memory device according to the first embodiment in the steps of the method for manufacturing the nonvolatile semiconductor memory device, which illustrate the method.
Figure 8B:
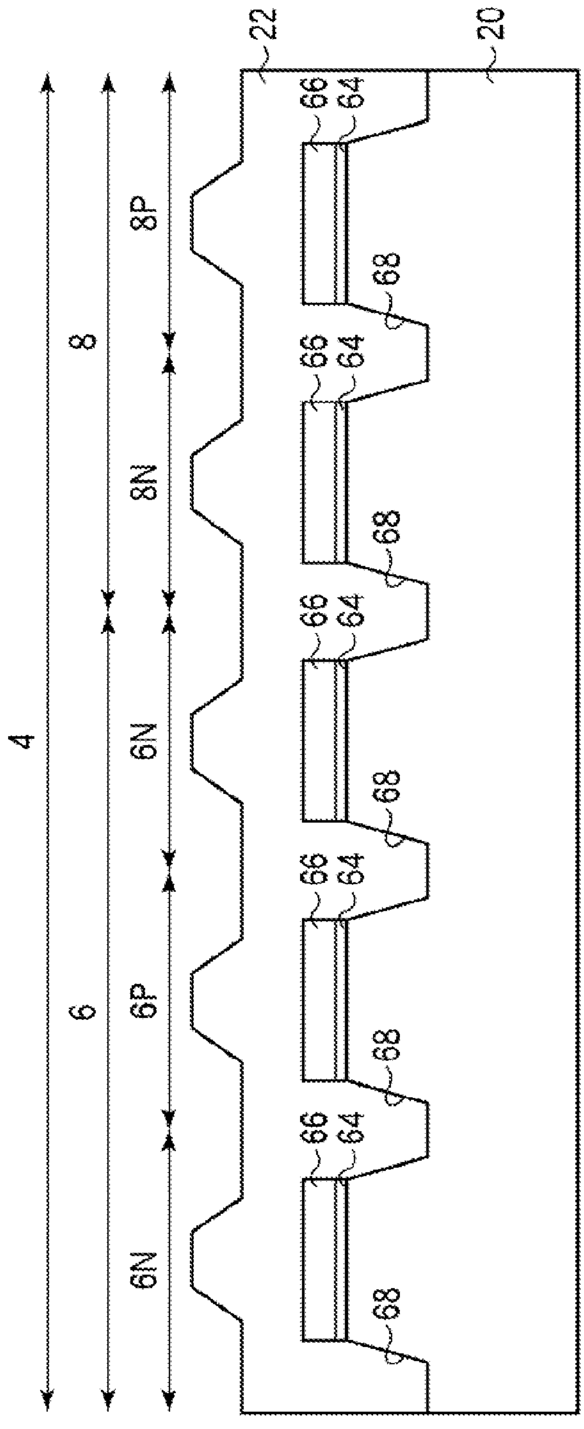

Next, as illustrated in FIGS. 8A and 8B, a 700 nm-thickness silicon oxide film 22 is formed on the entire surface by high density plasma-enhanced CVD.

Figure 9A:
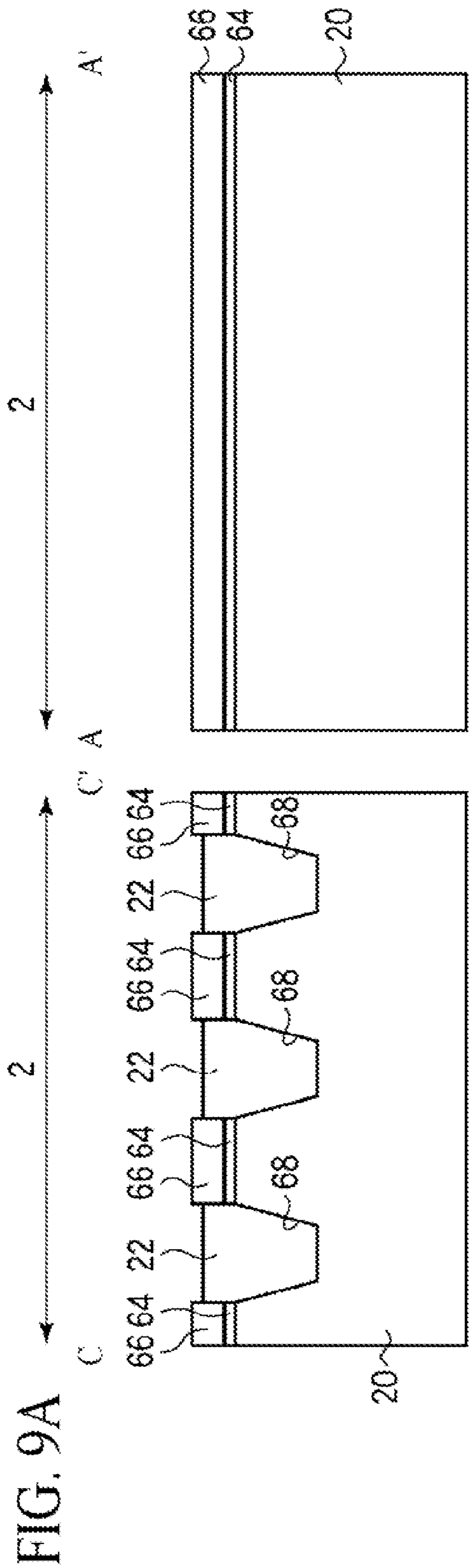
FIGS. 9A and 9B are sectional views (Part 3) of the nonvolatile semiconductor memory device according to the first embodiment in the steps of the method for manufacturing the nonvolatile semiconductor memory device, which illustrate the method.
Figure 9B:
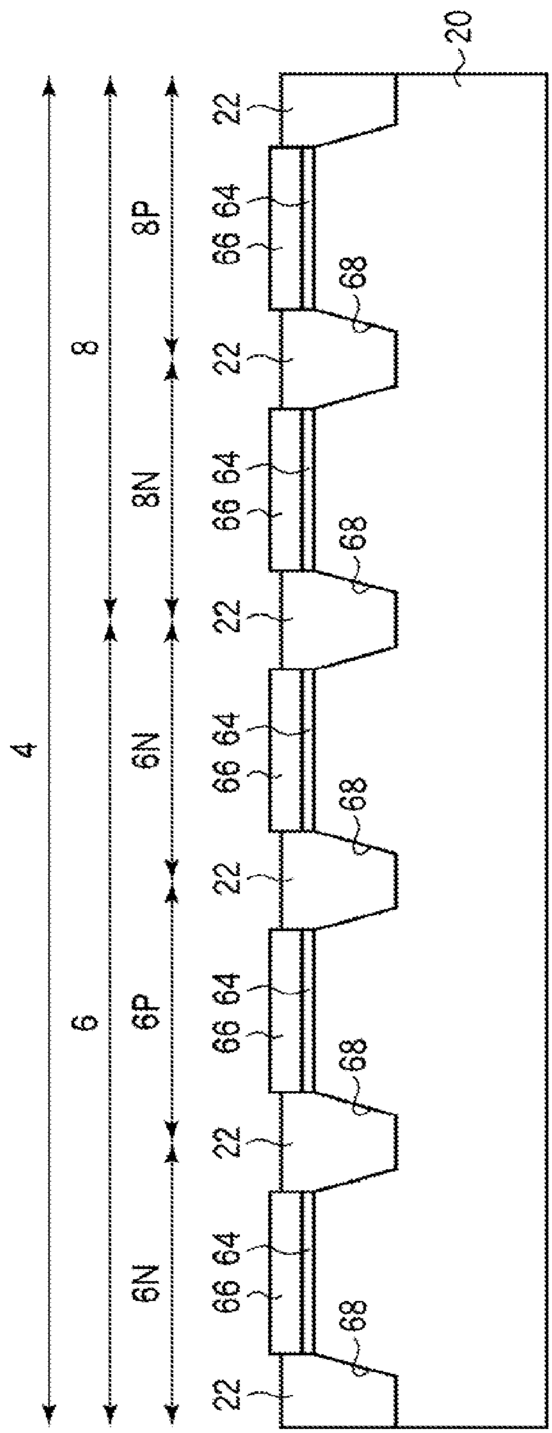

Next, as illustrated in FIGS. 9A and 9B, the silicon oxide film 22 is polished by CMP (Chemical Mechanical Polishing)

until the surface of the silicon nitride film 66 is exposed. Thus, the device isolation regions 22 of silicon oxide film are formed.

Next, thermal processing for curing the device isolation regions 22 is made. The thermal processing conditions are, e.g., 900° C. in a nitrogen atmosphere and 30 minutes.

Next, the silicon nitride film 66 is removed by wet etching.

Figure 10A:
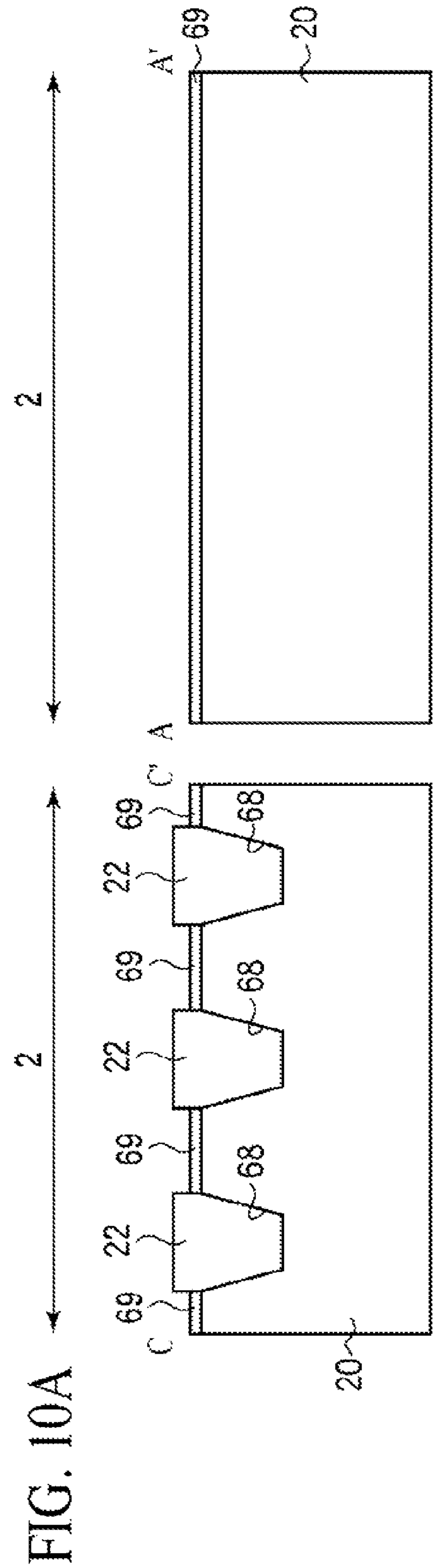
FIGS. 10A and 10B are sectional views (Part 4) of the nonvolatile semiconductor memory device according to the first embodiment in the steps of the method for manufacturing the nonvolatile semiconductor memory device, which illustrate the method.
Figure 10B:
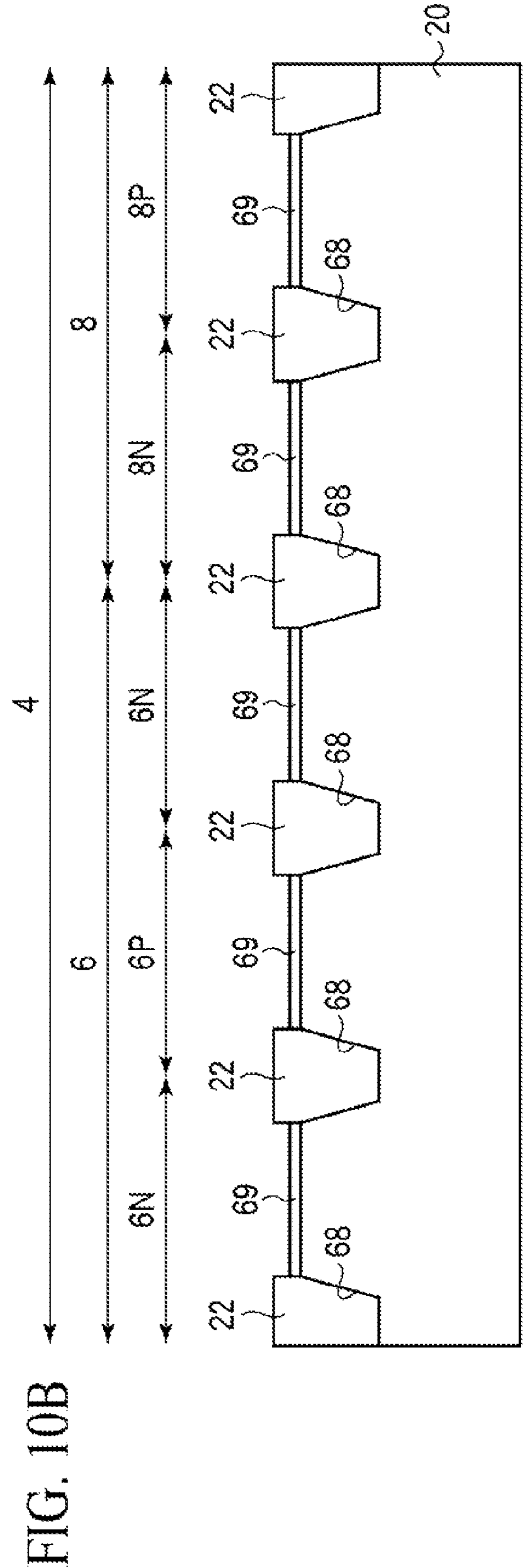

Next, as illustrated in FIGS. 10A and 10B, a sacrifice oxide film 69 is grown on the surface of the semiconductor substrate 20 by thermal oxidation.

Figure 11A:
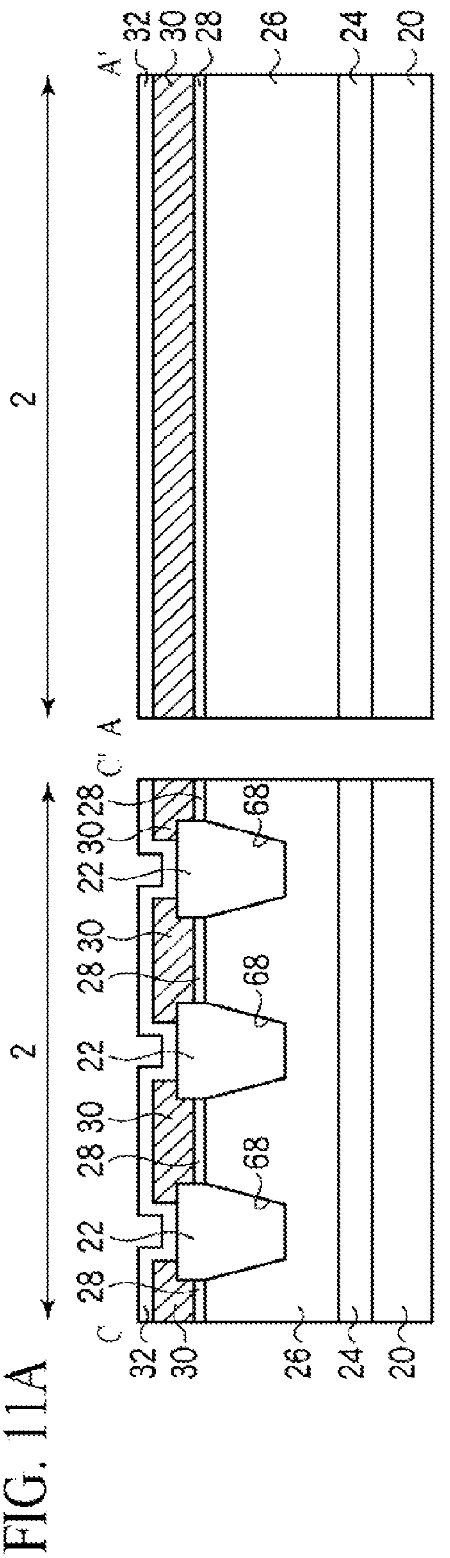
FIGS. 11A and 11B are sectional views (Part 5) of the nonvolatile semiconductor memory device according to the first embodiment in the steps of the method for manufacturing the nonvolatile semiconductor memory device, which illustrate the method.
Figure 11B:
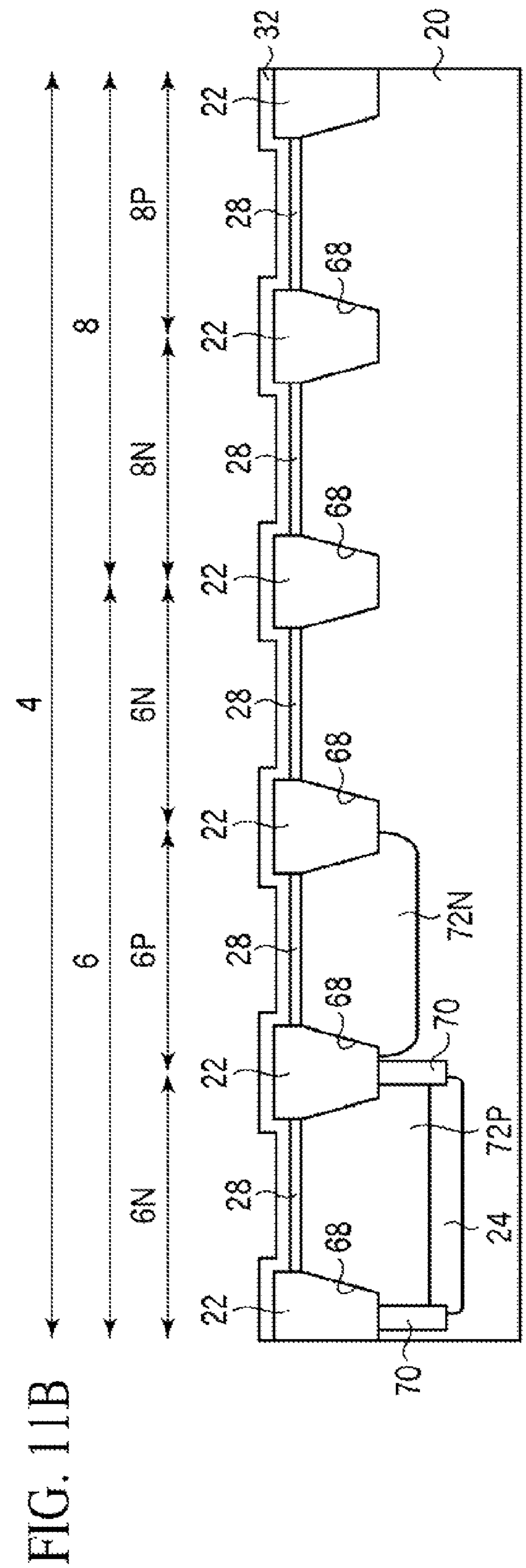

Next, as illustrated in FIGS. 11A and 11B, an N-type dopant impurity is implanted deep in the memory cell array region 2 to thereby form an N-type buried diffused layer 24. At this time, also in the region 6N where the high withstand voltage N-channel transistors are to be formed, the N-type dopant impurity is implanted deep to thereby form the N-type buried diffused layer 24. In the memory cell array region 2, a P-type dopant impurity is implanted shallower than the buried diffused layer 24 to thereby form a P-type well 26. In the region 6N where the high withstand voltage N-channel transistor are to be formed, a P-type dopant impurity is implanted shallower than the buried diffused layer 24 to thereby form a P-type well 72P.

Then, in the region 6N where the high withstand voltage N-channel transistors are to be formed, an N-type diffused layer 70 is formed in a frame-shape. The frame-shaped diffused layer 70 is formed from the surface of the semiconductor substrate 20 to the peripheral edge of the buried diffused layer 24. The P-type well 72P is surrounded by the buried diffused layer 24 and the diffused layer 70. Although not illustrated, the P-type well 26 of the memory cell array region 2 is also surrounded by the buried diffused layer 24 and the frame-shaped diffused layer 70.

Then, in the region 6P where the high withstand voltage channel transistor is to be formed, an N-type dopant impurity is implanted to thereby form an N-type well 72N.

Next, in the memory cell array region 2, channel doping is made (not illustrated).

Then, channel doping is made in the region 6N where the high voltage N-channel transistors are to be formed and in the region 6P where the high withstand voltage P-channel transistor is to be formed (not illustrated).

Next, the sacrifice oxide film 69 present on the surface of the semiconductor substrate 20 is etched off.

Next, a 10 nm-thickness tunnel insulation film 28 is formed on the entire surface by thermal oxidation.

Next, a 90 nm-thickness polycrystalline silicon film 30 is formed on the entire surface by, e.g., CVD. As the polycrystalline silicon film 30, an impurity-doped polycrystalline silicon film is formed.

Then, the polycrystalline silicon film 30 present in the peripheral circuit region 4 is etched off.

Then, on the entire surface, an insulation film (ONO film) 32 of a silicon oxide film, a silicon nitride film and a silicon oxide film sequentially laid is formed. The insulation film 32 is for insulating the floating gate 30*a* and the control gate 34*a* from each other.

Figure 12A:
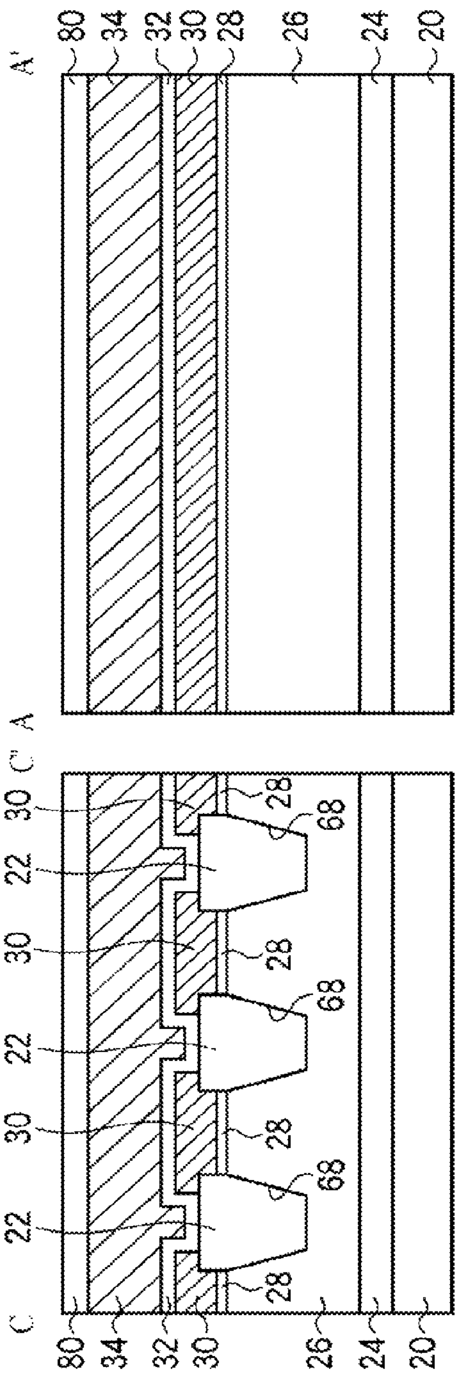
FIGS. 12A and 12B are sectional views (Part 6) of the nonvolatile semiconductor memory device according to the first embodiment in the steps of the method for manufacturing the nonvolatile semiconductor memory device, which illustrate the method.
Figure 12B:
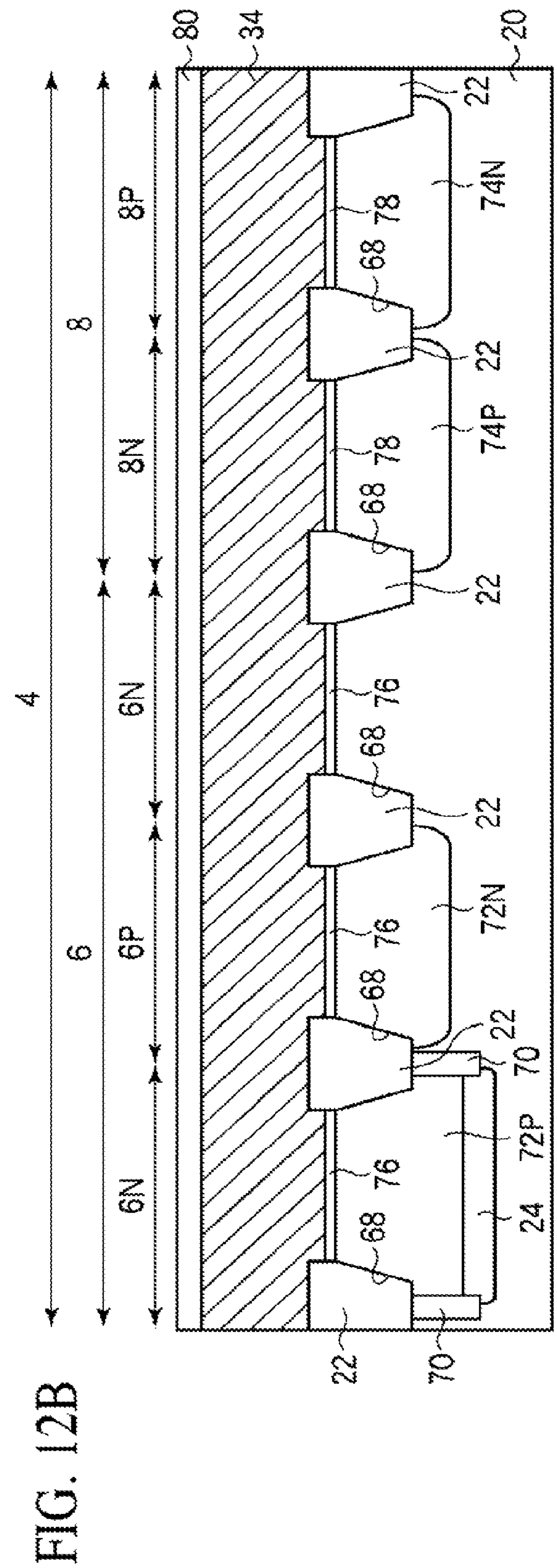

Then, as illustrated in FIGS. 12A and 12B, in the region 8N where the low voltage N-channel transistor is to be formed, an P-type dopant impurity is implanted to thereby form an P-type well 74P.

Next, in the region 8P where the low voltage P-channel transistor is to be formed, an N-type dopant impurity is implanted to thereby form an N-type well 74N.

Next, in the region 8N where the low voltage N-channel transistor is to be formed and in the region 8P where the low voltage P-channel transistor is to be formed, channel doping is made (not illustrated).

Next, the insulation film (ONO film) 32 present in the peripheral circuit region 4 is etched off.

Then, the gate insulation film 76 of, e.g., a 15 nm-thickness is formed on the entire surface by thermal oxidation.

Next, the gate insulation film 76 present in the region 8 where the low voltage transistors are to be formed is removed by wet etching.

Next, the gate insulation film 78 of, e.g., a 3 nm-thickness is formed on the entire surface by thermal oxidation. Thus, the gate insulation film of, e.g., a 3 nm-thickness is formed in the region 8 where the low voltage transistors are to be formed. On the other hand, in the region 6 where the high withstand voltage transistors are to be formed, the film thickness of the gate insulation film 76 is, e.g., about 16 nm.

Next, a polycrystalline silicon film 34 of, e.g., a 180 nm-thickness is formed on the entire surface by, e.g., CVD.

Then, an anti-reflection film 80 is formed on the entire surface.

Figure 13A:
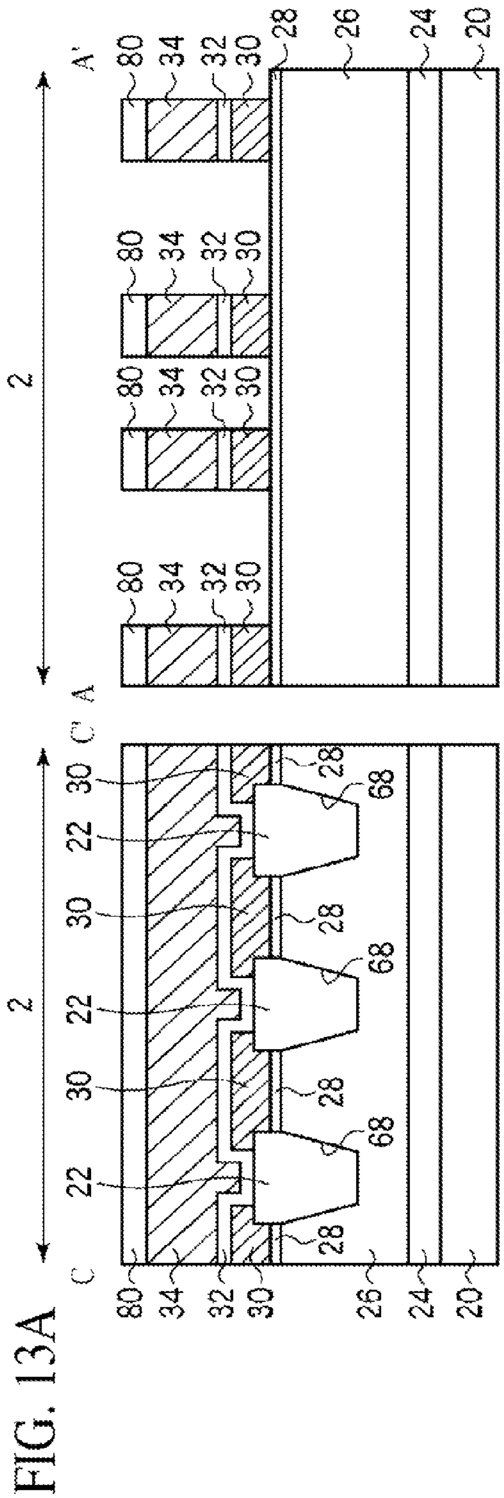
FIGS. 13A and 13B are sectional views (Part 7) of the nonvolatile semiconductor memory device according to the first embodiment in the steps of the method for manufacturing the nonvolatile semiconductor memory device, which illustrate the method.
Figure 13B:
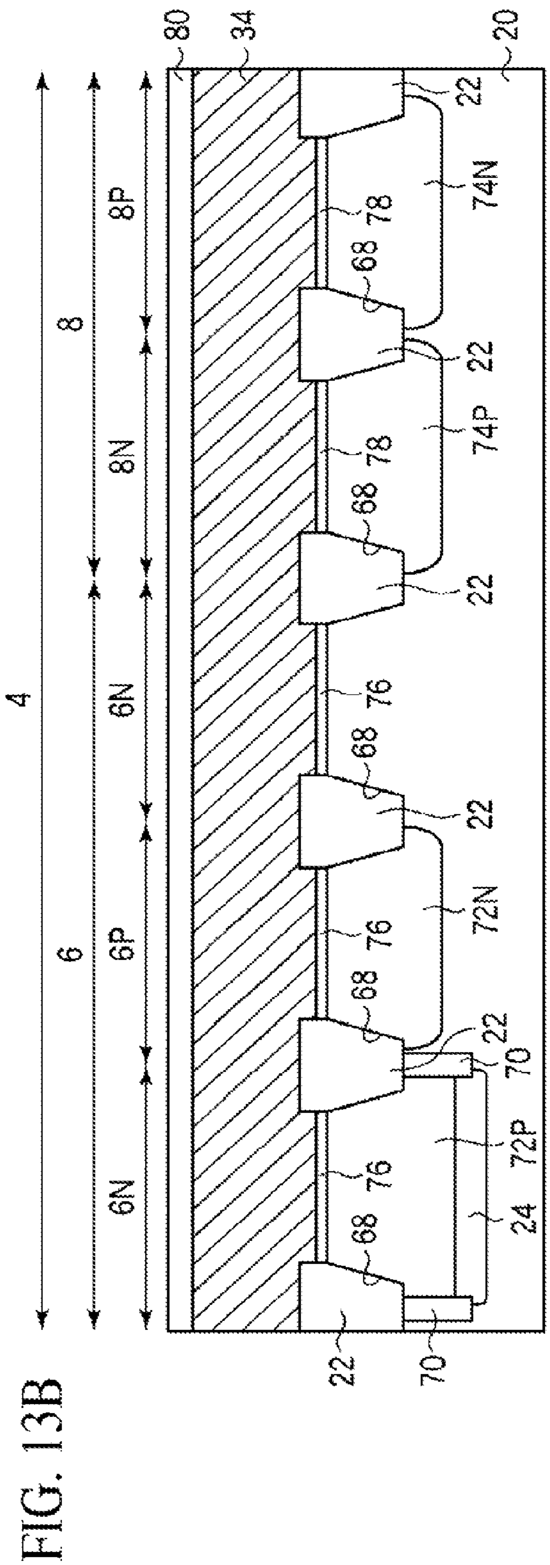

Next, as illustrated in FIGS. 13A and 13B, the anti-reflection film 80, the polycrystalline silicon film 34, the insulation film 32 and the polycrystalline silicon film 30 are dry etched by photolithography. Thus, the layer structure including the floating gate 30*a* of polycrystalline silicon and the control gate 34*a* of polycrystalline silicon is formed in the memory cell array region 2. The layer structure of the select gate 30*b* of polycrystalline silicon and the polycrystalline silicon film 34*b* is formed in the memory cell array region 2.

Then, in the region where an interconnection (the first metal interconnection) 46 and the select gate 30*b* are to be connected to each other, the polycrystalline silicon film 34*b* is etched off (not illustrated).

Figure 14A:
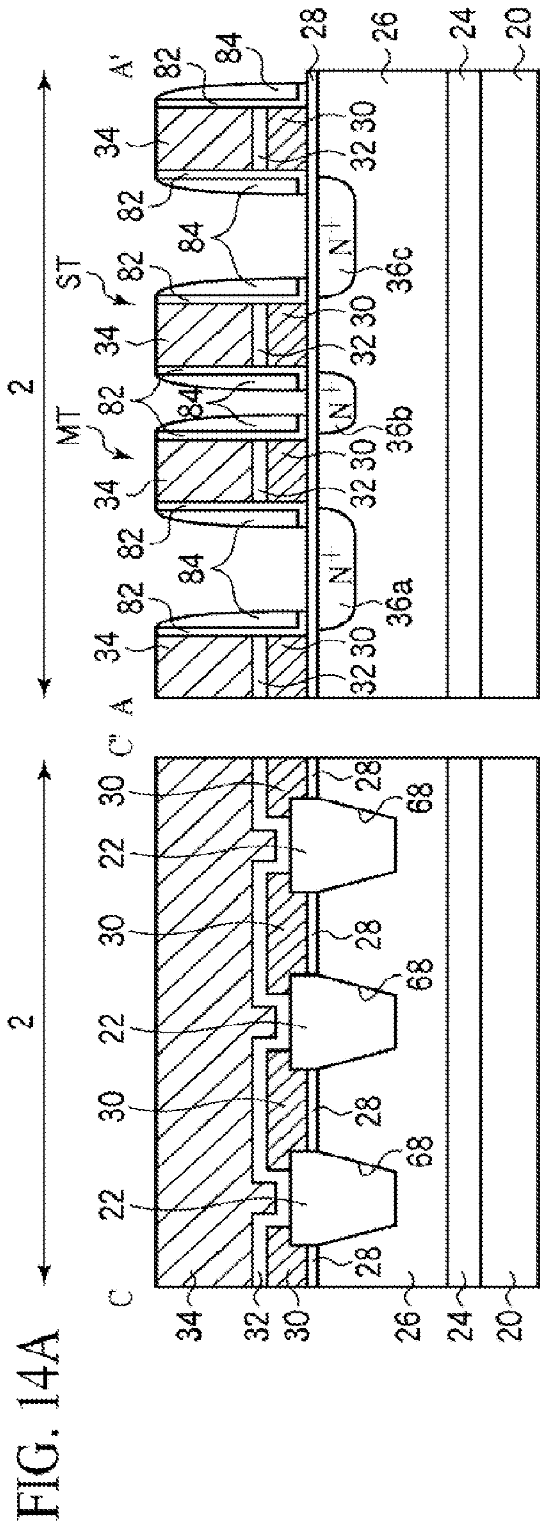
FIGS. 14A and 14B are sectional views (Part 8) of the nonvolatile semiconductor memory device according to the first embodiment in the steps of the method for manufacturing the nonvolatile semiconductor memory device, which illustrate the method.
Figure 14B:
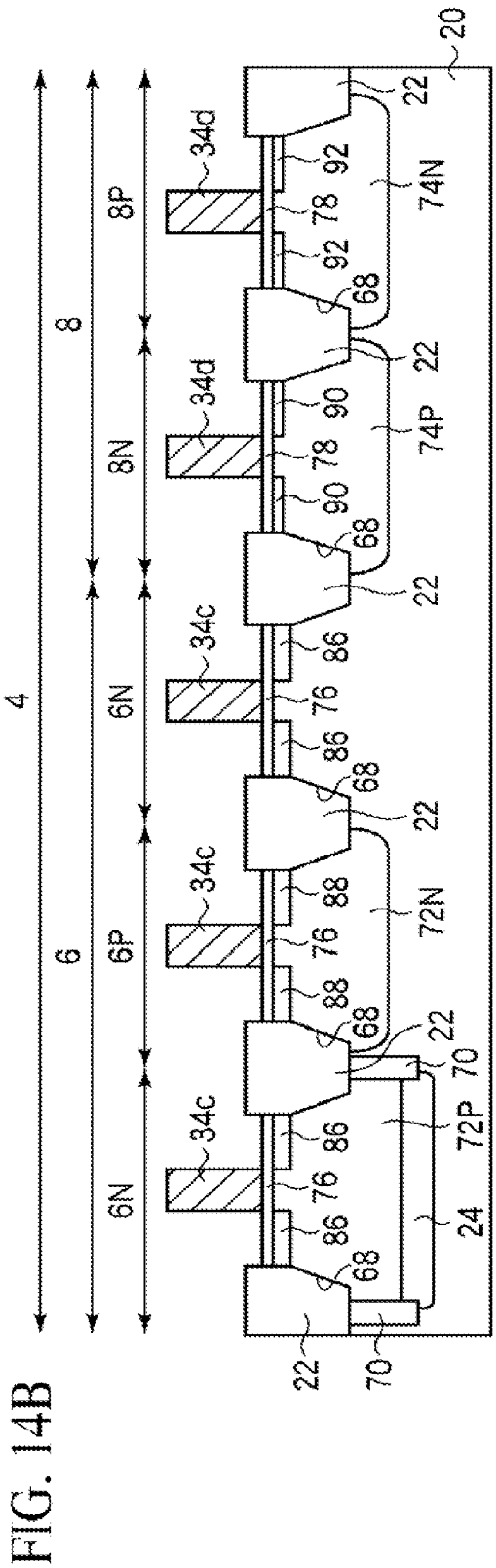
Figure 15A:
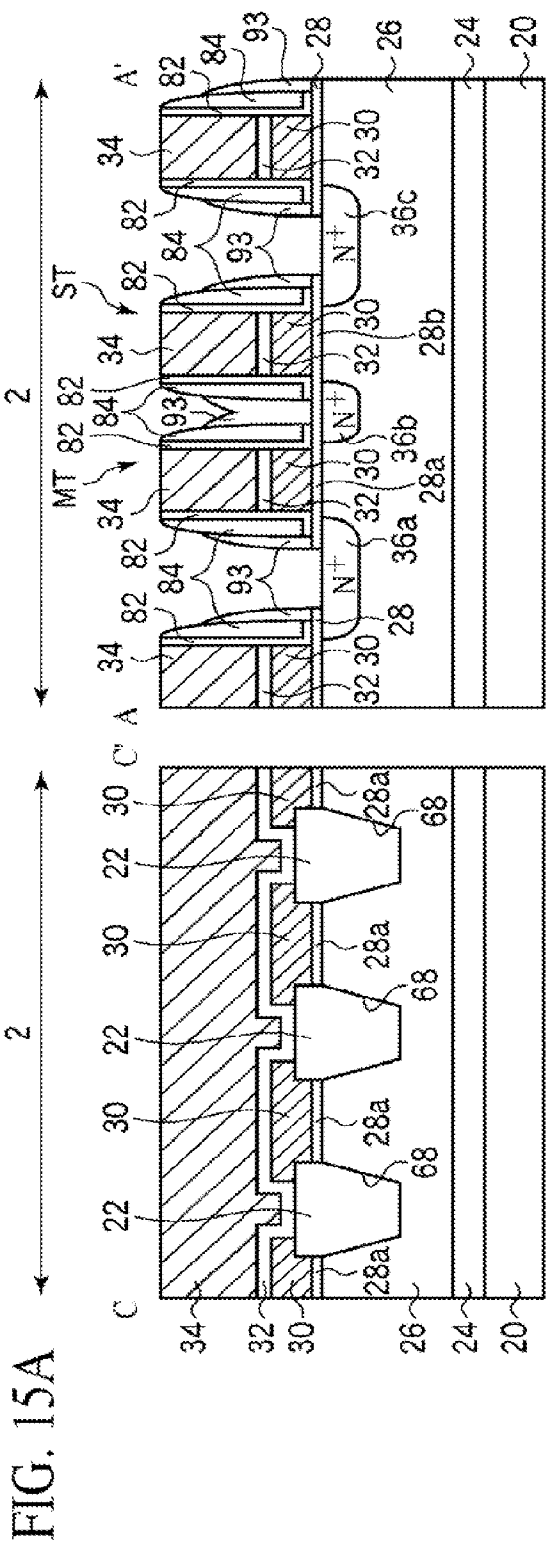
FIGS. 15A and 15B are sectional views (Part 9) of the nonvolatile semiconductor memory device according to the first embodiment in the steps of the method for manufacturing the nonvolatile semiconductor memory device, which illustrate the method.
Figure 15B:
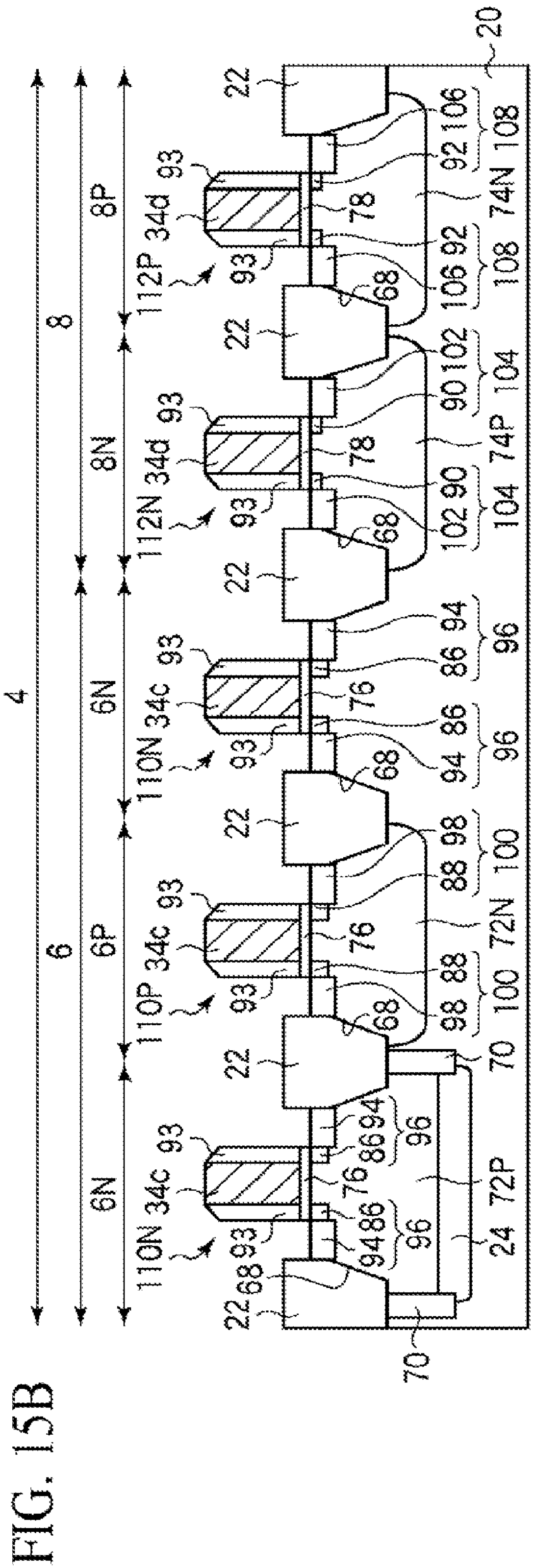
Figures 16A, 16B:
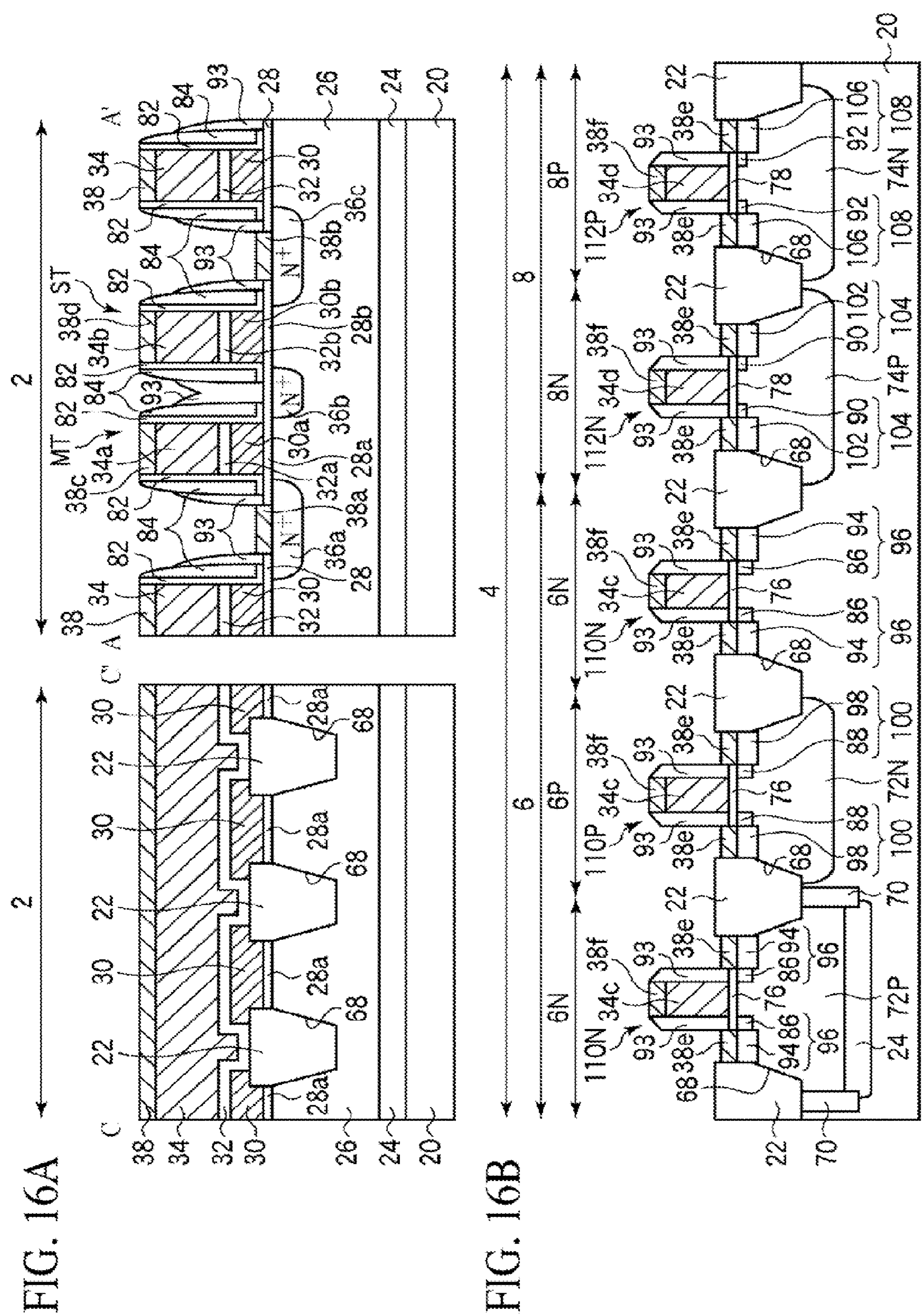
FIGS. 16A and 16B are sectional views (Part 10) of the nonvolatile semiconductor memory device according to the first embodiment in the steps of the method for manufacturing the nonvolatile semiconductor memory device, which illustrate the method.

Next, as illustrated in FIGS. 14A and 14B, a silicon oxide film (not illustrated) is formed by thermal oxidation on the side wall of the floating gate 30*a*, the side wall of the control gate 34*a*, the side wall of the select gate 30*b* and the side wall of the polycrystalline silicon film 34*b*.

Next, a photoresist film (not illustrated) is formed on the entire surface by spin coating.

Then, a photoresist film having an opening (not illustrated) for exposing the memory cell array region 2 is formed by photolithography.

Then, with the photoresist film as the mask, an N-type dopant impurity is implanted into the semiconductor substrate 20. Thus, impurity diffused layers 36*a*-36*c* are formed in the semiconductor substrate 20 on both sides of the floating gate 30*a* and in the semiconductor substrate 20 on both sides of the select gate 30*b*. Then, the photoresist film is released.

Thus, the memory cell transistor MT including the floating gate 30*a*, the control gate 34*a* and the source/drain diffused layers 36*a*, 36*b* is formed. The selecting transistor ST including the control gate 30*b* and the source/drain diffused layers 36*b*, 36*c* is formed.

Then, a silicon oxide film 82 is formed by thermal oxidation on the side wall of the floating gate 30*a*, the side wall of the control gate 34*b*, the side wall of the select gate 30*b* and the side wall of the polycrystalline silicon film 34*b*.

Next, a 50 nm-thickness silicon nitride film 84 is formed by, e.g., CVD.

Then, the silicon nitride film 84 is anisotropically etched by dry etching to thereby form the sidewall insulation film 84 of silicon nitride film. At this time, the anti-reflection film 80 is etched off.

Then, by photolithography, the polycrystalline silicon film 34 in the region 6 where the high withstand voltage transistors are to be formed and in the region 8 where the withstand voltage transistors are to be formed is patterned. Thus, the gate electrodes 34$c$ of the high withstand voltage transistors, which are formed of polycrystalline silicon film 34 are formed. The gate electrodes 34$d$ of the low voltage transistors, which is formed of the polycrystalline silicon film 34 are formed.

Next, a photoresist film (not illustrated) is formed on the entire surface by spin coating.

Then, openings (not illustrated) for exposing the region 6N where the high withstand voltage N-channel transistors are to be formed are formed in the photoresist film by photolithography.

Then, with the photoresist film as the mask, an N-type dopant impurity is implanted into the semiconductor substrate 20. Thus, N-type lightly doped diffused layers 86 are formed in the semiconductor substrate 20 on both sides of the gate electrodes 34$c$ of the high withstand voltage N-channel transistors. Then, the photoresist film is released.

Next, a photoresist film (not illustrated) is formed on the entire surface by spin coating.

Then, an opening (not illustrated) for exposing the region 6P where the high withstand voltage P-channel transistors are to be formed is formed in the photoresist film by photolithography.

Then, with the photoresist film as the mask, a P-type dopant impurity is implanted into the semiconductor substrate 20. Thus, P-type lightly doped diffused layers 88 are formed in the semiconductor substrate 20 on both sides of the gate electrodes 34$c$ of the high withstand voltage P-channel transistors. Then, the photoresist film is released.

Next, a photoresist film (not illustrated) is formed on the entire surface by spin coating.

Next, an opening (not illustrated) for exposing the region 8N where the low voltage N-channel transistor is to be formed is formed in the photoresist film by photolithography.

Then, with the photoresist film as the mask, an N-type dopant impurity is implanted into the semiconductor substrate 20. Thus, N-type lightly doped diffused layers 90 are formed in the semiconductor substrate 20 on both sides of the gate electrode 34$d$ of the low voltage N-channel transistor. Then, the photoresist film is released.

Next, a photoresist film (not illustrated) is formed on the entire surface by spin coating.

Then, an opening (not illustrated) for exposing the region 8P where the low voltage P-channel transistor is to be formed is formed in the photoresist film by photolithography.

Then, with the photoresist film as the mask, a P-type dopant impurity is implanted into the semiconductor substrate 20. Thus, a P-type lightly doped diffused layers 92 are formed in the semiconductor substrate 20 on both sides of the gate electrode 34$d$ of the low voltage P-channel transistor. Then, the photoresist film is released.

Then, a 100 nm-thickness silicon oxide film 93 is formed by, e.g., CVD.

Then, the silicon oxide film 93 is anisotropically etched by dry etching. Thus, the sidewall insulation film 93 of silicon oxide film is formed on the side wall of the layer structure of the floating gate 30$a$ and the control gate 34$a$ (see FIGS. 15A and 15B). Also on the side wall of the layer structure of the select gate 30$b$ and the polycrystalline silicon film 34$b$, the sidewall insulation film 93 of silicon oxide film is formed. Also on the side walls of the gate electrodes 34$c$, the sidewall insulation film 93 of silicon oxide film is formed. Also on the side walls of the gate electrodes 34$d$, the side wall insulation film 93 of silicon oxide film is formed.

Next, a photoresist film (not illustrated) is formed on the entire surface by spin coating.

Next, openings (not illustrated) for exposing the regions 6N where the high withstand voltage N-channel transistors are to be formed are formed in the photoresist film by photolithography.

Then with the photoresist film as the mask, an N-type dopant impurity is implanted into the semiconductor substrate 20. Thus, N-type heavily doped diffused layers 94 are formed in the semiconductor substrate 20 on both sides of the gate electrodes 34$c$ of the high withstand voltage N-channel transistors. The N-type lightly doped diffused layers 86 and the N-type heavily doped diffused layers 94 form the N-type source/drain diffused layers 96 of the LDD structure. Thus, the high withstand voltage N-channel transistors 110N each including the gate electrode 34$c$ and the source/drain diffused layer 96 are formed. The high withstand voltage N-channel transistors 110N are used in the high voltage circuit (high withstand voltage circuit). Then the photoresist film is released.

Next, a photoresist film (not illustrated) is formed on the entire surface by spin coating.

Then, an opening for exposing the region 6P where the high withstand voltage P-channel transistor is to be formed is formed in the photoresist film by photolithography.

Then, with the photoresist film as the mask, a P-type dopant impurity is implanted into the semiconductor substrate 20. Thus, P-type heavily doped diffused layers 98 are formed in the semiconductor substrate 20 on both sides of the gate electrode 34$c$ of the high withstand voltage P-channel transistor. The P-type lightly doped diffused layer 88 and the P-type heavily doped diffused layer 98 form the P-type source/drain diffused layers 100 of the LDD structure. Thus, the high withstand voltage P-channel transistors 110P including the gate electrode 34$c$ and the source/drain diffused layers 100 is formed. The high withstand voltage P-channel transistor 110P is used in the high voltage circuit (high withstand voltage circuit). Then, the photoresist film is released.

Next, a photoresist film (not illustrated) is formed on the entire surface by spin coating.

Next, an opening (not illustrated) for exposing the region 8N where the low voltage N-channel transistor is to be formed is formed in the photoresist film by photolithography.

Then, with the photoresist film as the mask, an N-type dopant impurity is implanted into the semiconductor substrate 20. N-type heavily doped diffused layers 102 are formed in the semiconductor substrate 20 on both sides of the gate electrode 34$d$ of the low voltage N-channel transistor. The N-type lightly doped diffused layers 90 and the N-type heavily doped diffused layers 102 form the N-type source/drain diffused layers 104 of the LDD structure. Thus, the low voltage N-channel transistor 112N including the gate electrode 34$d$ and the source/drain diffused layers 104 is formed. The low voltage N-channel transistor 112N is used in the low voltage circuit. Then, the photoresist film is released.

Then, a photoresist film (not illustrated) is formed on the entire surface by spin coating.

Then, an opening (not illustrated) for exposing the region 8P where the low voltage P-channel transistor is to be formed is formed in the photoresist film by photolithography.

Then, with the photoresist film as the mask, a P-type dopant impurity is implanted into the semiconductor substrate 20. Thus, P-type heavily doped diffused layers 106 are formed in the semiconductor substrate 20 on both sides of the gate electrode 34$d$ of the low voltage P-channel transistor. The P-type lightly doped diffused layers 92 and the P-type heavily doped diffused layers 106 form the P-type source/drain diffused layers 108 of the LDD structure. Thus, the low voltage P-channel transistor 112P including the gate electrode 34*d* and the source/drain diffused layers 108 is formed. The low voltage P-channel transistor 112P is used in the low voltage circuit. Then, the photoresist film is released.

Next, a 10 nm-thickness cobalt film is formed on the entire surface by, e.g., sputtering.

Next, thermal processing is made to thereby react the silicon atoms in the surface of the semiconductor substrate 20 and the cobalt atoms in the cobalt film with each other. The silicon atoms in the surface of the control gates 34*c* and the cobalt atoms in the cobalt film are also reacted with each other. The silicon atoms in the surface of the polycrystalline silicon film 34*d* and the cobalt atoms in the cobalt film are also reacted with each other. The silicon atoms in the surface of the gate electrodes 34*c*, 34*d* and the cobalt atoms in the cobalt film are also reacted with each other. Thus, a cobalt silicide film 38*a*, 38*b* is formed on the source/drain diffused layers 36*a*, 36*c* (see FIGS. 16A and 16B). On the control gate 34*a*, the cobalt silicide film 38*c* is also formed. On the polycrystalline silicon film 34*b*, the cobalt silicide film 38*d* is formed. On the source/drain diffused layers 96, 100, 104, 108, cobalt silicide films 38*e* are formed. On the gate electrodes 34*c*, 34*d*, the cobalt silicide film 38*f* is formed.

Next, the non-reacted cobalt film is etched off.

The cobalt silicide film 38*b* formed on the drain diffused layer 36*c* of the selecting transistor ST functions as the drain electrode.

The cobalt silicide film 38*a* formed on the source diffused layer 36*a* of the memory cell transistor MT functions as the source electrode.

The cobalt silicide film 38*e* formed on the source diffused layers 96, 100 of the high withstand voltage transistors 110N, 110P function as the source/drain electrodes.

The cobalt silicide film 38*e* formed on the source/drain diffused layers 104, 108 of the low voltage transistors 112N, 112P functions as the source/drain electrodes.

Figure 17:
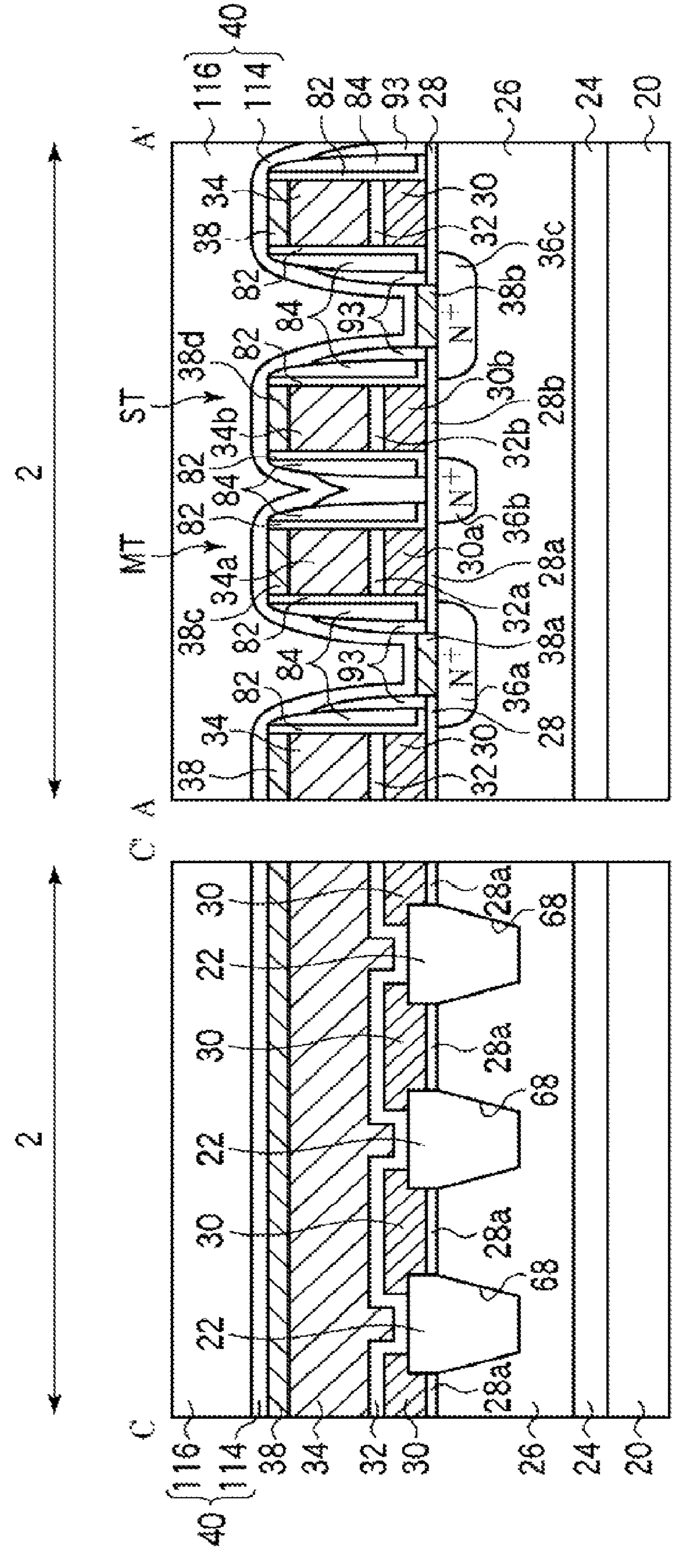
FIG. 17 is a sectional view (Part 11) of the nonvolatile semiconductor memory device according to the first embodiment in the steps of the method for manufacturing the nonvolatile semiconductor memory device, which illustrates the method.
Figure 18:
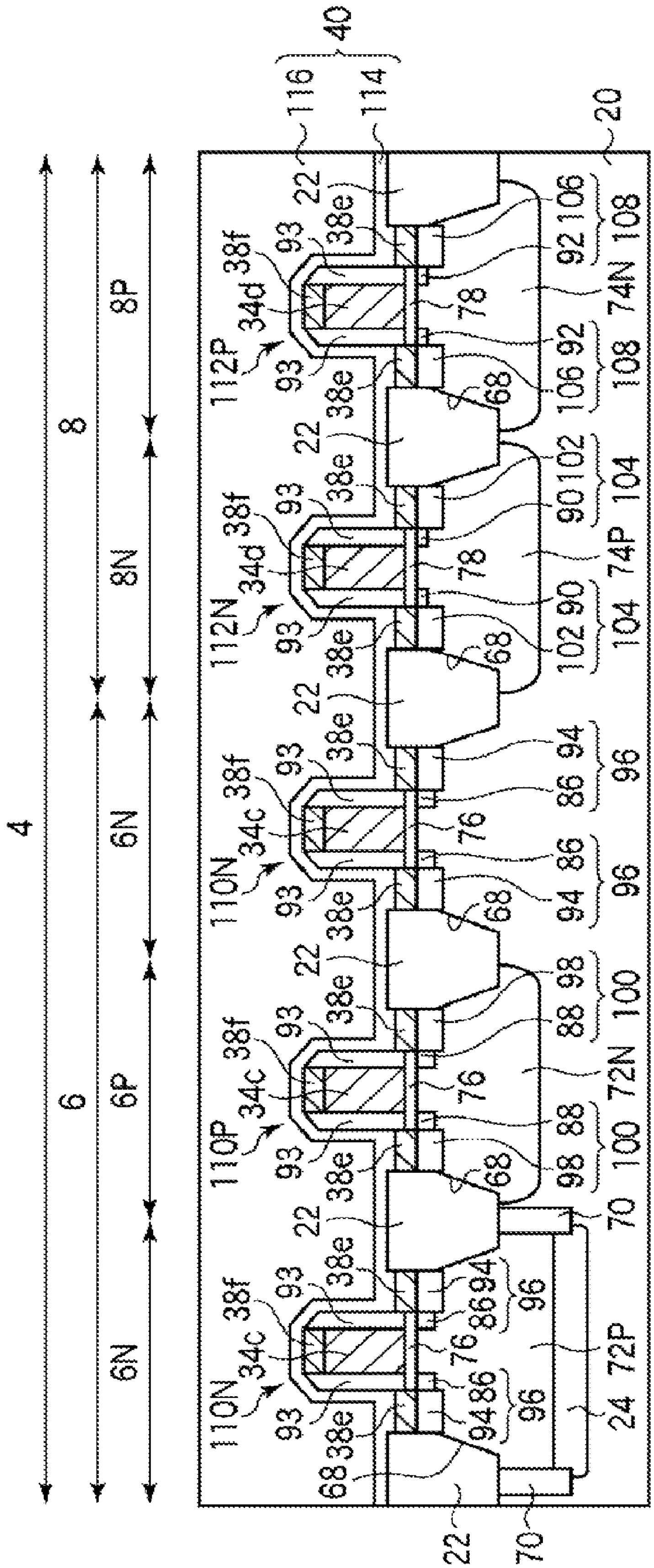
FIG. 18 is a sectional view (Part 12) of the nonvolatile semiconductor memory device according to the first embodiment in the steps of the method for manufacturing the nonvolatile semiconductor memory device, which illustrates the method.

Then, as illustrated in FIGS. 17 and 18, a 100 nm-thickness silicon nitride film 114 is formed on the entire surface by, e.g., CVD. The silicon nitride film 114 functions as the etching stopper.

Next, a 1.6 μm-thickness silicon oxide film 116 is formed on the entire surface by CVD. Thus, the inter-layer insulation film 40 of the silicon nitride film 114 and the silicon oxide film 116 is formed.

Next, the surface of the inter-layer insulation film 40 is planarized by CMP.

Figure 19:
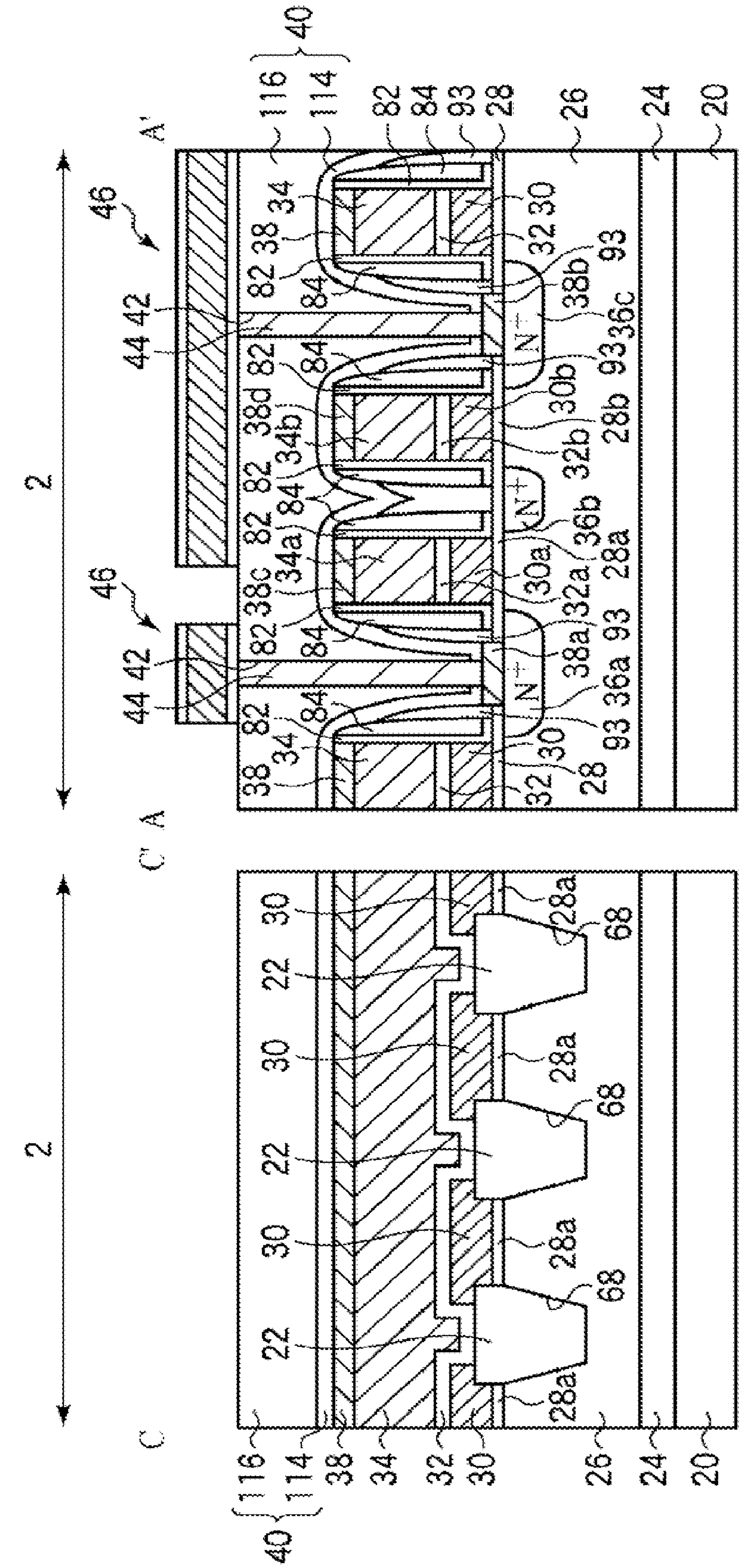
FIG. 19 is a sectional view (Part 13) of the nonvolatile semiconductor memory device according to the first embodiment in the steps of the method for manufacturing the nonvolatile semiconductor memory device, which illustrates the method.
Figure 20:
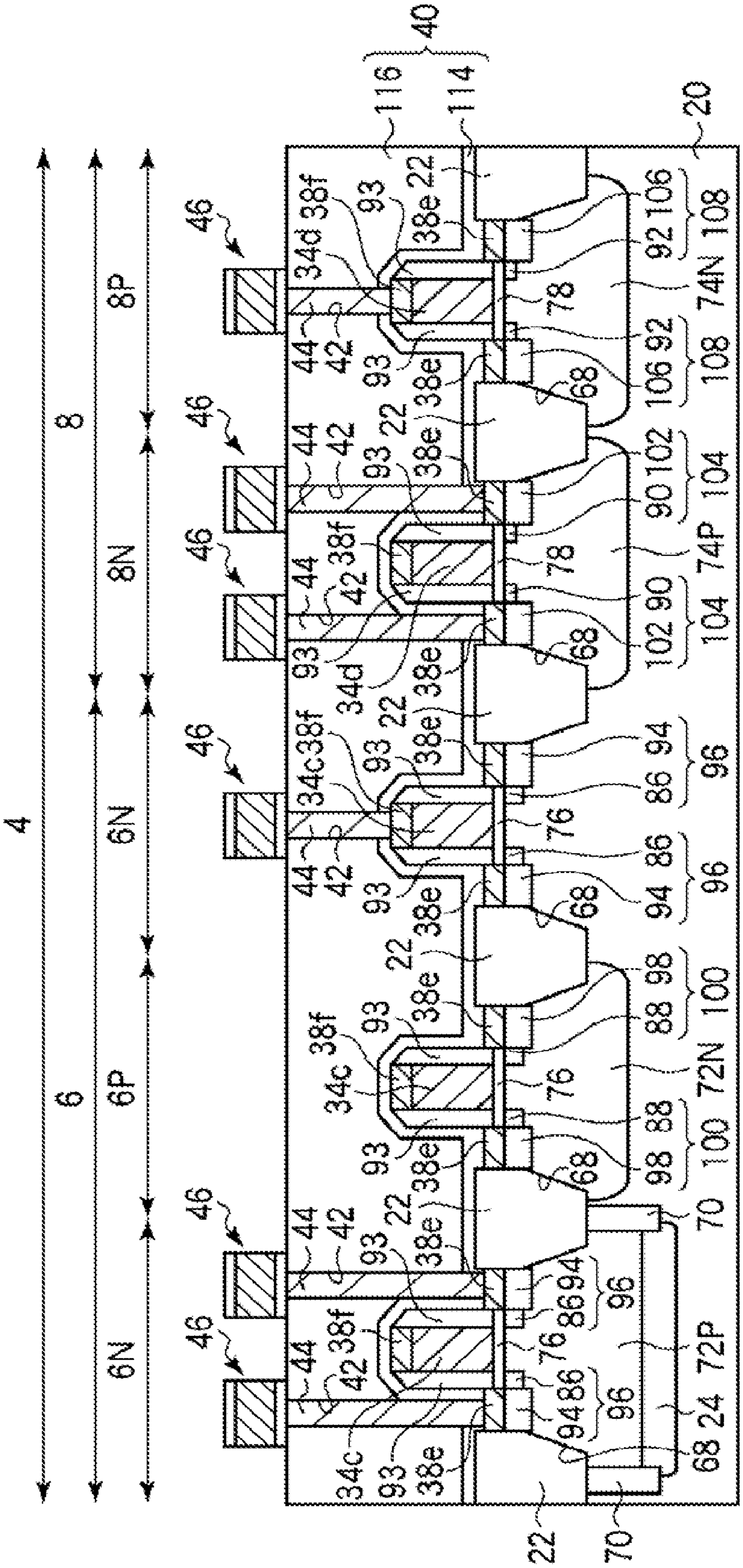
FIG. 20 is a sectional view (Part 14) of the nonvolatile semiconductor memory device according to the first embodiment in the steps of the method for manufacturing the nonvolatile semiconductor memory device, which illustrates the method.

Then, contact holes 42 arriving at the source/drain electrodes 38*a*, 38*b*, contact holes 42 arriving at the cobalt silicide film 38*e* and contact holes 42 arriving at the cobalt silicide film 38 are formed by photolithography (see FIG. 19 and FIG. 20).

Next, a barrier layer (not illustrated) of a Ti film and a TiN film is formed on the entire surface by sputtering.

Next, a 300 nm-thickness tungsten film 44 is formed on the entire surface by, e.g., CVD.

Next, the tungsten film 44 and the barrier film are polished by CMP until the surface of the inter-layer insulation film 40 is exposed. Thus, the conductor plugs 44 of, e.g., tungsten are buried in the contact holes 42.

Next, on the inter-layer insulation film 40 with the conductor plugs 44 buried in, the layer film 46 of a Ti film, a TiN film, an Al film, a Ti film and a TiN film sequentially laid is formed by, e.g., sputtering.

Next, the layer film 46 is patterned by photolithography. Thus, the interconnection (the first metal interconnection layers) 46 of the layer film are formed.

Figure 21:
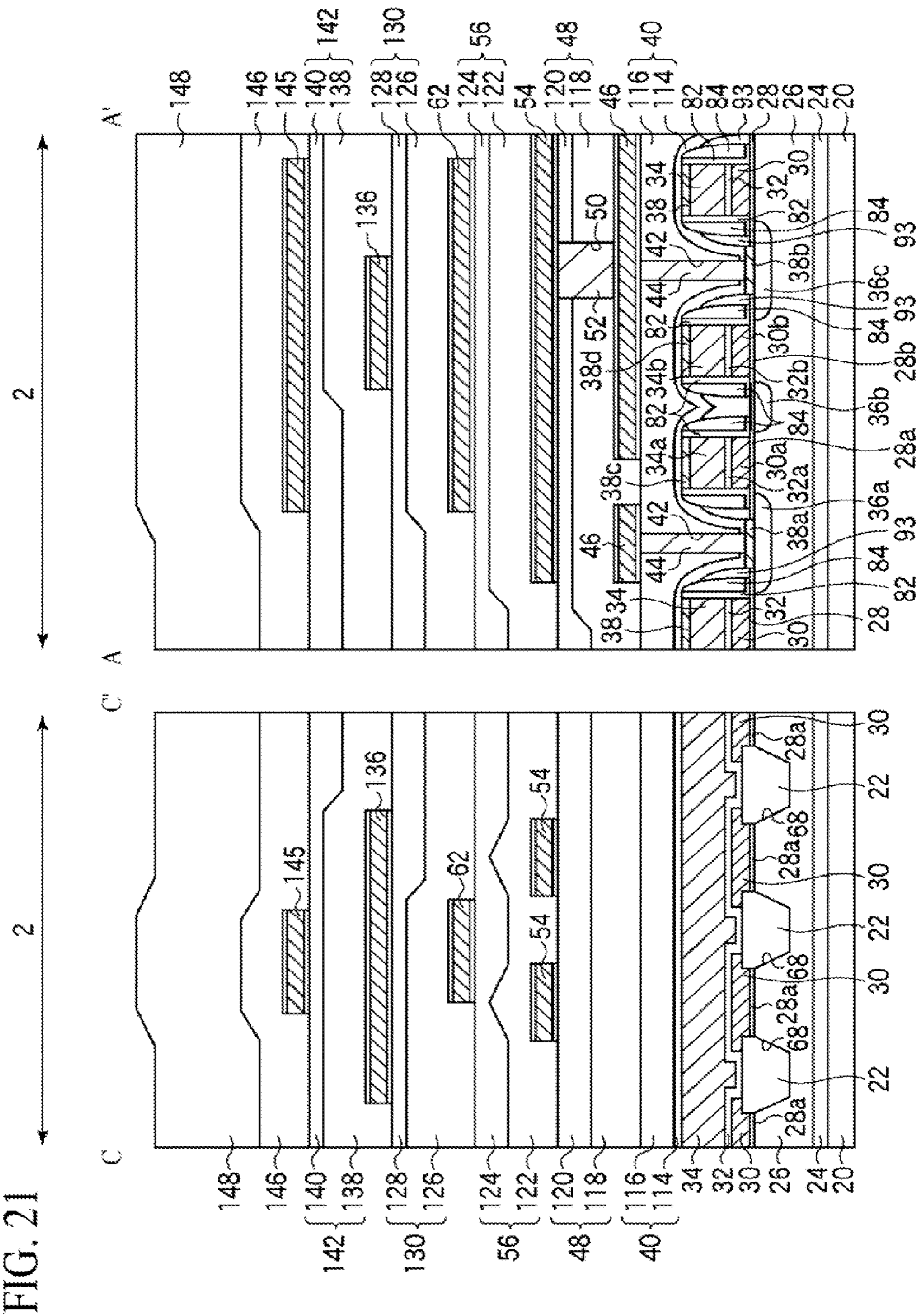
FIG. 21 is a sectional view (Part 15) of the nonvolatile semiconductor memory device according to the first embodiment in the steps of the method for manufacturing the nonvolatile semiconductor memory device, which illustrates the method.
Figure 22:
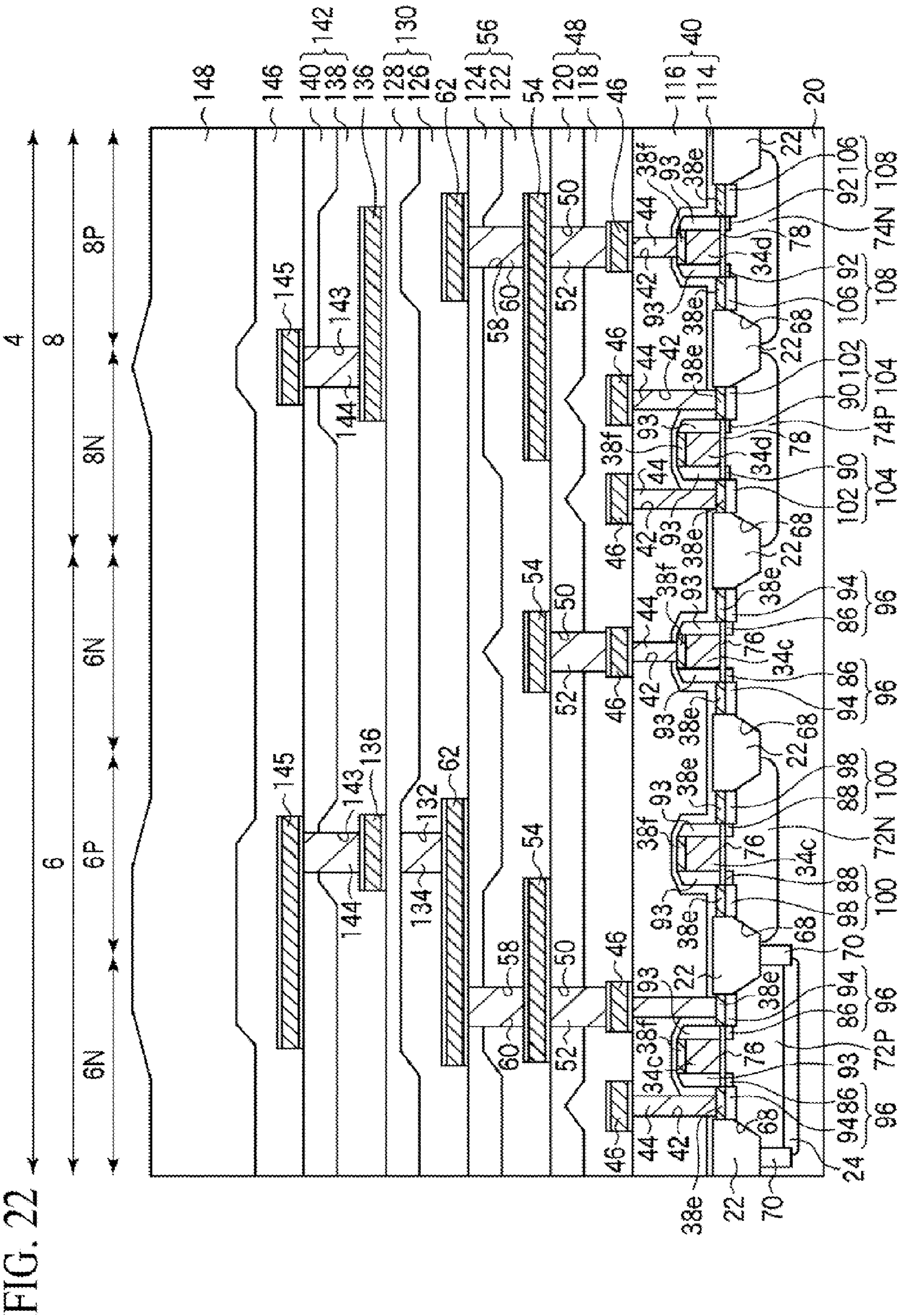
FIG. 22 is a sectional view (Part 16) of the nonvolatile semiconductor memory device according to the first embodiment in the steps of the method for manufacturing the nonvolatile semiconductor memory device, which illustrates the method.

Next, as illustrated in FIGS. 21 and 22, a 700 nm-thickness silicon oxide film 118 is formed by, e.g., high density plasma-enhanced CVD.

Then, a silicon oxide film 120 is formed by TEOSCVD (Tetra-Ethoxy-Silane Chemical Vapor Deposition). The silicon oxide film 118 and the silicon oxide film 120 form the inter-layer insulation film 48.

Next, by photolithography, contact holes 50 arriving at the interconnections 46 are formed in the inter-layer insulation film 48.

Next, a barrier layer (not illustrated) of a Ti film and a TiN film is formed on the entire surface by sputtering.

Next, a 300 nm-thickness tungsten film 52 is formed on the entire surface by, e.g., CVD.

Then, the tungsten film 52 and the barrier film are polished by CMP until the surface of the inter-layer insulation film 48 is exposed. Thus, the conductor plugs 52 of, e.g., tungsten are buried in the contact holes 50.

Next, on the inter-layer insulation film 48 with the conductor plugs 52 buried in, the layer film 54 of a Ti film, a TiN film, an Al film, a Ti film and a TiN film sequentially laid is formed by, e.g., puttering on the inter-layer insulation film 48 with the conductor plugs 52 buried in.

Then, the layer film 54 is patterned by photolithography. Thus, the interconnections (the second interconnection layers) 54 of the layer film are formed.

Next, a silicon oxide film 122 is formed by, e.g., high density plasma-enhanced CVD.

Next, a silicon oxide film 124 is formed by TEOSCVD. The silicon oxide film 122 and the silicon oxide film 124 form the inter-layer insulation film 56.

Then, contact holes 58 arriving at the interconnections 54 are formed in the inter-layer insulation film 56 by photolithography.

Next, a barrier layer (not illustrated) of a Ti film and a TiN film is formed on the entire surface by sputtering.

Then, a 300 nm-thickness tungsten film 60 is formed on the entire surface by, e.g., CVD.

Then, the tungsten film 60 and the barrier film are polished by CMP until the surface of the inter-layer insulation film 56 is exposed. Thus, conductor plugs 60 (see FIG. 22) of, e.g., tungsten are formed in the contact holes 58.

Next, a layer film 62 is formed by, e.g., puttering on the inter-layer insulation film 56 with the conductor plugs 60 buried in.

Then, the layer film 62 is patterned by photolithography. Thus, the interconnections (the third metal interconnection layers) 62 of the layer film are formed.

Then, a silicon oxide film 126 is formed by, e.g., high density plasma-enhanced CVD.

Next, a silicon oxide film 128 is formed by TEOSCVD. The silicon oxide film 126 and the silicon oxide film 128 form the inter-layer insulation film 130.

Then, a contact hole 132 arriving at the interconnection 62 is formed in the inter-layer insulation film 130 by photolithography.

Next, a barrier layer (not illustrated) of a Ti film and a TiN film is formed on the entire surface by sputtering.

Then, a 300 nm-thickness tungsten film 134 is formed on the entire surface by, e.g., CVD.

Next, the tungsten film 134 and the barrier film are polished by CMP until the surface of the inter-layer insulation film 130 is exposed. Thus, a conductor plug (not illustrated) 134 of, e.g., tungsten is buried in the contact holes 132.

Then, on the inter-layer insulation film 130 with the conductor plug 134 buried in, a layer film 136 is formed by, e.g., sputtering.

Then, a layer film 136 is patterned by photolithography. Thus, the interconnections (the fourth metal interconnection layers) 136 of the layer film are formed.

Next, a silicon oxide film 138 is formed by, e.g., high density plasma-enhanced CVD.

Then, a silicon oxide film 140 is formed by TEOSCVD. The silicon oxide film 138 and the silicon oxide film 140 form the inter-layer insulation film 142.

Next, by photolithography, contact holes 143 arriving at the interconnections 136 are formed in the inter-layer insulation film 142.

Then, a barrier layer (not illustrated) of a Ti film and a TiN film is formed on the entire surface by sputtering.

Next, a 300 nm-thickness tungsten film 146 is formed on the entire surface by, e.g., CVD.

Next, the tungsten film 146 and the barrier film are polished by CMP until the surface of the inter-layer insulation film 142 is exposed. Thus, the conductor plugs 144 of tungsten are buried in the contact holes 143.

Next, a layer film 145 is formed by, e.g., sputtering on the inter-layer insulation film 142 with the conductor plugs 144 buried in.

Next, the layer film 145 is patterned by photolithography. Thus, the interconnections (the fifth metal interconnection layers) 145 of the layer film are formed.

Next, a silicon oxide film 146 is formed by, e.g., high density plasma-enhanced CVD.

Next, a 1 μm-thickness silicon nitride film 148 is formed by plasma-enhanced CVD.

Thus, the nonvolatile semiconductor memory device according to the present embodiment is manufactured.

[b] Second Embodiment

Figure 23:
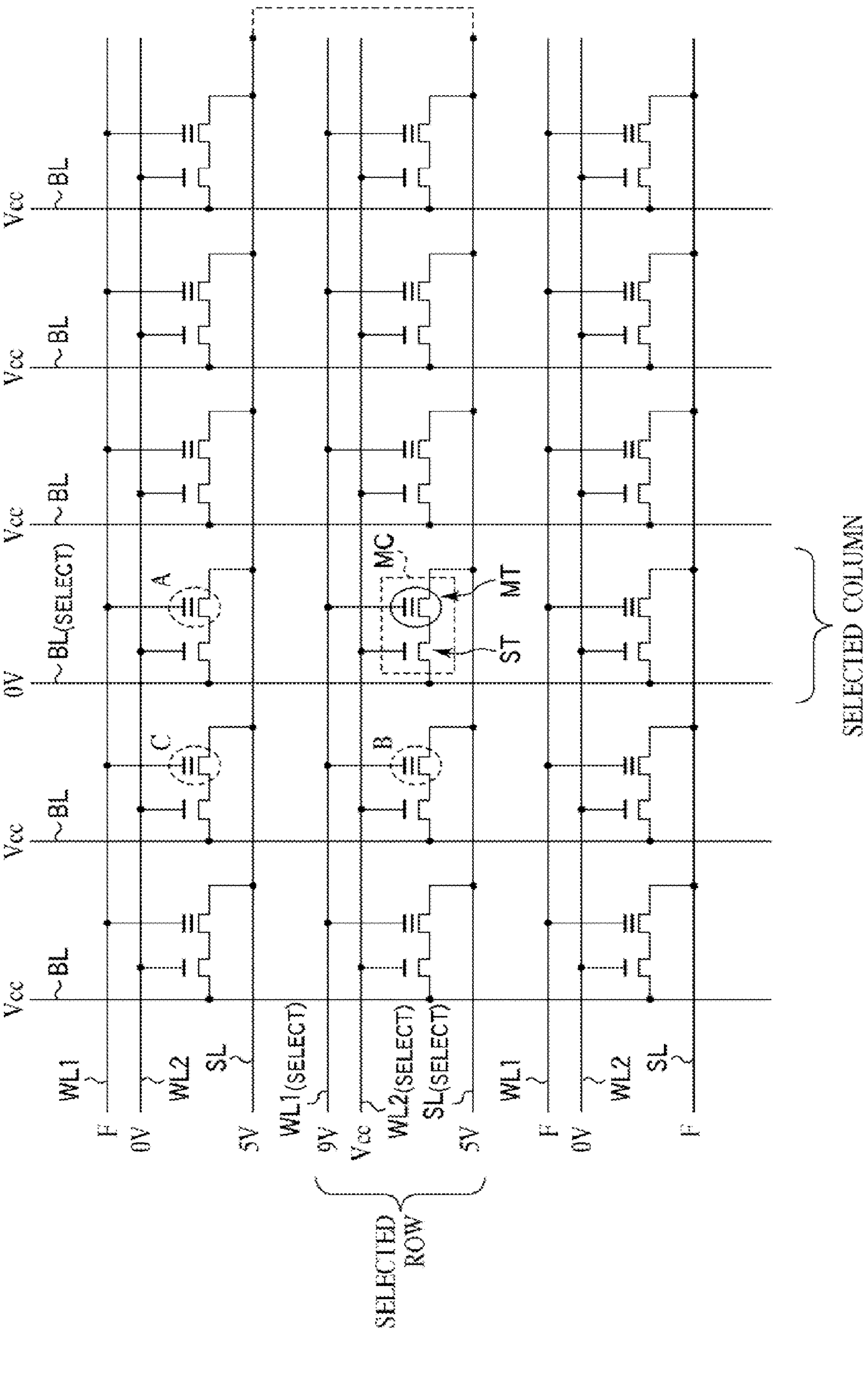
FIG. 23 is a partial circuit diagram of the nonvolatile semiconductor memory device according to a second embodiment.
Figure 25:
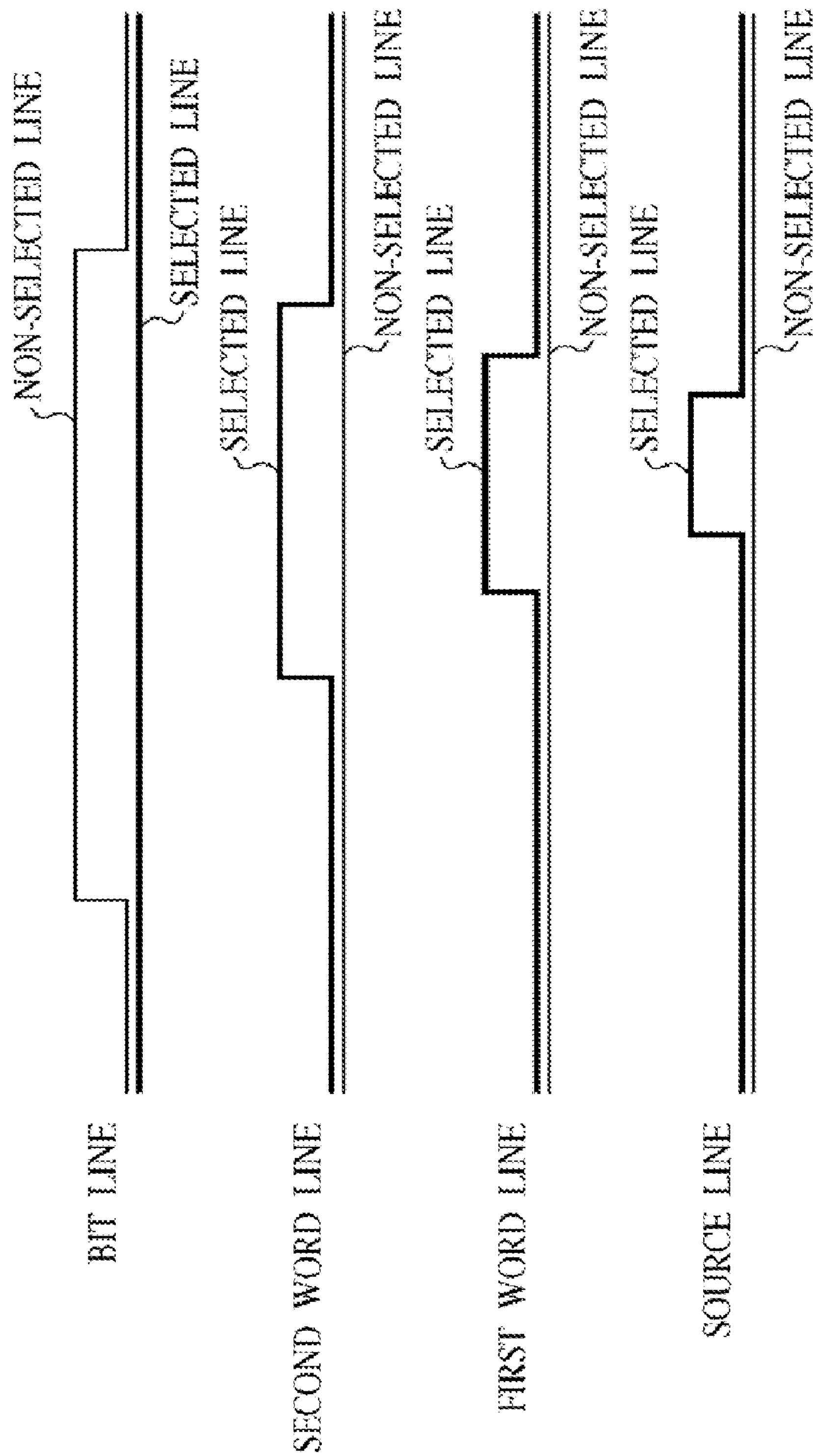
FIG. 25 is the time chart of the writing method of the nonvolatile semiconductor memory device according to the second embodiment.

The writing method of the nonvolatile semiconductor memory device according to a second embodiment will be explained with reference to FIGS. 23 to 25. FIG. 23 is a partial circuit diagram of the nonvolatile semiconductor memory device according to the present embodiment. FIG. 24 is a view illustrating the reading method, the writing method and the erasing method of the nonvolatile semiconductor memory device according to the present embodiment. In FIG. 24, the voltages in the parentheses are the potentials of the non-selected lines. In FIG. 24, F indicates floating. FIG. 25 is the time chart of the writing method of the nonvolatile semiconductor memory device according to the present embodiment. The same members of the present embodiment as those of the nonvolatile semiconductor memory device, etc. according to the first embodiment illustrated in FIGS. 1 to 22 are represented by the same reference numbers not to repeat or to simplify their explanation.

The constitution of the nonvolatile semiconductor memory device according to the present embodiment is the same as the constitution of the nonvolatile semiconductor memory device according to the first embodiment described above with reference to FIG. 1.

The writing method of the nonvolatile semiconductor memory device according to the present embodiment is characterized mainly in that a power supply voltage $V_{CC}$ (the first voltage) is applied to the non-selected bit lines, and the potential of the non-selected second word lines is set at 0 V (ground voltage).

When information is written into a memory cell transistor MT, in accordance with the time chart of FIG. 25, the potentials of the respective parts are set as illustrated in FIGS. 23 and 24. A memory cell transistor MT for information to be written into is surrounded by the solid line circle in FIG. 23.

First, the potential of the bit line $BL_{(SELECT)}$ connected to the memory cell MC to be selected, i.e., the potential of the bit line $BL_{(SELECT)}$ of the selected column is set at 0 V. The potential of the bit lines BL other than the selected bit line $BL_{(SELECT)}$, i.e., the potential of the bit lines BL of the non-selected columns is set at $V_{CC}$ (the first potential). At this time, the potential of all the second word lines WL2 is 0 V (ground voltage).

Next, the potential of the second word line $WL2_{(SELECT)}$ connected to the memory cell MC to be selected, i.e., the potential of the second word line $WL2_{(SELECT)}$ of the selected row is set at $V_{CC}$ (the first potential). On the other hand, the potential of the second word lines WL2 other than the selected second word line $WL2_{(SELECT)}$, i.e., the potential of the second word lines WL2 of the non-selected rows remains 0 V (ground voltage).

Next, the potential of the first word lines $WL1_{(SELECT)}$ connected to the memory cell MC to be selected, i.e., the potential of the first word line $WL1_{(SELECT)}$ of the selected row is set at, e.g., 9 V (the third potential). On the other hand, the potential of the first word lines WL1 other than the selected first word line $WL1_{(SELECT)}$, i.e., the potential of the first word lines WL1 of the non-selected row is set at 0 V or floating.

Next, the potential of the source line $SL_{(SELECT)}$ connected to the memory cell MC to be selected, i.e., the potential of the source line $SL_{(SELECT)}$ of the selected row is set at, e.g., 5 V (the second potential). On the other hand, the potential of the source lines SL other than the selected source line $SL_{(SELECT)}$, i.e., the potential of the source line SL of the non-selected row is set at 0 V or floating. In FIG. 23 the potential of the source line SL of another row adjacent to the source line $SL_{(SELECT)}$ of the selected row is 5 V (the second potential), because the each source line SL is common between 2 rows, as illustrated with broken line. That is to say, as will be detailed later with reference to FIG. 65, as in the nonvolatile semiconductor memory device according to an eleventh embodiment, the sources of the memory cell transistors MT present in rows adjacent to each other may be connected by a common source line SL.

The potential of the wells 26 is constantly 0 V (ground voltage).

With the potentials of the respective parts being set as above, electrons flow between the source diffused layer **36*a* of the memory cell transistor MT and the drain diffused layer 36*c* of the selecting transistor ST, and the electrons are injected into the floating gate 30*a* of the memory cell transistors MT. Thus, charges are stored in the floating gate 30*a*** of the memory cell transistor MT, and information is written into the memory cell transistor MT.

The reading method and the erasing method of the nonvolatile semiconductor memory device according to the present embodiment are the same as the reading method and the erasing method of the nonvolatile semiconductor memory device according to the first embodiment and are not explained here.

In the present embodiment, the potential of the non-selected bit lines BL is $V_{CC}$ for the following reason. That is, with the potential of the non-selected bit lines BL being floating as in the first embodiment, there is a risk that information might be erroneously written into the non-selected memory cell transistor MT present in the same selected row. There is a risk that information might be erroneously written into, e.g., the memory cell transistor MT indicated by the mark B in FIG. 23. In the present embodiment, the potential of the non-selected bit lines BL is $V_{CC}$, whereby the potential of the select gates 30*b* of the select transistors and the potential of the drain diffused layers 36*c* thereof become equal to each other. Thus, in the present embodiment, the selecting transistors ST can be surely turned off-state. According to the present embodiment, erroneous write of information in the non-selected memory cell transistors MT present in the same selected row can be prevented.

In the present embodiment, the potential of the non-selected second word lines WL2 is 0 V (ground voltage) for the following reason. That is, with the potential of the non-selected second word lines WL2 being floating as in the first embodiment, there is a risk that information might be erroneously written into the non-selected memory cell transistors MT present in the rows other than the selected row. There is a risk that information might be written erroneously in, e.g., the memory cell transistors MT indicated by the marks A and C in FIG. 23. In the present embodiment, the potential of the non-selected second word lines WL2 being 0 V (ground voltage), whereby the potential of the select gates 30*b* of the selecting transistor ST becomes lower than the potential of the drain diffused layer 36*c* of the selecting transistors ST. Thus, in the present embodiment, the selecting transistors ST can be surely turned off-state. According to the present embodiment the erroneous write of information in the non-selected memory cell transistors MT present in the rows other than the selected row can be prevented.

In the present embodiment the potentials of the respective parts are set in accordance with the time chart of FIG. 25 so as to turn off-state the selecting transistors ST of the non-selected memory cells MC before voltages are applied to the first word lines WL1 and the source line SL.

As described above, according to the present embodiment, the power supply voltage $V_{CC}$ (the first voltage) is applied to the non-selected bit lines, and potential of the non-selected second word lines is set at 0 V (ground voltage), whereby the erroneous write of information in the non-selected memory cells MC can be prevented.

[c] Third Embodiment

Figure 26:
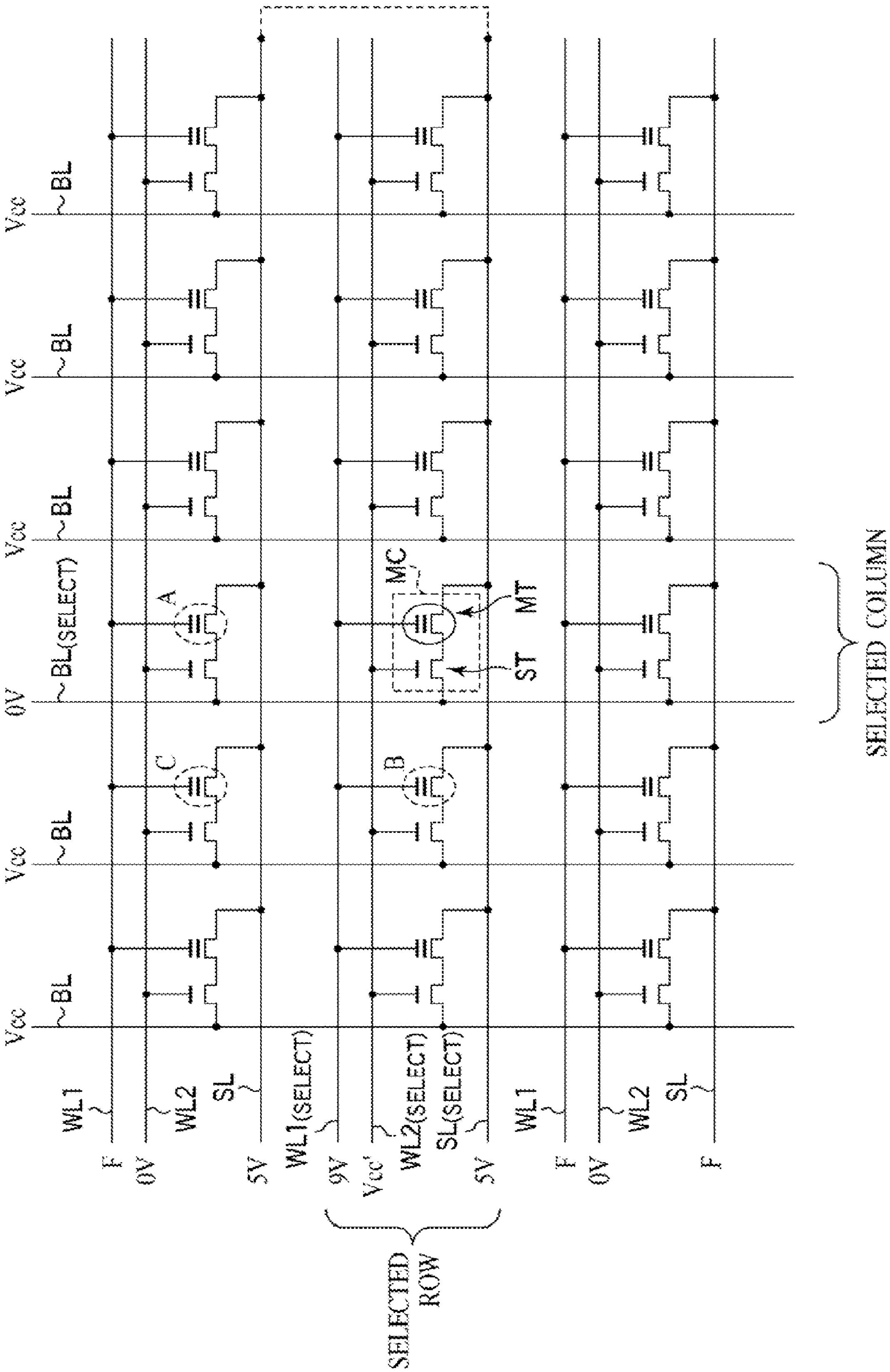
FIG. 26 is a partial circuit diagram of the nonvolatile semiconductor memory device according to a third embodiment.

The writing method of the nonvolatile semiconductor memory device according to a third embodiment will be explained with reference to FIGS. 26 and 27. FIG. 26 is a partial circuit diagram of the nonvolatile semiconductor memory device according to the present embodiment. FIG. 27 is a view illustrating the reading method, the writing method and the erasing method of the nonvolatile semiconductor memory device according to the present embodiment. In FIG. 27, the voltages in the parentheses are the potentials of the non-selected lines. In FIG. 27, F indicates floating. FIG. 27 is the time chart of the writing method of the nonvolatile semiconductor memory device according to the present embodiment. The same members of the present embodiment as those of the nonvolatile semiconductor memory device, etc. according to the first or the second embodiment illustrated in FIGS. 1 to 25 are represented by the same reference numbers not to repeat or to simplify their explanation.

The constitution of the nonvolatile semiconductor memory device according to the present embodiment is the same as the constitution of the nonvolatile semiconductor memory device according to the first embodiment described above with reference to FIG. 1.

The writing method of the nonvolatile semiconductor memory device according to the present embodiment is characterized mainly in that the potential of the second word line WL2$_{(SELECT)}$ connected to a memory cell MC to be selected is set at $V_{CC}$' which is lower than a $V_{CC}$ which is the potential of the non-selected bit lines BL.

When information is written into the memory cell transistor MT, in accordance with the time chart of FIG. 25, the potentials of the respective parts are set as illustrated in FIGS. 26 and 27.

First, the potential of the bit line $BL_{(SELECT)}$ connected to the memory cell MC to be selected is set at 0 V. On the other hand, the potential of the bit lines BL other than the selected bit line $BL_{(SELECT)}$ is set at $V_{CC}$ (the fourth potential).

Then, the potential of the second word line WL2$_{(SELECT)}$ connected to the memory cell MC to be selected is set at the potential $V_{CC}$' (the first potential) which is lower than the potential $V_{CC}$ (the fourth potential) of the non-selected bit lines BL. In other words, the potential $V_{CC}$ (the fourth potential) of the non-selected bit lines BL is set higher than the potential $V_{CC}$' (the first potential) of the selected second word line WL2$_{(SELECT)}$. The potential $V_{CC}$' (the first potential) of the selected second word line WL2$_{(SELECT)}$ is set lower by, e.g., about 0.2-0.5 V than the potential $V_{CC}$ (the fourth potential) of the non-selected bit lines BL. On the other hand, the potential of the second word line WL2 other than the selected second word line WL2$_{(SELECT)}$ is set at 0 V (ground voltage).

Then, the potential of the first word line WL1$_{(SELECT)}$ connected to the memory cell MC to be selected is set at, e.g., 9 V (the third potential). On the other hand, the potential of the first word lines WL1 other than the selected first word line WL1$_{(SELECT)}$ is set at 0 V or floating.

Next, the potential of the source line $SL_{(SELECT)}$ connected to the memory cell MC to be selected is set at, e.g., 5 V (the second potential). On the other hand, the potential of the source lines SL other than the selected source line $SL_{(SELECT)}$ is set at 0 V or floating. In FIG. 26, the potential of the source line SL of the row adjacent to the selected row is 5 V (the second potential), because each source line SL is common between 2 rows, as illustrated with a broken line. That is to say, as will be detailed later with reference to FIG. 65, as in the nonvolatile semiconductor memory device according to an eleventh embodiment, the sources of the memory cell transistors MT present in rows adjacent to each other may be connected by a common source line SL.

The potential of the wells 26 is constantly 0 V (ground voltage).

In the present embodiment, the potential $V_{CC}$' (the first potential) of the second word line WL2$_{(SELECT)}$ connected to the memory cell MC to be selected is set lower than the potential $V_{CC}$ (the fourth potential) of the non-selected bit lines BL for the following reason. That is, with the potential of the non-selected bit lines BL being set floating as in the first embodiment, there is a risk that information is erroneously written into a non-selected memory cell transistor MT present in the same selected row. There is a risk that information might be written into, e.g., the memory cell transistor MT indicated by the mark B in FIG. 26. In the present embodiment, the potential $V_{CC}$' of the selected second word line WL2$_{(SELECT)}$ is lower than the potential $V_{CC}$ (the fourth potential) of the non-selected bit lines BL, whereby the potential of the select gates 30*b* of the selecting transistors ST becomes lower than the potential of the drain diffused layers 36*c* of the selecting transistors ST. Thus, according to the present embodiment, the selecting transistors ST can be surely turned off-state. According to the present embodiment, the erroneous write of information in the non-selected memory cell transistors MT present in the same selected row can be further surely prevented.

As described above, according to the present embodiment, the potential of the second word line WL2$_{(SELECT)}$ connected to the memory cell MC to be selected is $V_{CC}$' lower than the potential $V_{CC}$ of the non-selected bit lines, whereby the erroneous write of information in the non-selected memory cell transistors MT present in the same selected row can be further surely prevented.

[d] Fourth Embodiment

Figure 29:
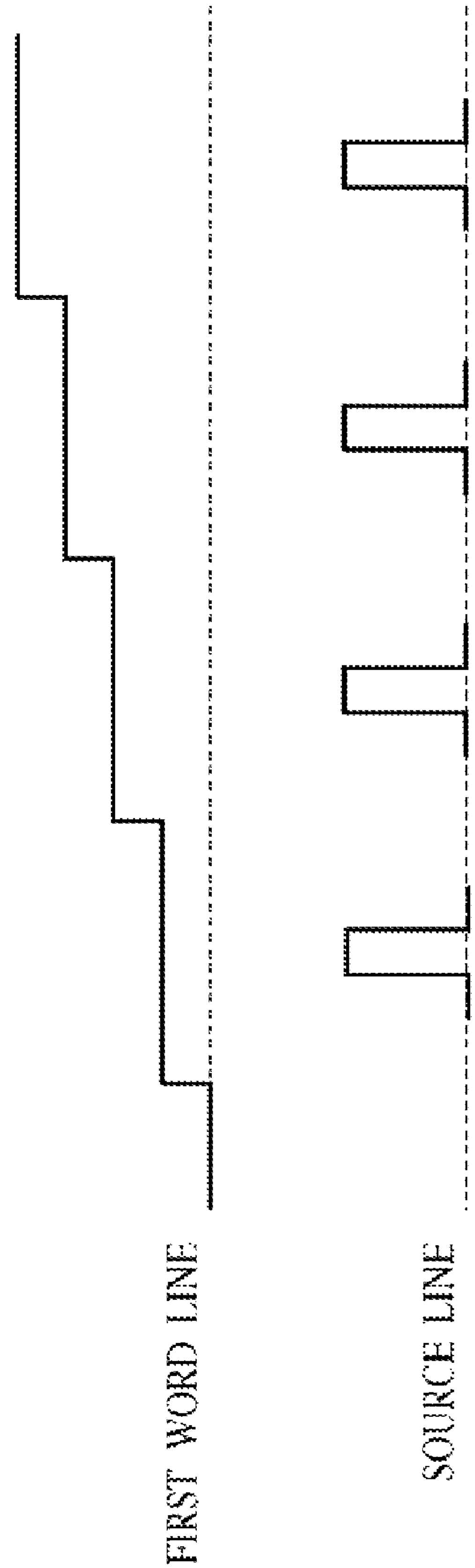
FIG. 29 is the time chart of the writing method of the nonvolatile semiconductor memory device according to the fourth embodiment.
Figure 30:
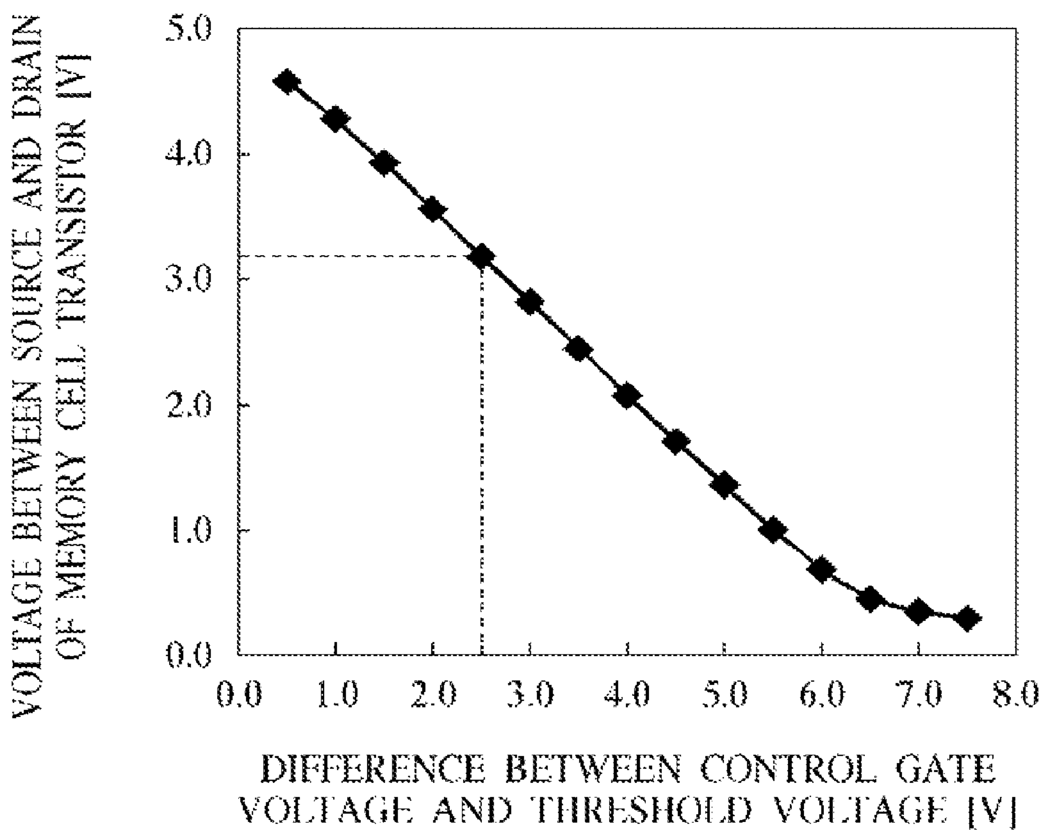
FIG. 30 is a graph of the relationships between the difference between the control gate voltage and the threshold voltage, and the voltage between the source and the drain of the memory cell transistor.

The writing method of the nonvolatile semiconductor memory device according to a fourth embodiment will be explained with reference to FIG. 26 and FIGS. 28 to 30. FIG. 28 is a view illustrating the reading method, the writing method and the erasing method of the nonvolatile semiconductor memory device according to the present embodiment. In FIG. 28, the voltages in the parentheses are the potentials of the non-selected lines. In FIG. 28, F indicates floating. FIG. 29 is the time chart of the writing method of the nonvolatile semiconductor memory device according to the present embodiment. FIG. 30 is the graph of the relationships between the difference between the control gate voltage and the threshold voltage, and the voltage between the source and the drain of the memory cell transistor. The same members of the present embodiment as those of the nonvolatile semiconductor memory device, etc. according to the first to the third embodiments illustrated in FIGS. 1 to 27 are represented by the same reference numbers not to repeat or to simplify their explanation.

The constitution of the nonvolatile semiconductor memory device according to the present embodiment is the same as the constitution of the nonvolatile semiconductor memory device according to the first embodiment described above with reference to FIG. 1.

The writing method of the nonvolatile semiconductor memory device according to the present embodiment is characterized mainly in that voltage is applied in pulses to the source line SL$_{(SELECT)}$ connected to the memory cell MC to be selected while the potential of the first word line WL1$_{(SELECT)}$ connected to the memory cell MC to be selected is gradually being raised, whereby information can be written into the memory cell transistor MT of the selected memory cell MC.

When information is written into the memory cell transistor MT, as illustrated in FIG. 28, the potential of the bit line BL$_{(SELECT)}$ connected to the memory cell MC to be selected is set at 0 V. On the other hand, the potential of the bit lines BL other than the selected bit line BL$_{(SELECT)}$ is set at $V_{CC}$ (the first potential).

The potential of the second word line WL2$_{(SELECT)}$ connected to the memory cell MC to be selected is set at $V_{CC}$ (the first potential). On the other hand, the potential of the second word lines WL2 other than the selected second word line WL2$_{(SELECT)}$ is set at 0 V (ground voltage).

To the first word line WL1$_{(SELECT)}$ connected to the memory cell MC to be selected, as illustrated in FIG. 29, the first voltage $V_{step}$ which gradually rises is applied. On the other hand, the potential of the first word lines WL1 other than the selected first word line WL1$_{(SELECT)}$ is set at 0 V or floating.

To the source line SL$_{(SELECT)}$ connected to the memory cell MC to be selected, as illustrated in FIG. 29, the second voltage is applied in pulses. The pulsated second voltage to be applied to the source line SL$_{(SELECT)}$ is, e.g., 5 V. One the other hand, the potential of the source lines SL other than the selected source line SL$_{(SELECT)}$ is 0 V or floating.

The potential of the wells 26 is constantly 0 V (ground voltage).

In the present embodiment, voltage is applied in pulses to the source line SL$_{(SELECT)}$ of the selected column while the first voltage $V_{step}$ to be applied to the first word line WL1$_{(SELECT)}$ of the selected row is being raised for the following reason. That is, when high voltage is applied to the control gate 34*b* of the memory cell transistor MT, the electric resistance between the source and the drain of the memory cell transistor MT becomes smaller in comparison with the electric resistance between the source and the drain of the selecting transistor ST. Then, a large transverse electric field is applied between the source and the drain of the selecting transistor, while a sufficient transverse electric field is not applied between the source and the drain of the memory cell transistor MT. When a sufficient transverse electric filed is not applied between the source and the drain of the memory cell transistor MT, the electrons are not accelerated between the source and the drain of the memory cell transistor MT, and the write speed becomes slow. In the present embodiment, in the initial stage of the write relatively low voltage is applied to the first word line WL1$_{(SELECT)}$ of the selected row, whereby the electric resistance between the source and the drain of the memory cell transistor MT does not become excessively small. Then, when voltage is applied in pulses to the source line SL$_{(SELECT)}$ of the selected column, charges are injected into the floating gate 30*a* of the memory cell transistor MT. Hereafter, when voltage is applied in pulses to the source line SL$_{(SELECT)}$ of the selected column while the voltage of the first word line WL1$_{(SELECT)}$ of the selected row is gradually raised, charges are gradually injected into the floating gate 30*a* of the memory cell transistor MT. The first voltage $V_{step}$ to be applied to the first word line WL1$_{(SELECT)}$ of the selected row gradually rises, but charges are gradually increasingly stored in the floating gate 30*a*, whereby the electric resistance between the source and the drain of the memory cell transistor MT never becomes excessively small. Thus, according to the present embodiment, the write speed of writing information in the memory cell transistor MT can be increased.

In the nonvolatile semiconductor memory device according to the present embodiment, hot carriers are generated, and the generated hot carriers are injected into the floating gate 30*a* of the memory cell transistor MT, whereby information is written into the memory cell transistor MT. To write by using hot carriers, energy which exceeds the height of the barrier of the tunnel insulation film 28*a*, i.e., 3.2 V is necessary, and the hot carriers is accelerated to this energy or more by the potential difference between the source and the drain of the memory cell transistor MT. FIG. 30 is the graph of the relationships between the difference between the control gate voltage and the threshold voltage, and the voltage between the source and the drain of the memory cell transistor. FIG. 30 was given by simulation. As the conditions for the simulation, the voltage to be applied to the select gate 30*b* of the selecting transistor is 1.5 V, and the voltage to be applied to the source line is 5 V. As seen in FIG. 30, when the difference between the voltage of the control gate 34*a* of the memory cell transistor MT and the threshold voltage of the memory cell transistor MT is 2.5 V or below, the voltage between the source and the drain of the memory cell transistor MT is 3.2 V or above. On the other hand, to flow large current to the channel of the memory cell transistor MT to increase the write speed, it is preferable to set the voltage of the control gate 34*a* of the memory cell transistor MT as high as possible with respect to the threshold voltage of the memory cell transistor MT. Preferably, the first voltage $V_{step}$ to be applied to the control gate 34*a* of the memory cell transistor MT is gradually increased so that the voltage of the control gate 34*a* of the memory cell transistor MT becomes higher constantly by 2.5 V than the threshold voltage of the memory cell transistor MT. In other words, preferably, the first voltage $V_{step}$ to be applied to the first word line WL1$_{(SELECT)}$ of the selected row is gradually increased so that the voltage of the control gate 34*a* of the memory cell transistor MT is higher constantly by 2.5 V than the threshold voltage of the memory cell transistor MT.

The present embodiment is explained here by means of an example that the first voltage $V_{step}$ to be applied to the first word line WL1$_{(SELECT)}$ of the selected row is gradually increased so that the voltage to be applied to the first word line WL1$_{(SELECT)}$ of the selected row is higher constantly by 2.5 V than the threshold voltage of the memory cell transistor MT. However, the difference between the first voltage $V_{step}$ to be applied to the first word line WL1$_{(SELECT)}$ of the selected row and the threshold voltage of the memory cell transistor MT is not limited to this. The first voltage $V_{step}$ to be applied to the first word line WL1$_{(SELECT)}$ of the selected row may be gradually increased so that the first voltage $V_{step}$ to be applied to the first word line WL1$_{(SELECT)}$ of the selected row is higher by 2-3 V than the threshold voltage of the memory cell transistor MT.

[e] Fifth Embodiment

Figure 31:
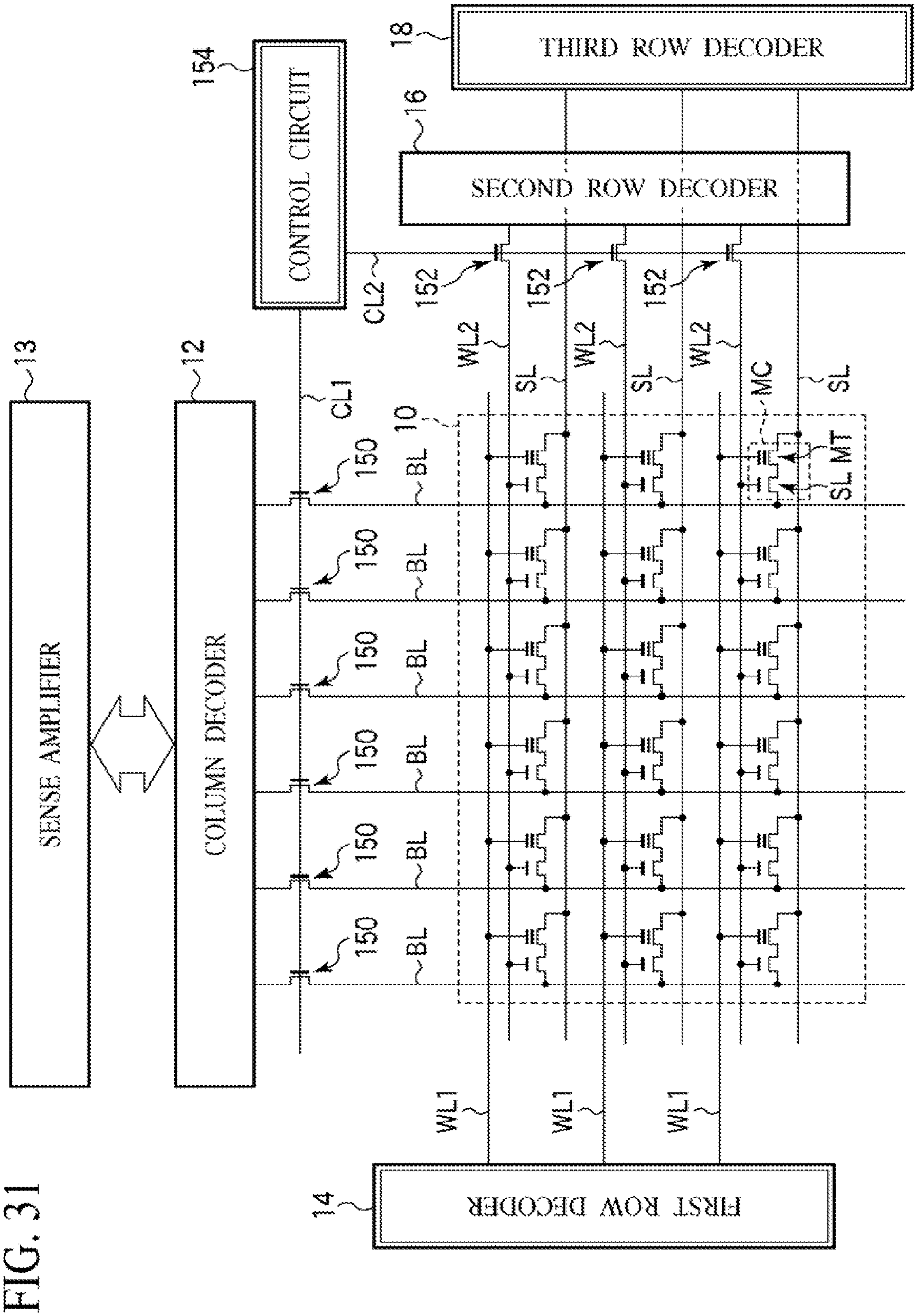
FIG. 31 is the circuit diagram of the nonvolatile semiconductor memory device according to a fifth embodiment.

The nonvolatile semiconductor memory device according to a fifth embodiment, and the reading method, the writing method and the erasing method thereof will be explained with reference to FIGS. 31 and 32. FIG. 31 is the circuit diagram of the nonvolatile semiconductor memory device according to the present embodiment. The same members of the present embodiment as those of the nonvolatile semiconductor memory device, etc. according to the first to the fourth embodiments are represented by the same reference numbers not to repeat or to simplify their explanation.

(Nonvolatile Semiconductor Memory Device)

First, the nonvolatile semiconductor memory device according to the present embodiment will be explained with reference to FIG. 31.

The nonvolatile semiconductor memory device according to the present embodiment is characterized mainly in that the bit lines BL are connected to the column decoder 12 via the first protection transistors 150, the second word lines WL2 are connected to the second row decoder 16 via the second protection transistors 152, and when information written in the memory cell array 10 is erased, the column decoder 12 is electrically disconnected from the bit lines BL, and the second row decoder 16 is electrically disconnected from the second word lines WL2.

As illustrated in FIG. 31, the respective bit lines BL are connected to the column decoder 12 via the first protection transistors 150. In other words, one of the source/drain of each of the first protection transistor 150 is connected to a bit line BL, and the other of the source/drain of each of the first protection transistor 150 is connected to the column decoder 12.

The gates of the respective first protection transistor 150 are connected to a control circuit 154 via the first control line CL1. The respective first protection transistors 150 are controlled by the control circuit 154.

The film thickness of the gate insulation film (not illustrated) of the first protection transistors 150 is set equal to the film thickness of the gate insulation film 28*b* of the selecting transistors ST. The film thickness of the gate insulation film of the first protection transistors 150 is set relatively thick as is the film thickness of the gate insulation film 28*b* of the selecting transistors ST so as to sufficiently ensure the withstand voltage of the first protection transistors 150.

The nonvolatile semiconductor memory device according to the present embodiment has been explained by means of the example that the film thickness of the gate insulation film (not illustrated) of the first protection transistors 150 is set equal to the film thickness of the gate insulation film 28*b* of the selecting transistors ST. However, the film thickness of the gate insulation film of the first protection transistors 150 may be set equal to the film thickness of the gate insulation film of the high withstand voltage transistors. The film thickness of the gate insulation film of the first protection transistors 150 can be suitably set corresponding to a working voltage.

The respective second word lines WL2 are connected to the second row decoder 16 via the second protection transistors 152. In other words, one of the source/drain of each of the second protection transistors 152 is connected to the second word line WL2, and the other of the source/drain of each of the second protection transistors 152 is connected to the second row decoder 16.

The gates of the respective second protection transistors 152 are connected to the control circuit 154 via the second control line CL2. The respective second protection transistors 152 are controlled by the control circuit 154.

The film thickness of the gate insulation film (not illustrated) of the second protection transistors 152 is set equal to the film thickness of the gate insulation film 28*b* of the selecting transistors ST. The film thickness of the gate insulation film of the second protection transistors 152 is set relatively thick as is the film thickness of the gate insulation film 28*b* of the selecting transistors ST so as to sufficiently ensure the withstand voltage of the second protection transistors 152.

The nonvolatile semiconductor memory device according to the present embodiment has been explained by means of the example that the film thickness of the gate insulation film (not illustrated) of the second protection transistors 152 is set equal to the film thickness of the gate insulation film 28*b* of the selecting transistors ST. However, the film thickness of the gate insulation film of the second protection transistors 152 may be set equal to the film thickness of the gate insulation film of the high withstand voltage transistors. The film thickness of the gate insulation film of the second protection transistors 152 can be suitably set corresponding to a working voltage.

Thus, the nonvolatile semiconductor memory device according to the present embodiment is constituted.

The memory cell transistors MT of the respective rows are connected by the source lines SL respectively associated with the respective rows here as illustrated in FIG. 31. However, as in the nonvolatile semiconductor memory device according to an eleventh embodiment which will be detailed later with reference to FIG. 65, the sources of the memory cell transistors MT present in rows adjacent to each other may be connected by a common source line SL. The sources of the memory cell transistors MT present in rows adjacent to each other are connected by a common source line SL, whereby the area of the memory cell array region 2 can be reduced, and the nonvolatile semiconductor memory device can be downsized. The number of the source lines SL to be controlled by the third row decoder 18 can be decreased, whereby the third row decoder 18 can be simplified.

(Operations of the Nonvolatile Semiconductor Memory Device)

Next, the operation of the nonvolatile semiconductor memory device according to the present embodiment will be explained with reference to FIG. 32.

FIG. 32 is a view illustrating the reading method, the writing method and the erasing method of the nonvolatile semiconductor memory device according to the present embodiment. In FIG. 32, the voltages in the parentheses are the potentials of the non-selected lines. In FIG. 32, F indicates floating.

(Reading Method)

First, the reading method of the nonvolatile semiconductor memory device according to the present embodiment will be explained with reference to FIG. 32.

In the present embodiment, when information written in the memory cell transistors MT is read, the voltage of the first control line CL1 is set at 5 V, and the potential of the second control line CL2 is set at 5 V. That is, in the present embodiment, when information written in a memory cell transistor MT is read, the first protection transistors 150 and the second protection transistors 152 are turned on-state. The potential of the bit lines BL, the potential of the source lines SL, the potential of the first word lines WL1, the potential of the second word lines WL2, the potential of the wells 26 are the same as the potentials of the respective parts in the reading method of the nonvolatile semiconductor memory device according to the first embodiment.

Because of the first protection transistor 150 and the second protection transistor 152 being on-state, the bit line BL is electrically connected to the column decoder 12 as in the nonvolatile semiconductor memory device according to the first embodiment, and the second word line WL2 is electrically connected to the second row decoder 16 as in the nonvolatile semiconductor memory device according to the first embodiment. Thus, in the nonvolatile semiconductor memory device according to the present embodiment, information written in the memory cell transistor MT can be read in the same way as in the nonvolatile semiconductor memory device according to the first embodiment.

(Writing Method)

Next, the writing method of the nonvolatile semiconductor memory device according to the present embodiment will be explained with reference to FIG. 32.

In the present embodiment, when information is written into the memory cell transistors MT, the potential of the first control line CL1 is set at 5 V, and the potential of the second control line CL2 is set at 5 V. That is, in the present embodiment, when information is written into the memory cell transistors MT, the first protection transistors 150 and the second protection transistors 152 are turned on-state. The potential of the bit lines BL, the potential of the source lines SL, the potential of the first word lines WL1 and the potential of the second word lines WL2 and the potential of the wells 26 are the same as the potentials of the respective parts in the writing method of the nonvolatile semiconductor memory device according to the second embodiment.

Because of the first protection transistor 150 and the second protection transistor 152 being on-state, the bit line BL is electrically connected to the column decoder 12 as in the nonvolatile semiconductor memory device according to the second embodiment, and the second word line WL2 is connected to the second row decoder 16 as in the nonvolatile semiconductor memory device according to the second embodiment. Thus, in the nonvolatile semiconductor memory device according to the present embodiment, information can be written in the memory cell transistor MT in the same way as in the writing method of the nonvolatile semiconductor memory device according to the second embodiment.

(Erasing Method)

Next, the erasing method of the nonvolatile semiconductor memory device according to the present embodiment will be explained with reference to FIG. 32.

When information written in the memory cell array 10 is erased, the potential of the first control line CL1 is set at 0 V, and the potential of the second control line CL2 is set at 0 V. That is, in the present embodiment, when information written in the memory cell transistors MT is erased, the first protection transistors 150 and the second protection transistors 152 are turned off-state. The potential of the bit lines BL, the potential of the source lines SL, the potential of the first word lines WL1, the potential of the second word lines WL2 and the potential of the wells 26 are the same as the potential of the respective parts in the erasing method of the nonvolatile semiconductor memory device according to the first embodiment.

When information written in the memory cell array 10 is erased, high voltage is applied to the first word line WL1 and the wells 26. When information in the memory cell array 10 is erased with the column decoder 12 and the second row decoder 16, which are formed of low voltage circuits, electrically connected to the memory cell array 10, there is a risk that the column decoder 12 and the second row decoder 16 might be broken. In the present embodiment, when information written in the memory cell array 10 is erased, the first protection transistor 150 and the second protection transistor 152 are turned off-state, whereby the bit lines BL are electrically disconnected from the second row decoder 12, and the second word lines WL2 are electrically disconnected from the second row decoder 16. That is, in the present embodiment, when information written in the memory cell array 10 is erased, the column decoder 12 and the second row decoder 16 of low voltage circuits are electrically disconnected from the memory cell array 10. Thus, according to the present embodiment, when information written in the memory cell array 10 is erased, the column decoder 12 and the second row decoder 16 of low withstand voltage can be prevented from being broken.

As described above, according to the present embodiment, in which the bit lines BL are connected to the column decoder 12 via the first protection transistors 150, and the second word lines WL2 are connected to the second row decoder 16 via the second protection transistors 152, when information written in the memory cell array 10 is erased, the column decoder 12 is electrically disconnected from the bit lines BL, and the second row decoder 16 is electrically disconnected from the second word lines WL2. Thus, according to the present embodiment, when information written in the memory cell array 10 is erased, the column decoder 12 and the second row decoder of low withstand voltage can be prevented from being broken.

[f] Sixth Embodiment

Figure 33:
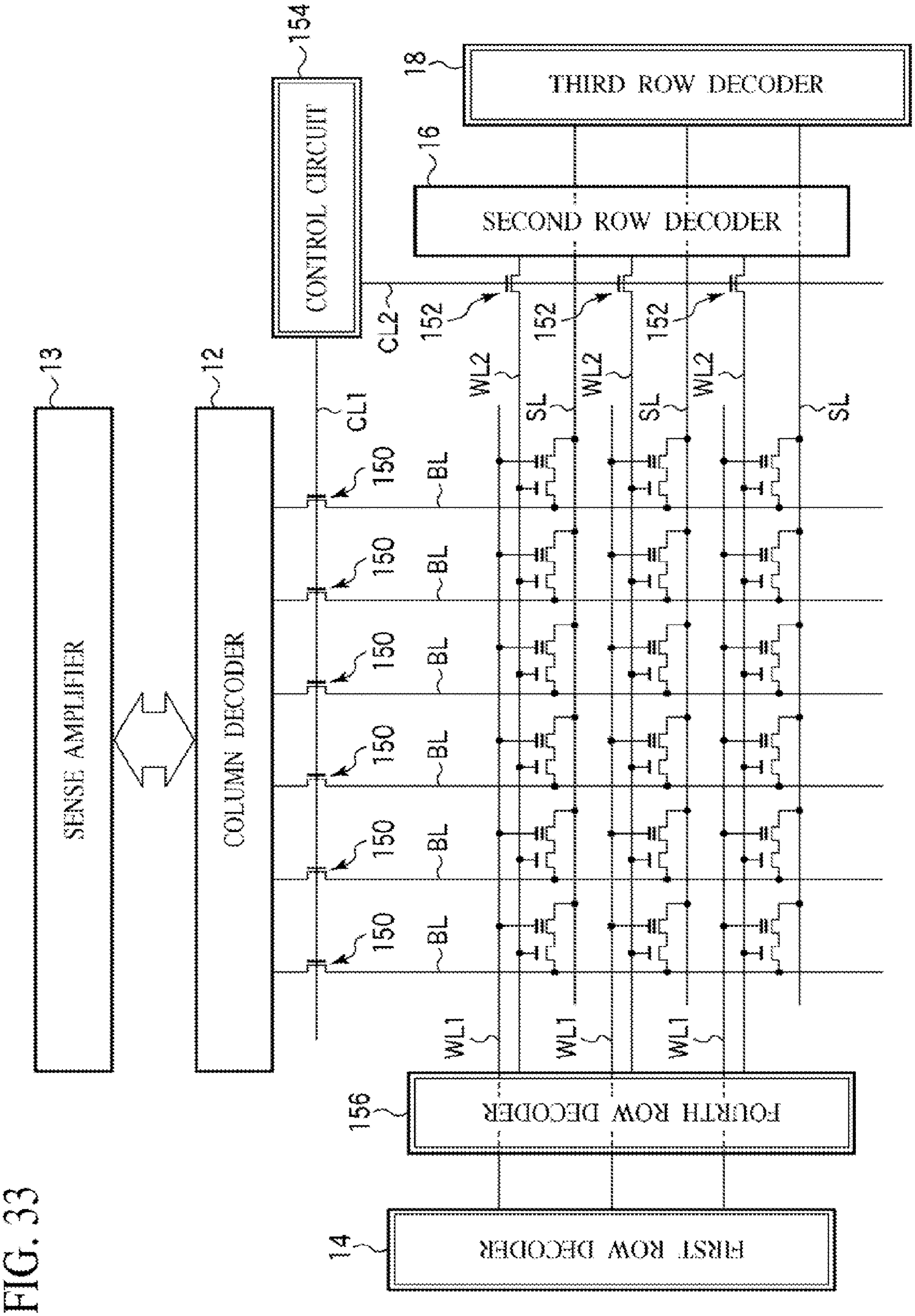
FIG. 33 is the circuit diagram of the nonvolatile semiconductor memory device according to a sixth embodiment.

The nonvolatile semiconductor memory device according to a sixth embodiment, and the reading method, the writing method and the erasing method thereof will be explained with reference to FIG. 33 and FIG. 34. FIG. 33 is a circuit diagram of the nonvolatile semiconductor memory device according to the present embodiment. The same members of the present embodiment as those of the nonvolatile semiconductor memory device, etc. according to the first to the fifth embodiments illustrated in FIGS. 1 to 32 are represented by the same reference numbers not to repeat or to simplify their explanation.

(Nonvolatile Semiconductor Memory Device)

First, the nonvolatile semiconductor memory device according to the present embodiment will be explained with reference to FIG. 33.

The nonvolatile semiconductor memory device according to the present embodiment is characterized mainly in that the second word lines WL2 are connected not only to the second row decoder 16 but also to the fourth row decoder of a high voltage circuit, and when information is written into the memory cell transistors MT, the second row decoder 16 is electrically disconnected from the second word lines WL2, and voltage is applied to the second word lines WL2 by the fourth row decoder 156.

As illustrated in FIG. 33, the respective bit lines BL are connected to the row decoder 12 via the first protection transistors 150. In other words, one of the source/drain of the first protection transistor 150 is connected to the bit line BL, and the other of the source/drain of the first protection transistor 150 is connected to column decoder 12.

The gate of each of the first protection transistor 150 is connected to the control circuit 154 via the first control line CL1. Each of the first protection transistors 150 is controlled by the control circuit 154.

The film thickness of the gate insulation film (not illustrated) of the first protection transistors 150 is set equal to the film thickness of the gate insulation film 28*b* of the selecting transistors ST. The film thickness of the gate insulation film of the first protection transistors 150 is set relatively thick as is the film thickness of the gate insulation film 28*b* of the selecting transistors ST so as to sufficiently ensure the withstand voltage of the first protection transistors 150.

The explanation of the nonvolatile semiconductor memory device according to the present embodiment has been explained here by means of the example that the film thickness of the gate insulation film (not illustrated) of the first protection transistors 150 is set equal to the film thickness of the gate insulation film 28*b* of the selecting transistors ST. However, the film thickness of the gate insulation film of the first protection transistors 150 may be set equal to the film thickness of the gate insulation film of the high voltage transistors. The film thickness of the gate insulation film of the first protection transistors 150 can be set suitably corresponding to a working voltage.

The respective second word lines WL2 are connected to the second row decoder 16 via the second protection transistors 152. In other words, one of the source/drain of the second protection transistors 152 is connected to the second word line WL2, and the other of the source/drain of the second protection transistors 152 is connected to the second row decoder 16.

The gates of the respective second protection transistors 152 are connected to the control circuit 154 via the second control line CL2. The respective second protection transistors 152 are controlled by the control circuit 154.

The film thickness of the gate insulation film (not illustrated) of the second protection transistors 152 is set equal to the film thickness of the gate insulation film 28*b* of the selecting transistors ST. The film thickness of the gate insulation film of the first protection transistors 152 are set relatively thick, as is the film thickness of the gate insulation film 28*b* of the selecting transistors ST so as to sufficiently ensure the withstand voltage of the first protection transistors 152.

The nonvolatile semiconductor memory device according to the present embodiment has been explained by means of the example that the film thickness of the gate insulation film (not illustrated) of the second protection transistors 152 is set equal to the film thickness of the gate insulation film 28*b* of the selecting transistors ST. However, the film thickness of the gate insulation film of the second protection transistors 152 may be set equal to the film thickness of the gate insulation film of the high voltage transistors. The film thickness of the gate insulation film of the second protection transistors 152 can be suitably set corresponding to a working voltage.

The respective second word lines WL2 are connected further to the fourth row decoder 156. The fourth row decoder 156 is for controlling the potential of the plural second word lines WL2. The fourth row decoder 156 is formed of a high voltage circuit (high withstand voltage circuit). The fourth row decoder 156 is formed of a high voltage circuit in the present embodiment so as to apply high voltage to the second word lines WL2 when information is written into the memory cell transistors MT.

Thus, the nonvolatile semiconductor memory device according to the present embodiment is constituted.

The nonvolatile semiconductor memory device according to the present embodiment has been explained here by means of the example that, as illustrated in FIG. 33, the memory cell transistors MT of each row are connected respectively to the source line SL associated with the row. However, as in the nonvolatile semiconductor memory device according to an eleventh embodiment which will be detailed with reference FIG. 65, the sources of the memory cell transistors MT present in rows adjacent to each other may be connected to the common source line SL. The sources of the memory cell transistors MT present in rows adjacent to each other are connected to the common source line SL, whereby the area of the memory cell array region 2 can be reduced, and the nonvolatile semiconductor memory device can be downsized. The number of the source lines SL to be controlled by the third row decoder 18 can be decreased, which can simplify the third row decoder 18.

(Operations of Nonvolatile Semiconductor Memory Device)

Next, the operation methods of the nonvolatile semiconductor memory device according to the present embodiment will be explained with reference to FIG. 34. FIG. 34 is a view illustrating the reading method, the writing method and the erasing method of the nonvolatile semiconductor memory device according to the present embodiment. In FIG. 34, the voltages in the parentheses are potentials of the non-selected lines. In FIG. 34, F indicates floating.

(Reading Method)

First, the reading method of the nonvolatile semiconductor memory device according to the present embodiment will be explained with reference to FIG. 34.

In the present embodiment, when information written in the memory cell transistors MT is read, the potential of the first control line CL1 is set at 5 V, and the potential of the second control lines CL2 is set at 5 V. That is, in the present embodiment, when information written in the memory cell transistors MT is read, the first protection transistors 150 and the second protection transistors 152 are turned on-state. The potential of the bit lines BL, the potential of the source lines SL, the potential of the first word lines WL1, the potential of the second word lines WL2 and the potential of the wells 26 are the same as the potentials of the respective parts in the reading method of the nonvolatile semiconductor memory device according to the first embodiment.

Because of the first protection transistors 150 and the second protection transistors 152 being on-state, the bit lines BL are electrically connected to the column decoder 12 as in the nonvolatile semiconductor memory device according to the first embodiment, and the second word lines WL2 are electrically connected to the second row decoder 16 as in the nonvolatile semiconductor memory device according to the first embodiment. Thus, in the nonvolatile semiconductor memory device according to the present embodiment, information written in the memory cell transistors MT can be read in the same way as in the reading method of the nonvolatile semiconductor memory device according to the first embodiment.

(Writing Method)

Next, the writing method of the nonvolatile semiconductor memory device according to the present embodiment will be explained with reference to FIG. 34.

When information is written into the memory cell transistors MT, the potentials of the respective parts are set as follows. That is, the potential of the bit line BL connected to a memory cell MC to be selected is set at 0 V. The potential of the bit lines BL other than the selected bit line BL is set at floating. The potential of the source line SL connected to the memory cell MC to be selected is set at, e.g., 5 V (the second potential). The potential of the source lines SL other than the selected source line SL is set at 0 V or floating. The potential of the first word line WL1 connected to the memory cell MC to be selected is set at, e.g., 9 V (the third potential). The potential of the first word lines WL1 other than the selected first word line WL1 is set at 0 V or floating. The potential of the second word line WL2 connected to the memory cell MC to be selected is set at, e.g., 4 V (the first potential). The potential of the second word lines WL2 other than the selected second word line WL2 is set at 0 V (ground voltage). The potential of the first control line CL1 is set at, e.g., 5 V. The potential of the second control line CL2 is set at, e.g., 5 V. That is, in the present embodiment, when information is written into the memory cell transistors MT, the first protection transistors 150 are turned on-state, and the second protection transistors 152 are turned off-state. The potential of all the wells 26 is set at 0 V.

In the present embodiment, in which voltage is applied to the second word lines WL2 by the fourth row decoder 156 of a high voltage circuit, relative high voltage can be applied to the select gates 30*b* of the selecting transistors ST. Accordingly, in the present embodiment, the current flowing in the channels of the selecting transistors ST can be increased, and the write speed can be increased. On the other hand, when information is written into the memory cell transistors MT, the second protection transistors 152 are turned off-state, and accordingly, the second row decoder 16 of a low voltage circuit is electrically disconnected from the second word lines WL2. Thus, according to the present embodiment, when information is written into the memory cell transistors MT, the second row decoder 16 of a low voltage circuit can be prevented from being broken.

(Erasing Method)

The erasing method of the nonvolatile semiconductor memory device according to the present embodiment will be explained with reference to FIG. 34.

In the present embodiment, when information written in the memory cell array 10 is erased, the potentials of the respective parts are the same as the potentials of the respective parts in the erasing method of the nonvolatile semiconductor memory device according to the fifth embodiment.

Accordingly, in the nonvolatile semiconductor memory device according to the present embodiment, information written in the memory cell transistors MT can be erased in the same way as in the erasing method of the nonvolatile semiconductor memory device according to the fifth embodiment.

As described above, in the present embodiment, the second word lines WL2 are connected not only to the second row decoder 16 and also to the fourth row decoder 156 of a high voltage circuit, and when information is written into the memory cell transistors MT, the second row decoder 16 is electrically disconnected from the second word lines WL2, and voltage is applied to the second word lines WL2 by the fourth row decoder 156. Thus, according to the present embodiment, when information is written into the memory cell transistors MT, high voltage can be applied to the channels of the selecting transistors ST, and the current flowing in the selecting transistors ST can be increased, and the write speed can be increased. The second row decoder 16 is electrically disconnected from the second word lines WL2 when information is written into the memory cell transistors MT, whereby the breakage of the second row decoder 16 of a low voltage circuit can be prevented.

[g] Seventh Embodiment

Figure 35:
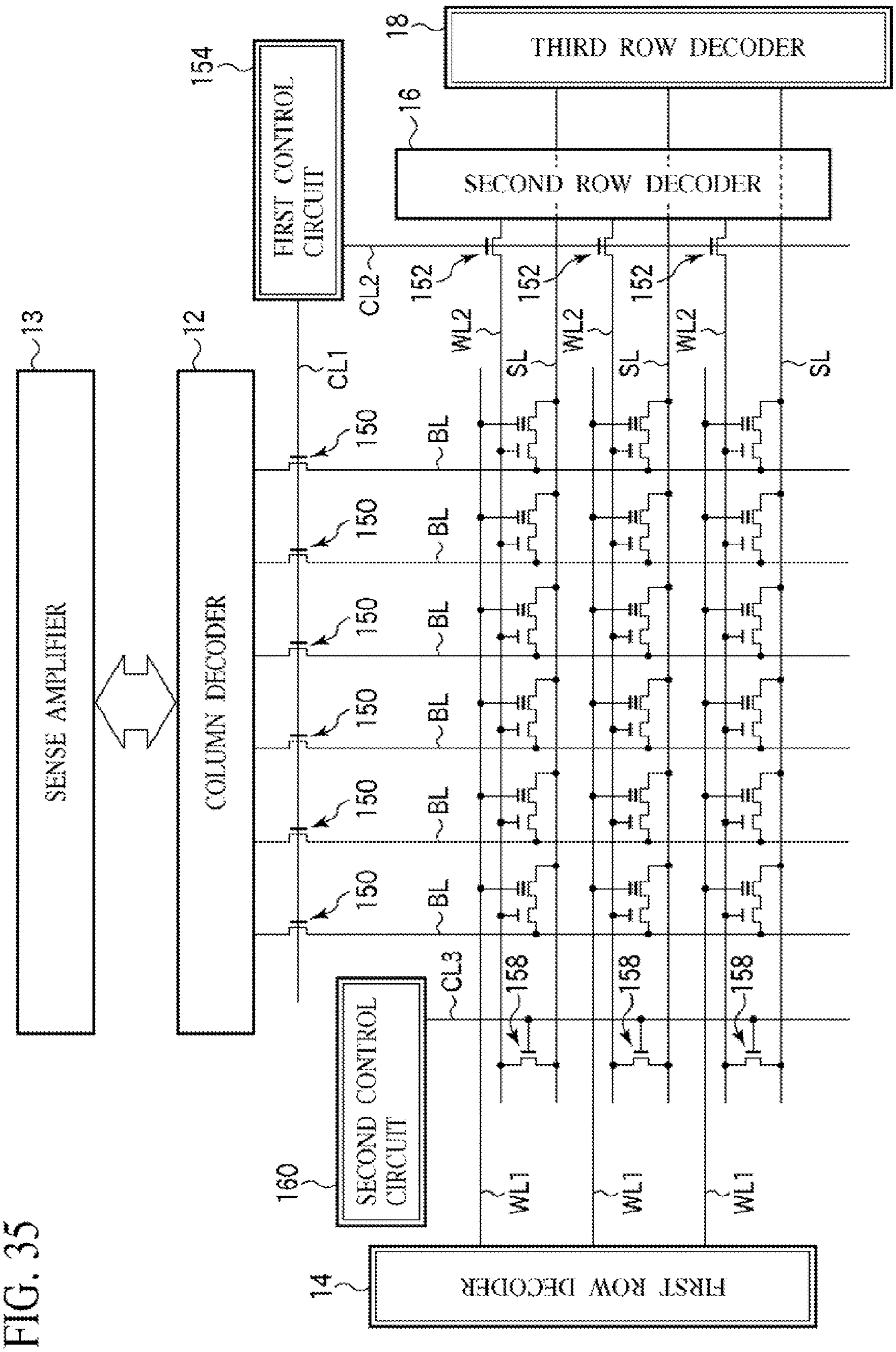
FIG. 35 is the circuit diagram of the nonvolatile semiconductor memory device according to a seventh embodiment.

The nonvolatile Semiconductor Memory Device according to a seventh embodiment, and the reading method, the writing method and the erasing method thereof will be explained with reference to FIG. 35 and FIG. 36. FIG. 35 is the circuit diagram of the nonvolatile semiconductor memory device according to the present embodiment. The same members of the present embodiment as those of the nonvolatile semiconductor memory device, etc. according to the first to the sixth embodiments illustrated in FIGS. 1 to 34 are represented by the same reference numbers not to repeat or to simplify their explanation.

(Nonvolatile Semiconductor Memory Device)

First, the nonvolatile semiconductor memory device according to the present embodiment will be explained with reference to FIG. 35.

The nonvolatile semiconductor memory device according to the present embodiment is characterized mainly in that bypass transistors 158 are provided respectively between the respective second word lines WL2 and the respective source lines SL, and when information is written into the memory cell transistors MT, the second row decoder 16 is electrically disconnected from the second word lines WL2, the source lines SL and the second word lines WL2 are electrically connected by the bypass transistor 158, and voltage is applied to the word lines WL2 by the third row decoder 18.

As illustrated in FIG. 35, the respective bit lines BL are connected to the column decoder 12 via the first protection transistors 150. In other words, one of the source and drain of the first protection transistors 150 is connected to the bit line BL, and the other of the source and the drain of the first protection transistors 150 is connected to the column decoder 12.

The gates of the respective first protection transistors 150 are connected to the first control circuit 154 via the first control line CL1. The respective first protection transistors 150 are controlled by the first control circuit 154.

The film thickness of the gate insulation film (not illustrated) of the first protection transistors 150 is set equal to the film thickness of the gate insulation film 28*b* of the selecting transistors ST. The film thickness of the gate insulation film of the first protection transistors 150 is set relatively thick as is the film thickness of the gate insulation film 28*b* of the selecting transistor ST so as to sufficiently ensure the withstand voltage of the first protection transistors 150.

The nonvolatile semiconductor memory device according to the present embodiment has been explained by means of the example that the film thickness of the gate insulation film (not illustrated) of the first protection transistors 150 is set equal to the film thickness of the gate insulation film 28*b* of the selecting transistors ST. However, the film thickness of the gate insulation film of the first protection transistors 150 may be set equal to the film thickness of the gate insulation film of the high withstand voltage transistors. The film thickness of the gate insulation film of the first protection transistors 150 can be set suitably corresponding to a working voltage.

The respective second word lines WL2 are connected to the second row decoder 16 via the second protection transistors 152. In other words, one of the source and the drain of the second protection transistors 152 is connected to the second word line WL2, and the other of the source and the drain of the second protection transistors 152 is connected to the second row decoder 16.

The gates of the respective second protection transistors 152 are connected to the second control circuit 154 via the second control line CL2. The respective second protection transistors 152 are controlled by the second control circuit 154.

The film thickness of the gate insulation film (not illustrated) of the second protection transistors 152 is set equal to the film thickness of the gate insulation film 28*b* of the selecting transistors ST. The film thickness of the gate insulation film of the first protection transistors 152 is set relatively thick as is the film thickness of the gate insulation film 28*b* of the selecting transistors ST so as sufficiently ensure the withstand voltage of the first protection transistors 152.

The nonvolatile semiconductor memory device according to the present embodiment has been explained here by means of the example that the film thickness of the gate insulation film (not illustrated) of the second protection transistors 152 is set equal to the film thickness of the gate insulation film 28*b* of the selecting transistors ST. However, the film thickness of the gate insulation film of the second protection transistors 152 may be set equal to the film thickness of the gate insulation film of the high withstand voltage transistors. The film thickness of the gate insulation film of the second protection transistors 152 can be set suitably corresponding to a working voltage.

The bypass transistors 158 is provided each between the second word line WL2 and the source line SL. In other words, one of the source and the drain of the bypass transistor 158 is connected to the second word line WL2, and the other of the source and the drain of the bypass transistor 158 is connected to the source line SL.

The gate of the respective bypass transistors 158 are connected to the second control circuit 160 via the third control line CL3. The respective bypass transistors 158 are controlled by the third control circuit 160.

The film thickness of the gate insulation film (not illustrated) of the bypass transistor 158 is set equal to the film thickness of the gate insulation film 28*b* of the selecting transistors ST. The film thickness of the gate insulation film of the bypass transistors 158 is set relatively thick as is the film thickness of the gate insulation film 28*b* of the selecting transistors ST so as to sufficiently ensure the withstand voltage of the bypass transistors 158.

The nonvolatile semiconductor memory device according to the present embodiment has been explained here by means of the example that the film thickness of the gate insulation film (not illustrated) of the bypass transistors 158 is set equal to the film thickness of the gate insulation film 28*b* of the selecting transistors ST. However, the film thickness of the gate insulation film of the bypass transistors 158 may be set equal to the film thickness of the gate insulation film of the high withstand voltage transistors. The film thickness of the gate insulation film of the bypass transistors 158 can be set suitably corresponding to a working voltage.

The second word lines WL2 are connected to the third row decoder 18 via the bypass transistors 158 in the present embodiment so as to apply high voltage to the second word lines WL2 when information is written into the memory cell transistors MT.

Thus, the nonvolatile semiconductor memory device according to the present embodiment is constituted.

The nonvolatile semiconductor memory device according to the present embodiment has been explained by means of the example that, as illustrated in FIG. 35, the memory cell transistors MT of the respective rows are respectively connected to the source lines SL associated with the respective rows. However, as will be detailed later with reference to FIG. 65, as in the nonvolatile semiconductor memory device according to an eleventh embodiment, the sources of the memory cell transistors MT present in rows adjacent to each other may be connected to a common source line SL. The sources of the memory cell transistors MT present in rows adjacent to each other are connected to a common source line SL, whereby the area of the memory cell array region 2 can be reduced, and the nonvolatile semiconductor memory device can be down sized. The number of the source lines SL to be controlled by the third row decoder 18 can be decreased, whereby the third row decoder 18 can be simplified.

(Operations of Nonvolatile Semiconductor Memory Device)

Then, the operation methods of the nonvolatile semiconductor memory device according to the present embodiment will be explained with reference to FIG. 36. FIG. 36 is a view illustrating the reading method, the writing method and the erasing method of the nonvolatile semiconductor memory device according to the present embodiment. In FIG. 36, the voltages in the parentheses are potentials of the non-selected lines. In FIG. 36, F indicates floating.

(Reading Method)

The reading method of the nonvolatile semiconductor memory device according to the present embodiment will be explained with reference to FIG. 36.

In the present embodiment, when information in the memory cell transistors MT is read, the potential of the first control line CL1 is set at 5 V, and the potential of the second control line CL2 is set at 5 V. That is, in the present embodiment, when information written in the memory cell transistors MT is read, the first protection transistors 150 and the second protection transistors 152 are turned on-state. When information written in the memory cell transistors MT is read, the potential of the third control line CL3 is set at 0 V. That is, in the present embodiment, when information written in the memory cell transistors MT is read, the bypass transistors 158 are turned off-state. The potential of the bit lines BL, the potential of the source lines SL, the potential of the first word lines WL1, the potential of the second word lines WL2 and the potential of the wells 26 are the same as the potentials of the respective parts in the reading method of the nonvolatile semiconductor memory device according to the first embodiment.

Because of the first protection transistors 150 and the second protection transistors 152 being on-state, the bit lines BL are electrically connected to the column decoder 12 as in the nonvolatile semiconductor memory device according to the first embodiment, and the second word lines WL2 are electrically connected to the second row decoder 16 as in the nonvolatile semiconductor memory device according to the first embodiment. Because of the bypass transistors 158 being off-state, the second word lines WL2 are electrically disconnected from the source line SL as in the nonvolatile semiconductor memory device according to the first embodiment.

Thus, in the nonvolatile semiconductor memory device according to the present embodiment, information written in the memory cell transistors MT can be read in the same way as in the reading method of the nonvolatile semiconductor memory device according to the first embodiment.

(Writing Method)

Next, the writing method of the nonvolatile semiconductor memory device according to the present embodiment will be explained with reference to FIG. 36.

When information is written into the memory cell transistors MT, the potentials of the respective parts are set as follows.

That is, the potential of the bit line BL connected to a memory cell MC to be selected is set at 0 V. On the other hand, the potential of the bit lines BL other than the selected bit line BL is set floating.

The potential of the source line SL connected to the memory cell MC to be selected is set at, e.g., 5 V (the first potential). On the other hand, the potential of the source lines SL other than the selected source line SL is set at 0 V or floating.

The potential of the first word line WL1 connected to the memory cell MC to be selected is set at, e.g., 9 V (the second potential). On the other hand, the potential of the word lines WL1 other than the selected first word line WL1 is set at 0 V or floating.

The bypass transistors 158 are turned on-state, whereby the source line SL and the second word line WL2 are electrically connected. Thus, the potential of the second word line WL2 connected to the memory cell MC to be selected becomes equal to the potential of the source line. The potential of the selected source line SL is set here at, e.g., 5 V (the first potential), and the potential of the selected second word line WL2 becomes, e.g., 5 V (the first potential). On the other hand, the potential of the second word line WL2 other than the selected second word line WL2 becomes 0 V (ground voltage).

The potential of the first control line CL1 is set at, e.g., 5 V. The potential of the second control line CL2 is set at, e.g., 0 V. That is, in the present embodiment, when information is written into the memory cell transistors MT, the first protection transistors 150 are turned on-state, and the second protection transistors 152 are turned off-state.

The potential of the third control line CL3 is set at, e.g., 6 V (the third potential). The potential (the third potential) of the third control line CL3 is set higher than the first potential, which is the potential of the selected source line SL. The potential (the third potential) of the third control line CL3 is set higher than the potential (the first potential) of the selected source line SL so as to surely make equal the potential of the second word lines WL2 and the potential of the source lines SL to each other.

The potential of all the wells 26 is set at 0 V.

In the present embodiment, in which when information is written into the memory cell transistors MT, voltage is applied to the second word lines WL2 by the third row decoder 18 of a high voltage circuit, relatively high voltage can be applied to the select gates 30*b* of the selecting transistors ST. Thus, according to the present embodiment, the current flowing in the channels of the selecting transistors ST can be increased, and the write speed can be increased. When information is written into the memory cell transistors MT, the second protection transistors 152 are turned off-state, and the second row decoder 16 of a low voltage circuit can be electrically disconnected from the second word lines WL2. Thus, according to the present embodiment, when information is written into the memory cell transistors MT, the breakage of the second row decoder 16 of a low voltage circuit can be prevented.

(Erasing Method)

First, the erasing method of the nonvolatile semiconductor memory device according to the present embodiment will be explained with reference to FIG. 36.

In the present embodiment, when information written in the memory cell array 10 is erased, the potential of the first control line CL1 is set at 0 V, and the potential of the second control line CL2 is set at 0 V. That is, in the present embodiment, when information written in the memory cell array 10 is erased, the first protection transistors 150 and the second protection transistors 152 are turned off-state. When the information written in the memory cell array 10 is erased, the third control line CL3 is set at 0 V. That is, when the information written in the memory cell array 10 is erased, the bypass transistors 158 are turned off-state. The potential of the bit lines BL, the potential of the source line SL, the potential of the first word lines WL1, the potential of the second word lines WL2 and the potential of the wells 26 are the same as the potentials of the respective parts in the erasing method of the nonvolatile semiconductor memory device according to the first embodiment.

Because of the first protection transistors 150 and the second protection transistors 152 being off-state, the bit lines BL are electrically disconnected from the column decoder 12, as in the fifth embodiment, and the second word lines WL2 are electrically disconnected from the second row decoder 16, as in the nonvolatile semiconductor memory device according to the fifth embodiment. Thus, in the nonvolatile semiconductor memory device according to the present embodiment, information written in the memory cell array 10 can be erased in the same way as in the erasing method of the nonvolatile semiconductor memory device according to the fifth embodiment.

[h] Eighth Embodiment

Figure 37:
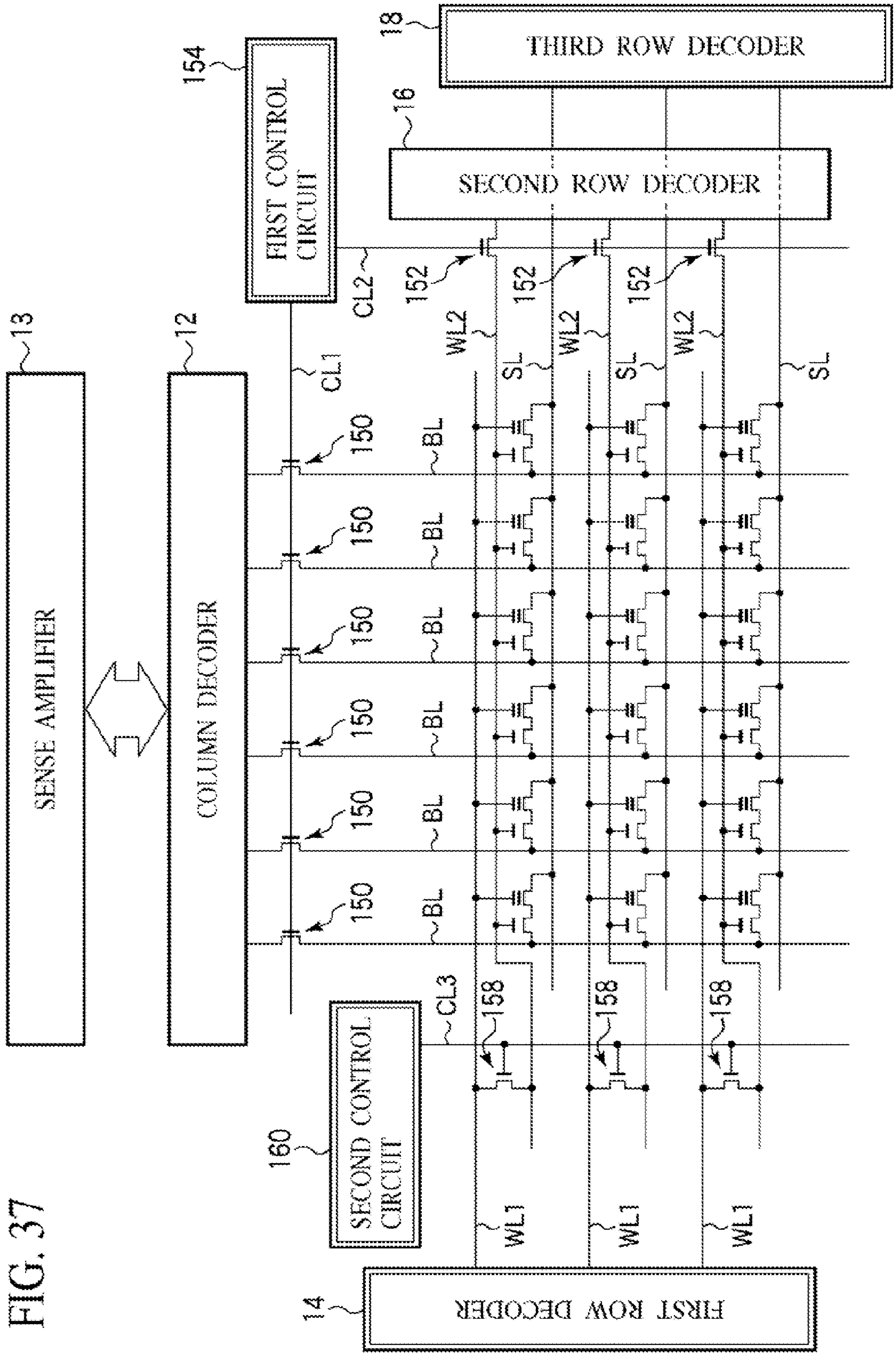
FIG. 37 is the circuit diagram of the nonvolatile semiconductor memory device according to an eighth embodiment.

The nonvolatile semiconductor memory device according to an eighth embodiment, the reading method, the writing method and the erasing method thereof will be explained with reference to FIG. 37 and FIG. 38. FIG. 37 is the circuit diagram of the nonvolatile semiconductor memory device according to the present embodiment. The same members of the present embodiment as those of the nonvolatile semiconductor memory device, etc. according to the first to the seventh embodiments are represented by the same reference numbers not to repeat or to simplify their explanation.

(Nonvolatile Semiconductor Memory Device)

First, the nonvolatile semiconductor memory device according to the present embodiment will be explained with reference to FIG. 37.

The nonvolatile semiconductor memory device according to the present embodiment is characterized mainly in that the bypass transistors 158 are provided respectively between the respective first word lines WL1 and the respective second word lines WL2, and when information is written into the memory cell transistors MT, the second row decoder 16 is electrically disconnected from the second word lines WL2, the first word lines WL1 and the second word lines WL2 are electrically connected by the bypass transistors 158, and voltage is applied to the first word lines WL1 and the second word lines WL2 by the first row decoder (voltage application circuit) 14.

As illustrated in FIG. 37, the respective bit lines BL are connected to the column decoder 12 via the first protection transistors 150. In other words, one of the source and the drain of the first protection transistors 150 is connected to the bit line BL, and the other of the source and the drain of the first protection transistors 150 is connected to the column decoder 12.

The gates of the respective first protection transistors 150 are connected to the first control circuit 154 via the first control line CL1. The respective first protection transistors 150 are controlled by the first control circuit 154.

The film thickness of the gate insulation film (not illustrated) of the first protection transistors 150 is set equal to the film thickness of the gate insulation film 28*b* of the selecting transistors ST. The film thickness of the gate insulation film of the first protection transistors 150 is set relatively thick, as is the film thickness of the gate insulation film 28*b* of the selecting transistors ST so as to sufficiently ensure the withstand voltage of the first protection transistors 150.

The nonvolatile semiconductor memory device according to the present embodiment has been explained here by means of the example that the film thickness of the gate insulation film (not illustrated) of the first protection transistors 150 is set equal to the film thickness of the gate insulation film 28*b* of the selecting transistors ST. However, the film thickness of the gate insulation film of the first protection transistor 150 may be set equal to the film thickness of the gate insulation film of the high withstand voltage transistors. The film thickness of the gate insulation film of the first protection transistors 150 can be set suitably corresponding to a working voltage.

The respective second word lines WL2 are connected to the second row decoder 16 via the second protection transistors 152. In other words, one of the source and the drain of the second protection transistors 152 is connected to the second word line WL2, and the other of the source and the drain of the second protection transistors 152 is connected to the second row decoder 16.

The respective second protection transistors 152 are connected to the second control circuit 154 via the second control line CL2. The respective second protection transistors 152 are controlled by the second control circuit 154.

The film thickness of the gate insulation film (not illustrated) of the second protection transistors 152 is set equal to the film thickness of the gate insulation film 28*b* of the selecting transistors ST. The film thickness of the gate insulation film of the first protection transistors 152 is set relatively thick as is the film thickness of the gate insulation film 28*b* of the selecting transistors ST so as to sufficiently ensure the withstand voltage of the first protection transistors 152.

The nonvolatile semiconductor memory device according to the present embodiment has been explained here by means of the example that the film thickness of the gate insulation film (not illustrated) of the second protection transistors 152 is set equal to the film thickness of the gate insulation film 28*b* of the selecting transistors ST. However, the film thickness of the gate insulation film of the second protection transistors 152 may be set equal to the film thickness of the gate insulation film of the high withstand voltage transistors. The film thickness of the gate insulation film of the second protection transistors 152 can be set suitably corresponding to a working voltage.

The bypass transistors 158 are provided respectively between the first word lines WL1 and the second word line WL2. In other words, the source and the drain of the bypass transistor 158 is connected to the first word line WL1, and the other of the source and the drain of the bypass transistor 158 is connected to the second word line WL2.

The gates of the respective bypass transistors 158 are connected to the second control circuit 160 via the third control line CL3. The respective bypass transistors 158 are controlled by the second control circuit 160.

The film thickness of the gate insulation film (not illustrated) of the bypass transistors 158 is set equal to the film thickness of the gate insulation film 28*b* of the selecting transistors ST. The film thickness of the gate insulation film of the bypass transistors 158 is set relatively thick, as is the film thickness of the gate insulation film 28*b* of the selecting transistors ST so as to sufficiently ensure the withstand voltage of the bypass transistors 158.

The nonvolatile semiconductor memory device according to the present embodiment has been explained here by means of the example that the film thickness of the gate insulation film (not illustrated) of the bypass transistors 158 is set equal to the film thickness of the gate insulation film 28*b* of the selecting transistors ST. However, the film thickness of the gate insulation film of the bypass transistors 158 may be set equal to the film thickness of the gate insulation film of the high withstand voltage transistors. The film thickness of the gate insulation film of the bypass transistors 158 can be set suitably corresponding to a working voltage.

In the present embodiment, the first word lines WL1 are connected to the second word lines WL2 via the bypass transistors 158 so that when information is written into the memory cell transistors MT, high voltage is applied to the second word lines WL2.

Thus the nonvolatile semiconductor memory device according to the present embodiment is constituted.

The nonvolatile semiconductor memory device according to the present embodiment has been explained here by means of the example that, as illustrated in FIG. 37, the memory cell transistors MT of the respective rows are connected to the source lines SL associated with the respective rows. The sources of the memory cell transistors MT present in the rows adjacent to each other may be connected to the common source line SL, as in the nonvolatile semiconductor memory device according to an eleventh embodiment which will be detailed later with reference to FIG. 65. The sources of the memory cell transistors MT present in rows adjacent to each other are connected by the common source line SL, whereby the area of the memory cell array region 2 can be reduced, and the nonvolatile semiconductor memory device can be downsized. The number of the source lines SL to be controlled by the third row decoder 18 can be decreased, which can simplify the third row decoder 18.

(Operations of the Nonvolatile Semiconductor Memory Device)

Then, the operation methods of the nonvolatile semiconductor memory device according to the present embodiment will be explained with reference to FIG. 38. FIG. 38 is a view illustrating the reading method, the writing method and the erasing method of the nonvolatile semiconductor memory device according to the present embodiment. In FIG. 38, the voltages in the parentheses are the potential of the non-selected lines. In FIG. 38, F indicates floating.

(Reading Method)

The reading method of the nonvolatile semiconductor memory device according to the present embodiment will be explained with reference to FIG. 38.

In the present embodiment, when information written in the memory cell transistors MT is read, the potential of the first control line CL1 is set at 5 V, and the potential of the second control line CL2 is set at 5 V. That is, in the present embodiment, when information written in the memory cell transistors MT is read, the first protection transistors 150 and the second protection transistors 152 are turned on-state.

When information written in the memory cell transistors MT is read, the potential of the third control line CL3 is set at 0 V. That is, in the present embodiment, when information written in the memory cell transistors MT is read, the bypass transistors 158 are turned off-state.

The potential of the bit lines BL, the potential of the source lines SL, the potential of the first word lines WL1, the potential of the second word lines WL2 and the potential of the wells 26 are the same as the potentials of the respective parts in the reading method of the nonvolatile semiconductor memory device according to the first embodiment.

Because of the first protection transistors 150 and the second protection transistors 152 being on-state, the bit lines BL are electrically connected to the column decoder 12, as in the nonvolatile semiconductor memory device according to the first embodiment, and the second word lines WL2 are electrically connected to the second row decoder 16, as in the nonvolatile semiconductor memory device according to the first embodiment. Because of the bypass transistors 158 being off-state, the second word lines WL2 are electrically disconnected from the source lines SL, as in the nonvolatile semiconductor memory device according to the first embodiment. Thus, in the nonvolatile semiconductor memory device according to the present embodiment, information written in the memory cell transistors MT can be read in the same way as in the reading method of the nonvolatile semiconductor memory device according to the first embodiment.

(Writing Method)

Next, the writing method of the nonvolatile semiconductor memory device according to the present embodiment will be explained with reference to FIG. 38.

When information is written into the memory cell transistors MT, the potentials of the respective parts are set as follows.

That is, the potential of the bit line BL connected to a memory cell MC to be selected is set at 0 V. On the other hand, the potential of the bit lines BL other than the selected bit line BL is floating.

The potential of the source line SL connected to the memory cell MC to be selected is set at, e.g., 5 V (the first potential). On the other hand, the potential of the source lines SL other than the source line SL to be selected is set at 0 V or floating.

The potential of the word line WL1 connected to the memory cell MC to be selected is set at, e.g., 9 V (the second potential). On the other hand, the potential of the first word lines WL1 other than the selected first word line WL1 is set at 0 V.

The bypass transistors 158 are turned on-state, whereby the first word lines WL1 and the second word lines WL2 are electrically connected. Thus, the potential of the second word line WL2 connected to the memory cell MC to be selected becomes equal to the potential of the first word line WL1. The potential of the selected word line WL1 is, e.g., 9 V (the second potential) here, and the potential of the selected second word line WL2 also becomes, e.g., 9 V (the second potential). The potential of the second word lines WL2 other than the selected second word line WL2 becomes 0 V (ground voltage).

The potential of the first control line CL1 is set at, e.g., 5 V. The potential of the second control line CL2 is set at, e.g., 0 V. That is, in the present embodiment, when information is written into the memory cell transistors MT, the first protection transistors 150 are turned on-state, and the second protection transistors 152 are turned off-state.

The potential of the third control line CL3 is set at, e.g., 10 V (the third potential). The potential (the third potential) of the third control line CL3 is set higher than the second potential which is the potential of the selected first word line WL1 and the selected second word line WL2. The potential (the third potential) of the third control line CL3 is set higher than the potential (the second potential) of the selected first word line WL1 and the selected second word line WL2 so as to set on-state the bypass transistors 158.

The potential of the wells 26 is 0 V.

In the present embodiment, when information is written into the memory cell transistors MT, voltage is applied to the first word lines WL1 and the second word lines WL2 by the first row decoder 14 of a high voltage circuit, whereby relatively high voltage can be applied to the select gates 30*b* of the selecting transistors ST. Thus, according to the present embodiment, the current flowing in the channels of the selecting transistors ST can be increased, and the write speed can be increased. When information is written into the memory cell transistors MT, the second protection transistors 152 are turned off-state, whereby the second row decoder 16 of a low voltage circuit is electrically disconnected from the second word lines WL2. Thus, according to the present embodiment, when information is written into the memory cell transistors MT, the second row decoder 16 of a low voltage circuit is prevented from being broken.

(Erasing Method)

The erasing method of the nonvolatile semiconductor memory device according to the present embodiment will be explained with reference to FIG. 38.

In the present embodiment, when information written in the memory cell array 10 is erased, the potential of the first control line CL1 is set at 0 V, and the potential of the second control line CL2 is set at 0 V. That is, in the present embodiment, when information written in the memory cell array 10 is erased, the first protection transistors 150 and the second protection transistors 152 are turned off-state. When information written in the memory cell array 10 is erased, the potential of the third control line CL3 is set at 0 V. That is, in the present embodiment, when information written in the memory cell array 10 is erased, the bypass transistors 158 are turned off-state. The potential of the bit lines BL, the potential of the source lines SL, the potential of the first word lines WL1, the potential of the second word lines WL2 and the potential of the wells 26 are the same as the potential of the respective parts in the erasing method of the nonvolatile semiconductor memory device according to the first embodiment.

Because of the first protection transistors 150 and the second protection transistors 152 being off-state, the bit lines are electrically disconnected from the column decoder 12, as in the fifth embodiment, and the second word lines WL2 are electrically disconnected from the second row decoder 16, as in the nonvolatile semiconductor memory device according to the fifth embodiment. Thus, in the nonvolatile semiconductor memory device according to the present embodiment, information written in the memory cell array 10 can be erased in the same way as in the erasing method of the nonvolatile semiconductor memory device according to the fifth embodiment.

[i] Ninth Embodiment

Figure 39:
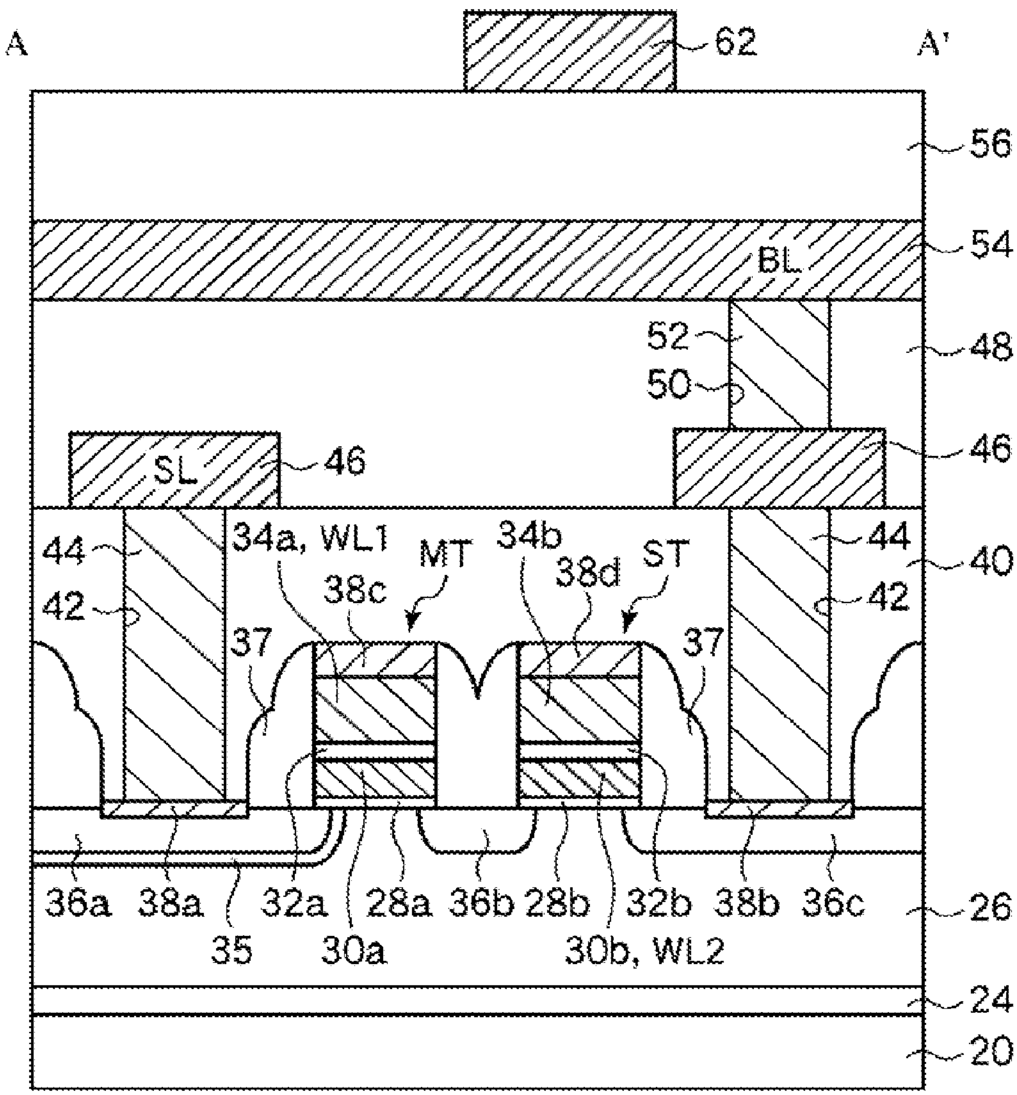
FIG. 39 is a sectional view of the nonvolatile semiconductor memory device according to a ninth embodiment.

The nonvolatile semiconductor memory device according to a ninth embodiment and its writing method will be explained with reference to FIG. 39 and FIG. 40. FIG. 39 is a sectional view of the nonvolatile semiconductor memory device according to the present embodiment. FIG. 40 is a view illustrating the reading method, the writing method and the erasing method of the nonvolatile semiconductor memory device according to the present embodiment. In FIG. 40, the voltages in the parentheses are the potential of the non-selected lines. In FIG. 40, F indicates floating. The same members of the present embodiment as those of the nonvolatile semiconductor memory device, etc. according to the first to the eighth embodiments are represented by the same reference numbers not to repeat or to simplify their explanation.

(Nonvolatile Semiconductor Memory Device)

First, the nonvolatile semiconductor memory device according to the present embodiment will be explained with reference to FIG. 39.

The nonvolatile semiconductor memory device according to the present embodiment is characterized mainly in that a P-type dopant impurity is implanted in a region where an N-type source diffused layer 36*a* is formed, whereby a P-type impurity diffused layer 35 is formed.

As illustrated in FIG. 39, in the region containing the region where the N-type source diffused layer 36*a* is formed, the P-type dopant impurity is implanted. Thus, the P-type impurity diffused layer 35 is formed in the region containing the region where the N-type source diffused layer 36*a* is formed.

In the present embodiment, the P-type impurity diffused layer 35 is formed in the region containing the region where the N-type source diffused layer 36*a* is formed for the following reason.

That is, the P-type impurity diffused layer 35 formed in the region containing the region where the N-type source diffused layer 36*a* is formed suppresses the expansion of the depletion layer from the N-type source diffused layer 36*a*. The expansion of the depletion layer from the N-type source diffused layer 36*a* is suppressed, whereby the electric field intensity near the N-type source diffused layer 36*a* is intensified, and the carriers can be abruptly accelerated near the N-type source diffused layer 36*a*. In the present embodiment, the carriers can be abruptly accelerated, whereby the write speed of information into the memory cell transistors MT can be increased.

The P-type dopant impurity is not implanted in the regions where the source/drain diffused layer 36*b*, 36*c* of the selecting transistor ST are formed, whereby the selecting transistor ST is never influenced by the P-type dopant impurity. Thus, the threshold voltage of the selecting transistor ST never rises, and the selecting transistor ST is operative at high speed.

(Reading Method)

The reading method of the nonvolatile semiconductor memory device according to the present embodiment is characterized mainly in that a voltage $V_r$ which is higher than a power supply voltage $V_{CC}$ of the logic circuit is applied to the first word lines WL1.

In the present embodiment, because of the P-type impurity diffused layer 35 is formed in the region which contains the N-type source diffused layer 36*a* of the memory cell transistor MT, the threshold voltage of the memory cell transistor MT is relatively high. Accordingly, when the voltage $V_{CC}$ which is relatively low is applied to the first word line WL1, there is a risk that sufficient current might not flow between the source and the drain of the memory cell transistor MT.

Thus, in the present embodiment, when information written in the memory cell transistors MT is read, the voltage $V_r$ which is higher than the power supply voltage $V_{CC}$ of the logic circuit is applied to the first word lines WL1. The voltage $V_r$ which is relative high is applied to the first word lines WL1, whereby sufficient current can be flowed between the sources and the drains of the memory cell transistors MT, and information written in the memory cell transistors MT can be stably read.

[j] Tenth Embodiment

The nonvolatile semiconductor memory device according to a tenth embodiment, the reading method, the writing method and the erasing method thereof, and the method for manufacturing the nonvolatile semiconductor memory device will be explained with reference to FIGS. 41 to 64. The same members of the present embodiment as those of the nonvolatile semiconductor memory device, etc. according to the first to the ninth embodiments are represented by the same reference numbers not to repeat or to simplify their explanation.

(Nonvolatile Semiconductor Memory Device)

Figure 41:
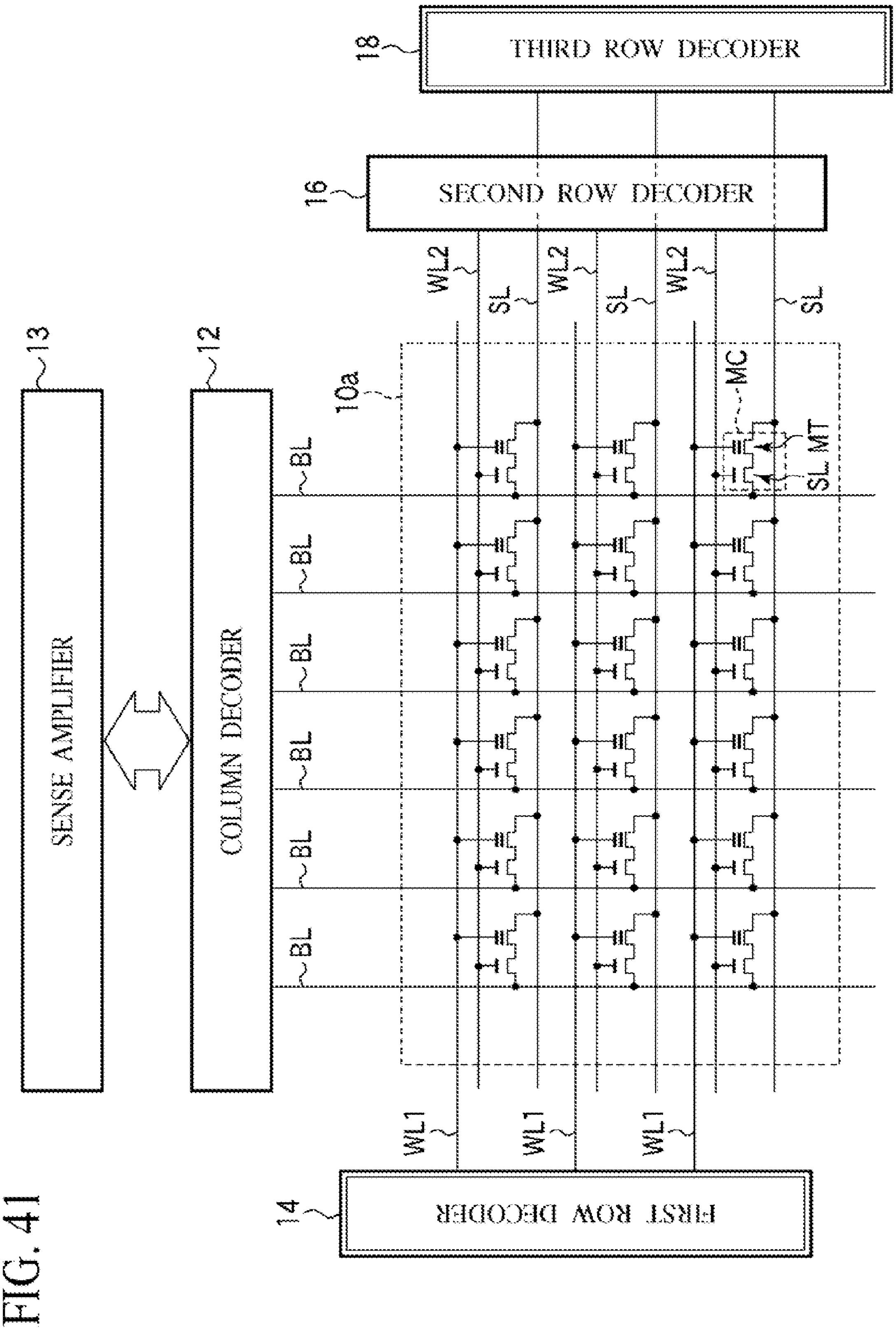
FIG. 41 is the circuit diagram of the nonvolatile semiconductor memory device according to a tenth embodiment.
Figure 42:
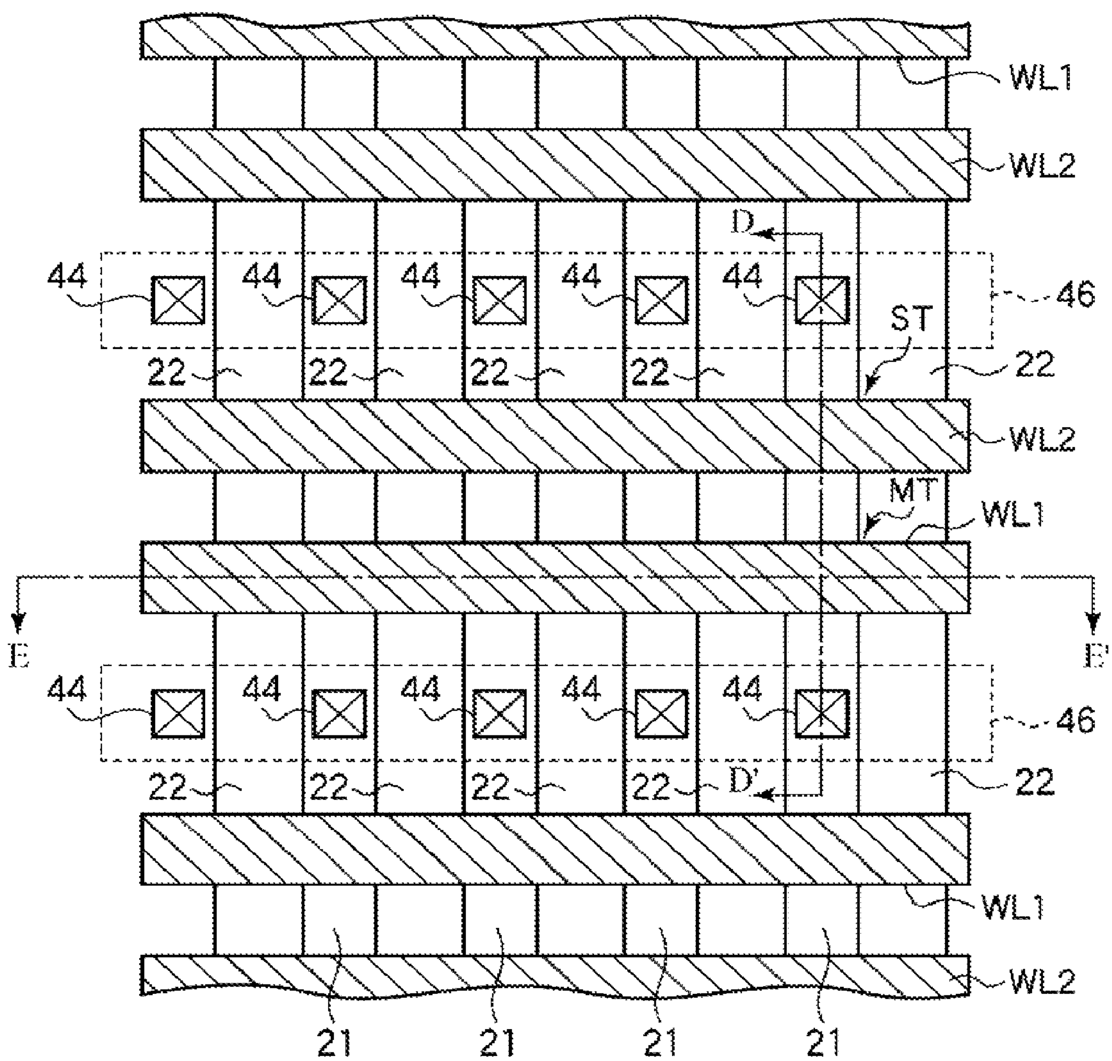
FIG. 42 is a plan view of the nonvolatile semiconductor memory device according to the tenth embodiment, which illustrate the memory cell array.
Figure 43:
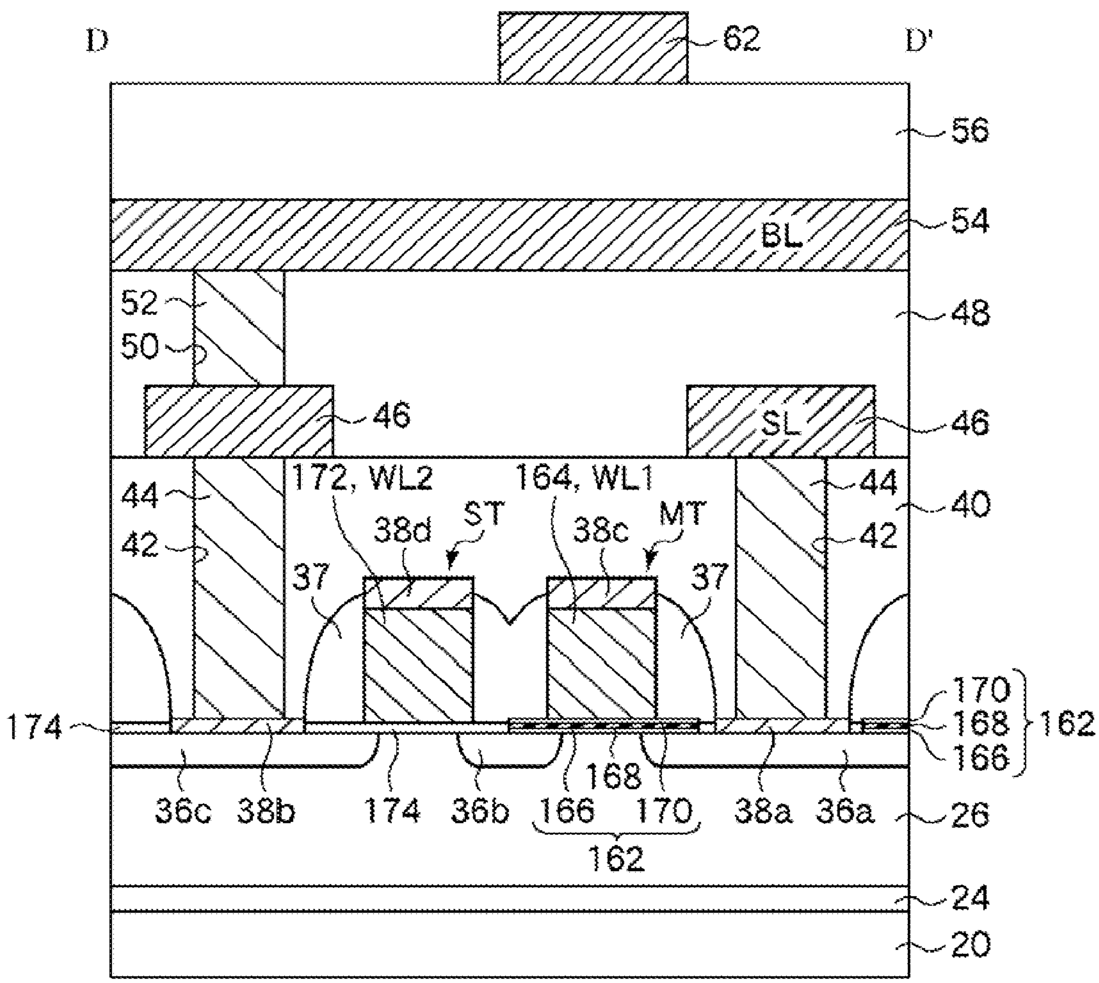
FIG. 43 is the sectional view along the D-D' line of FIG. 42.

First, the nonvolatile semiconductor memory device according to the present embodiment will be explained with reference to FIGS. 41 to 43. FIG. 41 is the circuit diagram of the nonvolatile semiconductor memory device according to the present embodiment.

The circuit diagram of the nonvolatile semiconductor memory device according to the present embodiment is the same as the circuit diagram of the nonvolatile semiconductor memory device described above with reference to FIG. 1.

That is, as illustrated in FIG. 41, the nonvolatile semiconductor memory device according to the present embodiment comprises memory cells MC each including a selecting transistor ST and a memory cell transistor MT connected to a selecting transistor ST. The sources of the selecting transistors ST are connected to the drains of the memory cell transistors MT. More specifically, the source of the selecting transistor ST and the drain of the memory cell transistor MT are integrally formed of one impurity diffused layer.

A plurality of the memory cells MC are arranged in a matrix. The memory cell array 10 is formed of the plural memory cells MC arranged in the matrix.

The drains of a plurality of the selecting transistors ST present in one and the same column are commonly connected to a bit line BL.

The control gates of a plurality of the memory cell transistors MT present in one and the same row are commonly connected by the first word line WL1.

The select gates of a plurality of the selecting transistors ST present in one and the same row are commonly connected by the second word line WL2.

The sources of a plurality of the memory cell transistors MT present in one and the same row are commonly connected by a source line SL.

The bit lines BL commonly connecting the selecting transistors ST are connected to the column decoder 12. The column decoder 12 is for controlling the potential of the plural bit lines BL commonly connecting the drains of the selecting transistors ST. The sense amplifier 13 for detecting current flowing in the bit lines BL is connected to the column decoder 12. The column decoder 12 is formed of a low voltage circuit, which is operative at relatively low voltage. The low voltage circuit is a circuit whose withstand voltage is relatively low but is operative at high speed. The gate insulation film (not illustrated) of the transistors (not illustrated) of the low voltage circuit is formed relatively thin. Accordingly, the transistors of the low voltage circuit used in the column decoder 12 are operative at relative high speed. The column decoder 12 is formed of a low voltage circuit in the present embodiment, because it is not necessary to apply high voltage to the drains of the selecting transistors ST, but it is preferably to operate the selecting transistors ST at high speed when information written in the memory cell transistors MT is read. In the present embodiment, in which the column decoder 12 is formed of a low voltage circuit, the selecting transistors ST can operate at relatively high speed, and resultantly the nonvolatile semiconductor memory device can operate at high read speed.

The plural first word lines WL1 commonly connecting the control gates of the memory cell transistors MT are connected to the first row decoder (voltage application circuit) 14. The first row decoder 14 is for controlling the potentials of the respective plural first word lines WL1 commonly connecting the control gates of the memory cell transistors MT. The first row decoder 14 is formed of a high voltage circuit (high withstand voltage circuit). The high voltage circuit is a circuit whose operation speed is relatively slow but whose withstand voltage is relatively high. The gate insulation film (not illustrated) of the transistors of the high voltage circuit is formed relatively thick so as to ensure sufficient withstand voltage. Accordingly, the transistors of the high voltage circuit have operation speed which is slow in comparison with the operation speed of the transistors of the low voltage circuit. The first row decoder 14 comprises a high voltage circuit in the present embodiment so that when information is written into the memory cell transistors MT or when information written in the memory cell transistors MT is erased, high voltage is applied to the first word lines WL1. When information written in the memory cell transistors MT is read, the power supply voltage $V_{CC}$ is constantly applied to the first word lines WL1. Thus, the relative slow operation speed of the high voltage circuit used in the first row decoder 14 causes no special problem.

The second word lines WL2 commonly connecting the select gates of the selecting transistors ST are connected to the second row decoder 16. The second row decoder 16 is for controlling the potential of the plural second word lines WL2 commonly connecting the select gates of the selecting transistors ST. The second row decoder 16 is formed of a low voltage circuit (low withstand voltage circuit). The second row decoder 16 is formed of a low voltage circuit in the present embodiment because it is not necessary to apply high voltage to the select gates of the selecting transistors ST, but it is important to operate the selecting transistors ST at high speed. In the present embodiment, in which the second row decoder 16 is formed of a low voltage circuit, the selecting transistors ST are operative at relatively high speed, and resultantly, the nonvolatile semiconductor memory device can operate at high read speed.

The plural source lines SL commonly connecting the sources of the memory cell transistors MT are connected to the third row decoder 18. The third row decoder 18 is for controlling the potential of the plural source lines SL commonly connecting the sources of the memory cell transistors MT. The third row decoder 18 is formed of a high voltage circuit (high withstand voltage circuit). The third row decoder 18 is formed of a high voltage circuit in the present embodiment because the high voltage is applied to the source lines SL when information is written into the memory cell transistors MT. When information written in the memory cell transistors MT is read, as will be described, the source lines SL are constantly grounded. Thus, the relatively slow operation speed of the third row decoder 18 makes no special problem.

Then, the structure of the memory cell array of the nonvolatile semiconductor memory device according to the present embodiment will be explained with reference to FIG. 42 and FIG. 43. FIG. 42 is a plan view of the memory cell array of the nonvolatile semiconductor memory device according to the present embodiment. FIG. 43 is the sectional view along the D-D' line in FIG. 42.

On a semiconductor substrate 20, device isolation regions 22 for defining device regions 21 are formed.

In the semiconductor substrate 20 with the device isolation regions 22 formed on, an N-type buried diffused layer 24 is formed. The upper part of the N-type buried diffused layer 24 is P-type wells 26.

On the semiconductor substrate 20, gate electrodes 164 are formed with charge storage layers 162 of, e.g., ONO film formed therebetween. The ONO film forming the charge storage layers 162 is formed of the first silicon oxide film 166, a silicon nitride film 168 formed on the first silicon oxide film 166, and the second silicon oxide film 170 formed on the silicon nitride film 168.

The gate electrodes 164 of the memory cell transistors MT present in one and the same row are commonly connected. In other words, the first word lines WL1 commonly connecting the gate electrodes 164 are formed on the semiconductor substrate 20 with the charge storage layer 162 formed therebetween.

On the semiconductor substrate 20, the gate electrodes 172 of the selecting transistors ST are formed in parallel with the gate electrodes 164 of the memory cell transistors MT. The gate electrodes 172 of the selecting transistors ST present in one and the same row are commonly connected. In other words, the second word lines WL2 commonly connecting the gate electrodes 172 are formed with a gate insulation film 174 formed therebetween on the semiconductor substrate 20. The gate insulation film 174 of the selecting transistors ST is, e.g., about 5-7 nm. That is, the film thickness of the gate insulation film 174 of the selecting transistors ST is set relatively thin.

In the nonvolatile semiconductor memory device according the first to the ninth embodiment, the gate insulation film 28*b* of the selecting transistors ST and the tunnel insulation film 28*a* of the memory cell transistors MT are formed one and the same insulation film, and the film thickness of the gate insulation film 28*b* of the selecting transistors ST and the film thickness of the tunnel insulation film 28*a* of the memory cell transistors MT are equal to each other. Accordingly, in the first to the ninth embodiments, the current flowing in the selecting transistors ST is not necessarily large enough, and the operation speed of the selecting transistors ST is not necessarily high enough.

In the present embodiment, however, the film thickness of the gate insulation film 174 of the selecting transistors ST is set relatively thin, whereby the current flowing in the channels of the selecting transistors ST can be increased, and the operation speed of the selecting transistors ST can be increased.

In the semiconductor substrate 20 on both sides of the gate electrode 164 of memory cell transistor MT and in the semiconductor substrate 20 on both sides of the gate electrode 164 of selecting transistor ST, N-type impurity diffused layers 36*a*, 36*b*, 36*c* are formed.

The impurity diffused layer 36*b* forming the drain of the memory cell transistor MT, and the impurity diffused layer 36*b* forming the source of the selecting transistor ST are one and the same impurity diffused layer 36*b*.

On the side wall of the gate electrode 164 of the memory cell transistor MT, a sidewall insulation film 37 is formed.

On the side wall of the gate electrode 172 of the selecting transistor ST, the sidewall insulation film 37 is formed.

On the source region 36*a* of the memory cell transistor MT, on the drain region 38*c* of the selecting transistor ST, in the upper part of the gate electrode 164 of the memory cell transistor MT and in the upper part of the gate electrode 172 of the selecting transistor ST, silicide layers 38*a*-38*d* of, e.g., cobalt silicide are respectively formed. The silicide layer 38*a* on the source electrode 36*a* functions as the source electrode. The silicide layer 38*c* on the drain electrode 36*c* functions as the drain electrode.

Thus, the memory cell transistors MT each including the charge storage layer 162, the gate electrode 164 and the source/drain diffused layers 36*a*, 36*b* are constituted.

Thus, the selecting transistors ST each including the gate electrode 172 and the source/drain diffused layers 36*b*, 36*c* are constituted. The selecting transistors ST are NMOS transistors. In the present embodiment, NMOS transistors, whose operation speed is higher than PMOS transistors, are used as the selecting transistors ST, which can contribute to the operation speed increase.

On the semiconductor substrate 20 with the memory cell transistors MT and the selecting transistors ST formed on, an inter-layer insulation film 40 of a silicon nitride film (not illustrated) and a silicon oxide film (not illustrated) is formed.

In the inter-layer insulation film 40, contact holes 42 are formed respectively down to the source electrode 38*a* and the drain electrode 38*b*.

In the contact holes 42, conductor plugs 44 of, e.g., tungsten are buried.

On the inter-layer insulation film 40 with the conductor plugs 44 buried in, interconnections (the first metal interconnection layer) 46 is formed.

On the inter-layer insulation film 40 with the interconnections 46 formed on, an inter-layer insulation film 48 is formed.

In the inter-layer insulation film 48, a contact hole 50 is formed down to the interconnection 46.

In the contact hole 50, a conductor plug 52 of, e.g., tungsten is buried.

On the inter-layer insulation film 48 with the conductor plug 52 buried in, an interconnection (the second metal interconnection layer) 54 is formed.

On the inter-layer insulation film 48 with the interconnection 54 formed on, an inter-layer insulation film 56 is formed.

In the inter-layer insulation film 56, a contact hole (not illustrated) is formed down to the interconnection 54.

In the contact hole (not illustrated), a conductor plug (not illustrated) of, e.g., tungsten is formed.

On the inter-layer insulation film 56 with the conductor plug (not illustrated) buried in, an interconnection (the third metal interconnection layer) 62 is formed.

Thus, the memory cell array 10*a* (see FIG. 41) of the nonvolatile semiconductor memory device according to the present embodiment is constituted.

The nonvolatile semiconductor memory device according to the present embodiment has been explained here by means of the example that, as illustrated in FIG. 41, the memory cell transistors of the respective rows are connected to the source lines SL associated with the respective rows. However, the sources of the memory cell transistors MT present in rows adjacent to each other may be connected by the common source line SL, as in the nonvolatile semiconductor memory device according to an eleventh embodiment which will be detailed later with reference to FIG. 65. The plan view of FIG. 42 correspond to the case that the sources of the memory cells MT present in rows adjacent to each other are connected by the common source line SL. The sources of the memory cell transistors MT present in rows adjacent to each other are connected by the common source line SL, whereby the area of the memory cell array region 2 can be reduced, and the nonvolatile semiconductor memory device can be downsized. The number of the source lines SL to be controlled by the third row decoder 18 can be decreased, which simplifies the third row decoder 18.

(Operations of Nonvolatile Semiconductor Memory Device)

Next, the operation methods of the nonvolatile semiconductor memory device according to the present embodiment will be explained with reference to FIG. 44. FIG. 44 is a view illustrating the reading method, the writing method and the erasing method of the nonvolatile semiconductor memory device according to the present embodiment. In FIG. 44, the voltages in the parentheses are the potentials of the non-selected lines.

(Reading Method)

First, the reading method of the nonvolatile semiconductor memory device according to the present embodiment will be explained with reference to FIG. 44.

When information written in the memory cell transistors MT is read, the potentials of the respective parts are set as follows. That is, the potential of the bit line BL connected to a memory cell MC to be selected is set at $V_{CC}$ (the first potential). The potential of the bit lines BL other than the selected bit line BL is set at 0 V. The potential of all the source lines SL is set at 0 V. The potential of the first word lines WL1 on standby for read is set constantly $V_{CC}$. The potential of the second word line WL2 connected to the memory cell MC to be selected is set at $V_{CC}$. The potential of the second word lines WL2 other than the selected second word line WL2 is set at 0 V. The potentials of the wells 26 is set at 0 V. In the present embodiment, the potential of the source lines SL on standby for read is set at 0 V, and the potential of the first word lines WL1 on standby for read is constantly set at $V_{CC}$, whereby information written in the memory cell transistors MT can be read only by controlling the potential of the bit lines BL and the potential of the second word lines WL2. In the present embodiment, in which the column decoder 12 for controlling the potential of the bit lines BL comprises a low voltage circuit as described above, whereby the bit lines BL can be controlled at high speed. The second row decoder 16 for controlling the potential of the second word lines WL2 is formed of a low voltage circuit as described above, whereby the second word lines WL2 can be controlled at high speed. Furthermore, the gate insulation film 174 of the selecting transistors ST is set relatively thin, whereby the selecting transistors ST are operative at high speed. Thus, according to the present embodiment, information written in the memory cell transistors MT can be read at high speed.

When information is written into the memory cell transistor MT, i.e., information in the memory cell transistor MT is "0", charges are stored in the charge storage layer 162 of the memory cell transistor MT. In this case, no current flows between the source diffused layer 36*a* of the memory cell transistor MT and the drain diffused layer 36*c* of the selecting transistor ST, and no current flows in the selected bit line BL. In this case, the information in the memory cell transistors MT is judged to be "0".

On the other hand, when information written in the memory cell transistor has been erased, i.e., the information of the memory cell is "1", charges are not stored in the charge storage layer 162 of the memory cell transistor MT. In this case, current flows between the source diffused layer 36*a* of the memory cell transistor MT and the drain diffused layer 36*c* of the selecting transistor ST, and current flows in the selected bit line BL. The current flows in the selected bit line BL is detected by the sense amplifier 13. In this case, the information in the memory cell transistor MT is judged to be "1"

(Writing Method)

Figure 45:
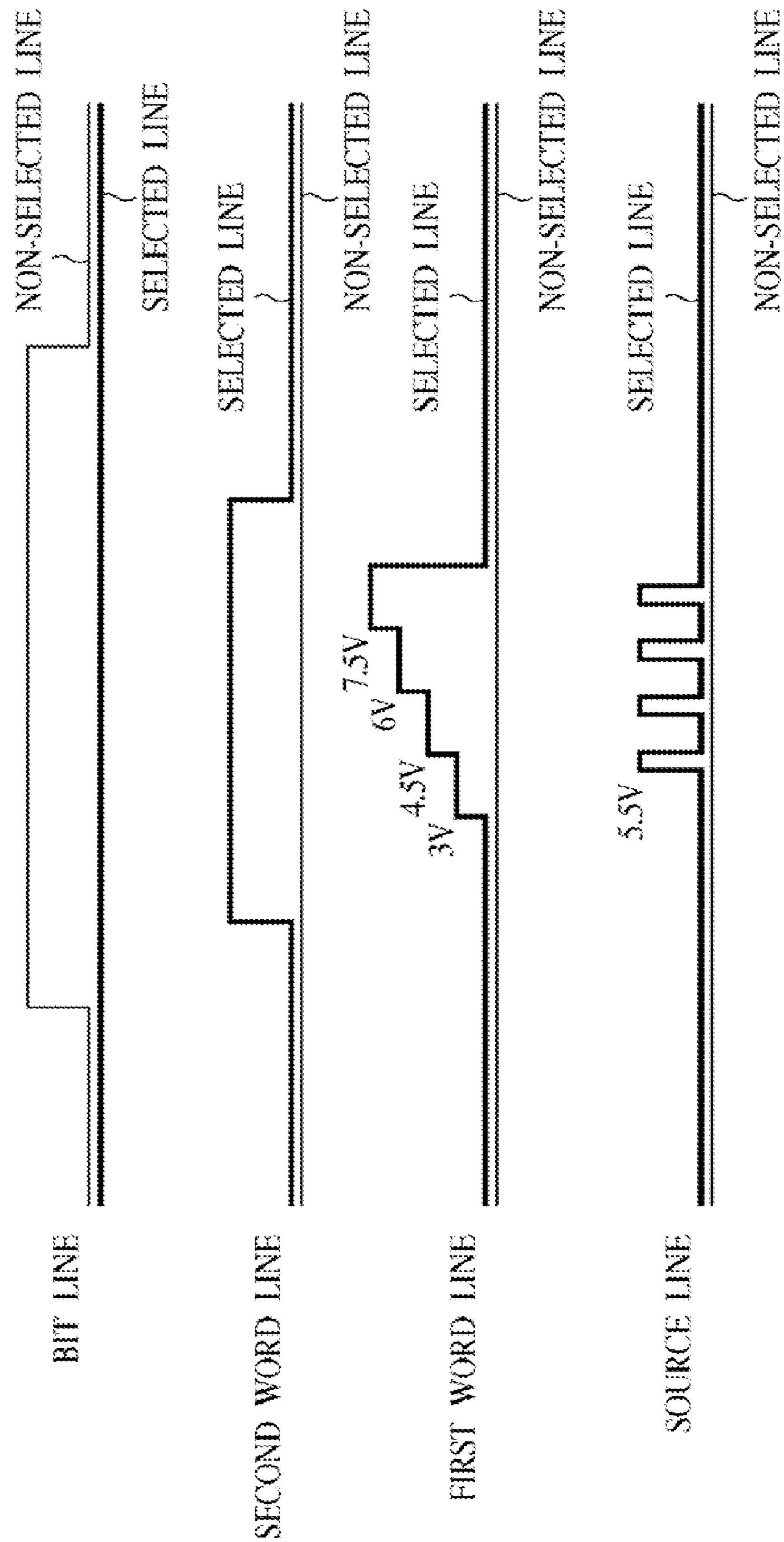
FIG. 45 is the time chart of the writing method of the nonvolatile semiconductor memory device according to the tenth embodiment.

Next, the writing method of the nonvolatile semiconductor memory device according to the present embodiment will be explained with reference to FIGS. 44 to 48. FIG. 45 is the time chart of the writing method of the nonvolatile semiconductor memory device according to the present embodiment.

When information is written into the memory cell transistor MT, the potentials of the respective parts are set as follows.

That is, the potential of the bit line BL connected to the memory cell MC to be selected is set at 0 V (ground voltage). On the other hand, the potential of the bit lines BL other than the selected bit line BL is set at $V_{CC}$.

To the source line SL connected to the memory cell MC to be selected, as illustrated in FIG. 45, the second voltage is applied in pulses. The pulsated second voltage to be applied to the source line SL is, e.g., 5.5 V. On the other hand, the potential of the source lines SL other than the selected source line SL is set at 0 V (ground voltage).

To the first word line WL1 connected to the memory cell MC to be selected, as illustrated in FIG. 45, the first voltage $V_{step}$ which gradually rises is applied. On the other hand, the potential of the first word lines WL1 other than the selected first word line WL1 is set at 0 V (ground voltage).

The potential of the second word lines WL2 connected to the memory cell MC to be selected is set at $V_{CC}$ (the first potential). On the other hand, the potential of the second word lines WL2 other than the selected second word line WL2 is set at 0 V (ground voltage).

The potential of all the wells is 0 V (ground voltage).

In the present embodiment, the voltage is applied in pulses to the source line SL of the selected column while the first voltage $V_{step}$ to be applied to the first word line WL1 of the selected row is being gradually increased for the following reason.

That is, when high voltage is applied to the gate electrodes 164 of a memory cell transistor, the electric resistance between the source and the drain of the memory cell transistor MT becomes small. Then, the electric resistance between the source and the drain of the memory cell transistor MT becomes smaller in comparison with the electric resistance between the source and the drain of the selecting transistor ST. Then, a large transverse electric field is applied between the source and the drain of the selecting transistor ST while a sufficient transverse electric field is not applied between the source and the drain of the memory cell transistor MT. Without a sufficient transverse electric field being applied between the source and the drain of the memory cell transistor MT, electrons are not accelerated between the source and the drain of the memory cell transistor MT, and the write speed becomes slow.

In the present embodiment, in the initial stage of the write, relatively low voltage is applied to the first word line WL1 of a selected row, whereby the electric resistance between the source and the drain of the memory cell transistor MT never excessively lowers. Then, when voltage is applied in pulses to the source line SL of the selected column, charges are injected into the charge storage layer 162 of the memory cell transistor MT. Then, when voltage is applied in pulses to the source line SL of the selected column while the voltage of the first word line WL1 of the selected row is being gradually raised, charges are injected into the chare storage layer 162 of the memory cell transistor MT. The first voltage $V_{step}$ to be applied to the first word line WL1 of the selected row gradually rises, but charges to be stored in the charge storage layer 162 are gradually increase, whereby the electric resistance between the source and the drain of the memory cell transistor MT never becomes excessively low. Thus, according to the present embodiment, the write speed of writing information in the memory cell transistor MT can be high.

In the nonvolatile semiconductor memory device according to the present embodiment, hot carriers are generated, and the generated hot carriers are injected into the charge storage layer 162 of a memory cell transistor MT, whereby information is written into the memory cell transistor MT. To make the write by using hot carriers, energy which exceeds a height of the barrier of the silicon oxide film 166 (see FIG. 43) is necessary, and hot carriers is accelerated to above the energy by the potential difference between the source and the drain of the memory cell transistor MT.

Figure 46:
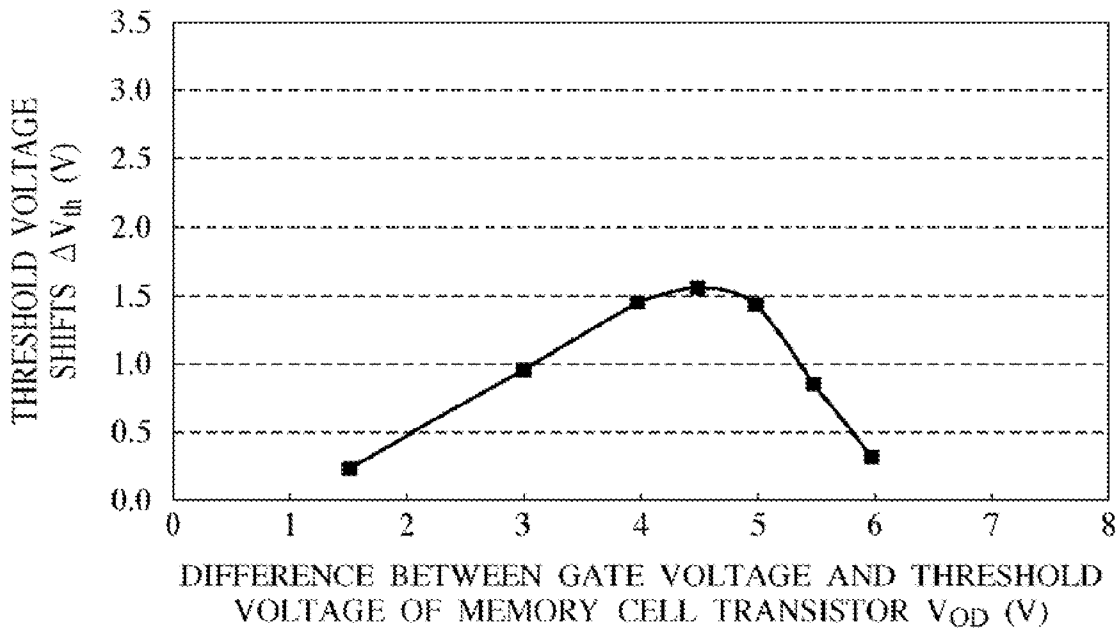
FIG. 46 is a graph of the relationships between the difference between the gate voltage and the threshold voltage of the memory cell transistor, and shifts of the threshold voltage.

FIG. 46 is a graph of the relationships between the difference between the gate voltage of the memory cell transistor and threshold voltage, and shifts of the threshold voltage. The relationships of FIG. 46 were experimentally given. As the conditions for the simulation, the threshold voltage of the selecting transistor ST was 0.8 V, and the voltage to be applied to the gate electrode 172 of the selecting transistor ST was 1.8 V. That is, the voltage to be applied to the gate electrode 172 of the selecting transistor ST was set higher by 1.0 V than the threshold voltage of the selecting transistor ST.

As seen in FIG. 46, with the gate voltage of the memory cell transistor MT set higher by about 4-5 V than the threshold voltage, a shift of the threshold voltage of the memory cell transistor MT becomes maximum, and charges can be most stored in the charge storage layer 162.

The relationships between the difference between the gate voltage of the memory cell transistor MT and the threshold voltage, and shifts of the threshold voltage were given by the experiment made under the above-described conditions. The relationships between the difference between the gate voltage of the memory cell transistor MT and the threshold voltage, and shifts of the threshold voltage have different values depending on the channel length of the selecting transistor ST, the channel length of the memory cell transistor MT, dose of a dopant impurity in the source/drain diffused layers **36*a*-36*c***, etc.

The write operation has been explained by means of the example that, as illustrated in FIG. 45, the voltage to be applied to the selected first word line WL1 is increased in steps, but the voltage to be applied to the selected first word line WL1 is not essentially the voltage illustrated in FIG. 45.

Figure 47:
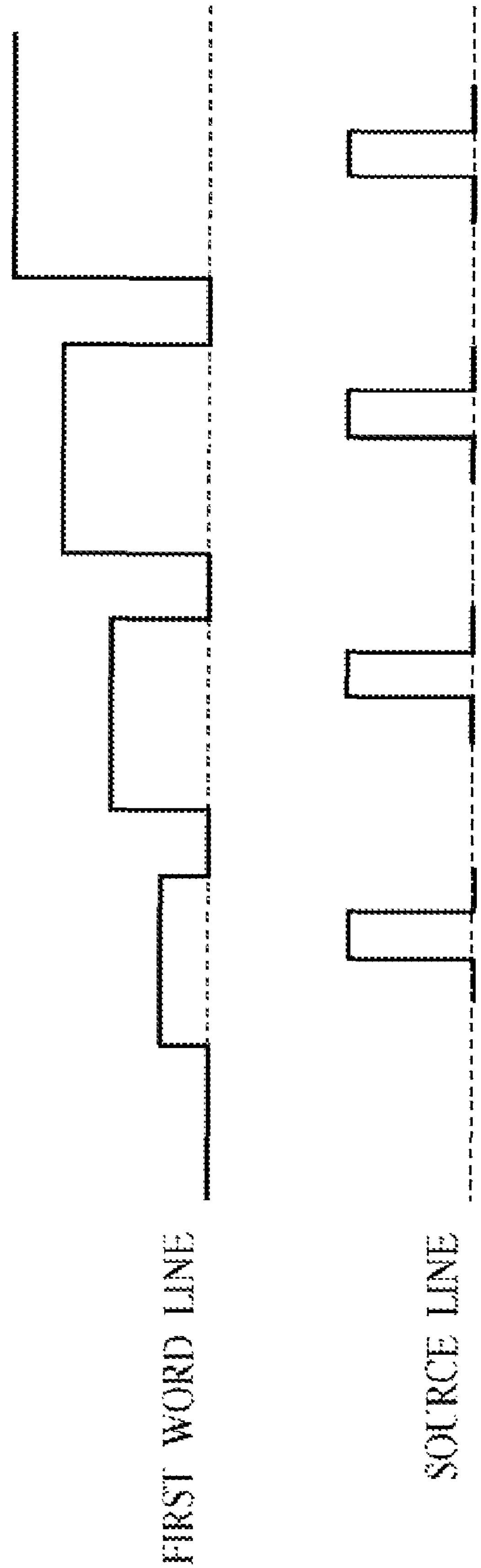
FIG. 47 is the time chart (Part 1) of another example of the writing method of the nonvolatile semiconductor memory device according to the tenth embodiment.

FIG. 47 is the time chart (Part 1) of another example of the writing method of the nonvolatile semiconductor memory device according to the present embodiment.

As illustrated in FIG. 47, it is possible that after voltage has been raised, the voltage is temporarily decreased, and further higher voltage is applied.

Figure 48:
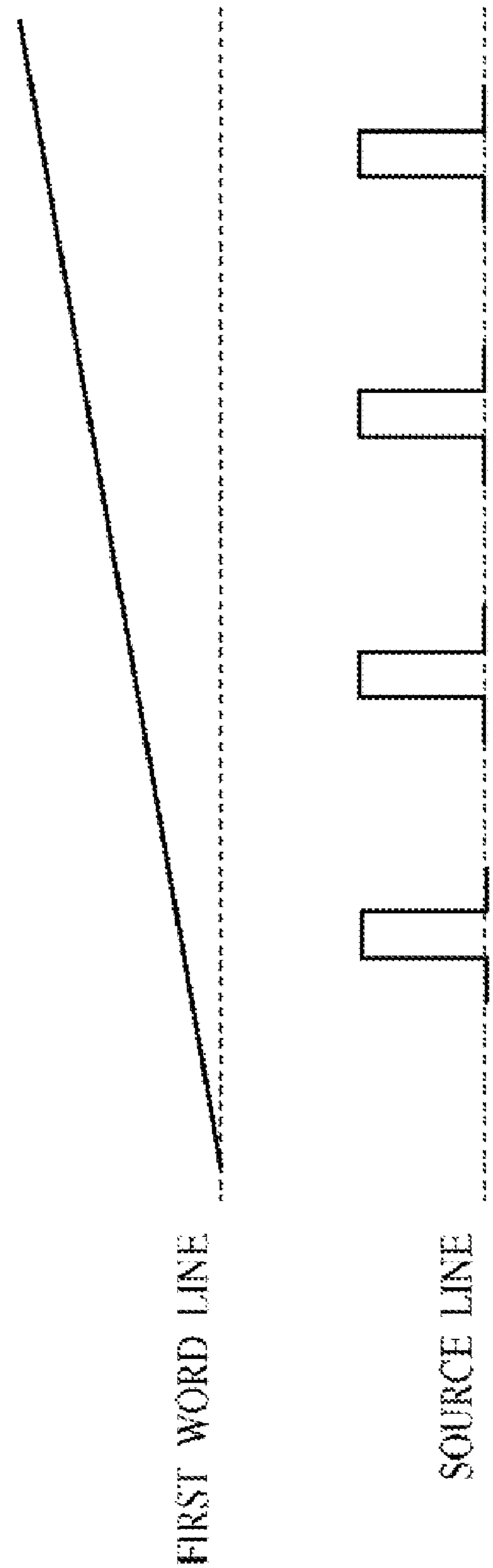
FIG. 48 is the time chart (Part 2) of another example of the writing method of the nonvolatile semiconductor memory device according to the tenth embodiment.
Figure 49A:
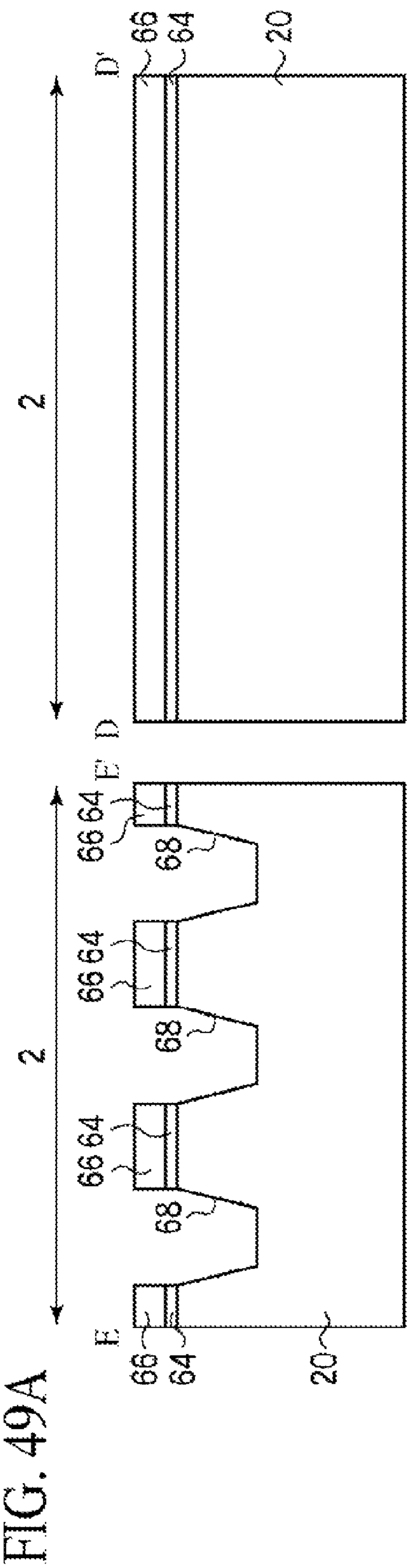
FIGS. 49A and 49B are sectional views (Part 1) of the nonvolatile semiconductor memory device according to the tenth embodiment in the steps of the method for manufacturing the nonvolatile semiconductor memory device, which illustrates the method.
Figure 49B:
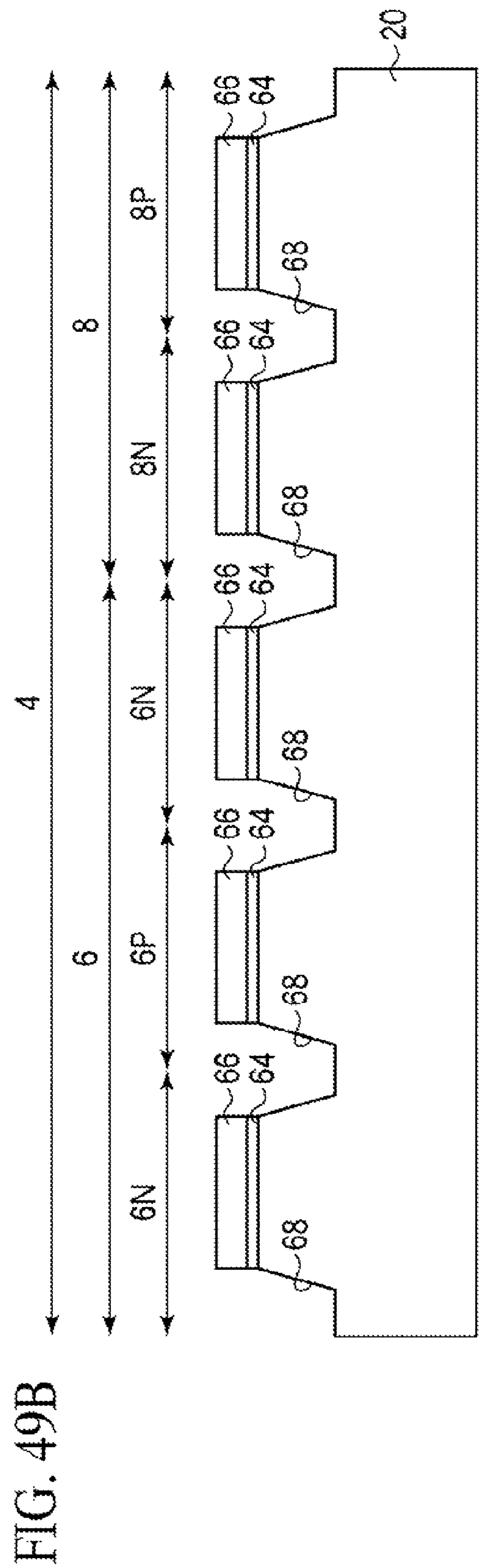

FIG. 48 is the time chart (Part 2) of further another example of the writing method of the nonvolatile semiconductor memory device according to the present embodiment.

As illustrated in FIG. 48, the voltage to be applied to the selected first word line WL1 may be continuously raised.

(Erasing Method)

Then, the erasing method of the nonvolatile semiconductor memory device according to the present embodiment will be explained with reference to FIG. 45.

When information written in the memory cell array 10, the potentials of the respective parts are set as follows.

That is, the potential of all the bit lines BL is set at 0 V (ground voltage). The potential of all the source lines SL is set at 5 V. The potential of all the first word lines WL1 is set at, e.g., −5 V. The potential of the second word lines WL2 is set at 0 V (ground voltage). The potential of all the wells 26 is set at 0 V (ground voltage).

With the potentials of the respective parts being set as above, charges are drawn out of the charge storage layer 162 of the memory cell transistors MT. Thus, no charges are stored in the charge storage layer 162 of the memory cell transistors MT, and the information in the memory cell transistors MT is erased.

As described above, in the present embodiment, the column decoder 12 for controlling the potential of the bit lines BL commonly connecting the drain diffused layers 36*c* of the selecting transistors ST is formed of a low voltage circuit, which is operative at high speed, and the second row decoder for controlling the potential of the second word lines WL2 commonly connecting the select gates 30*b* of the selecting transistors ST is formed of a low voltage circuit, which is operative at high speed. Besides, in the present embodiment, in which the film thickness of the gate insulation film 174 of the selecting transistors ST is formed relatively thin, the selecting transistors ST can operate at high speed. Only by controlling the potentials of the bit line BL and the second word lines WL2, information written in the memory cell transistors MT can be read. The bit lines BL and the second word lines WL2 are controlled at high speed, and besides, the selecting transistors ST are operative at high speed, whereby the nonvolatile semiconductor memory device according to the present embodiment can read at high speed information written in the memory cell transistors MT.

(Method for Manufacturing Nonvolatile Semiconductor Memory Device)

Next, the method for manufacturing the nonvolatile semiconductor memory device according to the present embodiment will be explained with reference to FIGS. 49A to 64. FIG. 49A to 64 are sectional views of the nonvolatile semiconductor memory device according to the present embodiment in the steps of the method for manufacturing the nonvolatile semiconductor memory device. FIG. 49A, FIG. 50A, FIG. 51A, FIG. 52A, FIG. 53A, FIG. 54A, FIG. 55A, FIG. 56A, FIG. 57A, FIG. 58A, FIG. 59A, FIG. 60A, FIG. 61 and FIG. 63 illustrate memory cell array region (core region) 2. The views on the left sides of the drawings of FIG. 49A, FIG. 50A, FIG. 51A, FIG. 52A, FIG. 53A, FIG. 54A, FIG. 55A, FIG. 56A, FIG. 57A, FIG. 58A, FIG. 59A, FIG. 60A, FIG. 61 and FIG. 63 correspond to the section along the E-E' line in FIG. 42. The views on the rights sides of the drawings of FIG. 49A, FIG. 50A, FIG. 51A, FIG. 52A, FIG. 53A, FIG. 54A, FIG. 55A, FIG. 56A, FIG. 57A, FIG. 58A, FIG. 59A, FIG. 60A, FIG. 61 and FIG. 63 correspond to the sections along the D-D' line in FIG. 42. FIG. 49B, FIG. 50B, FIG. 51B, FIG. 52B, FIG. 53B, FIG. 54B, FIG. 55B, FIG. 56B, FIG. 57B, FIG. 58B, FIG. 59B, FIG. 60B, FIG. 62 and FIG. 64 illustrate the peripheral circuit region 4. The views on the left sides of the drawings of FIG. 49B, FIG. 50B, FIG. 51B, FIG. 52B, FIG. 53B, FIG. 54B, FIG. 55B, FIG. 56B, FIG. 57B, FIG. 58B, FIG. 59B, FIG. 60B, FIG. 62 and FIG. 64 illustrate the region 6 where the high withstand voltage transistors are to be formed. The view on the left side of the region 6 for the high withstand voltage transistors to be formed in illustrates the region 6N where the high withstand voltage N-channel transistors are to be formed in. The views on the right side of the region 6N for the high withstand voltage N-channel transistors to be formed in illustrate the region 6P where the high withstand voltage P-channel transistors are to be formed. The views on the right side of the region 6P for the high withstand voltage P-channel transistors to be formed in illustrate the region 6N where the high withstand voltage N-channel transistors are to be formed. The views on the right sides of the drawings of FIG. 49B, FIG. 50B, FIG. 51B, FIG. 52B, FIG. 53B, FIG. 54B, FIG. 55B, FIG. 56B, FIG. 57B, FIG. 58B, FIG. 59B, FIG. 60B, FIG. 62 and FIG. 64 illustrate the region 8 where the low voltage transistors are to be formed. The views on the left side of the drawings of the region 8 for the low voltage transistors to be formed in illustrate the region 8N where the low voltage N-channel transistors are to be formed, and the view of the right side of the drawing of the region 8 for the low voltage transistors to be formed in illustrate the region 8P where the low voltage P-channel transistors are to be formed.

First, a conductor substrate 20 of, e.g., a P-type silicon substrate is prepared.

Next, a 15 nm-thickness thermal oxide film 64 is formed on the entire surface by, e.g., thermal oxidation.

Then, a 150 nm-thickness silicon nitride film 66 is formed on the entire surface by, e.g., CVD.

Then, a photoresist film (not illustrated) is formed on the entire surface by, e.g., spin coating.

Then, openings (not illustrated) are formed in the photoresist film by photolithography. These openings are for patterning the silicon nitride film 66.

Then, with the photoresist film as the mask, the silicon nitride film 66 is patterned. Thus, a hard mask 66 of silicon nitride film is formed.

Then, the semiconductor substrate 20 is etched by dry etching with the hard mask 66 as the mask. Thus, trenches 68 are formed in the semiconductor substrate 20 (see FIGS. 49A and 49B). The depth of the trenches 68 formed in the semiconductor substrate 20 is, e.g., 300 nm from the surface of the semiconductor substrate 20.

Next, the exposed parts of the semiconductor substrate 20 are oxidized by thermal oxidation. Thus, silicon oxide film (not illustrated) is formed on the exposed parts of the semiconductor substrate 20.

Figure 50A:
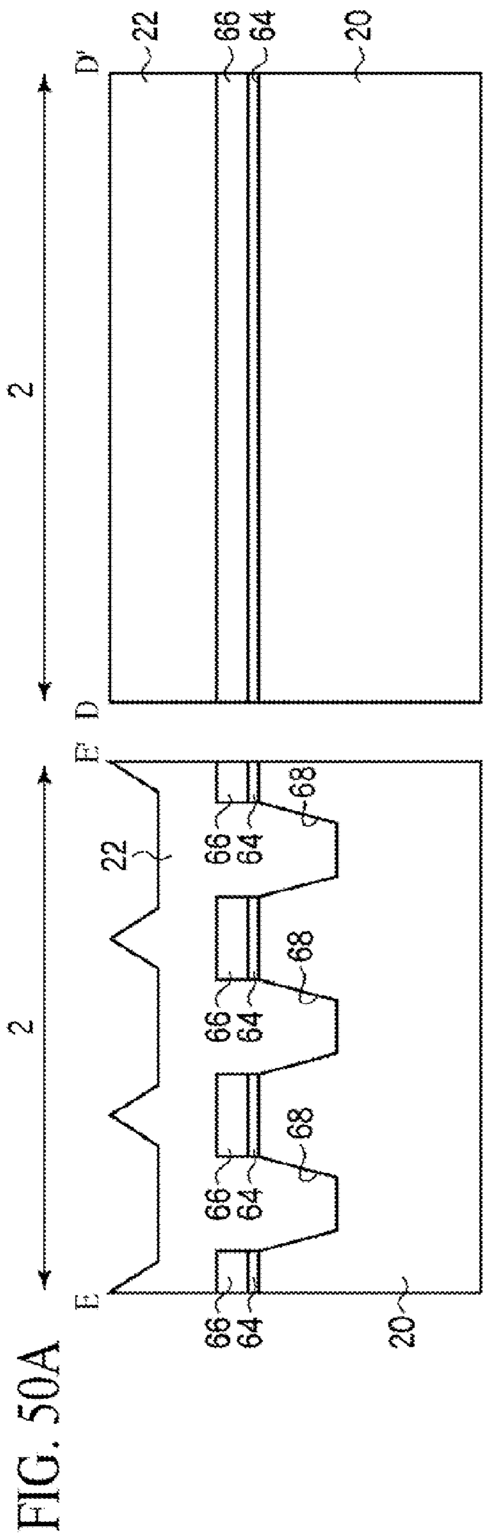
FIGS. 50A and 50B are sectional views (Part 2) of the nonvolatile semiconductor memory device according to the tenth embodiment in the steps of the method for manufacturing the nonvolatile semiconductor memory device, which illustrates the method.
Figure 50B:
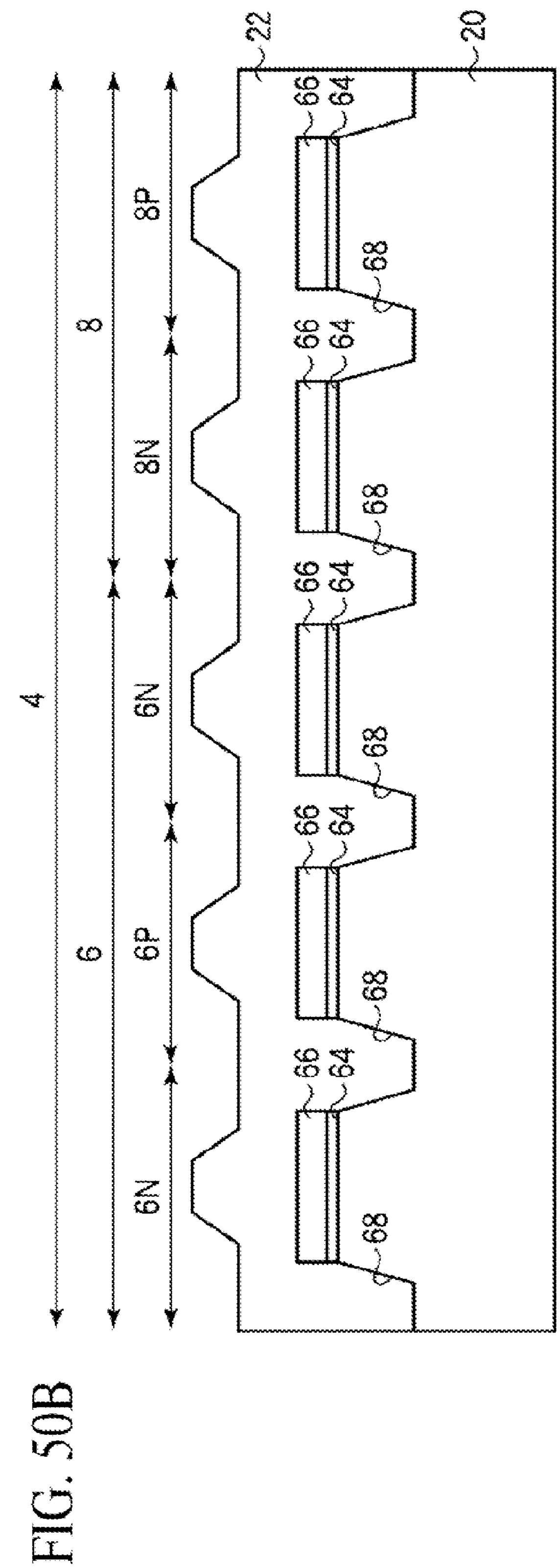

Next, as illustrated in FIGS. 50A and 50B, a 700 nm-thickness silicon oxide film 22 is formed on the entire surface by high density plasma-enhanced CVD.

Figure 51A:
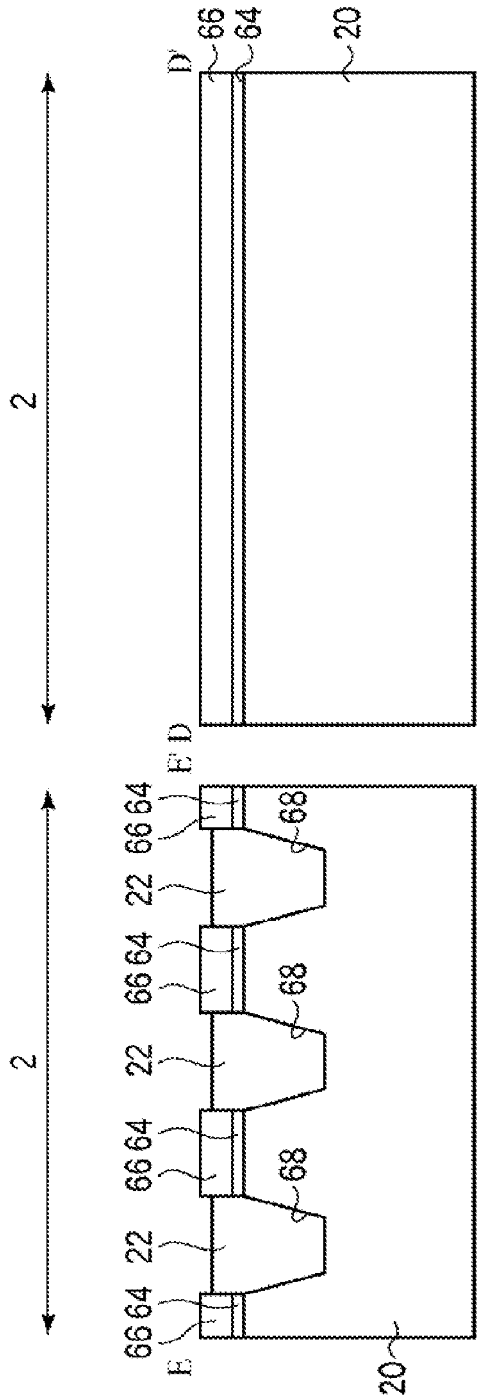
FIGS. 51A and 52B are sectional views (Part 3) of the nonvolatile semiconductor memory device according to the tenth embodiment in the steps of the method for manufacturing the nonvolatile semiconductor memory device, which illustrates the method.
Figure 51B:
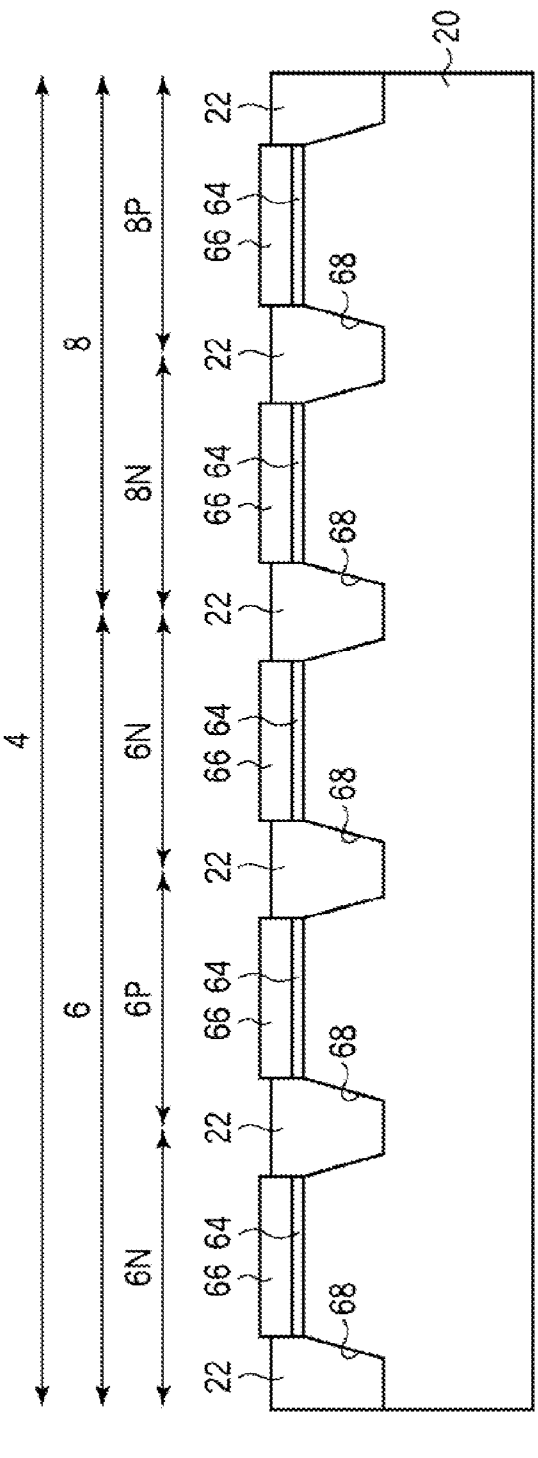

Next, as illustrated in FIGS. 51A and 51B, the silicon oxide film 22 is polished by CMP until the surface of the silicon nitride film 66 is exposed. Thus, the device isolation regions 22 of silicon oxide film are formed.

Next, thermal process for curing the device isolation regions 22 is made. The thermal processing conditions are, e.g., 900° C. and 30 minutes in a nitrogen atmosphere.

Next, the silicon nitride film 66 is removed by wet etching.

Figure 52A:
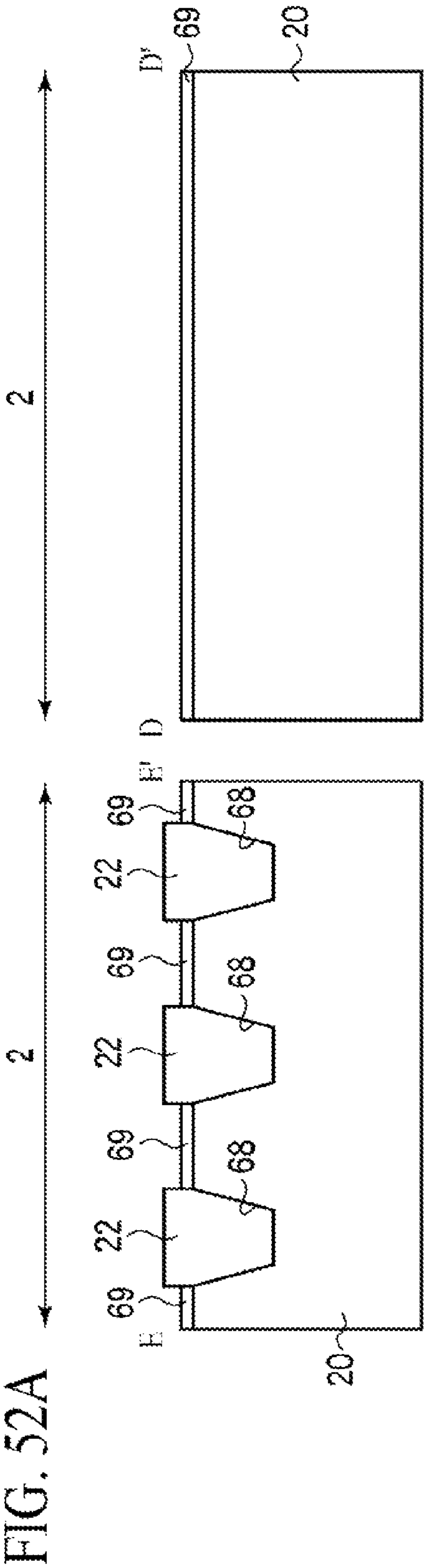
Figure 52B:
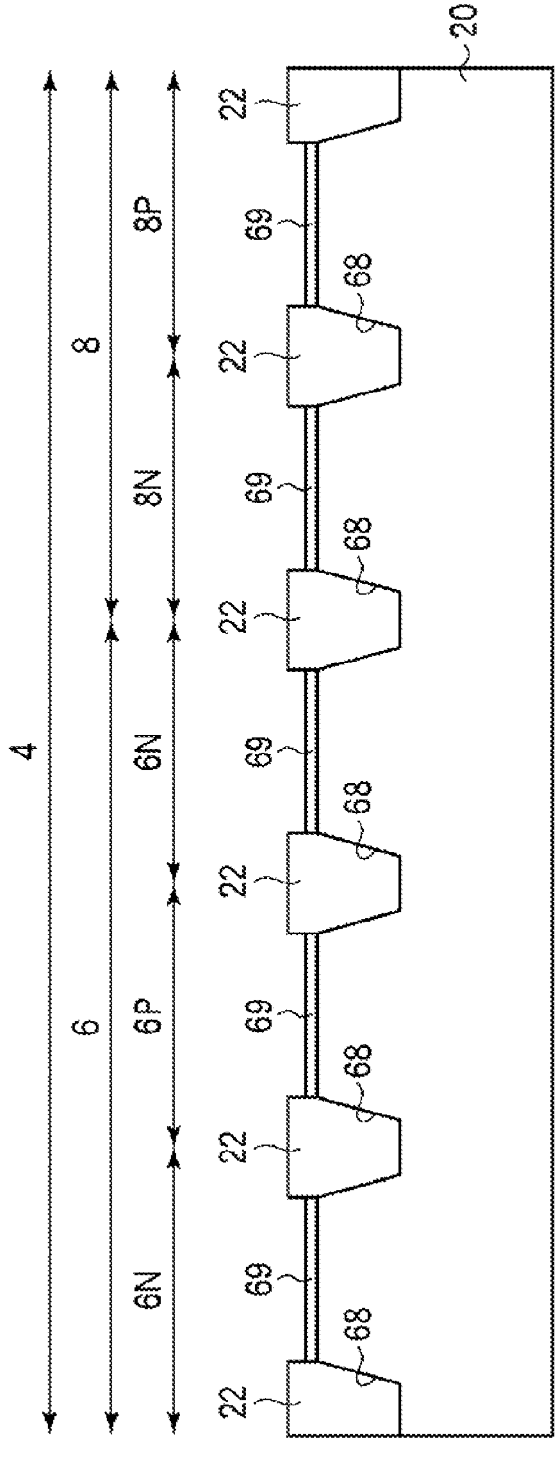

Next, as illustrated in FIGS. 52A and 52B, a sacrifice oxide film 69 is grown on the surface of the semiconductor substrate 20 by thermal oxidation.

Figure 53A:
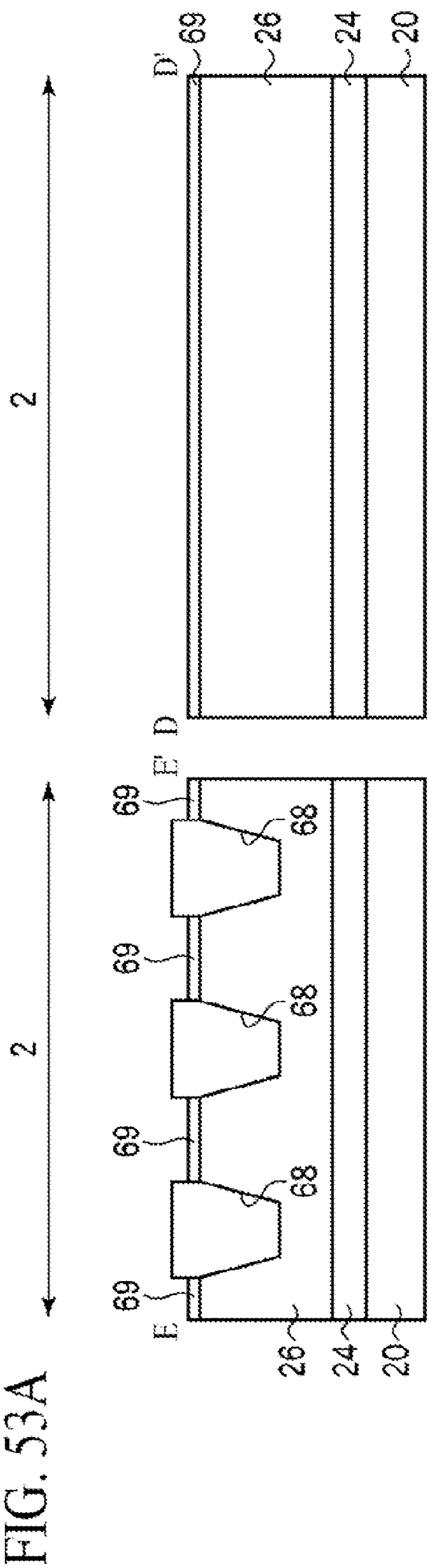
FIGS. 53A and 53B are sectional views (Part 5) of the nonvolatile semiconductor memory device according to the tenth embodiment in the steps of the method for manufacturing the nonvolatile semiconductor memory device, which illustrates the method.
Figure 53B:
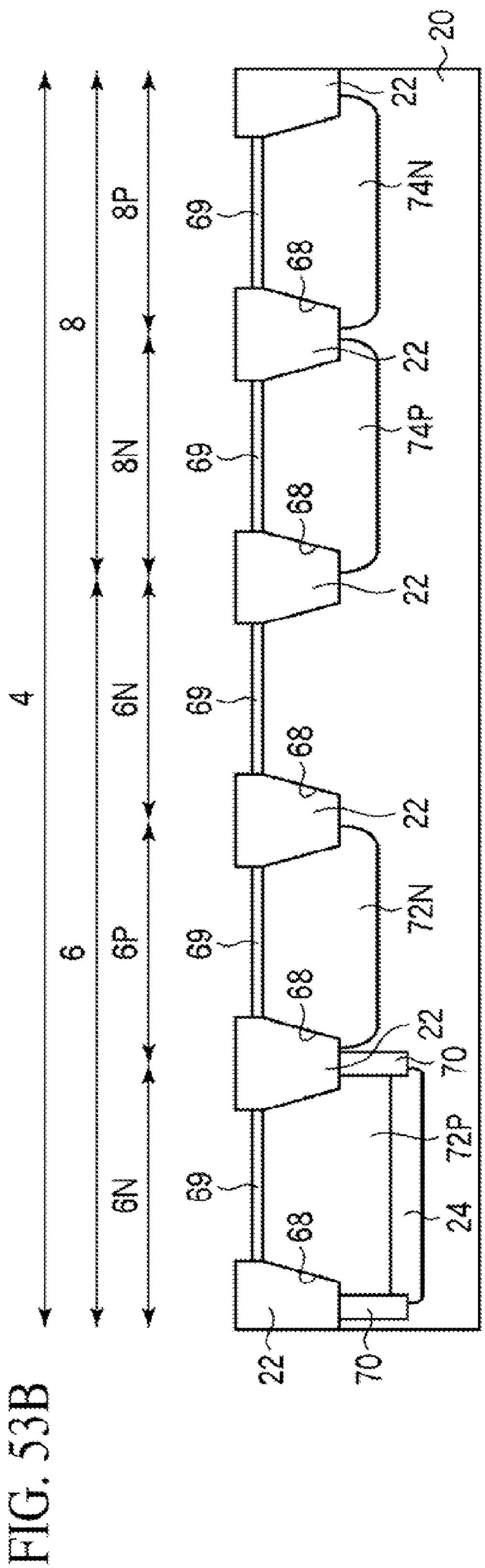

Then, as illustrated in FIGS. 53A and 53B, an N-type dopant impurity is implanted deep in the memory cell array region 2 to form the N-type buried diffused layer 24. At this time, the N-type dopant impurity is deeply implanted also into the region 6N where the high withstand voltage N-channel transistors are to be formed to thereby form the N-type buried diffused layer 24. In the memory cell array region 2, a P-type dopant impurity is implanted shallower than the buried diffused layer 24 to thereby form a P-type well 26. In the region 6N for the high withstand voltage N-channel transistors to be formed in, a P-type dopant impurity is implanted shallower than the buried diffused layer 24 to thereby form a P-type well 72P.

Then, in the region 6N for the high withstand voltage N-channel transistors to be formed in, an N-type diffused layer 70 is formed in a frame-shape. The frame-shaped diffused layer 70 is formed from the surface of the semiconductor substrate 20 to the peripheral edge of the buried diffused layer 24. The P-type well 72P is surrounded by the buried diffused layer 24 and the diffused layer 70. Although not illustrated, the P-type well 26 in the memory cell array region 2 as well is surrounded by the buried diffused layer 24 and the frame-shaped diffused layer 70.

Next, in the region 6P for the high withstand voltage P-channel transistors to be formed in, an N-type dopant impurity is implanted to thereby form an N-type well 72N.

Next, in the region 8N for the low voltage N-channel transistors to be formed in, a P-type dopant impurity is implanted to thereby form a P-type well 74P.

Next, in the region 8P for the low voltage P-channel transistors to be formed in, an N-type dopant impurity is implanted to thereby form an N-type well 74N.

Next, in the memory cell array region 2, channel doping is made (not illustrated).

Next, in the region 6N for the high withstand voltage N-channel transistors to be formed in and in the region 6P for the high voltage P-channel transistors to be formed in, channel doping is made (not illustrated).

Then, in the region 8N for the low voltage N-channel transistors to be formed in and the region 8P for the low voltage P-channel transistors to be formed in, channel doping is made (not illustrated).

Then, the sacrifice oxide film 69 present on the surface of the semiconductor substrate 20 is etched off.

Then, the first silicon oxide film 166 is formed on the entire surface by thermal oxidation.

Next a silicon nitride film 168 is formed on the entire surface by CVD.

Next, the surface of the silicon nitride film 168 is oxidized by thermal oxidation to form the second silicon oxide film 170 on the entire surface.

Figure 54A:
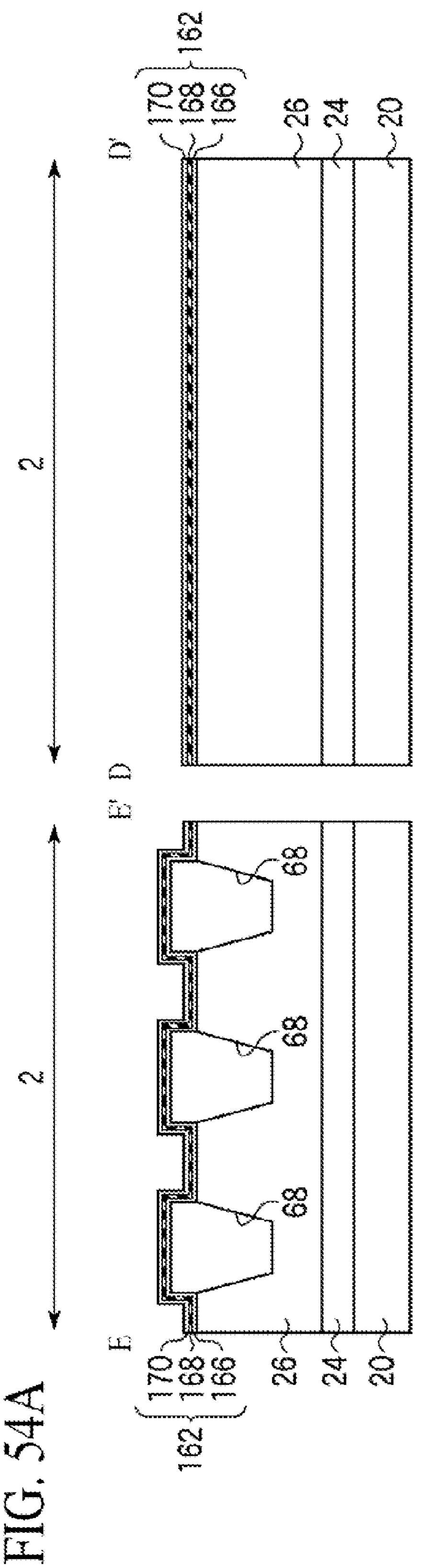
FIGS. 54A and 54B are sectional views (Part 6) of the nonvolatile semiconductor memory device according to the tenth embodiment in the steps of the method for manufacturing the nonvolatile semiconductor memory device, which illustrates the method.
Figure 54B:
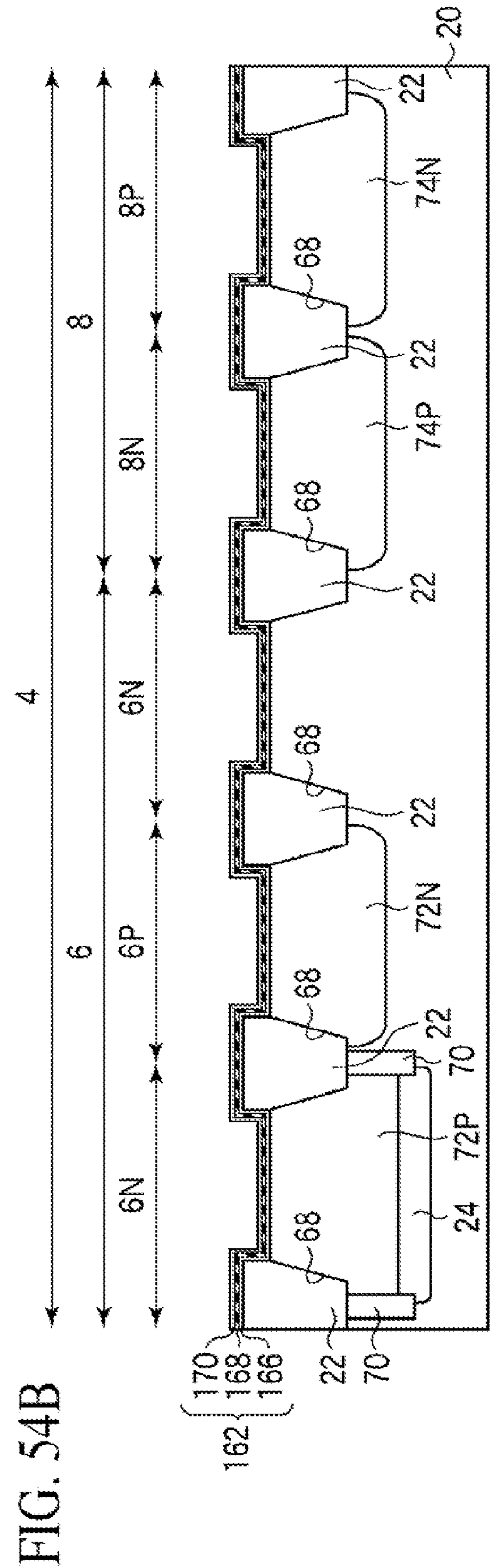

Thus, an ONO film 162 of the first silicon oxide film 166 of, e.g., a 4 nm-thickness, the silicon nitride film 168 of, e.g., a 5 nm-thickness formed on the first silicon oxide film 166, the second silicon oxide film 170 of, e.g., a 7 nm-thickness formed on the silicon nitride film 168 is formed (see FIGS. 54A and 54B). The ONO film 162 is to be the charge storage layer of the memory cell transistor MT.

Next, the ONO film 162 present in the region 6 for the high withstand voltage transistors to be formed in is etched off.

Figure 55A:
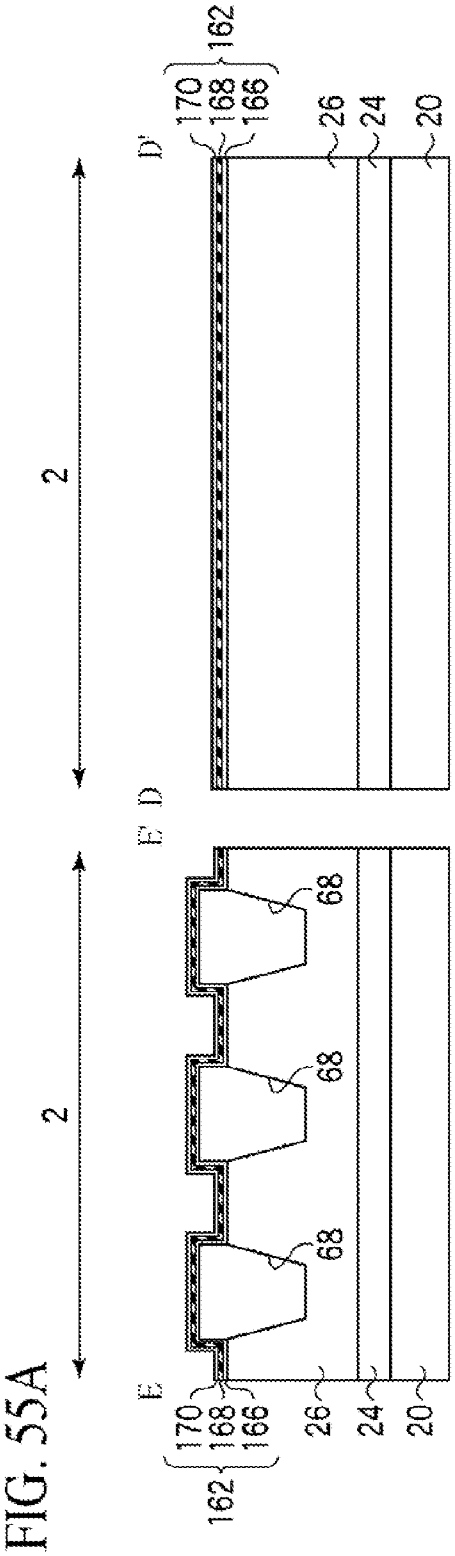
FIGS. 55A and 55B are sectional views (Part 7) of the nonvolatile semiconductor memory device according to the tenth embodiment in the steps of the method for manufacturing the nonvolatile semiconductor memory device, which illustrates the method.
Figure 55B:
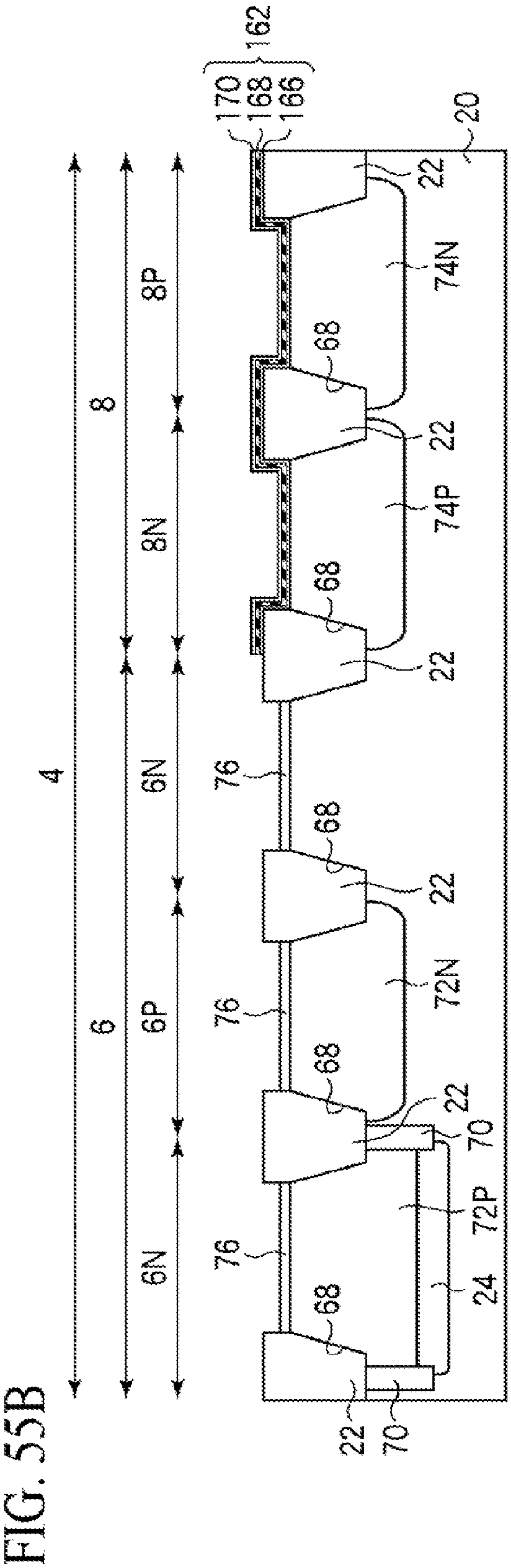

Then, in the region 6 for the high voltage transistors to be formed in, the gate insulation film 76 of, e.g., a 15 nm-thickness is formed by thermal oxidation (see FIGS. 55A and 55B).

Then, the ONO film 162 present in the region for the selecting transistor ST to be formed in is etched off.

Figure 56A:
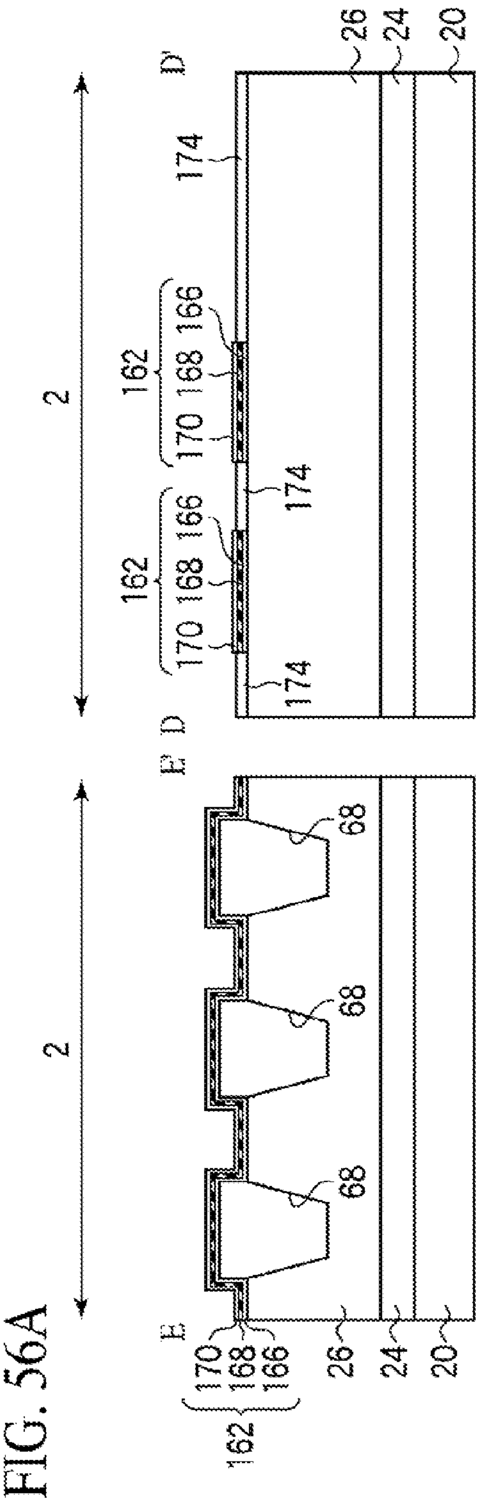
FIGS. 56A and 56B are sectional views (Part 8) of the nonvolatile semiconductor memory device according to the tenth embodiment in the steps of the method for manufacturing the nonvolatile semiconductor memory device, which illustrates the method.
Figure 56B:
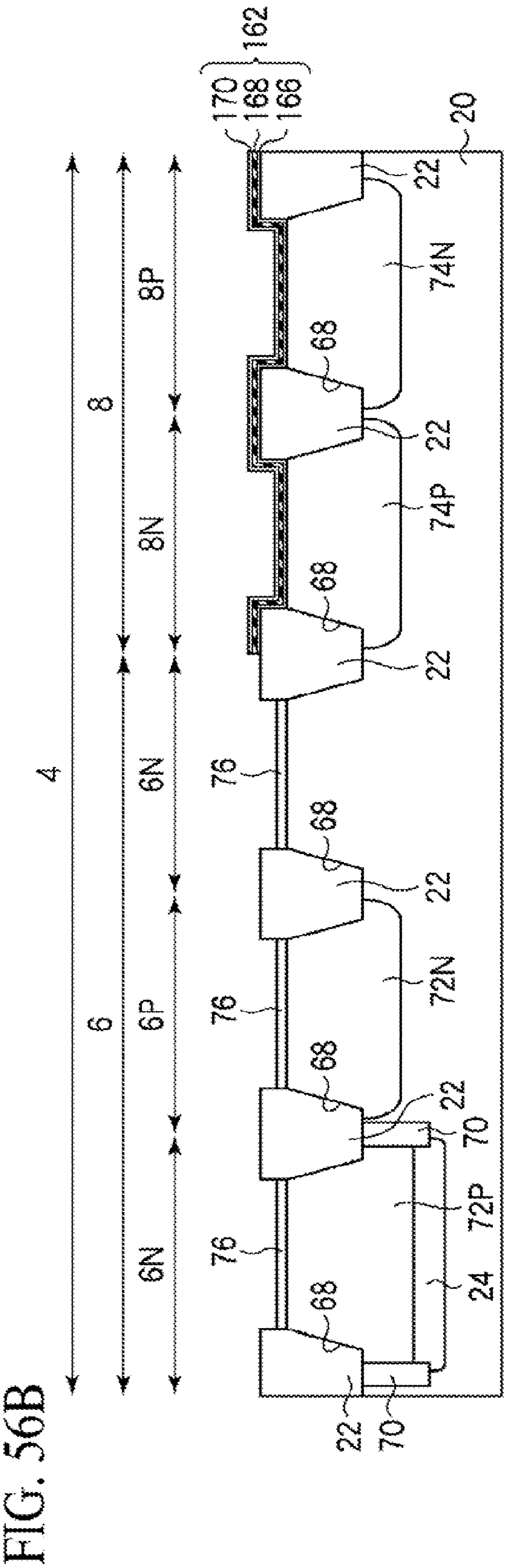

Next, on the semiconductor substrate 20 in the region for the selecting transistor ST to be formed in, the gate insulation film 174 of, e.g., a 5-7 nm-thickness is formed by thermal oxidation (see FIGS. 56A and 56B).

Then, the ONO film 162 present in the region for the low voltage transistors to be formed in is etched off.

Figure 57A:
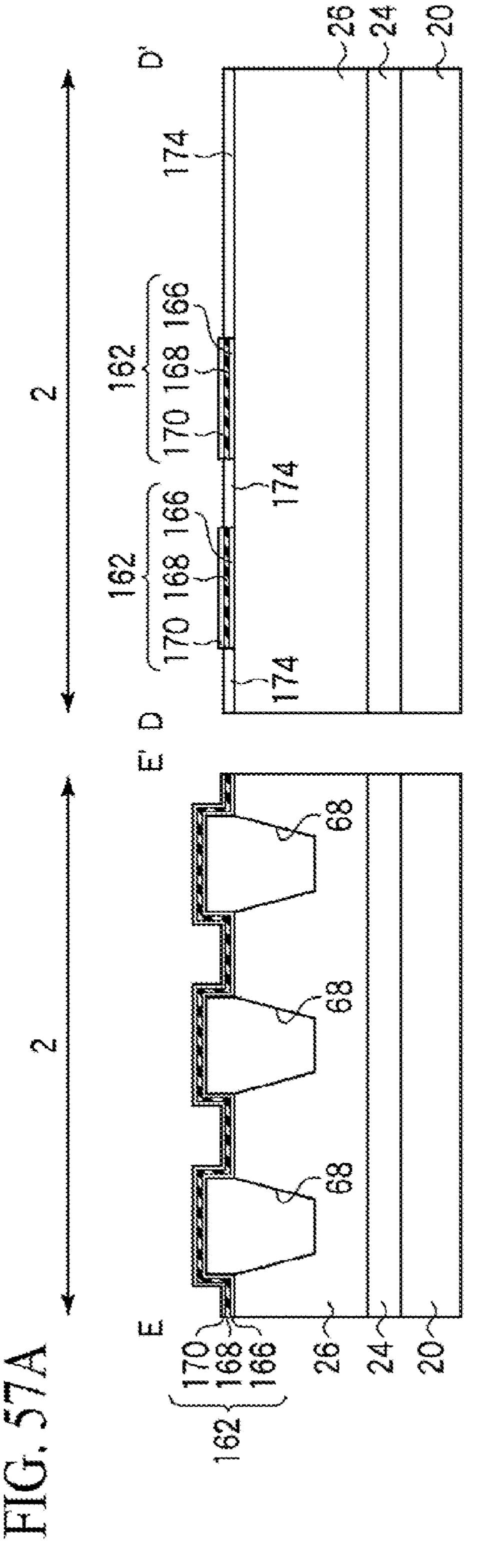
FIGS. 57A and 57B are sectional views (Part 9) of the nonvolatile semiconductor memory device according to the tenth embodiment in the steps of the method for manufacturing the nonvolatile semiconductor memory device, which illustrates the method.
Figure 57B:
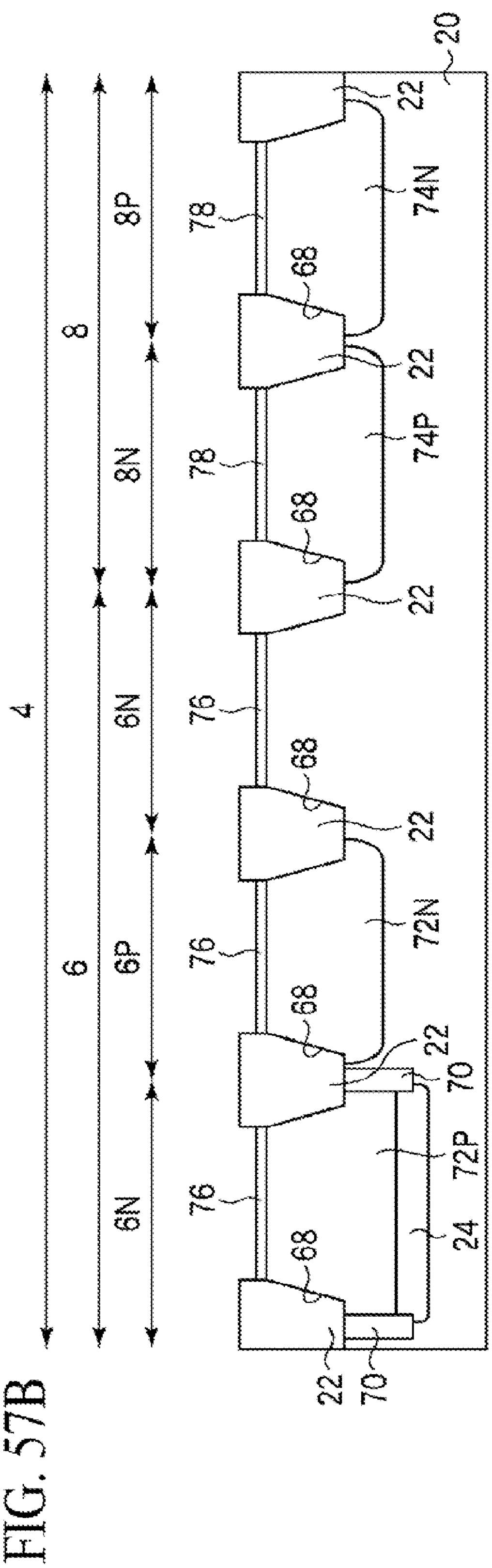
Figures 58A, 58B:
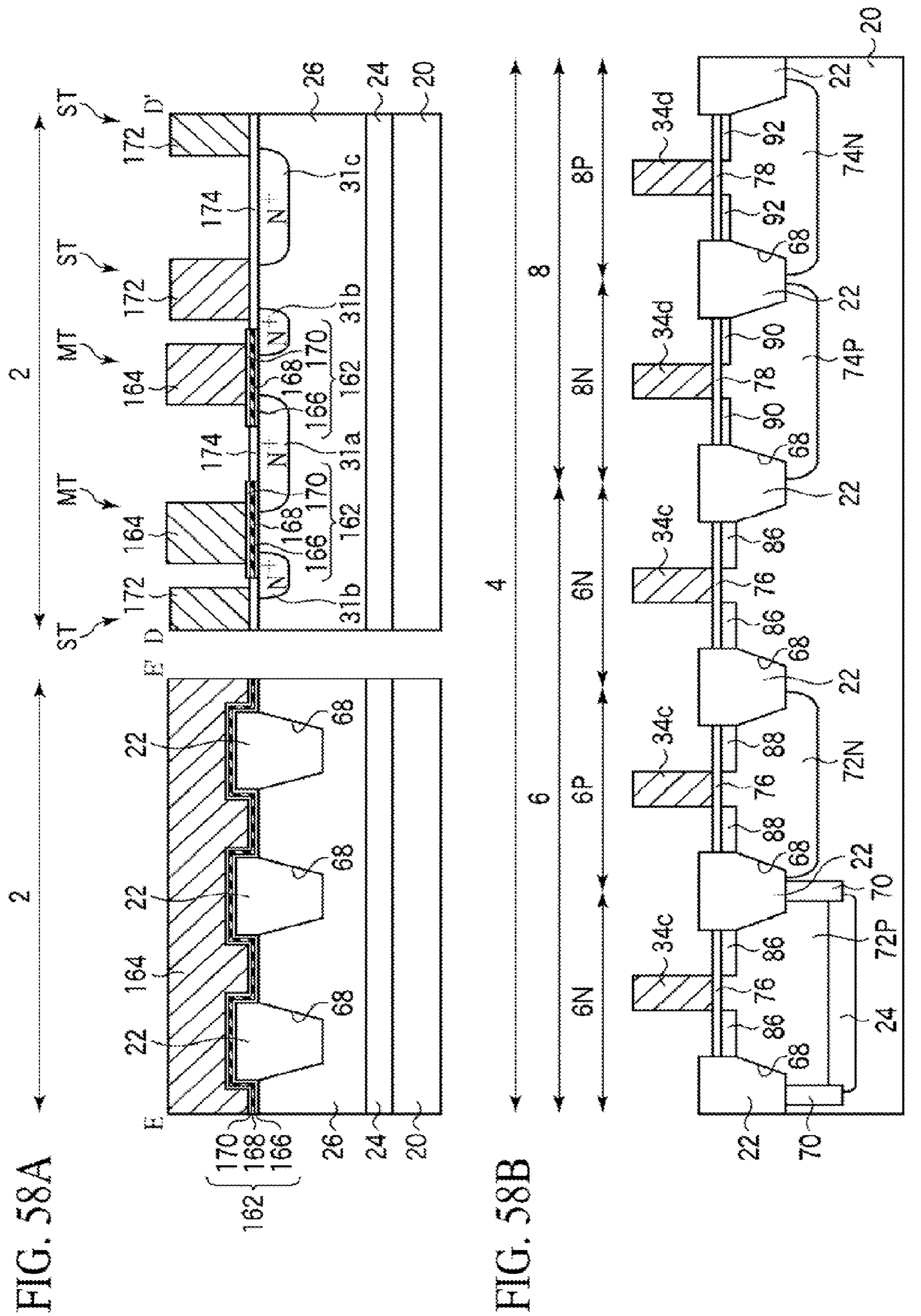
FIGS. 58A and 58B are sectional views (Part 10) of the nonvolatile semiconductor memory device according to the tenth embodiment in the steps of the method for manufacturing the nonvolatile semiconductor memory device, which illustrates the method.
Figure 59A:
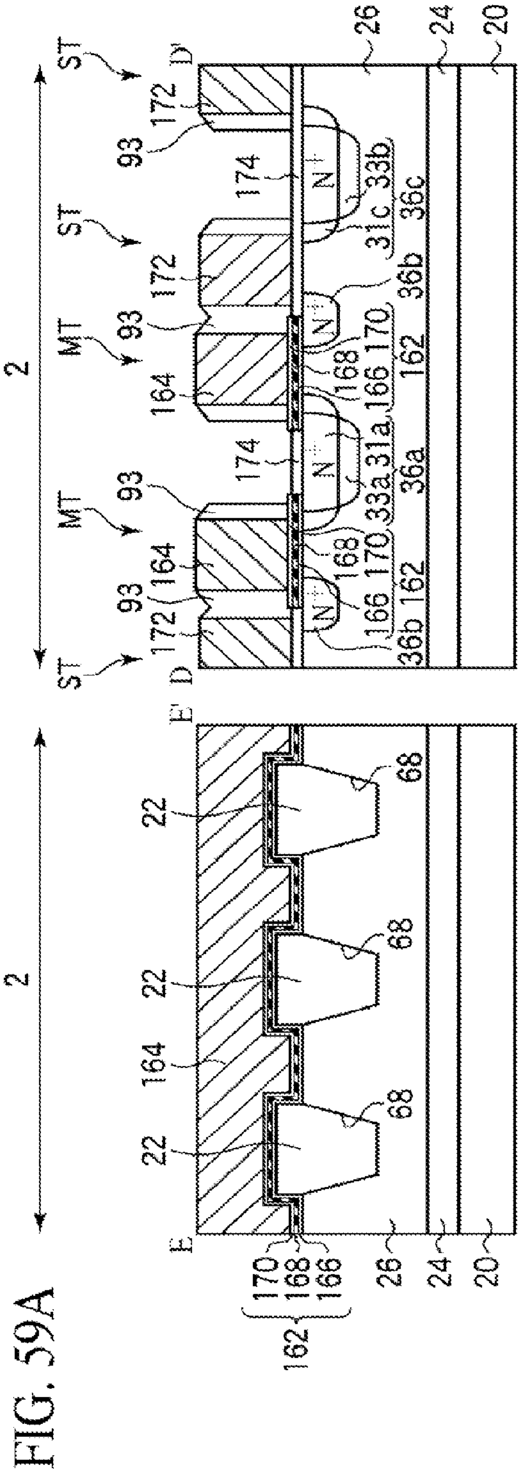
FIGS. 59A and 59B are sectional views (Part 11) of the nonvolatile semiconductor memory device according to the tenth embodiment in the steps of the method for manufacturing the nonvolatile semiconductor memory device, which illustrates the method.
Figure 59B:
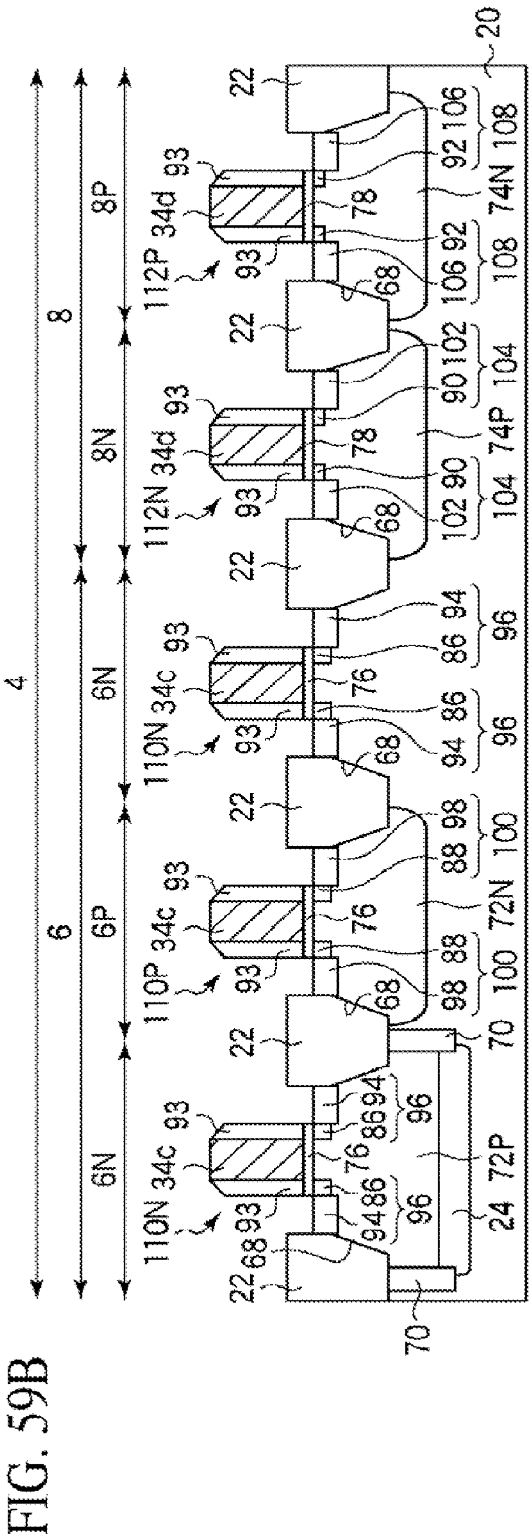

Next, in the region 8 for the low voltage transistors to be formed in, the gate insulation film 78 of, e.g., a 3 nm-thickness is formed by thermal oxidation (see FIGS. 57A and 57B).

Next, a polycrystalline silicon film 34 of, e.g., a 180 nm-thickness is formed on the entire surface by, e.g., CVD.

Next, the polycrystalline silicon film 34 is patterned by photolithography. Thus, the gate electrode 164 of the memory cell transistor MT, which is formed of polycrystalline silicon is formed in the memory cell array region 2. The gate electrode 172 of the selecting transistor ST, which is formed of polycrystalline silicon is formed in the memory cell array region 2. The gate electrodes 34*c* of the high withstand voltage transistors 110N, 110P, which are formed of polycrystalline silicon are formed in the region 6 for the high withstand voltage transistors to be formed in. The gate electrodes 34*d* of the low voltage transistors 112N, 112P, which are formed of the polycrystalline silicon are formed in the region 8 for the low withstand voltage transistors to be formed in.

Next, a photoresist film (not illustrated) is formed on the entire surface by spin coating.

Then, an opening (not illustrated) for exposing the region 6N for the high withstand voltage N-channel transistors to be formed in is formed in the photoresist film by photolithography.

Next, with the photoresist film as the mask, a N-type dopant impurity is implanted into the semiconductor substrate 20. Thus, in the semiconductor substrate 20 on both sides of the gate electrode 34*c* of the high withstand voltage N-channel transistor, N-type lightly doped diffused layer 86 is formed. Then the photoresist film released.

Next, a photoresist film (not illustrated) is formed on the entire surface by spin coating.

Then, an opening (not illustrated) for exposing the region 6P for the high withstand voltage P-channel transistors to be formed in is formed in the photoresist film by photolithography.

Next, with the photoresist film as the mask, a P-type dopant impurity is implanted into the semiconductor substrate 20. Thus, in the semiconductor substrate 20 on both sides of the gate electrode 34*c* of the high withstand voltage P-channel transistor, P-type lightly doped diffused layer 88 is formed. Then the photoresist film released.

Next, a photoresist film (not illustrated) is formed on the entire surface by spin coating.

Next, by photolithography, an opening (not illustrated) for exposing the region 8N for the low voltage N-channel transistors to be formed in is formed in the photoresist film.

Then, with the photoresist film as the mask, an N-type dopant impurity is implanted into the semiconductor substrate 20. Thus, in the semiconductor substrate 20 on both sides of the gate electrode 34*d* of the low voltage N-channel transistor, an N-type lightly doped diffused layer 90 is formed. Then, the photoresist film is released.

Next, a photoresist film (not illustrated) is formed on the entire surface by spin coating.

Next, by photolithography, an opening (not illustrated) for exposing the region 8P for the low voltage P-channel transistors to be formed in is formed in the photoresist film.

Then, with the photoresist film as the mask, a P-type dopant impurity is implanted into the semiconductor substrate 20. Thus, in the semiconductor substrate 20 on both sides of the gate electrode 34*d* of the low voltage P-channel transistor, a P-type lightly doped diffused layer 92 is formed. Then, the photoresist film is released.

Next, a photoresist film (not illustrated) is formed on the entire surface by spin coating.

Next, an opening (not illustrated) for exposing the memory cell array region 2 is formed in the photoresist film by photolithography.

Then, by ion implantation with the photoresist film as the mask, an N-type dopant impurity is implanted into the semiconductor substrate 20. The conditions for the ion implantation are as follows. The dopant impurity is, e.g., arsenic. The acceleration energy is, e.g., 20 keV. The dose is, e.g., $1\times10^{14}$-$1\times10^{15}$. Thus, in the semiconductor substrate 20 on both sides of the gate electrode 164 and in the semiconductor substrate 20 on both sides of the gate electrode 172, impurity diffused layers 31*a*-31*c* are formed. Then, the photoresist film is released (see FIGS. 58A and 58B).

Next, a 100 nm-thickness silicon oxide film 93 is formed by, e.g., CVD.

Then, the silicon oxide film 93 is anisotropically etched by dry etching. Thus, the sidewall insulation film 93 of silicon oxide film is formed on the side walls of the gate electrodes 164 of the memory cell transistors MT. On the side walls of the gate electrodes 172 of the selecting transistors ST, the sidewall insulation film 93 of silicon oxide film is formed. On the side walls of the gate electrodes 34*c*, the sidewall insulation film 93 of silicon oxide film is formed. On the side walls of the gate electrodes 34*d*, the sidewall insulation film 93 of silicon oxide film is formed.

Next, a photoresist film (not illustrated) is formed on the entire surface by spin coating.

Next, openings (not illustrated) for exposing the regions 6N for the high withstand voltage N-channel transistors to be formed in are formed in the photoresist film by photolithography.

Then, with the photoresist film as the mask, an N-type dopant impurity is implanted into the semiconductor substrate 20. Thus, in the semiconductor substrate 20 on both sides of the gate electrodes 34*c* of the high withstand voltage N-channel transistors, an N-type heavily doped diffused layer 94 is formed. The N-type lightly-doped diffused layer 86 and the N-type heavily doped diffused layer 94 form the N-type source/drain diffused layers 96 of the LDD structure. Thus, the high withstand voltage N-channel transistors 110N each including the gate electrode 34*c* and the source/drain diffused layer 96 are formed. The high withstand voltage N-channel transistors 110N are used in the high voltage circuit (high withstand voltage circuit). Then, the photoresist film is released.

Then, a photoresist film (not illustrated) is formed on the entire surface by spin coating.

Next, an opening (not illustrated) for exposing the region 6P for the high withstand voltage P-channel transistors to be formed in is formed in the photoresist film by photolithography.

Next, with the photoresist film as the mask, a P-type dopant impurity is implanted into the semiconductor substrate 20. Thus, a P-type heavily doped diffused layer 98 is formed in the semiconductor substrate 20 on both sides of the gate electrode 34*c* of the high withstand voltage P-channel transistor. The P-type lightly doped diffused layer 88 and the P-type heavily doped diffused layer 98 form P-type source/drain diffused layers 100 of the LDD structure. Thus, the high withstand voltage P-channel transistor 110P including the gate electrode 34*c* and the source/drain diffused layer 100 is formed. The high withstand voltage P-channel transistor 110P is used in the high voltage circuit (high withstand voltage circuit). Then, the photoresist film is released.

Next, a photoresist film (not illustrated) is formed on the entire surface by spin coating.

Then, an opening (not illustrated) for exposing the region 8N for the low voltage N-channel transistors to be formed in is formed in the photoresist film by photolithography.

Next, with the photoresist film as the mask, an N-type dopant impurity is implanted into the semiconductor substrate 20. Thus, an N-type heavily doped diffused layer 102 is formed in the semiconductor substrate 20 on both sides of the gate electrode 34*d* of the low voltage N-channel transistor. The N-type lightly doped diffused layer 90 and the N-type heavily diffused layer 102 form the N-type source/drain diffused layers 104 of the LDD structure. Thus, the low voltage N-channel transistor 112N including the gate electrode 34*d* and the source/drain diffused layers 104 is formed. The low voltage N-channel transistor 112N is used in the low voltage circuit. Then, the photoresist film is released.

Next, a photoresist film (not illustrated) is formed on the entire surface by spin coating.

Next, by photolithography, an opening (not illustrated) for exposing the region 8P for the low voltage P-channel transistors to be formed in is formed in the photoresist film.

Then, with the photoresist film as the mask, a P-type dopant impurity is implanted into the semiconductor substrate 20. Thus, a P-type heavily doped diffused layer 106 is formed in the semiconductor substrate 20 on both sides of the gate electrode 34*d* of the low voltage P-channel transistor. The P-type lightly doped diffused layer 92 and the P-type heavily doped diffused layer 106 form P-type source/drain diffused layers 108 of the LDD structure. Thus, the low voltage P-channel transistor 112P including the gate electrode 34*d* and the source/drain diffused layers 108 is formed. The low voltage P-channel transistor 112P is used in the low voltage circuit. Then, the photoresist film is released.

Next, a photoresist film (not illustrated) is formed on the entire surface by spin coating.

Next, by photolithography, an opening (not illustrated) for exposing the memory cell array region 2 is formed in the photoresist film.

Next, with the photoresist film as the mask, an N-type dopant impurity is implanted into the semiconductor substrate 20. Thus, an N-type heavily doped diffused layer 33*a* is formed in the semiconductor substrate 20 on one side of the gate electrode 164 of the memory cell transistor MT, and in the semiconductor substrate 20 on one side of the gate electrode 172 of the selecting transistor ST, an N-type heavily doped diffused layer 33*b* is formed. The N-type lightly doped diffused layer 31*a* and the N-type heavily doped diffused layer 33*a* form an N-type source diffused layer 36*a* of the LDD structure. The N-type lightly doped diffused layer 31*c* and the N-type heavily doped diffused layer 33*b* form an N-type drain diffused layer 36*c* of the LDD structure. The N-type source/drain diffused layer 36*b* of the N-type lightly doped diffused layer 31*b* is formed. Then, the photoresist film is released.

Thus, the memory cell transistors MT each including the charge storage layer 162, the gate electrode 164 and the source/drain diffused layers 36*a*, 36*b* are formed. The selecting transistors ST each including the gate electrode 172 and the source/drain diffused layers 36*b*, 36*c* are formed (see FIGS. 59A and 59B).

Next, a 10 nm-thickness cobalt film is formed on the entire surface by, e.g., sputtering.

Then, by thermal processing is made to react the silicon atoms in the surface of the semiconductor substrate 20 and the cobalt atoms in the cobalt film with each other. The silicon atoms in the surfaces of the gate electrodes 164 and the cobalt atoms in the cobalt film are reacted with each other. The silicon atoms in the gate electrodes 172 and the cobalt atoms in the cobalt film are reacted with each other. The silicon atoms in the surfaces of the gate electrodes 34*c*, 34*d* and cobalt atoms in the cobalt film are reacted with each other. Thus, the cobalt silicide films 38*a*, 38*b* are formed on the source/drain diffused layers 36*a*, 36*c*. The cobalt silicide film 38*c* is formed on the gate electrodes 164. The cobalt silicide film 38*d* is formed on the gate electrode 172. The cobalt silicide film 38*e* is formed on the source/drain diffused layers 96, 100, 104, 108. The cobalt silicide film 38*f* is formed on the gate electrodes 34*c*, 34*d*.

Figure 60A:
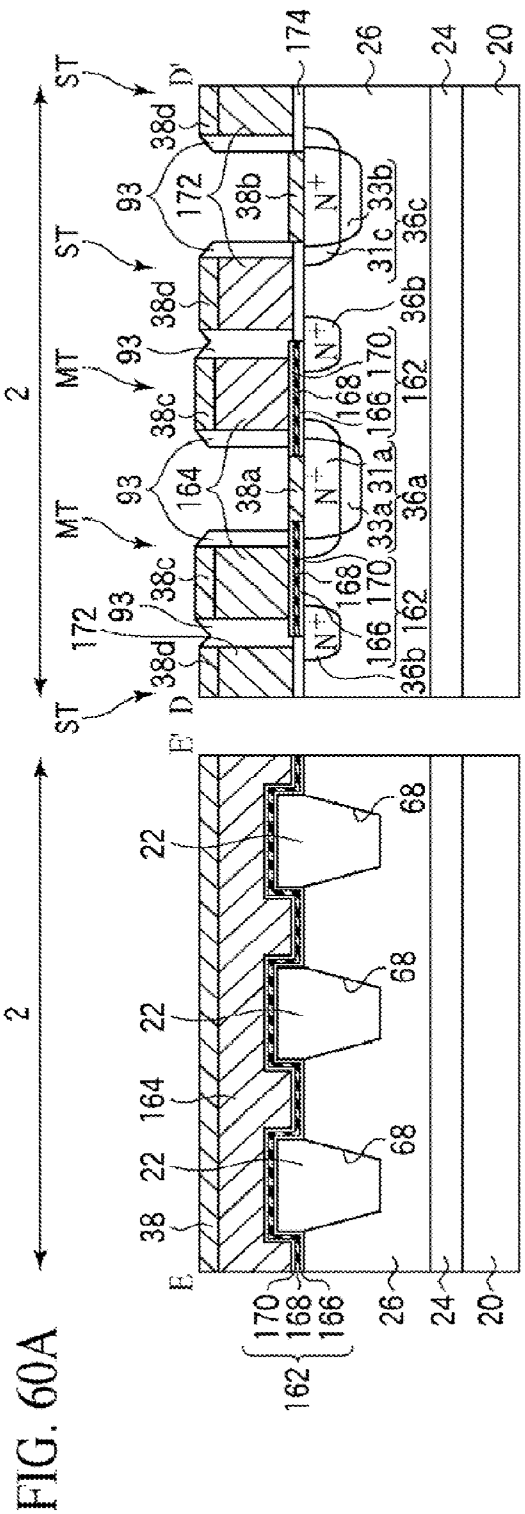
FIG. 60 is sectional views (Part 12) of the nonvolatile semiconductor memory device according to the tenth embodiment in the steps of the method for manufacturing the nonvolatile semiconductor memory device, which illustrates the method.
Figure 60B:
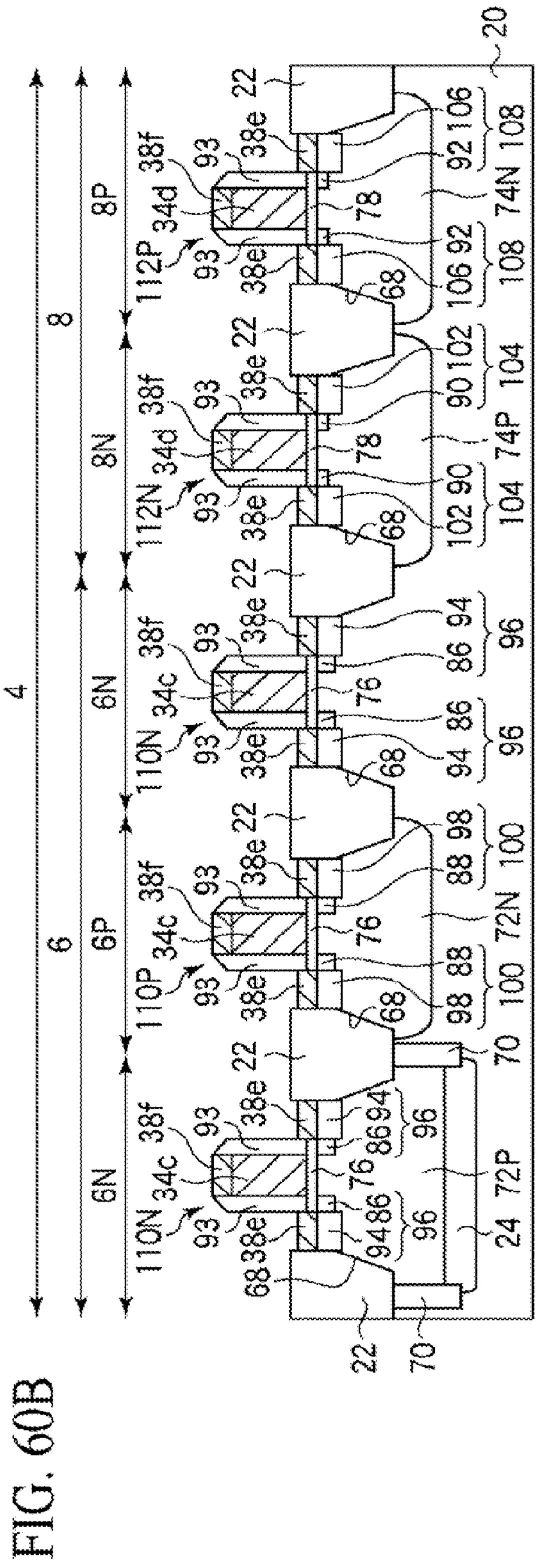

Next, the non-reacted cobalt film is etched off (see FIGS. 60A and 60B).

The cobalt silicide film 38*b* formed on the drain diffused layers 36*c* of the selecting transistors ST function as the drain electrodes.

The cobalt silicide film 38*a* formed on the source diffused layers 36*a* of the memory cell transistors MT function as the source electrodes.

The cobalt silicide film 38*e* formed on the source/drain diffused layers 96, 100 of the high withstand voltage transistors 110N, 110P functions as the source/drain electrodes.

The cobalt silicide film 38*e* formed on the source/drain diffused layers 104, 108 of the low voltage transistors 112N, 112P function as the source/drain electrodes.

Figure 61:
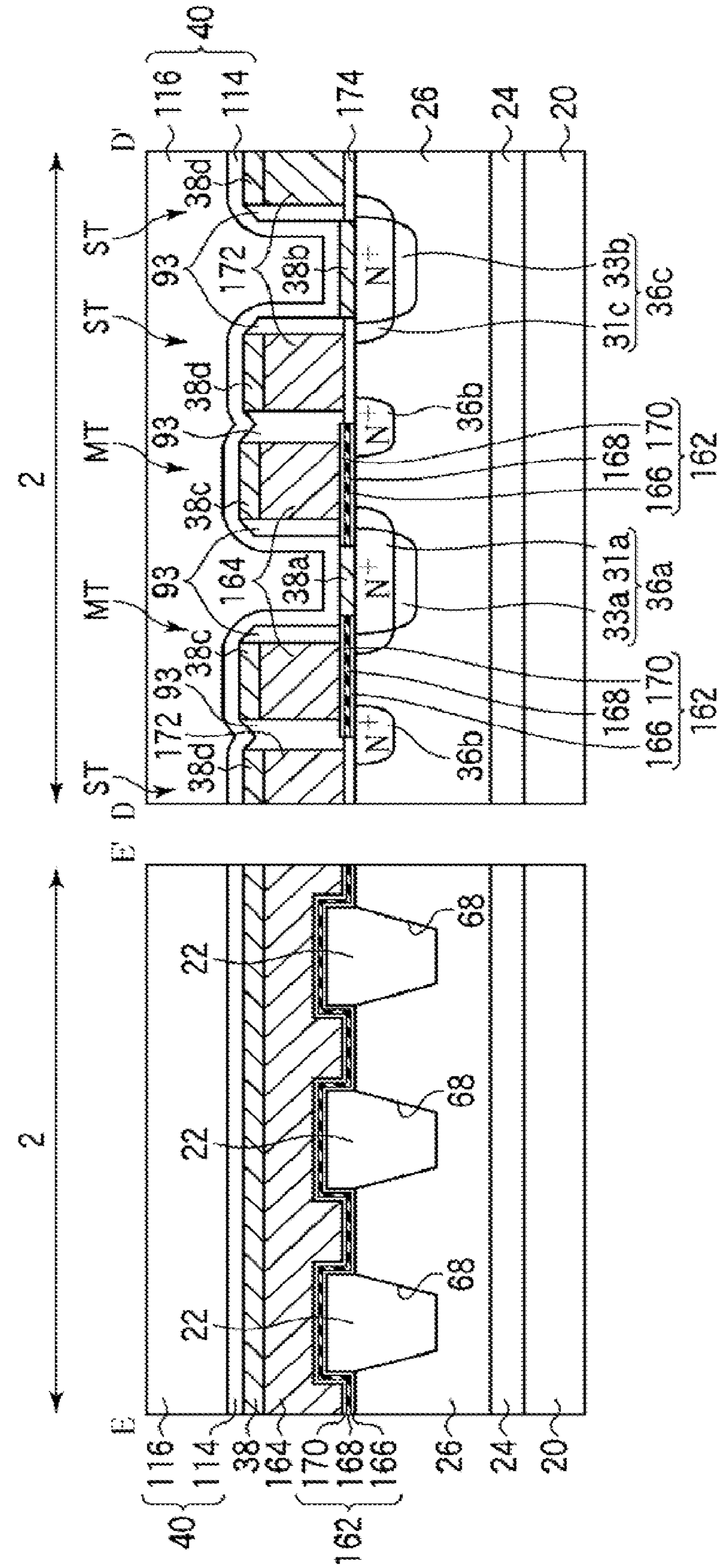
FIG. 61 is a sectional view (Part 13) of the nonvolatile semiconductor memory device according to the tenth embodiment in the steps of the method for manufacturing the nonvolatile semiconductor memory device, which illustrates the method.
Figure 62:
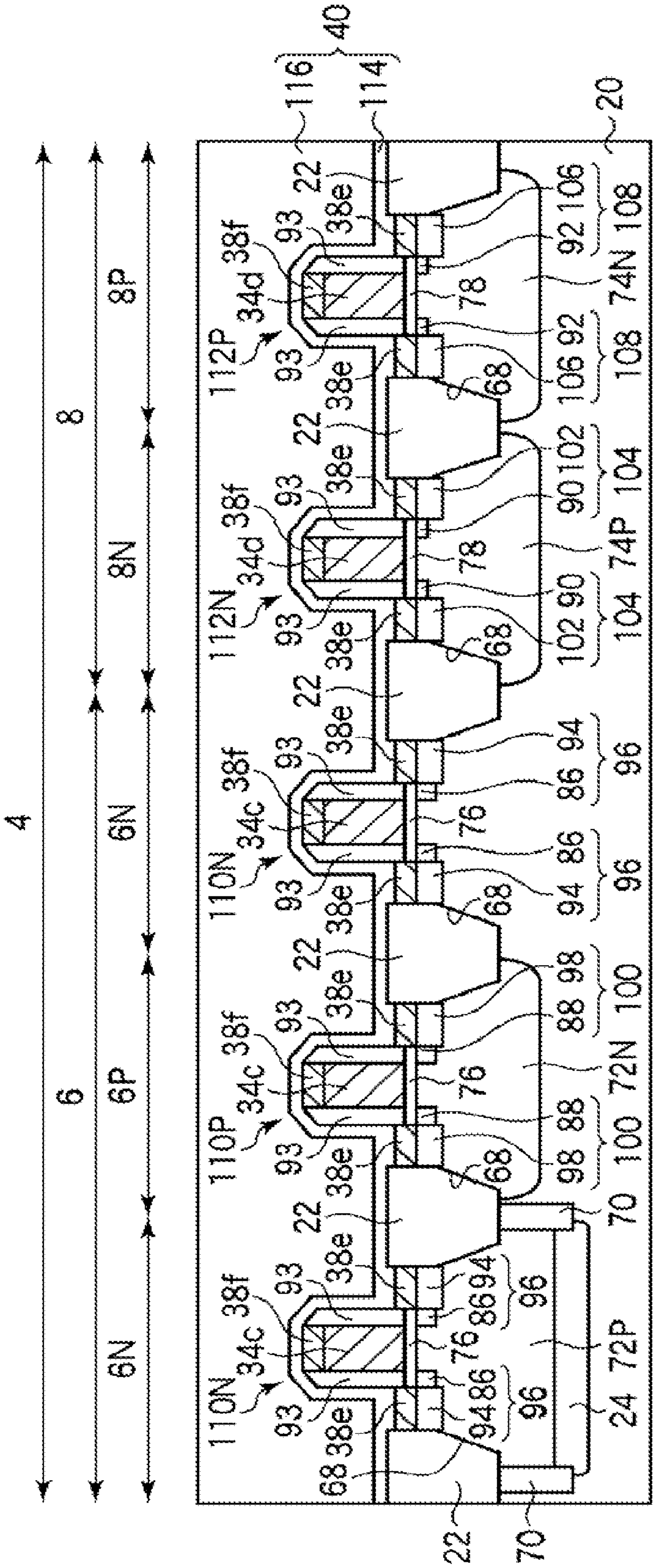
FIG. 62 is sectional views (Part 14) of the nonvolatile semiconductor memory device according to the tenth embodiment in the steps of the method for manufacturing the nonvolatile semiconductor memory device, which illustrates the method.

Next, as illustrated in FIGS. 61 and 62, a 20 nm-thickness silicon nitride film 114 is formed on the entire surface by, e.g., CVD. The silicon nitride film 114 functions as an etching stopper.

Then, a 1.6 μm-thickness silicon oxide film 116 is formed on the entire surface by CVD. Thus, the inter-layer insulation film 40 of the silicon nitride film 114 and the silicon oxide film 116 is formed.

Next, the surface of the inter-layer insulation film 40 is planarized by CMP.

Figure 63:
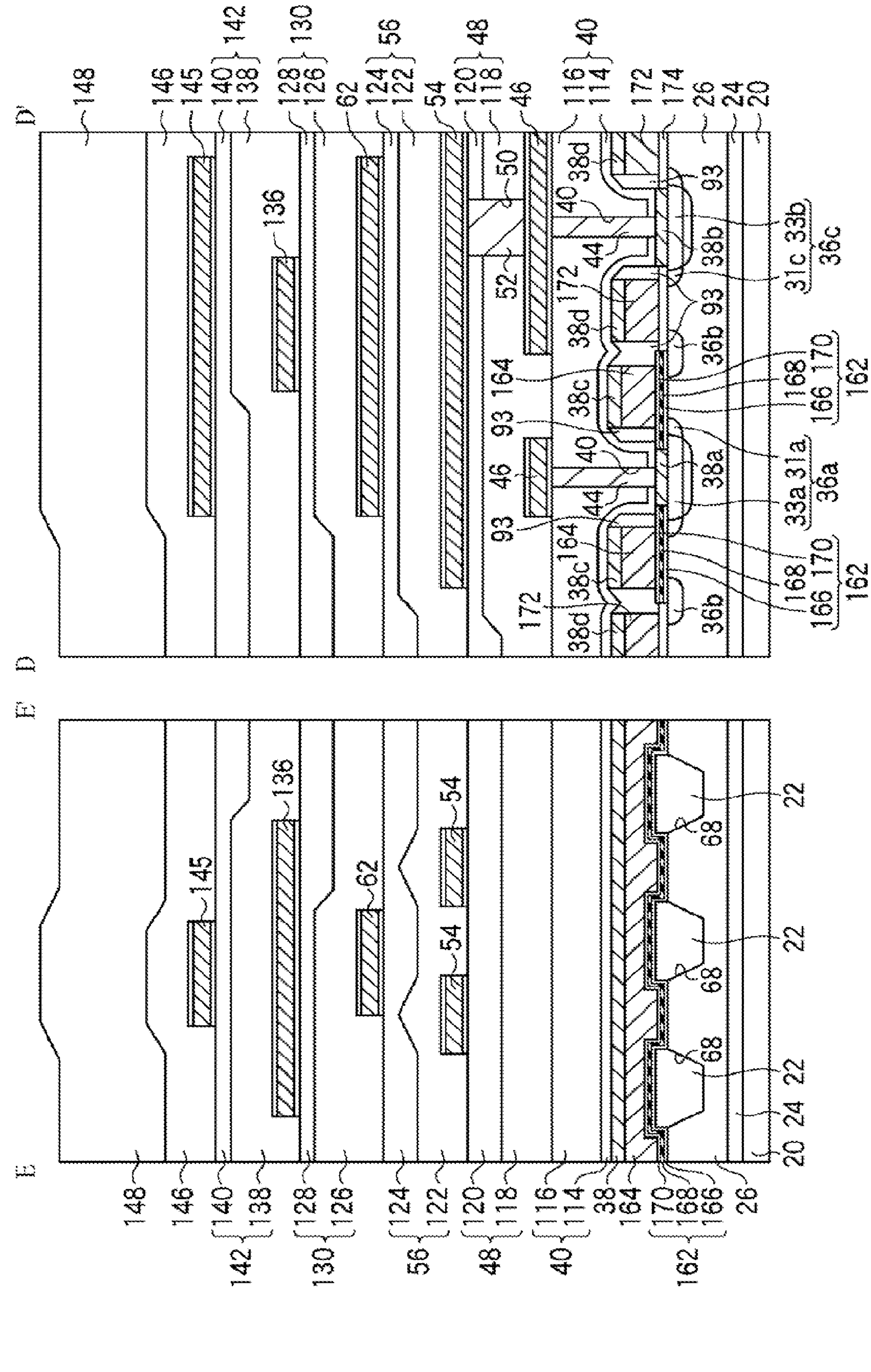
FIG. 63 is sectional views (Part 15) of the nonvolatile semiconductor memory device according to the tenth embodiment in the steps of the method for manufacturing the nonvolatile semiconductor memory device, which illustrates the method.
Figure 64:
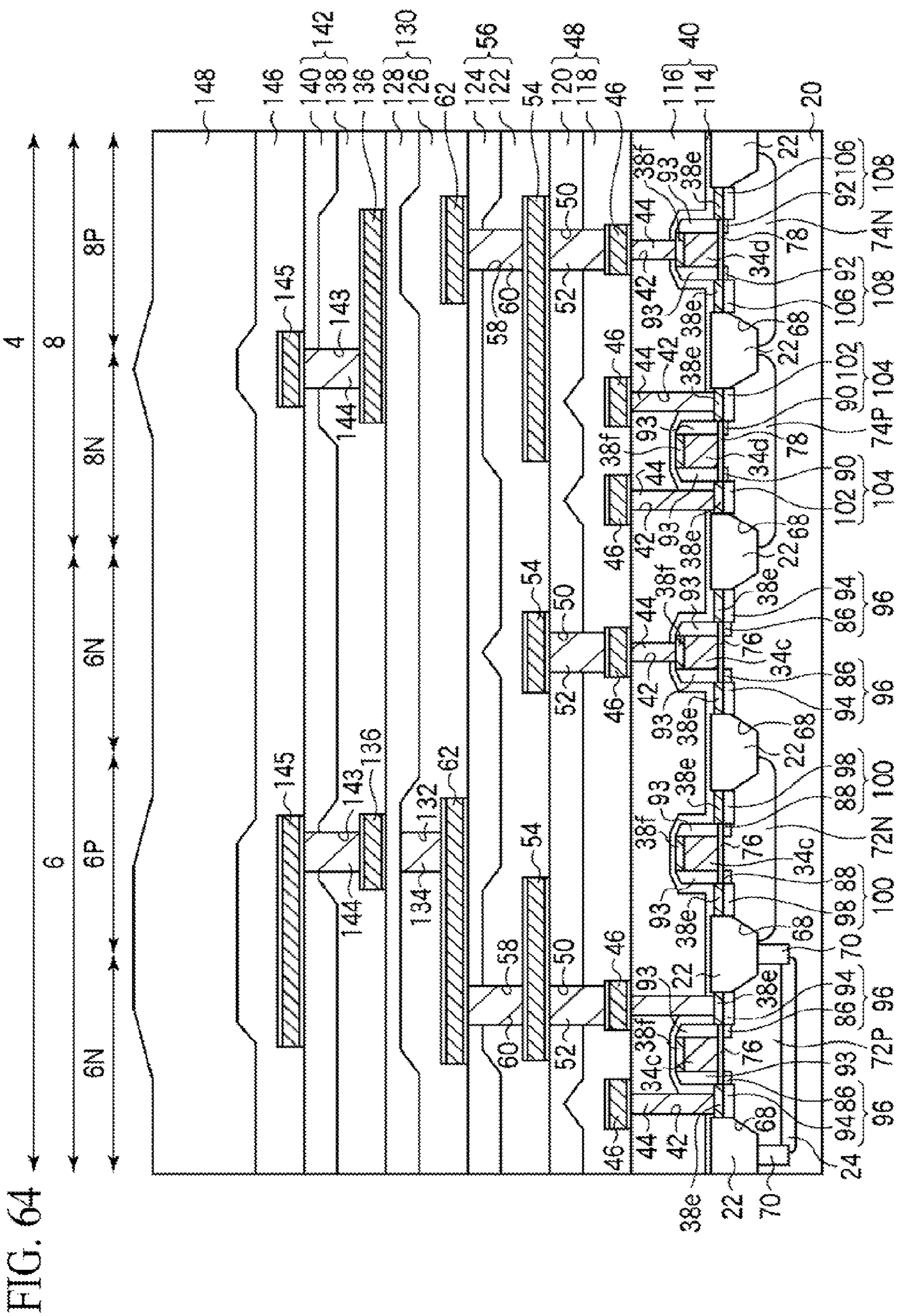
FIG. 64 is sectional views (Part 16) of the nonvolatile semiconductor memory device according to the tenth embodiment in the steps of the method for manufacturing the nonvolatile semiconductor memory device, which illustrates the method.

Next, by photolithography, the contact holes 42 arriving at the source/drain electrodes 38*a*, 38*b*, the contact holes 42 arriving at the source/drain electrodes 38*e* and the contact holes arriving at the cobalt silicide films 38*f* are formed (see FIG. 63 and FIG. 64).

Next, the barrier layer (not illustrated) of a Ti film and a TiN film is formed on the entire surface by sputtering.

Next, a 300 nm-thickness tungsten film 44 is formed on the entire surface by, e.g., CVD.

Next, the tungsten film 44 and the barrier film are polished by CMP until the surface of the inter-layer insulation film 40 is exposed. Thus, the conductor plugs 44 of, e.g., tungsten are buried in the contact holes 42.

Next, by, e.g., sputtering, the layer film 46 of a Ti film, a TiN film, an Al film, a Ti film and a TiN film sequentially laid is formed on the inter-layer insulation film 40 with the conductor plugs 44 buried in.

Next, the layer film 46 is patterned by photolithography. Thus, the interconnections (the first metal interconnection layer) 46 of the layer film are formed.

Next, a silicon oxide film 118 of, e.g., a 720 nm-thickness is formed by, e.g., high density plasma-enhanced CVD.

Next, a silicon oxide film 120 of, e.g., a 1.1 μm-thickness is formed by TEOSCVD. The silicon oxide film 118 and the silicon oxide film 120 form the inter-layer insulation film 48.

Next, the surface of the inter-layer insulation film 48 is planarized by, e.g., CMP.

Next, the contact holes 50 are formed in the inter-layer insulation film 48 down to the interconnections 46 by photolithography.

Next, the barrier film (not illustrated) of a Ti film of, e.g., a 10 nm-thickness and a TiN film of, e.g., a 7 nm-thickness is formed on the entire surface by sputtering.

Next, a 300 nm-thickness tungsten film 52 is formed on the entire surface by, e.g., CVD.

Next, the tungsten film 52 and the barrier film are polished by CMP until the surface of the inter-layer insulation film 48 is exposed. Thus, the conductor plugs 52 of, e.g., tungsten are buried in the contact holes 50.

Next, on the inter-layer insulation film 48 with the conductor plugs 52 buried in, the layer film 52 of a Ti film, a TiN film, an Al film, a Ti film and a TiN film sequentially laid is formed by, e.g., sputtering.

Next, the layer film 54 is patterned by photolithography. Thus, the interconnections (the second metal interconnection layer) 54 of the layer film are formed.

Next, a silicon oxide film 122 is formed by, e.g., high density plasma-enhanced CVD.

Next, a silicon oxide film 124 is formed by TEOSCVED. The silicon oxide film 122 and the silicon oxide film 124 form the inter-layer insulation film 56.

Then, by photolithography, the contact holes 58 arriving at the interconnections 54 are formed in the inter-layer insulation film 56.

Then, the barrier film (not illustrated) of a Ti film and a TiN film is formed on the entire surface by sputtering.

Next, a 300 nm-thickness tungsten film 60 is formed on the entire surface by, e.g., CVD.

Next, the tungsten film 60 and the barrier film are polished by CMP until the surface of the inter-layer insulation film 56 is exposed. Thus, the conductor plugs 60 of, e.g., tungsten are buried in the contact holes 58.

Next, by sputtering, a layer film 62 is formed on the inter-layer insulation film 56 with the conductor plugs 60 buried in.

Then, the layer film 62 is patterned by photolithography. Thus, the interconnections (the third metal interconnection layer) 62 of the layer film are formed.

Next, a silicon oxide film 126 is formed by, e.g., high density plasma-enhanced CVD.

Next, a silicon oxide film 128 is formed by TEOSCVD. The silicon oxide film 126 and the silicon oxide film 128 form the inter-layer insulation film 130.

Then, by photolithography, the contact hole 132 arriving at the interconnection 62 is formed in the inter-layer insulation film 130.

Next, the barrier layer (not illustrated) of a Ti film and a TiN film is formed on the entire surface by sputtering.

Next, a 300 nm-thickness tungsten film 134 is formed on the entire surface by, e.g., CVD.

Then, the tungsten film 134 and the barrier film are polished by CMP until the surface of the inter-layer insulation film 130 is exposed. Thus, the conductor plug 134 of, e.g., tungsten is buried in the contact hole 132.

Then, on the inter-layer insulation film 130 with the conductor plug 134 buried in, a layer film 136 is formed by, e.g., sputtering.

Next, the layer film 136 is patterned by photolithography. Thus, the interconnections (the fourth metal interconnection layer) 136 of the layer film are formed.

Next, a silicon oxide film 138 is formed by, e.g., high density plasma-enhanced CVD.

Next, a silicon oxide film 140 is formed by TEOSCVD. The silicon oxide film 138 and the silicon oxide film 140 form the inter-layer insulation film 142.

Then, by photolithography, the contact holes 143 arriving at the interconnections 136 are formed in the inter-layer insulation film 142.

Next, the barrier layer (not illustrated) of a Ti film and a TiN film is formed on the entire surface by sputtering.

Then, a 300 nm-thickness tungsten film 146 is formed on the entire surface by, e.g., CVD.

Then, the tungsten film 146 and the barrier film are polished by CMP until the surface of the inter-layer insulation film 142 is exposed. Thus, the conductor plugs 144 of, e.g., tungsten are buried in the contact holes 143.

Then, by, e.g., sputtering, the layer film 145 is formed on the inter-layer insulation film 142 with the conductor plugs 144 buried in.

Then, the layer film 145 is patterned by photolithography. Thus, the interconnections (the fifth metal interconnection layer) 145 of the layer film are formed.

Then, a silicon oxide film 146 is formed by, e.g., high density plasma-enhanced CVD.

Next, a 1 μm-thickness silicon nitride film 148 is formed by plasma-enhanced CVD.

Thus, the nonvolatile semiconductor memory device according to the present embodiment is manufactured.

[k] Eleventh Embodiment

The nonvolatile semiconductor memory device according to an eleventh embodiment, and the reading method, the writing method and the erasing method will be explained with reference to FIG. 65 and FIG. 66. FIG. 65 is the circuit diagram of the nonvolatile semiconductor memory device according to the present embodiment. The same members of the present embodiment as those of the nonvolatile semiconductor memory device, etc. according to the first to the tenth embodiments are represented by the same reference numbers not to repeat or to simplify their explanation.

The nonvolatile semiconductor memory device according to the present embodiment is characterized mainly in that the sources of the memory cell transistors MT present in rows adjacent to each other are connected by a common source line SL.

Figure 65:
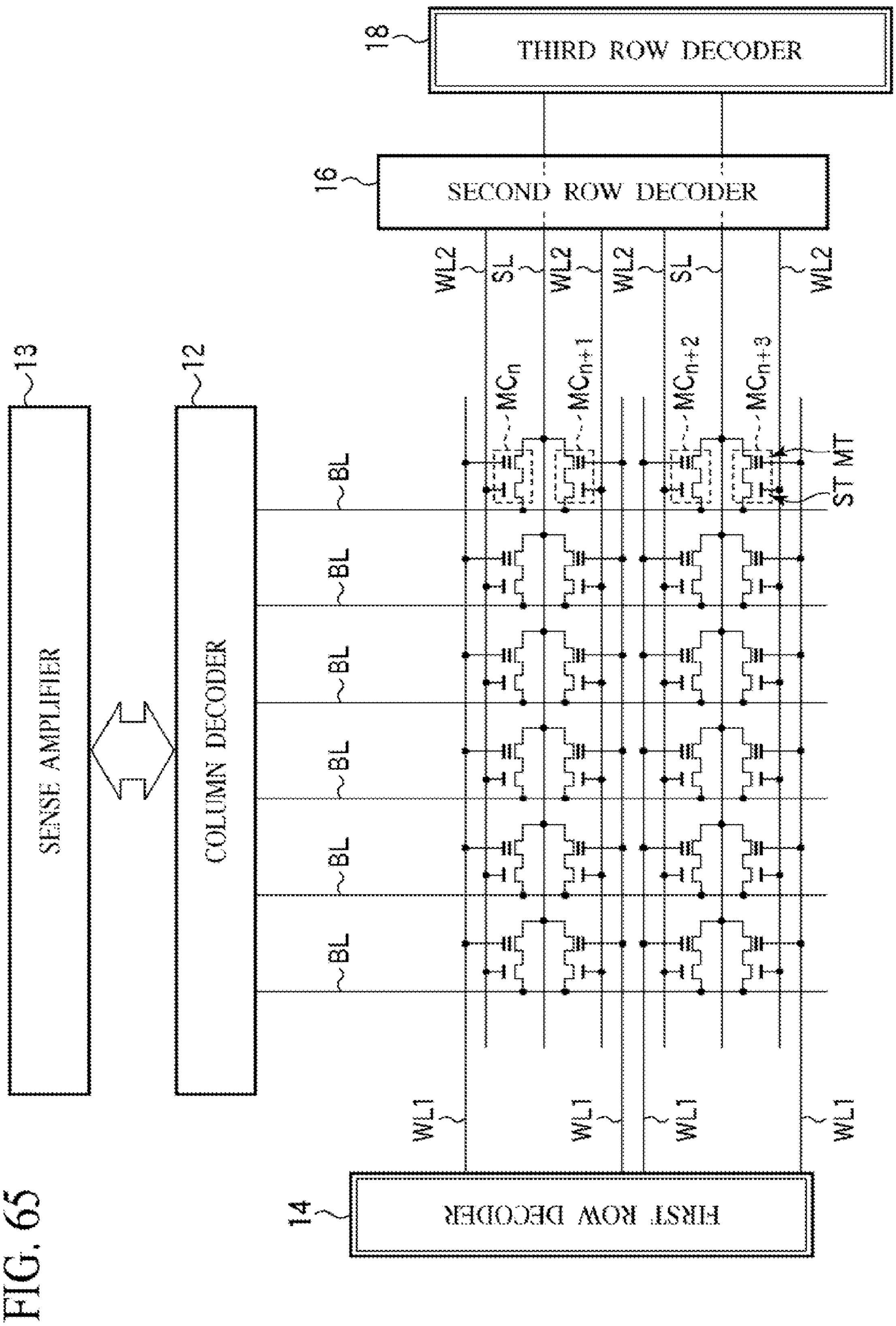
FIG. 65 is the circuit diagram of the nonvolatile semiconductor memory device according to an eleventh embodiment.

As illustrated in FIG. 65, a plurality of memory cells $MC_n$ are arranged in the $n^{th}$ row. In the $n+1^{th}$ row, a plurality of memory cells $MC_{n+1}$ are arranged. In the $n+2^{th}$ row, a plurality of memory cells $MC_{n+2}$ are arranged. In the $n+3^{th}$ row, a plurality of memory cells $MC_{n+3}$ are arranged. Similarly, in the $n+m^{th}$ row, a plurality of memory cells $MC_{n+m}$ are arranged.

The sources of the memory cell transistors MT of the memory cells $MC_{n+2}$ of the $n^{th}$ row and the sources of the memory cell transistors MT of the memory cells $MC_{m+1}$ of the $n+1^{th}$ row are connected by a common source line SL.

The sources of the memory cell transistors MT of the memory cells $MC_{n+2}$ of the $n+2^{th}$ row and the sources of the memory cell transistors MT of the memory cells $MC_{n+3}$ of the $n+3^{th}$ row are connected by a common source line SL.

That is, in the present embodiment, the sources of the memory cell transistors MT present in rows adjacent to each other are connected by a common source line SL.

The respective source lines are connected to the third row decoder 18.

According to the present embodiment, the sources of the memory cell transistors MT present in the rows adjacent to each other are connected by a common source line SL, whereby the area of the memory cell array region 2 can be reduced, and the nonvolatile semiconductor memory device can be downsized.

According to the present embodiment, the number of the source lines SL to be controlled by the third row decoder 18 can be small, whereby the third row decoder 18 can be simplified.

(Operations of Nonvolatile Semiconductor Memory Device)

Next, the operation methods of the nonvolatile semiconductor memory device according to the present embodiment will be explained with reference to FIG. 66. FIG. 66 is the view illustrating the reading method, the writing method and the erasing method of the nonvolatile semiconductor memory device according to the present embodiment. In FIG. 66, the voltages in the parentheses are the potentials of the non-selected lines.

(Reading Method)

First, the reading method of the nonvolatile semiconductor memory device according to the present embodiment will be explained with reference to FIG. 66.

When information written in the memory cell transistor MT is read, the potentials of the respective parts are set as follows. That is, the potential of the bit line BL connected to a memory cell $MC_n$ to be selected is set at $V_{CC}$ (the first potential). The potential of the bit lines BL other than the selected bit line is set at 0 V. The potential of all the source lines SL is set at 0 V. The potential of all the first word line WL1 on standby for read is constantly $V_{CC}$. The potential of the second word line WL2 connected to the memory cell MG to be selected is set at $V_{CC}$. The potential of the second word lines WL2 other than the selected second word line WL2 is set at 0 V. The potential of all the wells 26 is set at 0 V. In the present embodiment, the potential of the source lines SL is set at 0 V on standby for read, and the potential of the first word lines WL1 on standby for read is constantly set at $V_{CC}$, which permits information written in the memory cell transistor MT to be read only by controlling the potential of the bit lines BL and the potential of the second word lines WL2. In the present embodiment, the column decoder 12 for controlling the potential of the bit lines BL is formed of the low voltage circuit as described above, the bit lines BL can be controlled at high speed. The second row decoder 16 for controlling the potential of the second word lines WL2 is formed of the low voltage circuit, whereby the second word lines WL2 can be controlled at high speed. Furthermore, the gate insulation film 174 of the selecting transistors ST is formed relatively thin, whereby the selecting transistors ST can operate at high speed. Thus, according to the present embodiment, information written in the memory cell transistors MT can be read at high speed.

When information is written into a memory cell transistor MT, i.e., the information in the memory cell transistor is "0", charges are stored in the charge storage layer 162 of the memory cell transistor MT. In this case, no current flows between the source diffused layer 36*a* of the memory cell transistor MT and the drain diffused layer 36*c* of the selecting transistor ST, and no current flows in the selected bit line BL. In this case, the information in the memory cell transistor MT is judged to be "0".

On the other hand, when information written in a memory cell transistor MT has been erased, i.e., when the information in the memory cell is "1", no charges are stored in the charge storage layer 162 of the memory cell transistor MT. In this case, current flows between the source diffused layer 36*a* of the memory cell transistor MT and the drain diffused layer 36*c* of the selecting transistor ST, and current flows in the selected bit line BL. The current flowing in the selected bit line BL is detected by the sense amplifier 13. In this case, the information in the memory cell transistor MT is judged to be "1".

(Writing Method)

Next, the writing method of the nonvolatile semiconductor memory device according to the present embodiment will be explained with reference to FIG. 66.

When information is written into a memory cell transistor MT, the potential of the respective parts are set as follows.

That is, the potential of the bit line BL connected to the memory cell $MC_n$ to be selected is set at 0 V (ground voltage). On the other hand, the bit lines BL other than the selected bit line BL is set at $V_{CC}$.

To the source line SL connected to the memory cell $MC_n$ to be selected, the second voltage in pulses as illustrated in FIG. 45 is applied. The pulsated second voltage to be applied to the source line SL is, e.g., 5 V. On the other hand, the potential of the source lines SL other than the selected source line is set at 0 V (ground voltage).

To the first word line WL1 connected to the memory cell $MC_n$ to be selected, as illustrated in FIG. 45, FIG. 47 and FIG. 48, the first voltage $V_{step}$ which gradually rises is applied. On the other hand, the potential of the first word lines WL1 other than the selected first word line WL1 is set at 0 V (ground voltage).

The potential of the second word line WL2 connected to the memory cell $MC_n$ to be selected is set at $V_{CC}$ (the first potential). On the other hand, the potential of the second word lines WL2 other than the selected second word line WL2 is set at 0 V (ground voltage).

The potential of all the wells is set at 0 V (ground voltage).

Thus, information is written into the memory cell transistor MT of the selected memory cell $MC_n$.

(Erasing Method)

Next, the erasing method of the nonvolatile semiconductor memory device according to the present embodiment will be explained with reference to FIG. 66.

When information written in the memory cell array 10 is erased, the potentials of the respective parts are set as follows.

That is, the potential of all the bit lines BL is set at 0 V (ground voltage). The potential of all the source lines SL is set at 5 V. The potential of all the first word line WL is set at, e.g., −5 V. The potential of all the second word lines WL2 is set at 0 V (ground voltage). The potential of all the wells 26 is set at 0 V (ground voltage).

When the potentials of the respective parts are set as above, charges are drawn out of the charge storage layer 162 of the memory cell transistor MT. Thus, the charge storage layer 162 of the memory cell transistor MT stores no charges, and the information in the memory cell transistor MT is erased.

[l] Twelfth Embodiment

Figure 67:
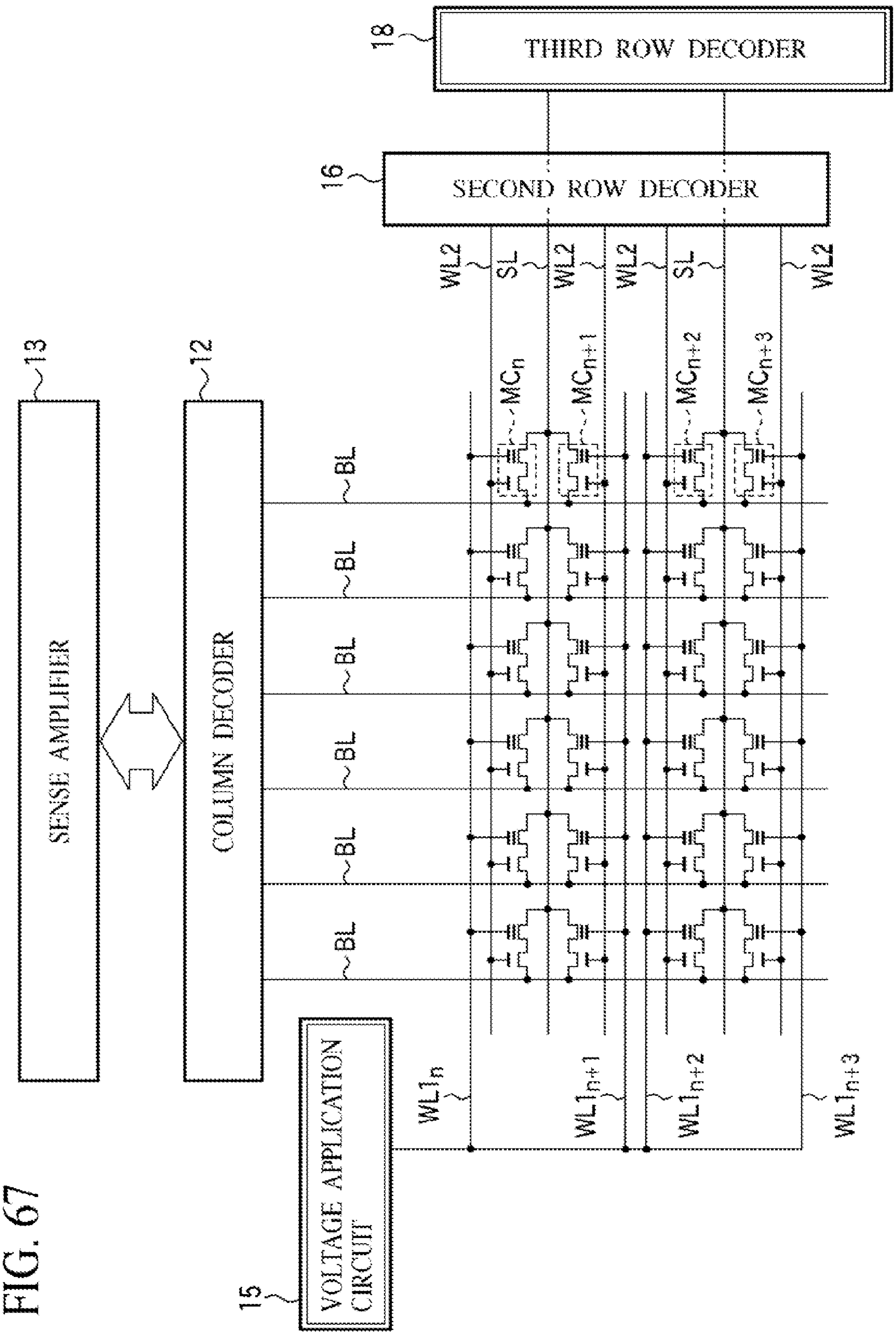
FIG. 67 is the circuit diagram of the nonvolatile semiconductor memory device according to a twelfth embodiment.

The nonvolatile semiconductor memory device according to a twelfth embodiment, and the reading method, the writing method and the erasing method will be explained with reference to FIG. 67 and FIG. 68. FIG. 67 is the circuit diagram of the nonvolatile semiconductor memory device according to the present embodiment. The same members of the present embodiment as those of the nonvolatile semiconductor memory device, etc. according to the first to the eleventh embodiments illustrated in FIGS. 1 to 66 are represented by the same reference numbers not to repeat or to simplify their explanation.

The nonvolatile semiconductor memory device according to the present embodiment is characterized mainly in that the potential of a plurality of the first word lines WL1 is controlled at once by a voltage application circuit 15.

As illustrated in FIG. 67, a plurality of memory cells $MC_n$ are arranged in the $n^{th}$ row. In the $n+1^{th}$ row, a plurality of memory cell $MC_{n+1}$ are arranged. In the $n+2^{th}$ row, a plurality of memory cells $MC_{n+2}$ are arranged. In the $n+3^{th}$ row, a plurality of memory cells $MC_{n+3}$ are arranged. Similarly, in the $n+m^{th}$ row, a plurality of memory cell $MC_{n+m}$ are arranged.

The sources of the memory cell transistors MT of the memory cells $MC_n$ in the $n^{th}$ row and the sources of the memory cell transistors MT of the memory cell $MC_{n+1}$ in the $n+1^{th}$ row are connected by a common source line SL.

The sources of the memory cell transistors MT of the memory cells $MC_{n+2}$ in the $n+2^{th}$ row and the sources of the memory cell transistors MT of the memory cells $MC_{n+3}$ in the $n+3^{th}$ row are connected by a common source line SL.

That is, in the present embodiment, the sources of the memory cell transistors MT present in rows adjacent to each other are connected by a common source line SL.

The respective source lines are connected to the third row decoder 18.

The memory cell transistors MT of a plurality of memory cells $MC_n$ present in the $n^{th}$ row are connected by the $n^{th}$ row first word line WL1.

The memory cell transistors MT of a plurality of memory cells $MC_{n+1}$ present in the $n+1^{th}$ row are connected by the $n+1^{th}$ row first word line $WL1_{n+1}$.

The memory cell transistors MT of a plurality of memory cells $MC_{n+2}$ present in the $n+2^{th}$ row are connected by the $n+2^{th}$ row first word line $WL1_{n+2}$.

The memory cell transistors MT of a plurality of memory cells $MC_{n+3}$ present in the $n+3^{th}$ row are connected by the $n+3^{th}$ row first word line $WL1_{n+3}$.

The voltage to be applied to the $n^{th}$ row first word line $WL1_n$, the $n+1^{th}$ row first word line $WL1_{n+1}$, the $n+2^{th}$ row first word line $WL1_{n+2}$ and the $n+3^{th}$ row first word line $WL1_{n+3}$ is controlled at once by the voltage application circuit 15.

The nonvolatile semiconductor memory device according to the present embodiment has been explained here by means of the example that the potential of 4 of the first word lines $WL1_n$-$WL1_{n+4}$ is controlled at once by the voltage application circuit 15. However, as long as no erroneous operations take place, more of the first word lines may be controlled at once by the voltage application circuit 15. For example, the potential of 8 of the first word lines WL1 may be controlled at once by the voltage application circuit 15. Furthermore, the potential of 16 of the first word lines WL1 may be controlled at once by the voltage application circuit 15.

According to the present embodiment, the potential of a plurality of the first word lines WL1 is controlled at once by the voltage application circuit 15. The voltage application circuit 15 which can control the potential of a plurality of the first word lines WL1 at once has a simpler circuit constitution in comparison with the first row decoder 14 (see FIG. 1) which controls the potential of the respective first word lines WL1. Thus, according to the present embodiment, the nonvolatile semiconductor memory device can be downsized and less costs.

(Operations of Nonvolatile Semiconductor Memory Device)

Then, the operation methods of the nonvolatile semiconductor memory device according to the present embodiment will be explained with reference to FIG. 68. FIG. 68 is a view illustrating the reading method, the writing method and the erasing method of the nonvolatile semiconductor memory device according to the present embodiment. In FIG. 68, the voltages in the parentheses are the potentials of the non-selected lines.

(Reading Method)

The reading method of the nonvolatile semiconductor memory device according to the present embodiment will be explained with reference to FIG. 68.

When information written in a memory cell transistor MT is read, the potentials of the respective parts are set as follows. That is, the potential of the bit line BL connected to a memory cell $MC_n$ to be selected is set at $V_{CC}$ (the first potential). The potentials of the bit lines BL other than the selected bit line is set at 0 V. The potential of all the source lines SL is set at 0 V. The potential of the first word lines WL1 on standby for read is constantly $V_{CC}$. The potential of the first word line WL1 is controlled at once by the voltage application circuit 15. The potential of the second word line WL2 connected to the memory cell $MC_n$ to be selected is set at $V_{CC}$. On the other hand, the potential of the second word lines WL2 other than the selected second word line WL2 is set at 0 V. The potential of all the wells 26 is 0 V. In the present embodiment, the potential of the source lines SL on standby for read is set at 0

V, and the potential of the first word lines WL1 on standby for read is constantly $V_{CC}$, whereby information written in the memory cell transistors MT can be read only by controlling the potential of the bit lines BL and the potential of the second word lines WL2. In the present embodiment, the column decoder 12 for controlling the potential of the bit lines BL is formed of the low voltage circuit as described above, whereby the bit lines BL can be controlled at high speed. The second row decoder 16 for controlling the potential of the second word lines WL2 is formed of the low voltage circuit, whereby the second word lines WL2 can be controlled at high speed. Besides, the gate insulation film 174 of the selecting transistors ST is formed relatively thin, whereby the selecting transistors ST are operative at high speed. Thus, according to the present embodiment, information written in the memory cell transistors MT can be read at high speed.

When information is written into a memory cell transistor MT, i.e., when the information in the memory cell transistor MT is "0", charges are stored in the charge storage layer 162 of the memory cell transistor MT. In this case, no current flows between the source diffused layer 36_a_ of the memory cell transistor MT and the drain diffused layer 36_c_ of the selecting transistor ST, and no current flows in the selected bit line BL. In this case, the information in the memory cell transistor MT is judged to be "0".

On the other hand, when information written in a memory cell transistor MT has been erased, i.e., information in the memory cell is "1", no charges are stored in the charge storage layer 162 of the memory cell transistor MT. In this case, current flows between the source diffused layer 36_a_ of the memory cell transistor MT and the drain diffused layer 36_c_ of the selecting transistor ST, and current flows in the selected bit line BL. The current flowing in the selected bit line BL is detected by the sense amplifier 13. In this case, the information in the memory cell transistor MT is judged to be "1".

(Writing Method)

Next, the writing method of the nonvolatile semiconductor memory device according to the present embodiment will be explained with reference to FIG. 68.

When information is written into a memory cell transistor MT, the potentials of the respective parts are set as follows.

That is, the potential of the bit line BL connected to the memory cell $MC_n$ to be selected is set at 0 V (ground voltage). On the other hand, the potential of the bit lines BL other than the selected bit line BL is set at $V_{CC}$.

To the source line SL connected to the memory cell $MC_n$ to be selected, the second voltage is applied in pulses as illustrated in FIG. 45. The pulsated second voltage to be applied to the source line SL is, e.g., 5.5 V. On the other hand, the potential of the source lines SL other than the selected source line SL is set at 0 V (ground voltage).

To the first word lines WL1, as illustrated in FIG. 45, FIG. 47 and FIG. 48, the first voltage $V_{step}$ which gradually rises is applied. The potential of the first word lines WL1 is controlled at once by the voltage application circuit 15.

The potential of the second word line WL2 connected to the memory cell $MC_n$ to be selected is set at $V_{CC}$ (the first potential). On the other hand, the potential of the second word lines WL2 other than the selected second word line WL2 is set at 0 V (ground voltage).

The potential of all the wells is 0 V (ground voltage).

Thus, information is written into the memory cell transistor MT of the selected memory cell $MC_n$.

(Erasing Method)

Next, the erasing method of the nonvolatile semiconductor memory device according to the present embodiment will be explained with reference to FIG. 68.

When information written in the memory cell array 10 is erased, the potentials of the respective parts are set as follows.

That is, the potential of all the bit lines BL is set at 0 V (ground voltage). The potential of all the source lines SL is set at 5V. The potential of all the first word lines WL1 is set at, e.g., −5 V. The potential of the first word lines WL1 is controlled at once by the voltage application circuit 15. The potential of the second word lines WL2 is set at 0 V (ground voltage). The potential of the wells 26 is 0 V (ground voltage).

When the potentials of the respective parts are set as above, charges are drawn out of the chare storage layers 162 of the memory cell transistors MT. Thus, no charges are stored in the charge storage layers 162 of the memory cell transistors MT, and information in the memory cell transistors MT is erased.

[m] Thirteenth Embodiment

The nonvolatile semiconductor memory device according to a thirteenth embodiment, and the reading method, the writing method and the erasing method will be explained with reference to FIG. 69. FIG. 69 is the view illustrating the reading method, the writing method and the erasing method of the nonvolatile semiconductor memory device according to the present embodiment. In FIG. 69, the voltages in the parentheses are the potentials of the non-selected lines. The same members of the present embodiment as those of the nonvolatile semiconductor memory device, etc. according to the first to the twelfth embodiments illustrated in FIGS. 1 to 68 are represented by the same reference numbers not to repeat or to simplify their explanation.

(Reading Method)

First, the reading method of the nonvolatile semiconductor memory device according to the present embodiment will be explained with reference to FIG. 69.

When information written in a memory cell transistor MT is read, the potentials of the respective parts are set as follows. That is, the potential of the bit line BL connected to a memory cell MC to be selected is set at $V_{CC}$ (the first potential). On the other hand, the potential of the bit lines BL other than the selected bit line is set at 0 V. The potential of all the source lines SL is set at 0 V. The potential of all the first word lines WL1 on standby for read is constantly $V_r$. The $V_r$ is a voltage which is higher than a power supply voltage $V_{CC}$ of the logic circuit.

When two kinds of electric power supplies to be supplied to the nonvolatile semiconductor memory device are present, the higher one of the two kinds of electric power supplies can be used to apply a voltage $V_r$ to the first word lines WL1. When the electric power supply to be supplied to the nonvolatile semiconductor memory device is higher than the power supply voltage $V_{CC}$ of the logic circuit, such electric power supply can be used to apply the voltage $V_r$ to the first word lines WL1. The electric power supply to be supplied to the nonvolatile semiconductor memory device may be applied as it is to the first word lines WL1, or the electric power supply to be supplied to the nonvolatile semiconductor memory device may be applied as lowered to the first word lines WL1.

According to the present embodiment, the voltage $V_r$ which is higher than the power supply voltage $V_{cc}$ of the logic circuit is applied to the first word lines WL1, whereby the read current can be increased, and resultantly, the reading time can be decreased.

(Writing Method and Erasing Method)

The writing method and the erasing method of the nonvolatile semiconductor memory device according to the present embodiment may be the same as any one of the tenth to the twelfth embodiment. The writing method and the erasing method of the nonvolatile semiconductor memory device according to the present embodiment are not explained here.

[n] A Fourteenth Embodiment

Figure 70:
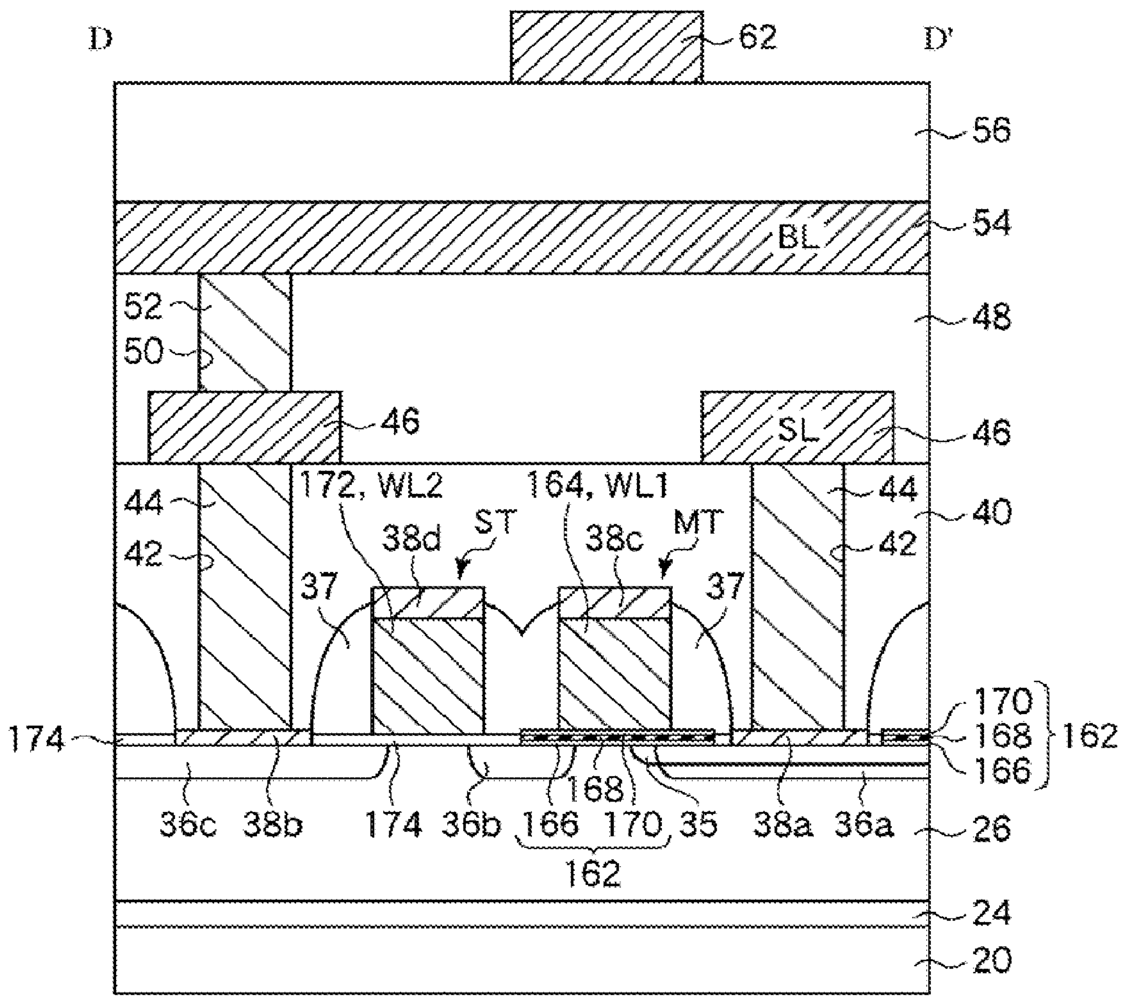
FIG. 70 is a sectional view of the nonvolatile semiconductor memory device according to a fourteenth embodiment.

The nonvolatile semiconductor memory device according to a fourteenth embodiment, and its reading method will be explained with reference to FIG. 70. FIG. 70 is a sectional view of the nonvolatile semiconductor memory device according to the present embodiment. The same members of the present embodiment as those of the nonvolatile semiconductor memory device according to the first to the thirteenth embodiments are represented by the same reference numbers not to repeat or to simplify the explanation.

The nonvolatile semiconductor memory device according to the present embodiment is characterized mainly in that a P-type dopant impurity is implanted in a region where an N-type source diffused layer 36*a* is formed, whereby a P-type impurity diffused layer 35 is formed.

As illustrated in FIG. 70, a P-type dopant impurity is implanted in a region containing the region for the N-type source diffused layer 36*a* is formed. Thus, in the region containing the region for the N-type source diffused layer 36*a* formed in, the P-type impurity diffused layer 35 is formed.

In the present embodiment, the P-type impurity diffused layer 35 is formed in the region containing the region for the N-type source diffused layer 36*a* formed in for the following reason.

That is, The P-type impurity diffused layer 35 is formed in the region containing the region for the N-type source diffused layer 36*a* formed in, whereby the expansion of the depletion layer from the N-type source diffused layer 36*a* can be suppressed. The expansion of the depletion layer from the N-type source diffused layer 36*a* is suppressed, whereby the electric field intensity is increased near the N-type source diffused layer 36*a*, and carriers can be abruptly accelerated near the N-type source diffused layer 36*a*. In the present embodiment, carriers can be abruptly accelerated, whereby the write speed of writing information in the memory cell transistors MT can be increased.

The P-type dopant impurity is not implanted in the region where the source/drain diffused layers 36*b*, 36*c* of the selecting transistor ST are formed, whereby the selecting transistor ST is never influenced by the P-type dopant impurity. Accordingly, the threshold value of the selecting transistor ST never rises, and the selecting transistor ST can operate at high speed.

(Reading Method)

The reading method of the nonvolatile semiconductor memory device according to the present embodiment is characterized mainly in that the voltage $V_r$ higher than the power supply voltage $V_{CC}$ of the logic circuit is applied to the first word lines WL1.

In the present embodiment, the P-type impurity diffused layer 35 is formed in the region containing the N-type source diffused layer 36*a* of the memory cell transistor MT, whereby the threshold voltage of the memory cell transistor MT is relatively high. Accordingly, when the $V_{CC}$, which is a relatively low voltage, is applied to the first word line WL1, there is a risk that sufficient current might not flow between the source and the drain of the memory cell transistor MT.

Thus, in the present embodiment, when information written in a memory cell transistor MT is read, the voltage $V_r$ higher than the power supply voltage $V_{CC}$ of the logic circuit is applied to the first word line WL1. The relatively high voltage $V_r$ is applied to the first word line WL1, whereby sufficient current can flow between the source and the drain of the memory cell transistor MT, and information written in the memory cell transistor MT can be stably read.

The reading method has been explained by means of the example that the voltage $V_r$ higher than the power supply voltage $V_{CC}$ of the logic circuit is applied to the word line WL1, but in the case that even when the $V_{CC}$ is applied to the first word line WL1, sufficient current flows between the source and the drain of the memory cell transistor MT, the $V_{CC}$ may be applied to the first word line WL1.

MODIFIED EMBODIMENTS

The present invention is not limited to the above-described embodiments and can cover other various modifications.

For example, in the sixth embodiment, when information is written into a memory cell transistor MT, the potential (the first potential) of the second word line WL2 is set at 4 V. However, the potential (the first potential) of the second word line WL2 at the time when information is written into a memory cell transistor MT is not limited to 4 V. The potential (the first potential) of the second word line WL2 at the time when information is written into a memory cell transistor MT may be higher than the power supply voltage $V_{CC}$ of the low voltage circuit. A voltage higher than the power supply voltage $V_{CC}$ of the low voltage circuit is applied to the second word line WL2, whereby the current flowing in the channel of the selecting transistor ST can be increased, and the write speed can be increased.

In the seventh embodiment, when information is written into a memory cell transistor MT, the potential (the third potential) of the third control line CL3 is set at 6 V. However, the potential (the third potential) of the third control line CL3 at the time when information is written into a memory cell transistor MT is not limited to 6 V. The potential (the third potential) of the third control line CL3 at the time when information is written into a memory cell transistor MT may be set at a potential higher than the potential (the first potential) of the selected source line SL. A potential higher than the potential (the first potential) of at least the selected source line SL is applied to the third control line CL3, whereby the bypass transistor 158 can be turned on-state.

In the eighth embodiment, when information is written into a memory cell transistor MT, the potential (the third potential) of the third control line CL3 is set at 10V. The potential of the third control line CL3 at the time when information is written into a memory cell transistor MT is not limited to 10 V.

In the first to the ninth embodiments, the voltage of the respective plural first word lines WL1 is controlled by the first row decoder 14. However, as in the nonvolatile semiconductor memory device according to the twelfth embodiment described above with reference to FIG. 67, the voltage of the plural first word lines WL1 may controlled at once by the voltage application circuit 15. The voltage application circuit 15 (see FIG. 67) for controlling the voltage of the plural first word lines WL1 has a simple circuit structure than the first row decoder 14 for controlling the potential of the respective first word lines WL1. The voltage application circuit which controls the voltage of the plural first word lines WL1 at once is used, whereby the nonvolatile semiconductor memory device can be downsized and costs less.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present inventions have been described in detail, it should be understood that the various changes, substitutions, and alterations could be made hereto without departing from the spirit and scope of the invention.

What is claimed is:

1. A nonvolatile semiconductor memory device comprising:

a memory cell array having a plurality of memory cells arranged in a matrix and a peripheral circuit, a first active region and a second active region defined by isolation regions in a memory cell array region, extending in a first direction, a first gate insulating film and a second gate insulating film on the first active region, a third gate insulating film and a fourth gate insulating film on the second active region, a first floating gate above the first gate insulating film, a third floating gate above the third gate insulating film, a first gate electrode above the first floating gate, a second gate electrode above the second gate insulating film, a third gate electrode above the third floating gate, a fourth gate electrode above the fourth gate insulating film, a first sidewall spacer on a sidewall of the first gate electrode, a second sidewall spacer on a sidewall of the second gate electrode, a third sidewall spacer on a sidewall of the third gate electrode, a fourth sidewall spacer on a sidewall of the fourth gate electrode, a first source region on one side of the first gate electrode and a first drain region on the other side of the first gate electrode in the first active region, a second source region on one side of the second gate electrode and a second drain region on the other side of the second gate electrode in the first active region, a third source region on one side of the third gate electrode and a third drain region on the other side of the third gate electrode in the second active region, a fourth source region on one side of the fourth gate electrode and a fourth drain region on the other side of the fourth gate electrode in the second active region, a first memory cell transistor including the first gate insulating film, the first floating gate, the first gate electrode, the first sidewall spacer, the first source region and the first drain region, a first selecting transistor including the second gate insulating film, the second gate electrode, the second sidewall spacer, the second source region and the second drain region, a second memory cell transistor including the third gate insulating film, the third floating gate, the third gate electrode, the third sidewall spacer, the third source region and the third drain region, a second selecting transistor including the fourth gate insulating film, the fourth gate electrode, the fourth sidewall spacer, the fourth source region and the fourth drain region, an interlayer insulating film having a planarized surface above the first gate electrode, the second gate electrode, the third gate electrode, the fourth gate electrode, the first sidewall spacer and the second sidewall spacer, the third sidewall spacer and the fourth sidewall spacer, a first plug in the interlayer insulating film above the first drain region, the second plug in the interlayer insulating film above the second source region, a third plug in the interlayer insulating film above the third drain region and a fourth plug in the interlayer insulating film above the fourth source region, a bit line commonly connecting to the first plug and the third plug, extending in a second direction perpendicular to the first direction, a source line commonly connecting to the second plug and the fourth plug, extending in the second direction, a third active region, a fourth active region, a fifth active region and sixth active region defined by isolation regions in a peripheral circuit region, a fifth gate insulating film on the third active region, a sixth gate insulating film on the fourth active region, a seventh gate insulating film on the fifth active region and a eighth gate insulating film on the sixth active region, a fifth gate electrode above the fifth gate insulating film, a sixth gate electrode above the sixth gate insulating film, a seventh gate electrode above the seventh gate insulating film, an eighth gate electrode above the eighth gate insulating film, a fifth sidewall spacer on a sidewall of the fifth gate electrode, a sixth sidewall spacer on a sidewall of the sixth gate electrode, a seventh sidewall spacer on a sidewall of the seventh gate electrode, an eighth sidewall spacer on a sidewall of the eighth gate electrode, a fifth source region on one side of the fifth gate electrode and a fifth drain region on the other side of the fifth gate electrode, a sixth source region on one side of the sixth gate electrode and a sixth drain region on the other side of the sixth gate electrode, a seventh source region on one side of the seventh gate electrode and a seventh drain region on the other side of the seventh gate electrode, an eighth source region on one side of the eighth gate electrode and an eighth drain region on the other side of the eighth gate electrode, a fifth transistor including the fifth gate insulating film, the fifth gate electrode, the fifth sidewall spacer, the fifth source region and the fifth drain region, a sixth transistor including the sixth gate insulating film, the sixth gate electrode, the sixth sidewall spacer, the sixth source region and the sixth drain region, a seventh transistor including the seventh gate insulating film, the seventh gate electrode, the seventh sidewall spacer, the seventh source region and the seventh drain region, an eighth transistor including the eighth gate insulating film, the eighth gate electrode, the eighth sidewall spacer, the eighth source region and the seventh drain region, a column decoder including the fifth transistor, connecting to the bit line, a first row decoder including the sixth transistor, connecting to the first gate electrode and the third gate electrode, a second row decoder including the seventh transistor, connecting to the second gate electrode and the fourth gate electrode, a third row decoder including the eighth transistor, connecting to the source line, wherein the first gate electrode and the third gate electrode are formed with a first conductor of one extending in the second direction, the second gate electrode and the fourth gate electrode are formed with a second conductor of one extending in the second direction, the first source region and the second drain region are the same region, the third source region and the fourth drain region are the same region, the first memory cell transistor is connected in series to the first selecting transistor, the second memory cell transistor is connected in series to the second selecting transistor, a thickness of the fifth gate insulating film is thinner than either a thickness of the sixth gate insulating film or a thickness of the eighth gate insulating film, a thickness of the seventh gate insulating film is thinner than either a thickness of the sixth gate insulating film or a thickness of the eighth gate insulating film.

2. The nonvolatile semiconductor memory device according to claim 1, wherein a first insulating film is located between the first floating gate and the first gate electrode, a third insulating film gate is located between the third floating gate and the third gate electrode.

3. The nonvolatile semiconductor memory device according to claim 2, wherein the first insulating film includes a first silicon oxide film, a first silicon nitride film above the first silicon oxide film, and a second silicon oxide film above the first silicon nitride film, the third insulating film includes a third silicon oxide flim, a fourth silicon nitride film above the third silicon oxide film, and a third silicon oxide film above the third silicon nitride film.

* * * * *